US012666128B2

(12) United States Patent

Hu et al.

(10) Patent No.: US 12,666,128 B2

(45) Date of Patent: Jun. 23, 2026

(54) DRIVING MECHANISM

(71) Applicant: TDK TAIWAN CORP., Taoyuan City (TW)

(72) Inventors: Chao-Chang Hu, Taoyuan City (TW); Chen-Hsien Fan, Taoyuan City (TW); Sung-Mao Tsai, Taoyuan City (TW); Yueh-Lin Lee, Taoyuan City (TW); Yu-Chiao Lo, Taoyuan City (TW); Mao-Kuo Hsu, Taoyuan City (TW); Ching-Chieh Huan, Taoyuan City (TW); Yi-Chun Cheng, Taoyuan City (TW)

(73) Assignee: Actutek Corporation, Taoyuan City (TW)

( * ) Notice: Subject to any disclaimer, the term of this patent is extended or adjusted under 35 U.S.C. 154(b) by 73 days.

(21) Appl. No.: 18/601,123

(22) Filed: Mar. 11, 2024

(65) Prior Publication Data

US 2024/0214680 A1     Jun. 27, 2024

Related U.S. Application Data

(63) Continuation of application No. 18/160,069, filed on Jan. 26, 2023, now Pat. No. 11,956,541, which is a (Continued)

(51) Int. Cl.
| | |
|---|---|
| *H04N 23/57* | (2023.01) |
| *G03B 3/10* | (2021.01) |

(Continued)

(52) U.S. Cl.
CPC .............. *H04N 23/57* (2023.01); *G03B 3/10* (2013.01); *G03B 5/00* (2013.01); *G03B 5/02* (2013.01); *G03B 9/02* (2013.01); *G03B 30/00* (2021.01); *H04N 23/54* (2023.01); *H04N 23/55* (2023.01); *H04N 23/6812* (2023.01); *H04N 23/687* (2023.01); *H05K 1/148* (2013.01);

(Continued)

(58) Field of Classification Search
None
See application file for complete search history.

(56) References Cited

U.S. PATENT DOCUMENTS

| | | | |
|---|---|---|---|
| 11,181,669 | B2 | 11/2021 | Hu et al. |
| 2009/0160960 | A1 | 6/2009 | Nagata et al. |

(Continued)

OTHER PUBLICATIONS

Search Report mailed Jul. 2, 2020 in corresponding European Application No. 20154908.6.

*Primary Examiner* — Paul M Berardesca

(57) ABSTRACT

A driving mechanism is provided. The driving mechanism includes a movable portion, a fixed portion, a driving assembly, and an aperture module. The movable portion is used for holding an optical module. The optical module includes a substrate and an optical sensor, the optical module connects to an external circuit through the substrate, and the optical sensor is used for receiving a light. The movable portion is movable relative to the fixed portion. The driving assembly is used for driving the movable portion to move relative to the fixed portion. The aperture module is used for controlling size of an aperture, and the light enters to the optical sensor through the aperture.

18 Claims, 178 Drawing Sheets

Related U.S. Application Data continuation of application No. 16/778,366, filed on Jan. 31, 2020, now Pat. No. 11,601,595.

(60) Provisional application No. 62/925,958, filed on Oct. 25, 2019, provisional application No. 62/899,423, filed on Sep. 12, 2019, provisional application No. 62/882,165, filed on Aug. 2, 2019, provisional application No. 62/861,440, filed on Jun. 14, 2019, provisional application No. 62/849,317, filed on May 17, 2019, provisional application No. 62/799,886, filed on Feb. 1, 2019.

(51) Int. Cl.

| | |
|---|---|
| *G03B 5/00* | (2021.01) |
| *G03B 5/02* | (2021.01) |
| *G03B 9/02* | (2021.01) |
| *G03B 30/00* | (2021.01) |
| *H04N 23/54* | (2023.01) |
| *H04N 23/55* | (2023.01) |
| *H04N 23/68* | (2023.01) |
| *H05K 1/14* | (2006.01) |

(52) U.S. Cl.
CPC ............... *G03B 2205/0015* (2013.01); *G03B 2205/0023* (2013.01); *G03B 2205/0069* (2013.01); *H05K 2201/055* (2013.01)

(56) References Cited

U.S. PATENT DOCUMENTS

| | | | | |
|---|---|---|---|---|
| 2011/0262121 | A1* | 10/2011 | Yanagisawa | ......... G02B 27/646 |
| | | | | 396/55 |
| 2012/0293671 | A1 | 11/2012 | Chan et al. | |
| 2016/0007017 | A1 | 1/2016 | Nishikawa et al. | |
| 2016/0070270 | A1 | 3/2016 | Beard et al. | |
| 2016/0077354 | A1 | 3/2016 | Takano et al. | |
| 2016/0327806 | A1 | 11/2016 | Kasamatsu | |
| 2017/0045710 | A1 | 2/2017 | Lee et al. | |

| | | | | |
|---|---|---|---|---|
| 2018/0249082 | A1 | 8/2018 | Saito et al. | |
| 2018/0295286 | A1 | 10/2018 | Maede et al. | |
| 2018/0343393 | A1 | 11/2018 | Maede et al. | |
| 2018/0373121 | A1* | 12/2018 | Park | ...................... H04N 23/55 |
| 2018/0376068 | A1 | 12/2018 | Shimatani et al. | |
| 2019/0018258 | A1* | 1/2019 | Minamisawa | ....... H04N 23/687 |
| 2019/0058817 | A1* | 2/2019 | Seo | .................... H04N 23/51 |
| 2019/0137844 | A1* | 5/2019 | Park | .................... H04N 23/55 |
| 2019/0141219 | A1* | 5/2019 | Oh | ..................... H04N 23/55 |
| 2019/0219892 | A1* | 7/2019 | Park | .................... H04N 23/51 |
| 2019/0373145 | A1* | 12/2019 | Yu | ......................... G02B 7/102 |
| 2020/0007721 | A1* | 1/2020 | Jeong | ................... G03B 9/06 |
| 2020/0012170 | A1* | 1/2020 | Hong | ................. G02B 26/02 |
| 2020/0028998 | A1* | 1/2020 | Jun | ..................... H04N 23/51 |
| 2020/0068100 | A1* | 2/2020 | Kim | ..................... G02B 5/005 |
| 2020/0077000 | A1* | 3/2020 | Lee | ...................... H04N 23/51 |
| 2020/0132979 | A1* | 4/2020 | Rho | ................... G02B 13/001 |
| 2020/0169665 | A1 | 5/2020 | Shin et al. | |
| 2020/0174271 | A1* | 6/2020 | Minamisawa | ........... G03B 5/00 |
| 2020/0174272 | A1* | 6/2020 | Minamisawa | ........... G03B 5/04 |
| 2020/0174273 | A1* | 6/2020 | Minamisawa | ........... G03B 5/02 |
| 2020/0209439 | A1 | 7/2020 | Hu et al. | |
| 2020/0213493 | A1 | 7/2020 | Cheng et al. | |
| 2020/0301246 | A1* | 9/2020 | Seo | ........................ H04N 23/55 |
| 2020/0310151 | A1* | 10/2020 | Sue | ...................... H04N 23/687 |
| 2020/0310152 | A1* | 10/2020 | Minamisawa | ....... H02K 11/215 |
| 2020/0310153 | A1* | 10/2020 | Sue | .......................... G03B 5/06 |
| 2020/0326557 | A1 | 10/2020 | Awazu et al. | |
| 2020/0363607 | A1* | 11/2020 | Fan | ...................... H04N 23/55 |
| 2020/0401014 | A1* | 12/2020 | Seo | .......................... G03B 9/06 |
| 2020/0409234 | A1* | 12/2020 | Jun | ..................... G03B 30/00 |
| 2021/0041715 | A1* | 2/2021 | Takei | .................. G02B 27/646 |
| 2021/0041716 | A1* | 2/2021 | Takei | ...................... G03B 5/06 |
| 2021/0041717 | A1* | 2/2021 | Takei | .................. G02B 27/646 |
| 2021/0063680 | A1 | 3/2021 | Kim | |
| 2021/0109421 | A1* | 4/2021 | Yu | .......................... G03B 30/00 |
| 2021/0203823 | A1* | 7/2021 | Yu | .......................... G01D 5/142 |
| 2021/0215903 | A1* | 7/2021 | Rho | ......................... G03B 13/36 |
| 2021/0215945 | A1* | 7/2021 | Rho | ................... G02B 27/646 |
| 2021/0218866 | A1* | 7/2021 | Moon | ..................... G03B 5/00 |
| 2022/0091476 | A1* | 3/2022 | Minamisawa | ......... H04N 23/54 |
| 2022/0091477 | A1* | 3/2022 | Minamisawa | ......... H04N 23/57 |

* cited by examiner

O

101

102

103

104

105

106

Z
Y
X

FIG. 8
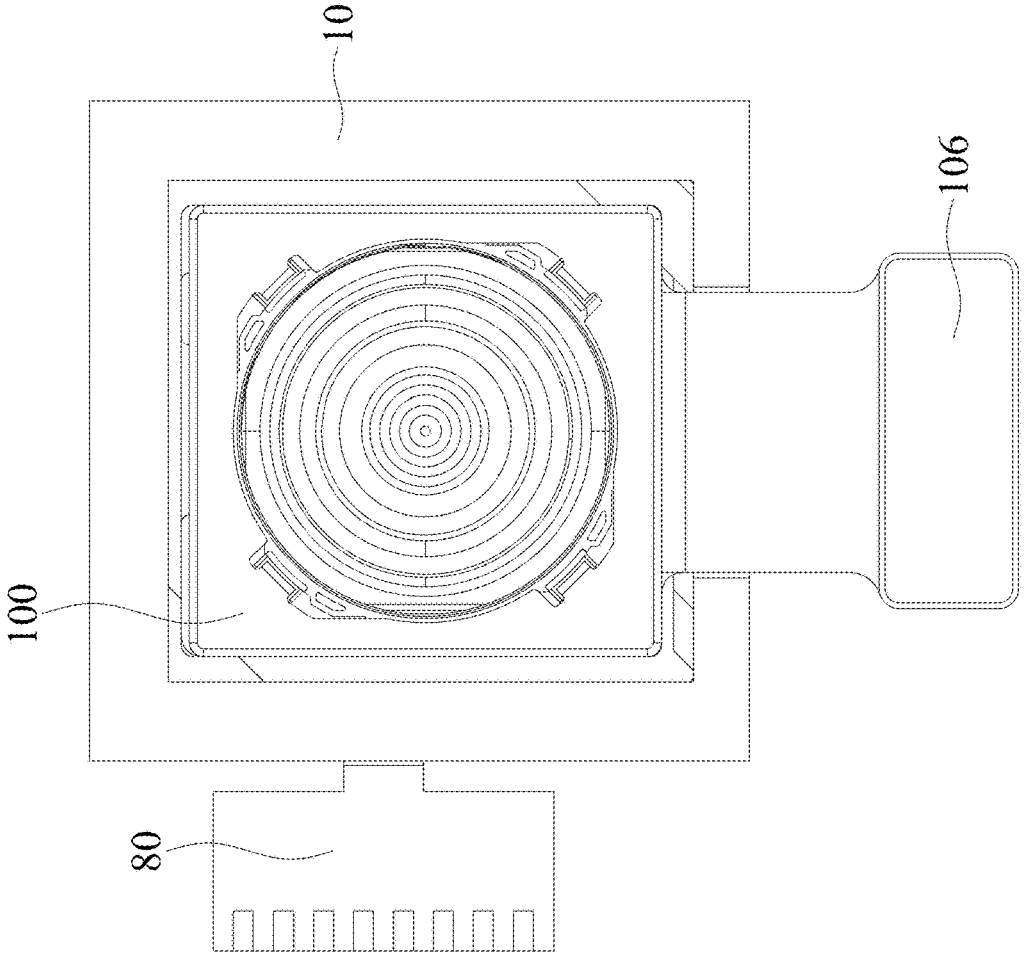
10
106
100
80
1
Z X Y

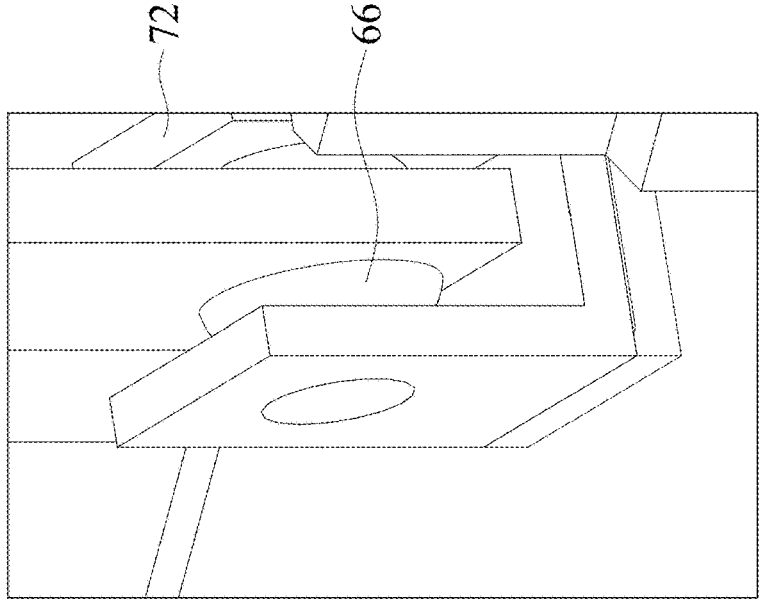
FIG. 12
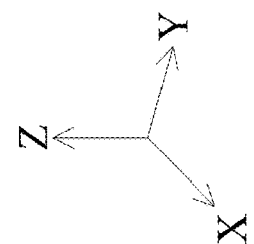

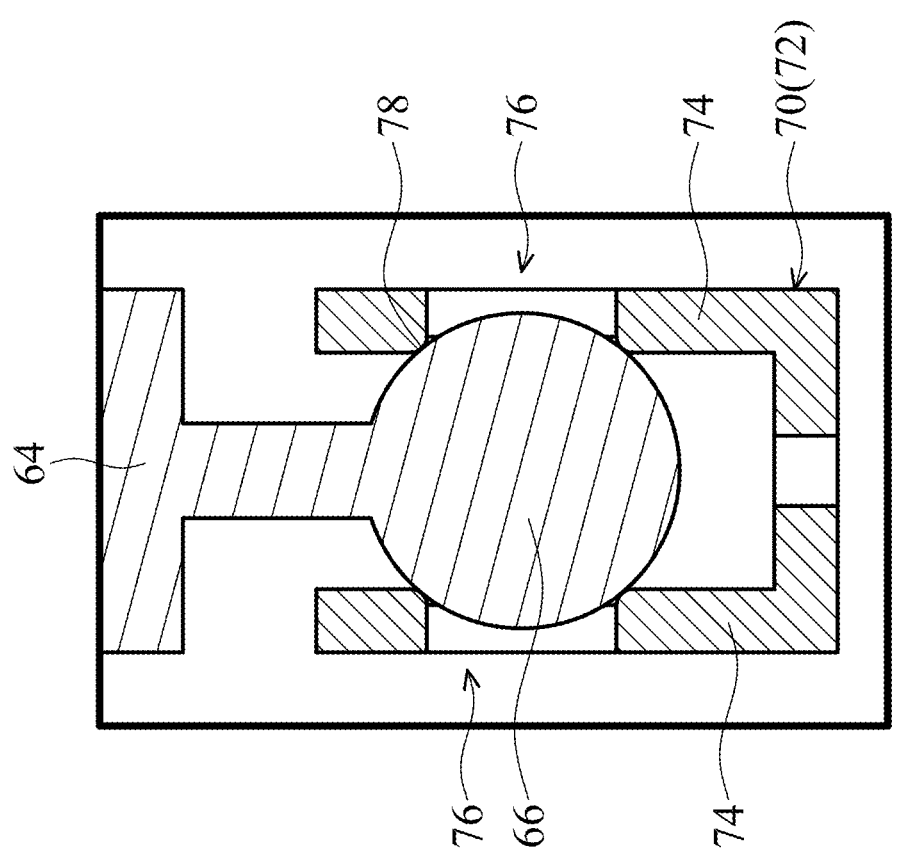
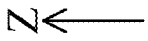
FIG. 13

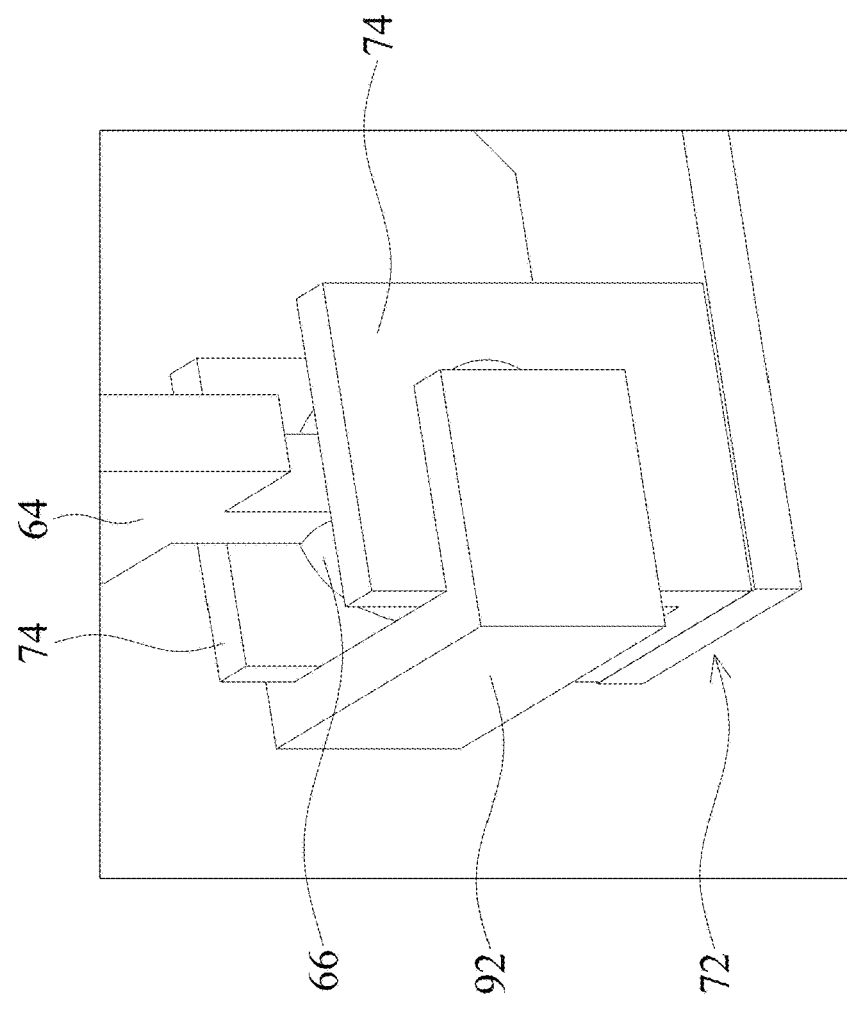
FIG. 17
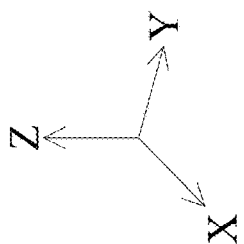

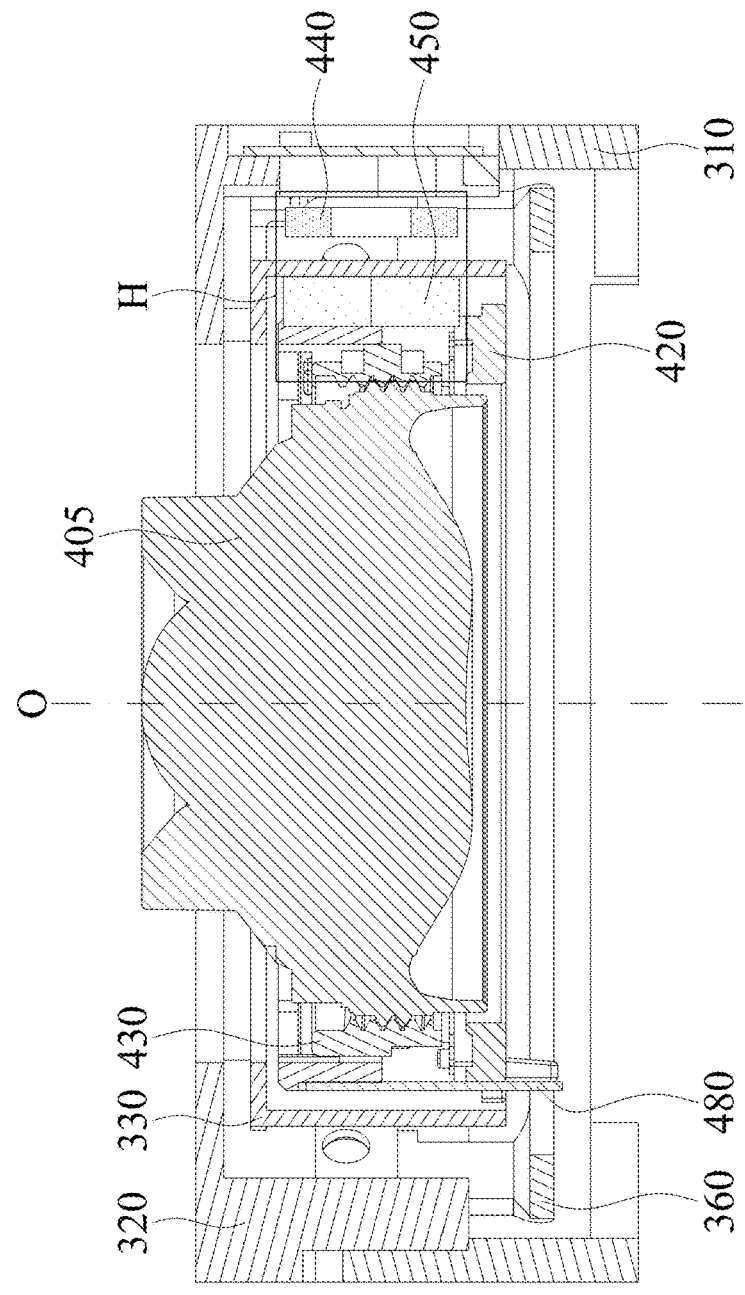
FIG. 24
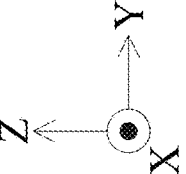

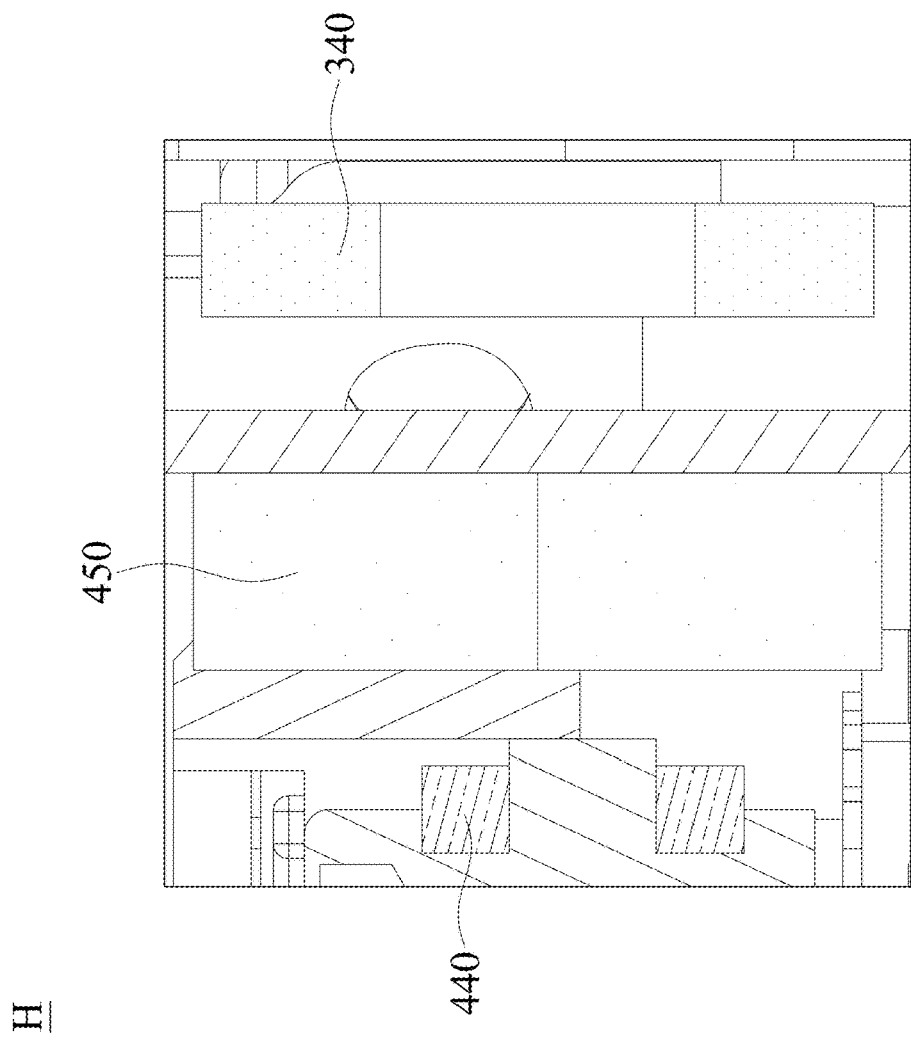
FIG. 25
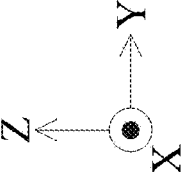

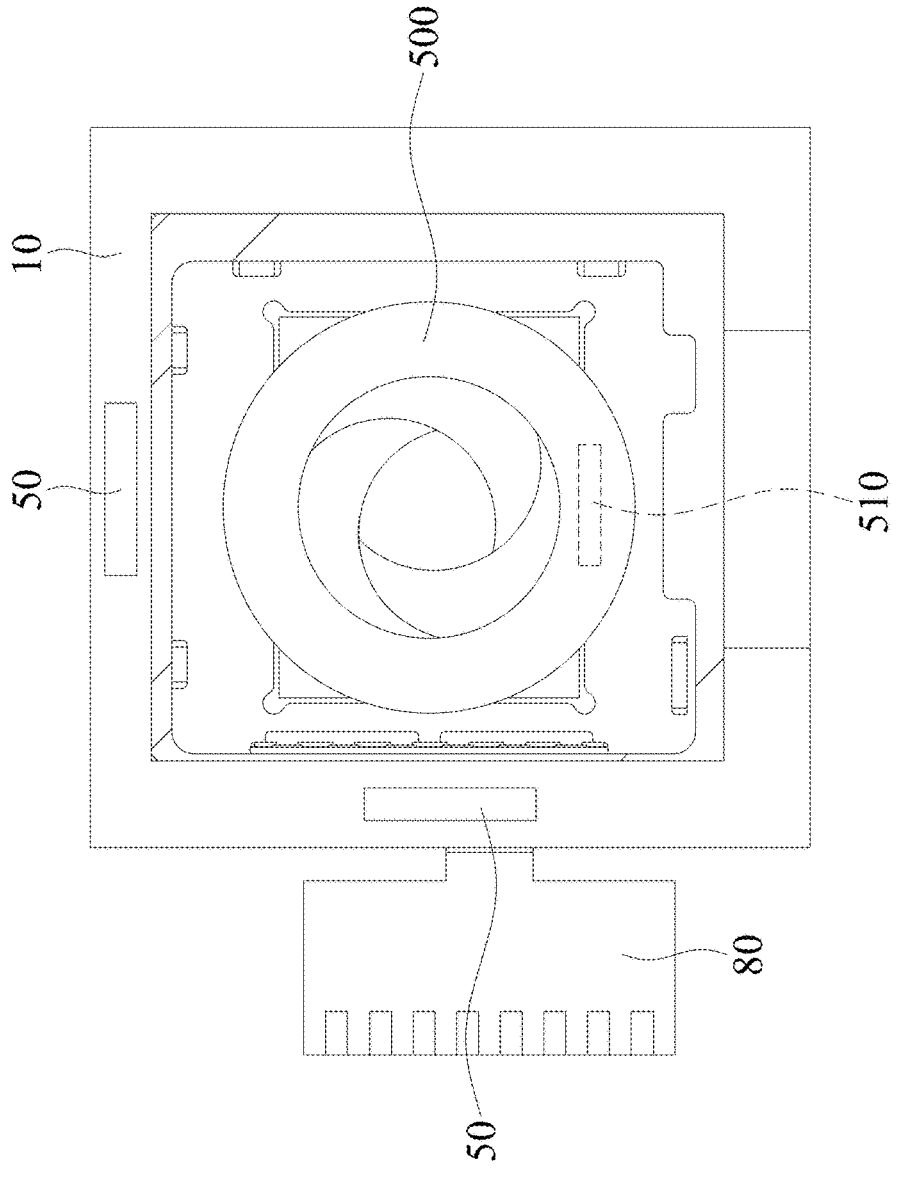
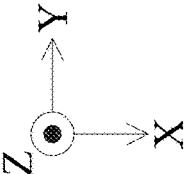
FIG. 27

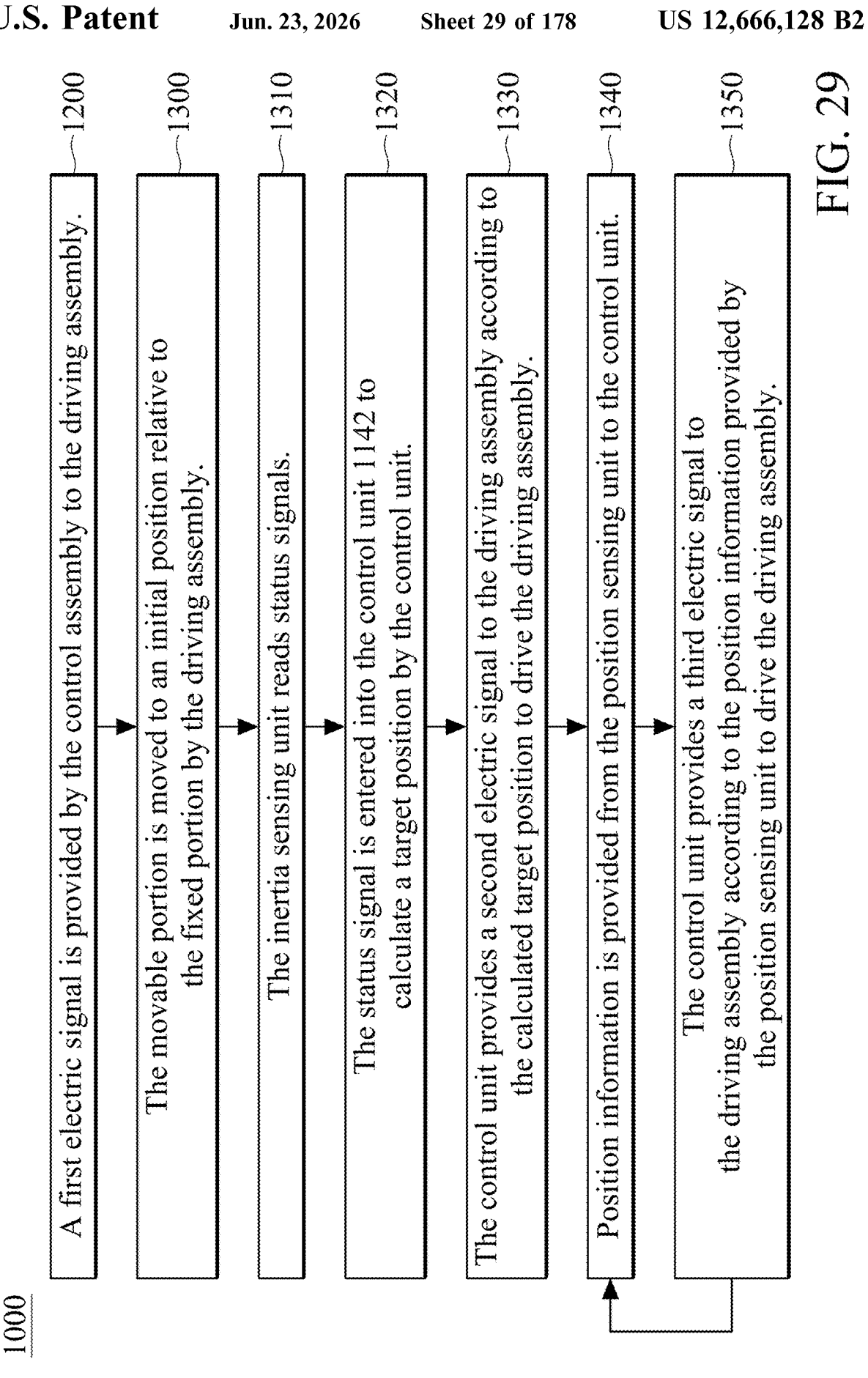

1000

1200 — A first electric signal is provided by the control assembly to the driving assembly.

1300 — The movable portion is moved to an initial position relative to the fixed portion by the driving assembly.

1310 — The inertia sensing unit reads status signals.

1320 — The status signal is entered into the control unit 1142 to calculate a target position by the control unit.

1330 — The control unit provides a second electric signal to the driving assembly according to the calculated target position to drive the driving assembly.

1340 — Position information is provided from the position sensing unit to the control unit.

1350 — The control unit provides a third electric signal to the driving assembly according to the position information provided by the position sensing unit to drive the driving assembly.

FIG. 29

1st dimension

2nd dimension

1704

1702

1800

<u>1910</u> moving the holder to a target position
in the close-loop mode ~1912 changing the close-loop mode to an
open-loop mode ~1914 performing tilting compensation ~1916 changing the open-loop mode to the
close-loop mode, and moving the
holder to the target position ~1918

1990

1992

1800

2900

O2

2990

2910

2920

2970

2980

Z
Y
X

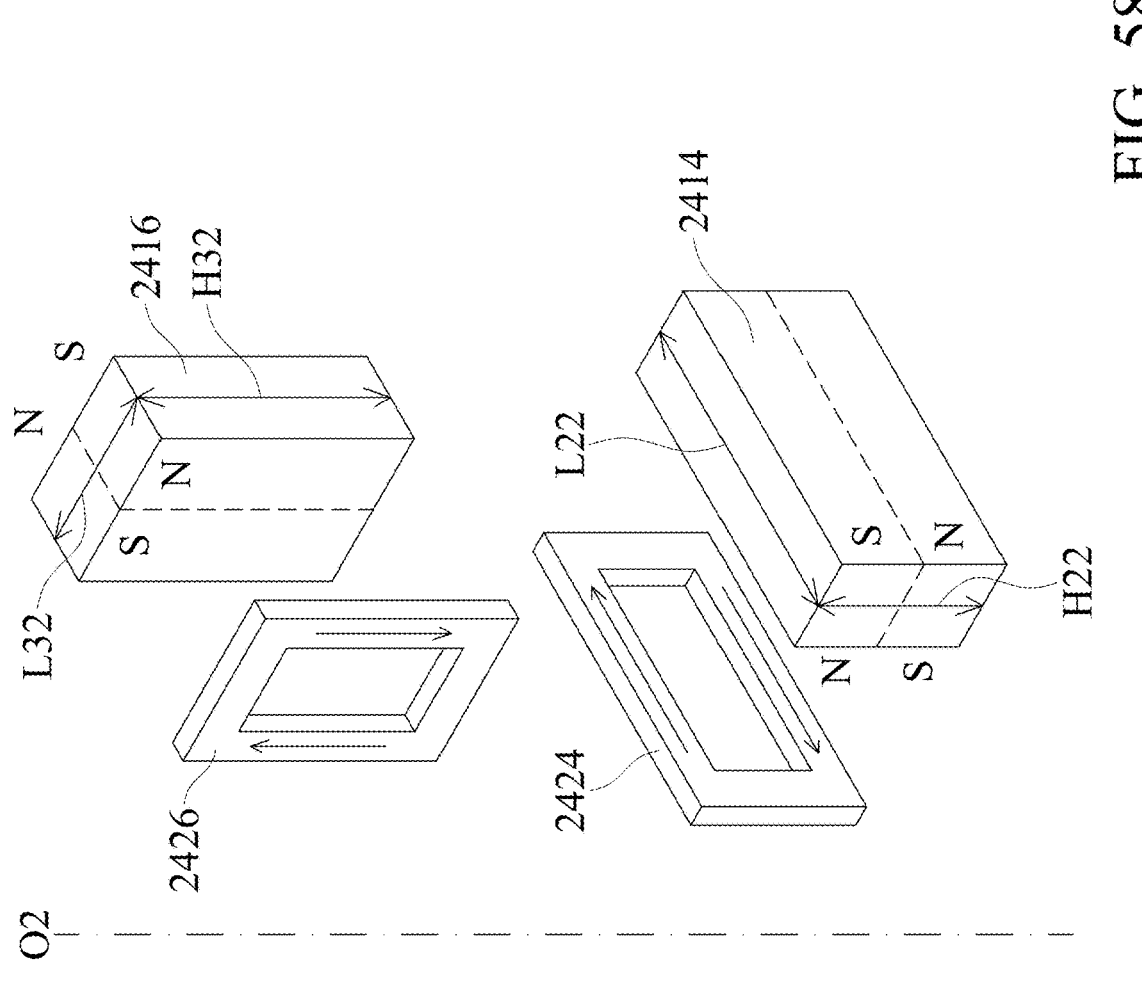
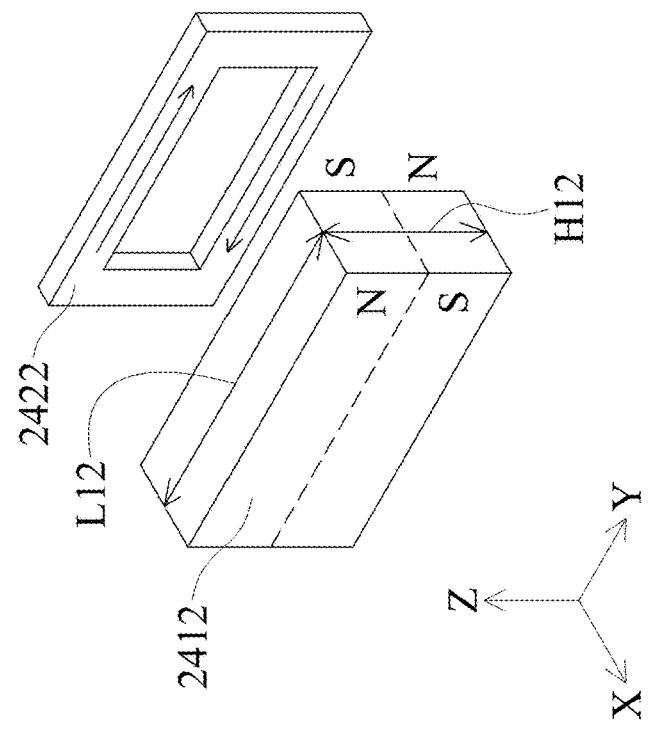
FIG. 58

2304C

2302C

2301C

2306

2301B

2302B

2304B

2300

2100

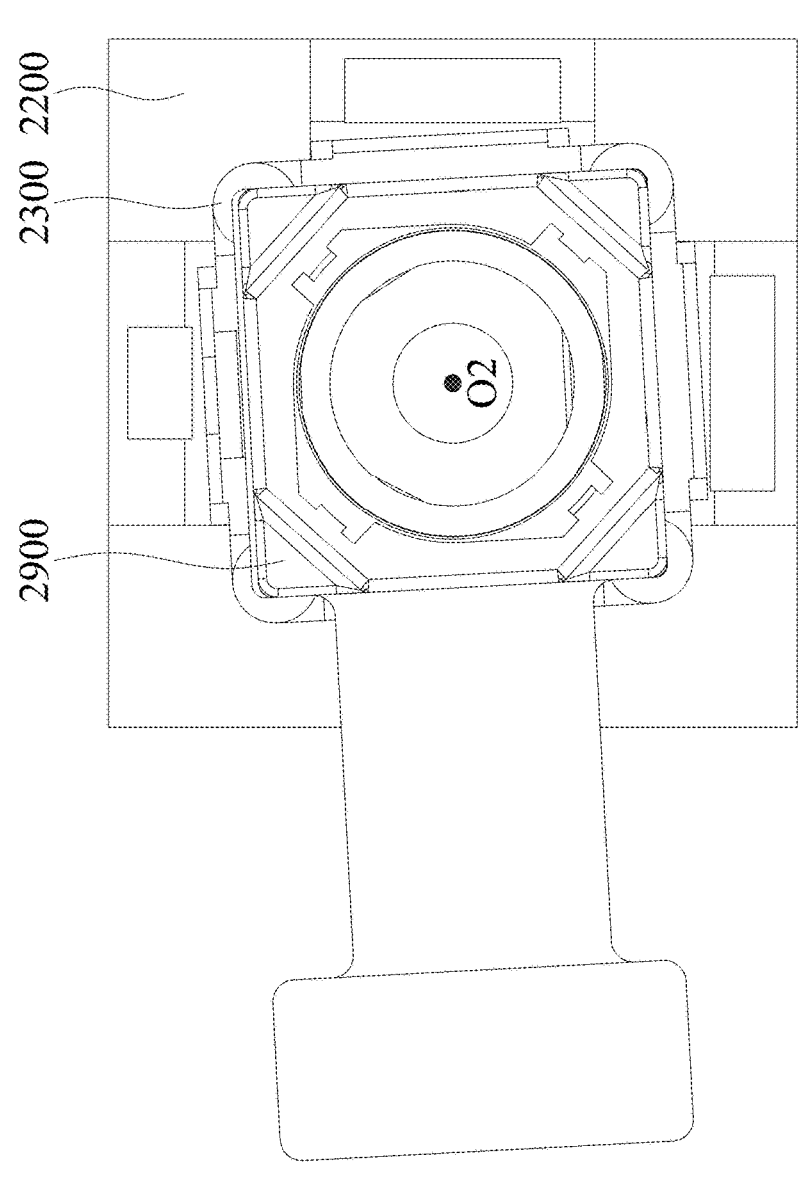
FIG. 63
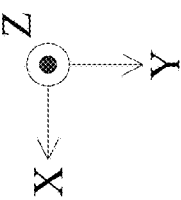

3101

O13

D13 { 3411
3421

3901

3301

3701

3811

3811

3411

3411

3431

3421

3421

3601

3211(F13)

Z

Y

X

3801

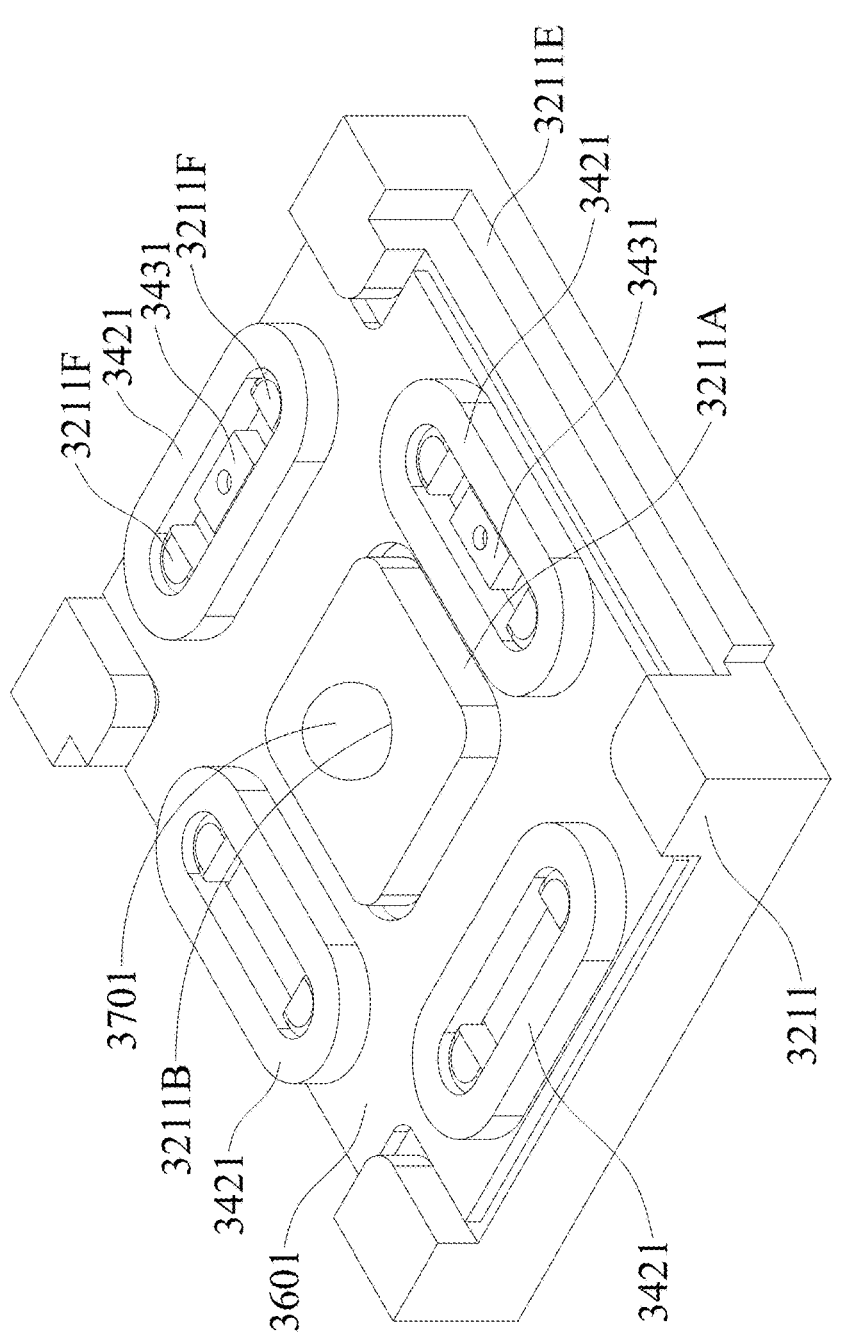
3211F
3421
3431
3211F
3211E
3421
3431
3211A
3701
3211B
3421
3601
3211
3421
3421
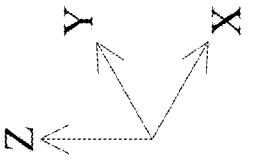
FIG. 67

3104

3214

3414A

3414A

R4

4212

4212A

4104

4214

4990

4304

4810

4811

5100

O5

5200

5220

5222

5222

5900

5302

5300

5830

5420

5430

5302

5410

5410

5430

5420

5830

5420

5600

5602

5604

5606

5330

5212

5218

5216

5215

5210

5214

5610

$F5 \begin{cases} 5200 \\ 5210 \end{cases}$ $D5 \begin{cases} 5410 \\ 5420 \end{cases}$

Z

Y

X

5330

5336
5334

5336
5334

5336
5334

5332

5336
5334

Z
Y
X

5300

5302

O5

5303

5302

5301

5303

Y

X

Z

5610

5210

5900

5600

5606

6900

6100

6202

6302

C6-C6

A7-A7

7900

O17

7990

7910

7950

7930

7940

7950

7980

7920

Z

Y

X

7210

B7

7315

7216

7312
7313

C7

7213
7310

7212

7216

7216

O17

7314

7311
7212

7321

7212

7213

C7

7312

7216

7325

7320

B7

B7-B7

C7-C7
7313
7323
7322
7312
7900
7312
7313
7323
7322
7324
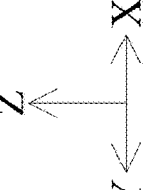
FIG. 154
Z
Y X

7210

7216

7216

7213
7211

7212

7212

7211
7213

7216

7216

7314

7313

7312

7315

7311

7315

7312

7313

7310

X

Z

Y

7210

7310

7320

7310

7320

7210

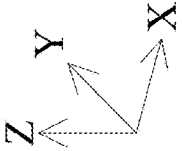
FIG. 161

7310
7320
7210
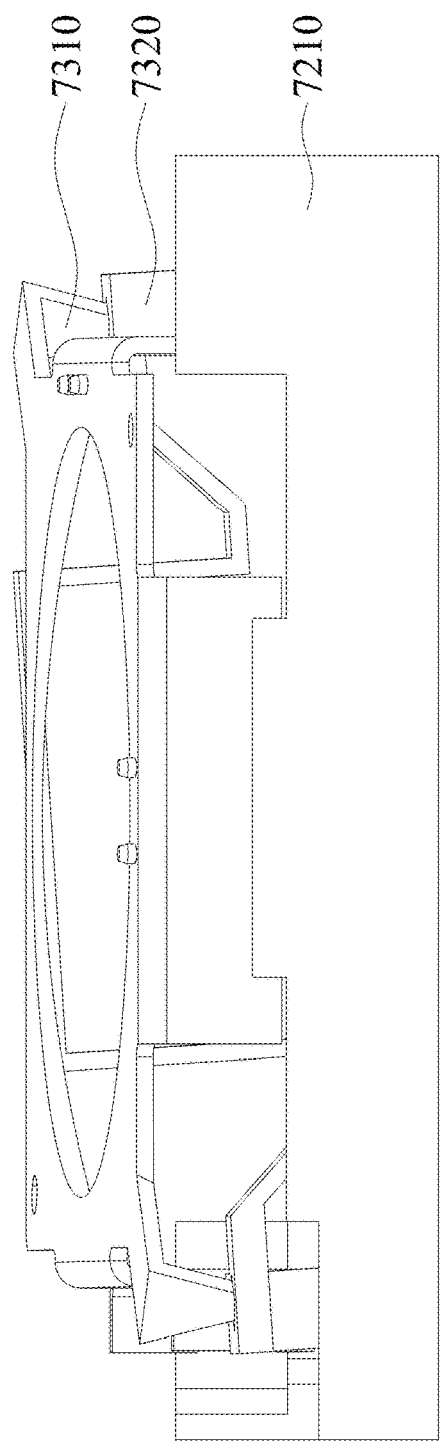
FIG. 162
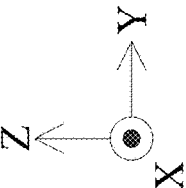

7101

O27

7330

7900

7342

7341

7340

7341

7342

R27

F27

Z

Y

X

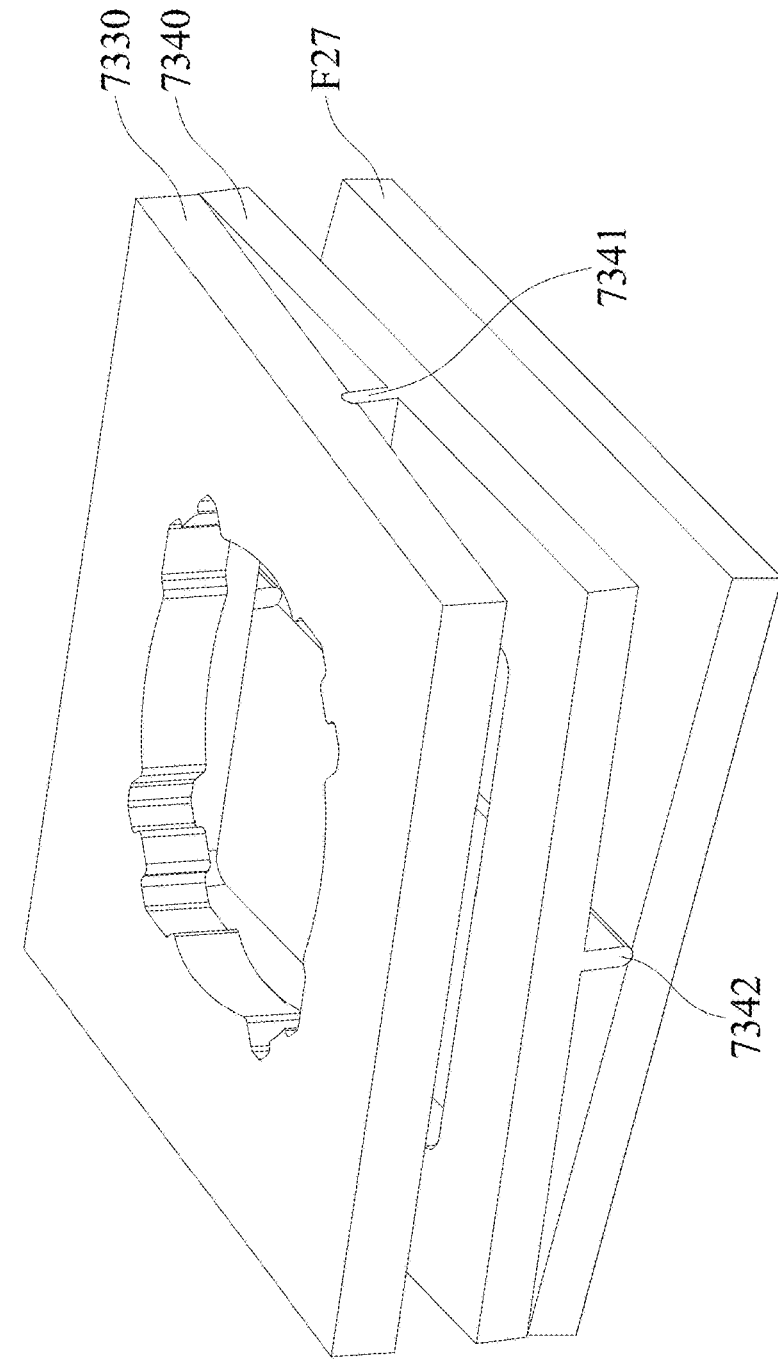
7330
7340
F27
7341
7342
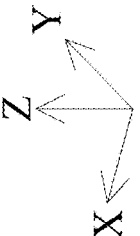
FIG. 166

7102

O37

7900

7350

7351

7362

7360

7361

7231

7230(F37)

Z

Y

X

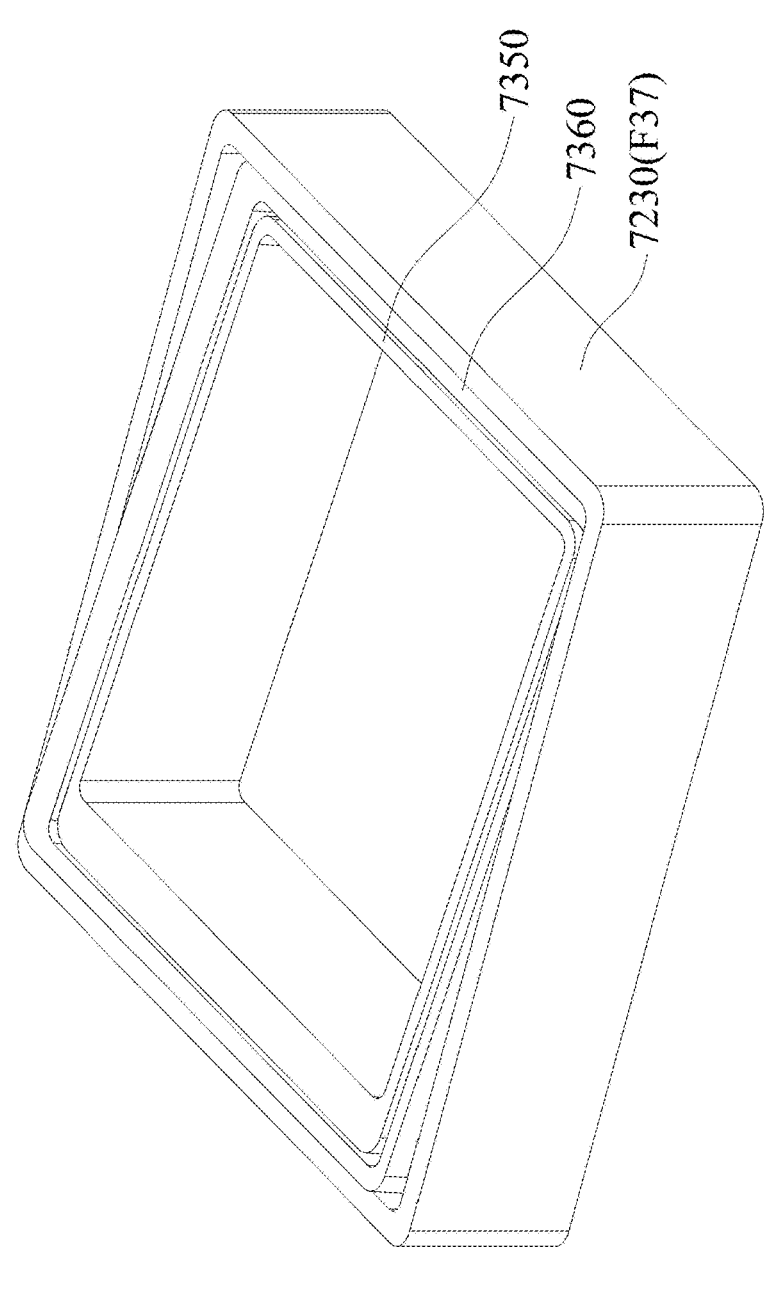
7102
7350
7360
7230(F37)
FIG. 170
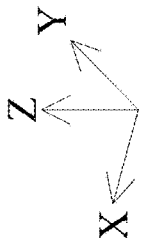

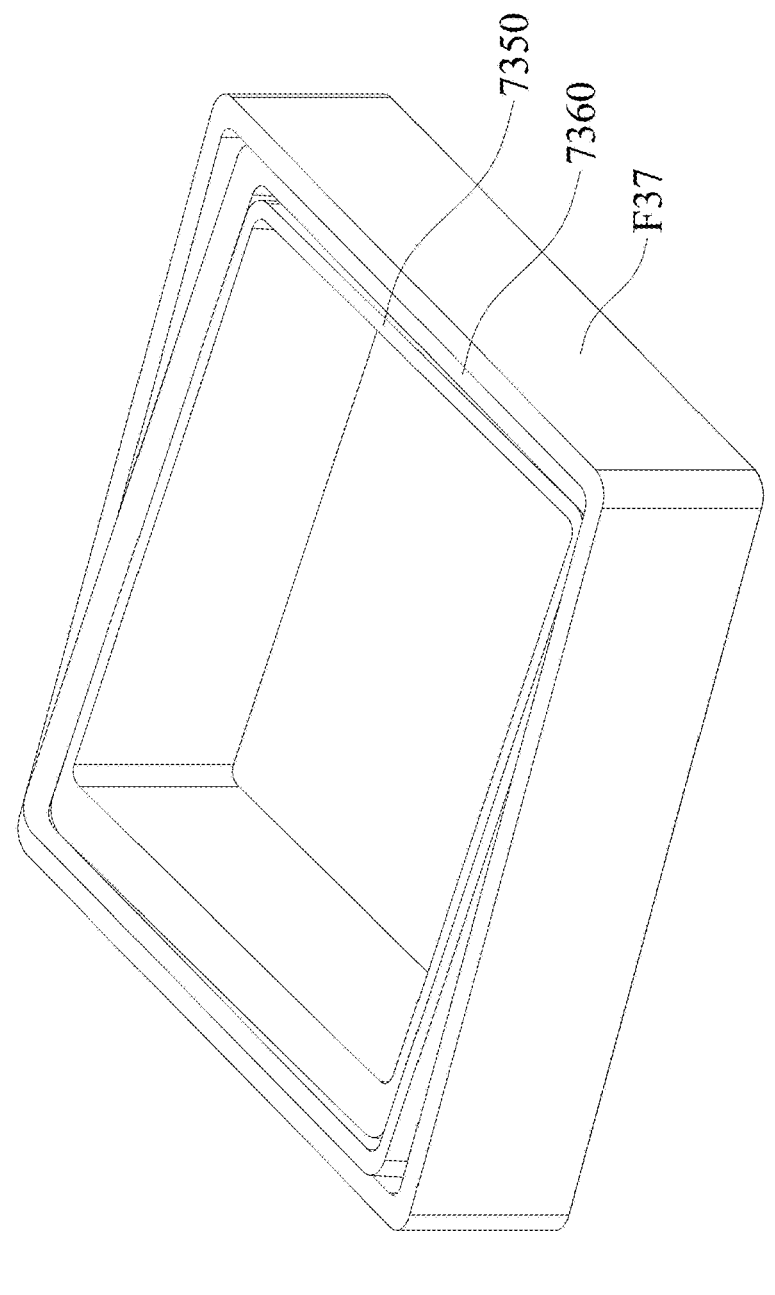
7102
7350
7360
F37
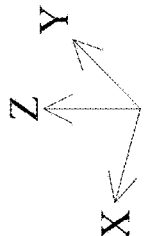
FIG. 171

8200

8210

A8

O8

A8

8100

B8

8311

8210

8310 ⎤M8
8320 ⎦

D8

8321

C8

D8

8422
8412 ⎤ D82

O8

8321

C8

8421 ⎤
8411 ⎦ D81
8600

8311

8211

B8

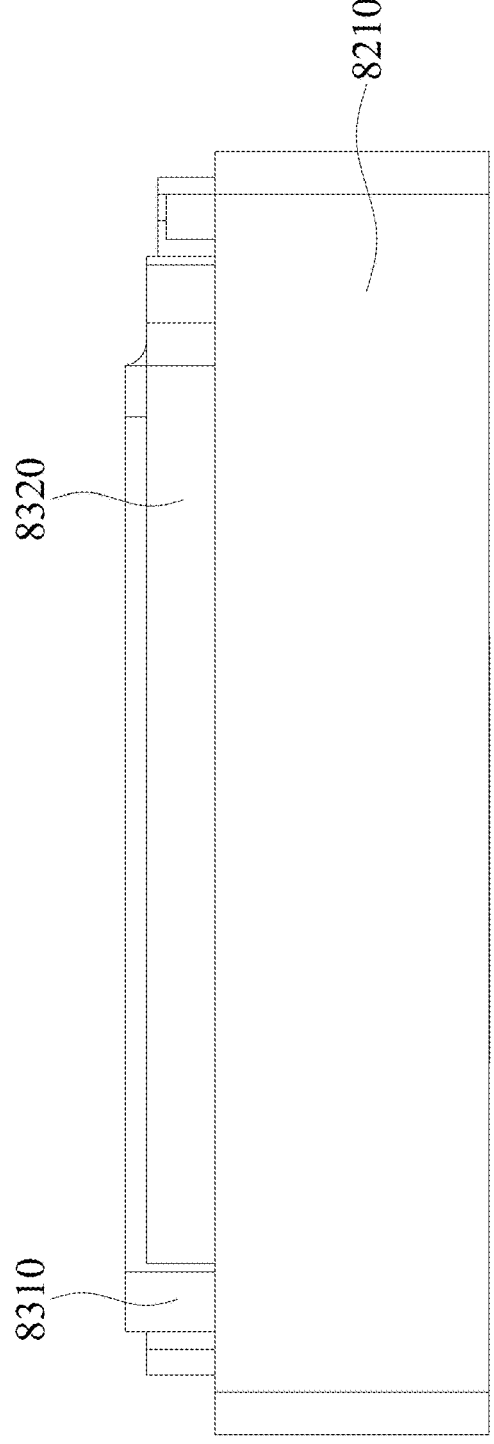
8210
8320
8310
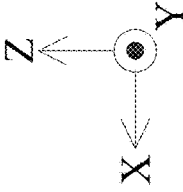
FIG. 176

D8-D8

8900

O8

8990

8910

8920

8970

8980

Z
Y
X

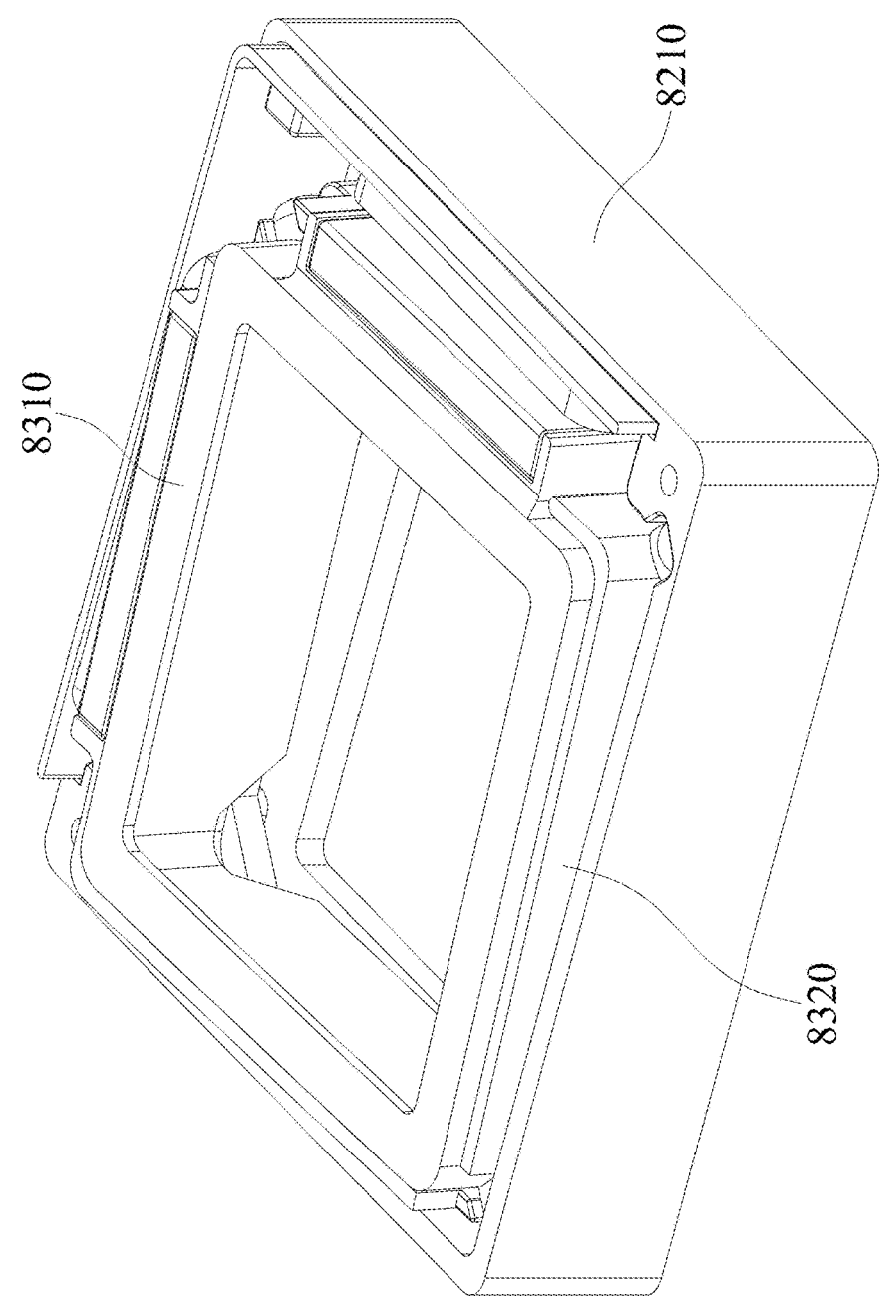
8310
8210
8320
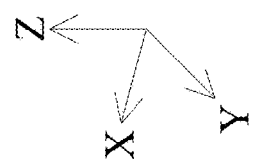
FIG. 182

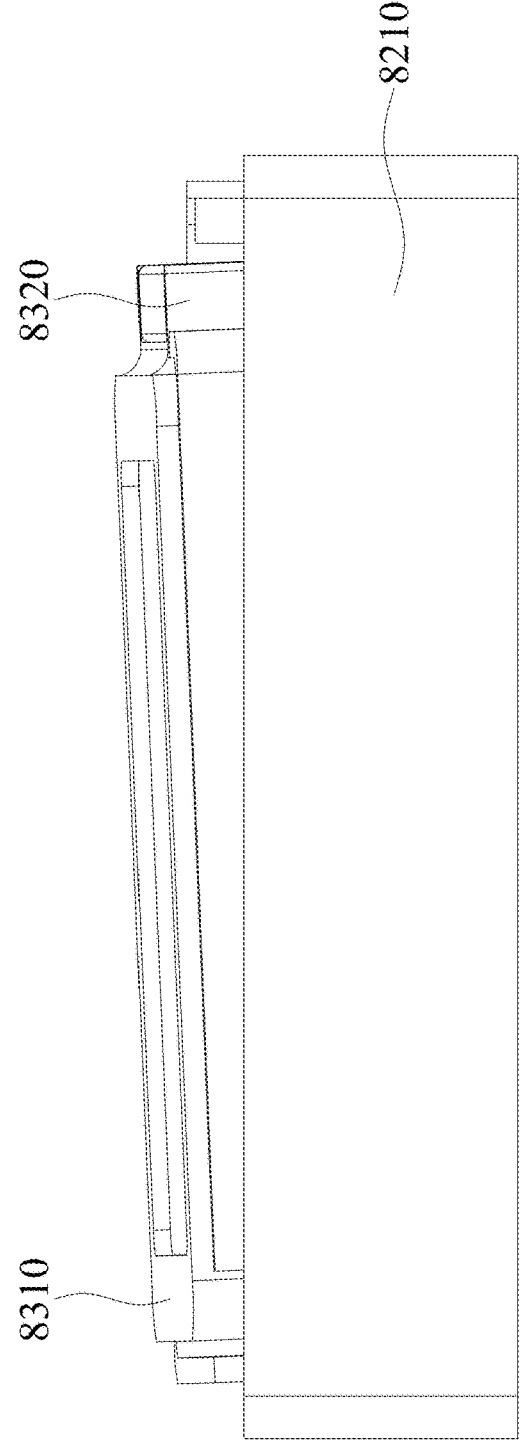
8210
8320
8310
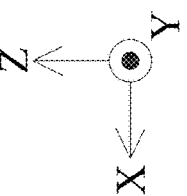
FIG. 183

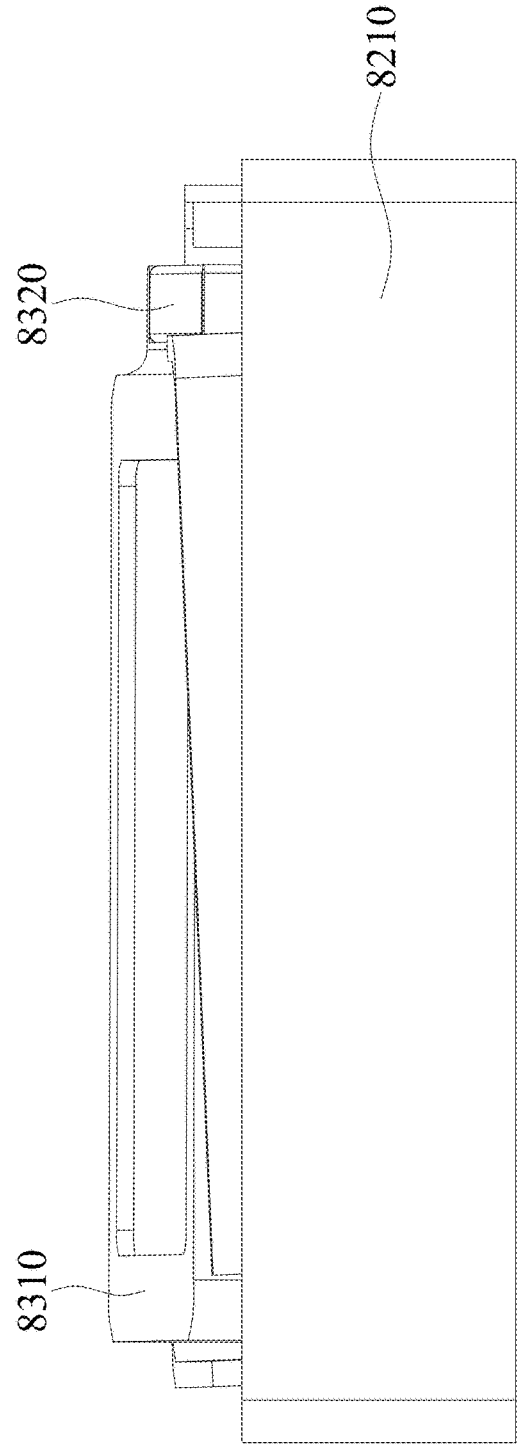
8320
8210
8310
FIG. 185
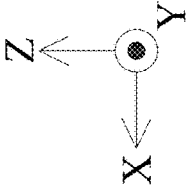

DRIVING MECHANISM

CROSS REFERENCE TO RELATED APPLICATIONS

This application is a Continuation of U.S. patent application Ser. No. 18/160,069, filed on Jan. 26, 2023, which is a continuation of U.S. patent application Ser. No. 16/778,366 filed on Jan. 31, 2020 (now U.S. Pat. No. 11,601,595 B2), which claims the benefit of U.S. Provisional Application Nos. 62/799,886 filed on Feb. 1, 2019, 62/849,317 filed on May 17, 2019, 62/861,440 filed on Jun. 14, 2019, 62/882,165 filed on Aug. 2, 2019, 62/899,423 filed on Sep. 12, 2019, and 62/925,958 filed on Oct. 25, 2019, the entirety of which are incorporated by reference herein.

BACKGROUND OF THE DISCLOSURE

Field of the Disclosure

The present disclosure relates to a control method of driving mechanism.

Description of the Related Art

As technology has developed, it has become more common to include image capturing or recording functions into many types of modern electronic devices, such as smartphones and digital cameras. These electronic devices are used more and more often, and new models have been developed that are convenient, thin, and lightweight, offering more choice for consumers.

Electronic devices that have image capturing or recording functions normally include a driving mechanism to drive an optical element (e.g. a lens) to move along its optical axis, thereby achieving auto focus (AF) or optical image stabilization (OIS). Light may pass through the optical element and may form an image on an optical sensor. However, the trend in modern mobile devices is to have a smaller size and a higher durability. As a result, how to effectively reduce the size of the driving mechanism and how to increase its durability has become an important issue.

BRIEF SUMMARY OF DISCLOSURE

A control method of a driving mechanism is provided, including: providing a first electrical signal from a control assembly to the driving mechanism to move a movable portion to an initial position relative to the fixed portion using the driving mechanism, wherein the control assembly includes a control unit and a position sensing unit; reading a status signal from an inertia sensing unit; using the inertia sensing unit to provide the status signal to the control unit, and then use the control unit to calculate a target position; using the control unit to provide a second electrical signal to the driving assembly according to the target position for driving the driving assembly; providing a position signal from the position sensing unit to the control unit; and using the control unit to provide a third electric signal to the driving assembly, according to the position signal to drive the driving assembly.

In some embodiments, providing the first electrical signal from the control assembly to the driving mechanism further includes: determining predetermined information; and providing the first signal to the driving assembly according to the predetermined information. In some embodiments, determining the predetermined information includes: establishing initial predetermined information; providing linear compensation to the initial predetermined information to achieve compensated predetermined information; searching for a zero value; and testing the driving mechanism according to the compensated predetermined information and the zero value, to determine a difference between the compensated predetermined information and an actual value of the driving mechanism, and to determine a difference between the zero value and the actual value of the driving mechanism, and then determine the predetermined information by the differences.

In some embodiments, establishing the initial predetermined information includes: measuring a first limit value of the movable portion on a first dimension; and measuring a second limit value of the movable portion on a second dimension, wherein the first dimension is different than the second dimension. In some embodiments, measuring the first limit value of the movable portion on the first dimension and measuring the second limit value of the movable portion on the second dimension are not performed simultaneously. In some embodiments, establishing the initial predetermined information further includes: measuring the first limit value of the movable portion on the first dimension again after measuring the second limit value of the movable portion on the second dimension. In some embodiments, establishing the initial predetermined information further includes: measuring the second limit value of the movable portion on the second dimension again after measuring the first limit value of the movable portion on the first dimension again.

In some embodiments, searching for the zero value includes: searching for a first zero value of the movable portion on the first dimension; and searching for a second zero value of the movable portion on the second dimension. In some embodiments, searching for the first zero value of the movable portion on the first dimension and searching for the second zero value of the movable portion on the second dimension are performed simultaneously. In some embodiments, searching for the first zero value of the movable portion on the first dimension and searching for the second zero value of the movable portion on the second dimension are performed sequentially.

In some embodiments, testing the driving mechanism includes: providing a predetermined command to the position sensing unit; measuring the driving mechanism to gain a position signal; and comparing the predetermined command and the position signal to get a difference value. In some embodiments, testing the driving mechanism further includes: after providing the predetermined command to the position sensing unit, waiting for a period of time, and then measuring the driving mechanism to gain the position signal. In some embodiments, testing the driving mechanism further includes: measuring a plurality of values of the position signal of the driving mechanism at different positions to get the actual value. In some embodiments, testing the driving mechanism further includes: measuring a plurality of read values of the position signal of the driving mechanism at different positions; calculating calculated values of the driving mechanism at different positions according to the read values; and combining the read values and the calculated values to get the actual value. In some embodiments, testing the driving mechanism further includes: comparing the difference value to an acceptable value; and determining the driving mechanism does not pass the test if the difference value exceeds the acceptable value.

In some embodiments, the operation of providing the linear compensation to the initial predetermined information includes: measuring the position of the movable portion relative to the fixed portion via an external apparatus to perform the linear compensation. In some embodiments, the operation of measuring the position of the movable portion relative to the fixed portion via an external apparatus includes: providing an input signal from the external apparatus to a reference surface of the movable portion; receiving a reflect signal reflected from the reference surface; and calculating an angle difference between the input signal and the reflect signal to get the position of the movable portion relative to the fixed portion. In some embodiments, determining the predetermined information further includes: searching for a predetermined value when searching for the zero value of the driving mechanism.

In some embodiments, the operation of reading the status signal of the inertia sensing unit includes a filtering signal having a frequency less than 1 Hz. In some embodiments, the control method of a driving mechanism further includes: after the control unit provides the third electric signal to the driving assembly according to the position signal to drive the driving assembly, the position information is sent from the position sensing unit to the control unit again; and the control unit again provides the third electric signal to the driving assembly according to the position information to drive the driving assembly.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 8 is a top view of the driving mechanism in some embodiments of the present disclosure.

FIG. 12 is an enlarged view of the portion D in FIG. 11.

FIG. 13 is a schematic view when the connecting portion is connected to the contact element in some embodiments of the present disclosure.

FIG. 17 is an enlarged view of the portion G in FIG. 16.

FIG. 24 is a cross-sectional view illustrated along line C-C' in FIG. 23.

FIG. 25 is an enlarged view of the portion H in FIG. 24.

FIG. 27 is a top view of a driving mechanism in some embodiments of the present disclosure.

FIG. 29 is a block diagram of a control method of driving mechanism.

FIG. 48 is a schematic view of an optical element driving mechanism in some embodiments of the present disclosure.

FIG. 58 is a schematic view of the driving assembly.

FIG. 63 is a cross-sectional view of the optical element driving mechanism when the optical element driving mechanism is moving in another direction.

FIG. 67 is a schematic view of some elements of the optical element driving mechanism.

FIG. 125 is a side view of some elements of the optical element driving mechanism.

FIG. 126 is an enlarged view of a portion where the connecting portion and the contact element are connected with each other.

FIG. 127 is a cross-sectional view of a portion where the connecting portion and the contact element are connected with each other.

FIG. 128 is a top view of some elements of the optical element driving mechanism.

FIG. 129 and FIG. 130 are block diagrams showing the electrical connection relationship between some elements of the optical element driving mechanism.

FIG. 131 is a perspective view of an optical element driving mechanism according to some embodiments of the present disclosure.

FIG. 132 is an exploded view of the optical element driving mechanism.

FIG. 133 is a cross-sectional view of the optical element driving mechanism.

FIG. 134 is an exploded of an optical module.

FIG. 135 is a schematic view of some elements of the optical element driving mechanism.

FIG. 136 is a cross-sectional view of some elements of the optical element driving mechanism.

FIG. 137 is a top view of the optical element driving mechanism.

Figure 138:
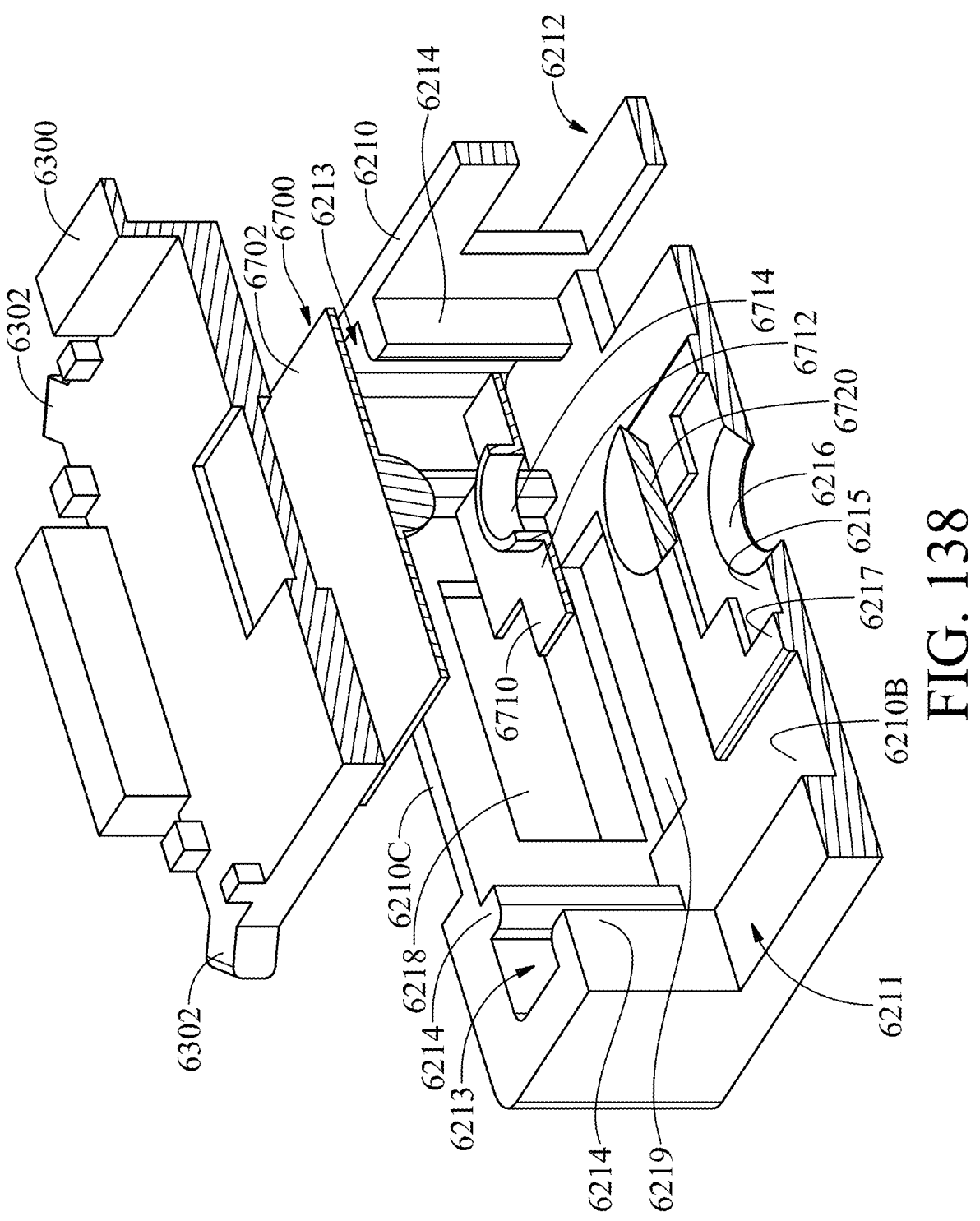

FIG. 138 is a schematic view of some elements of the optical element driving mechanism.

Figure 139:
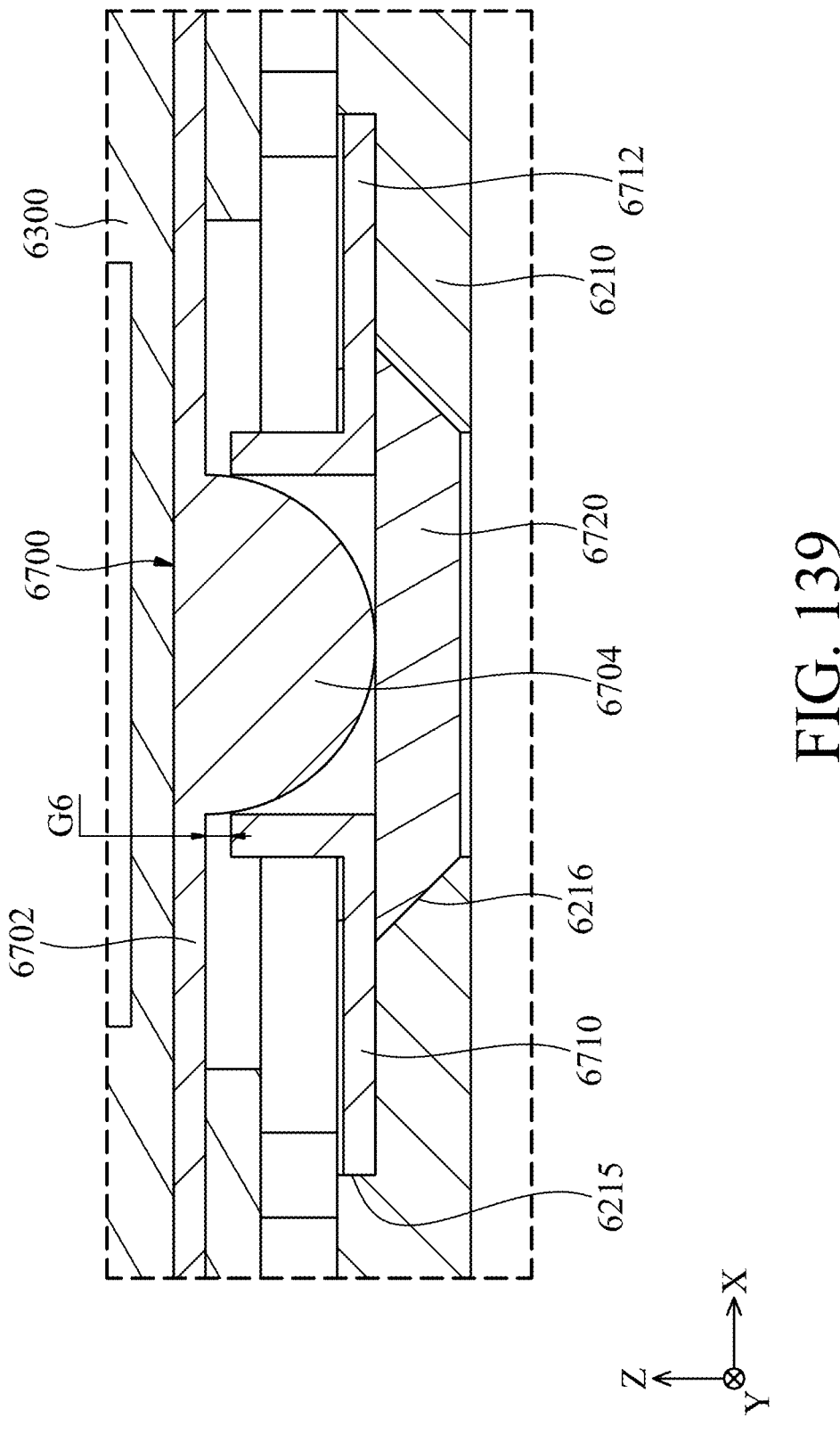

FIG. 139 is a cross-sectional view of some elements of the optical element driving mechanism.

Figure 140:
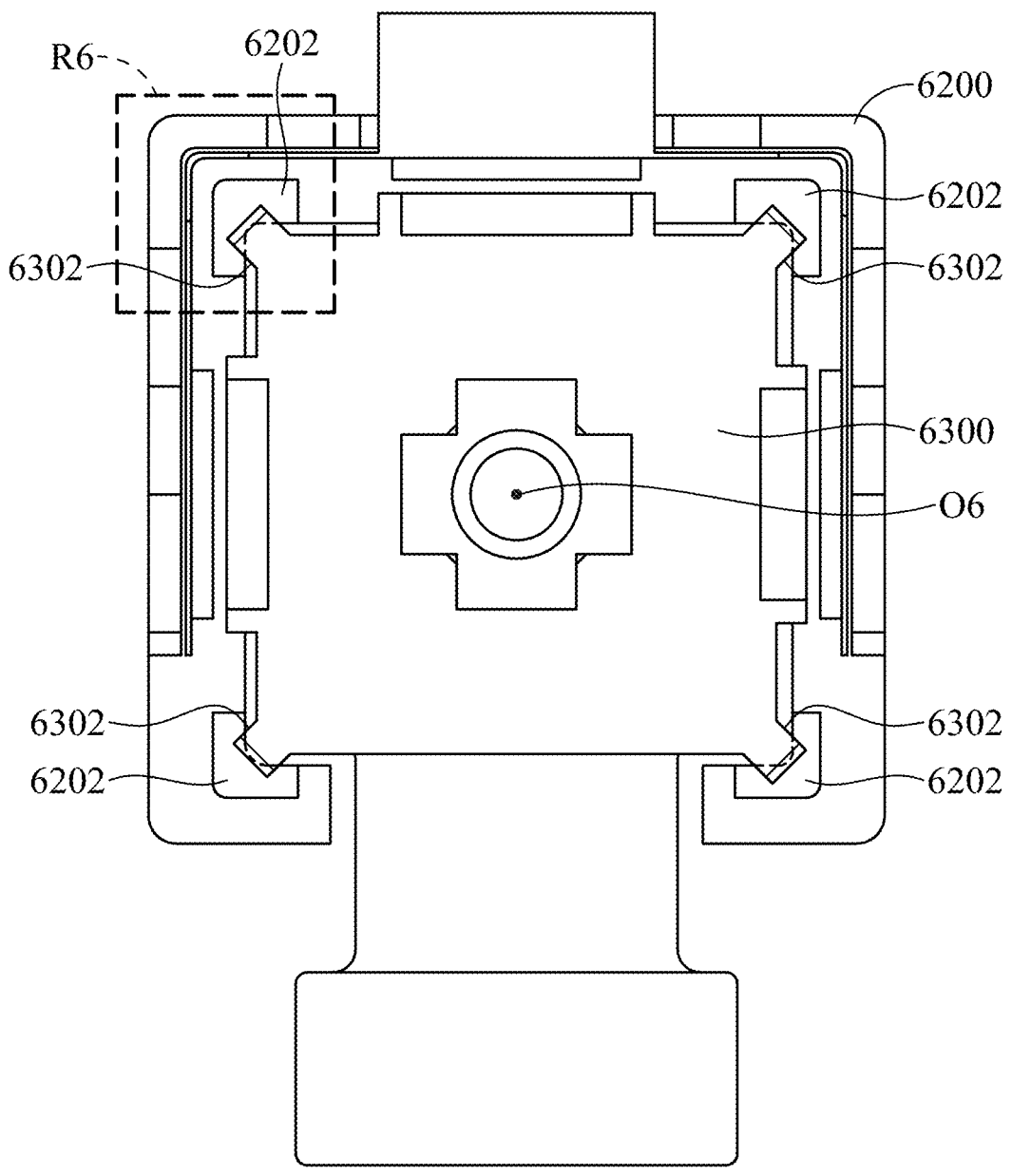

FIG. 140 is a bottom view of some elements of the optical element driving mechanism.

Figure 141:
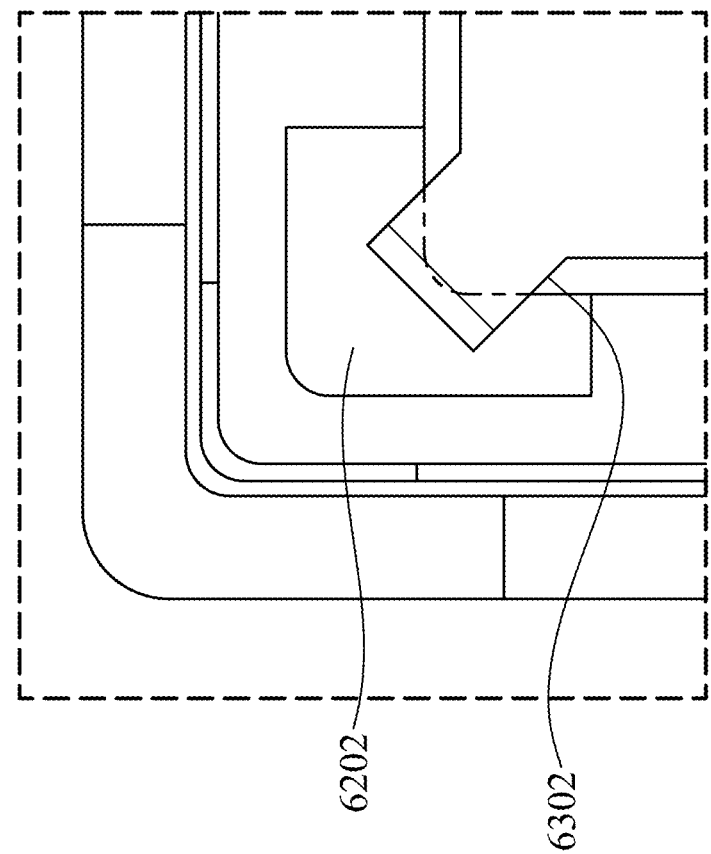

FIG. 141 is an enlarged view of FIG. 140.

Figure 142:
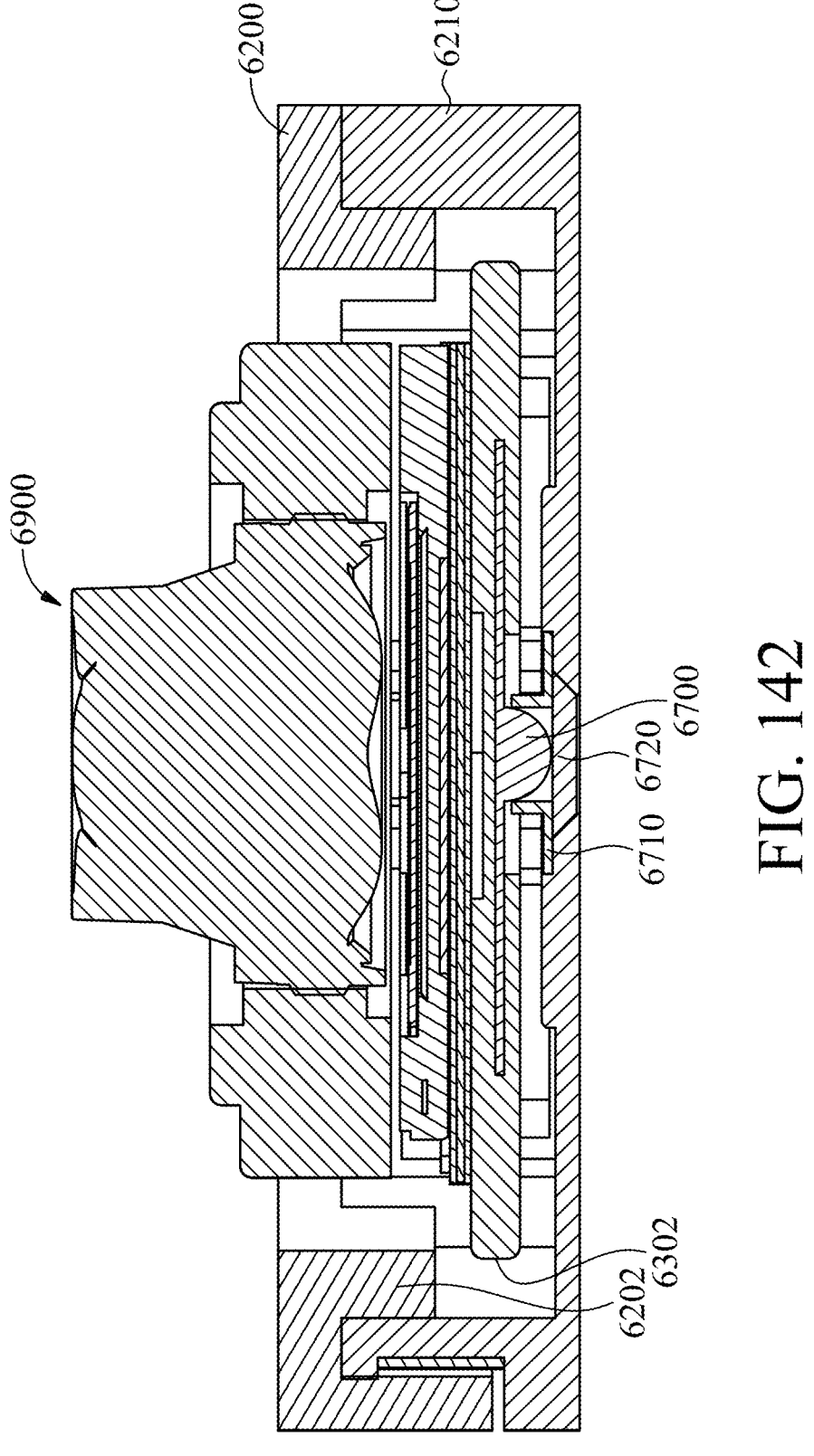

FIG. 142 is a cross-sectional view of the optical element driving mechanism.

Figure 143:
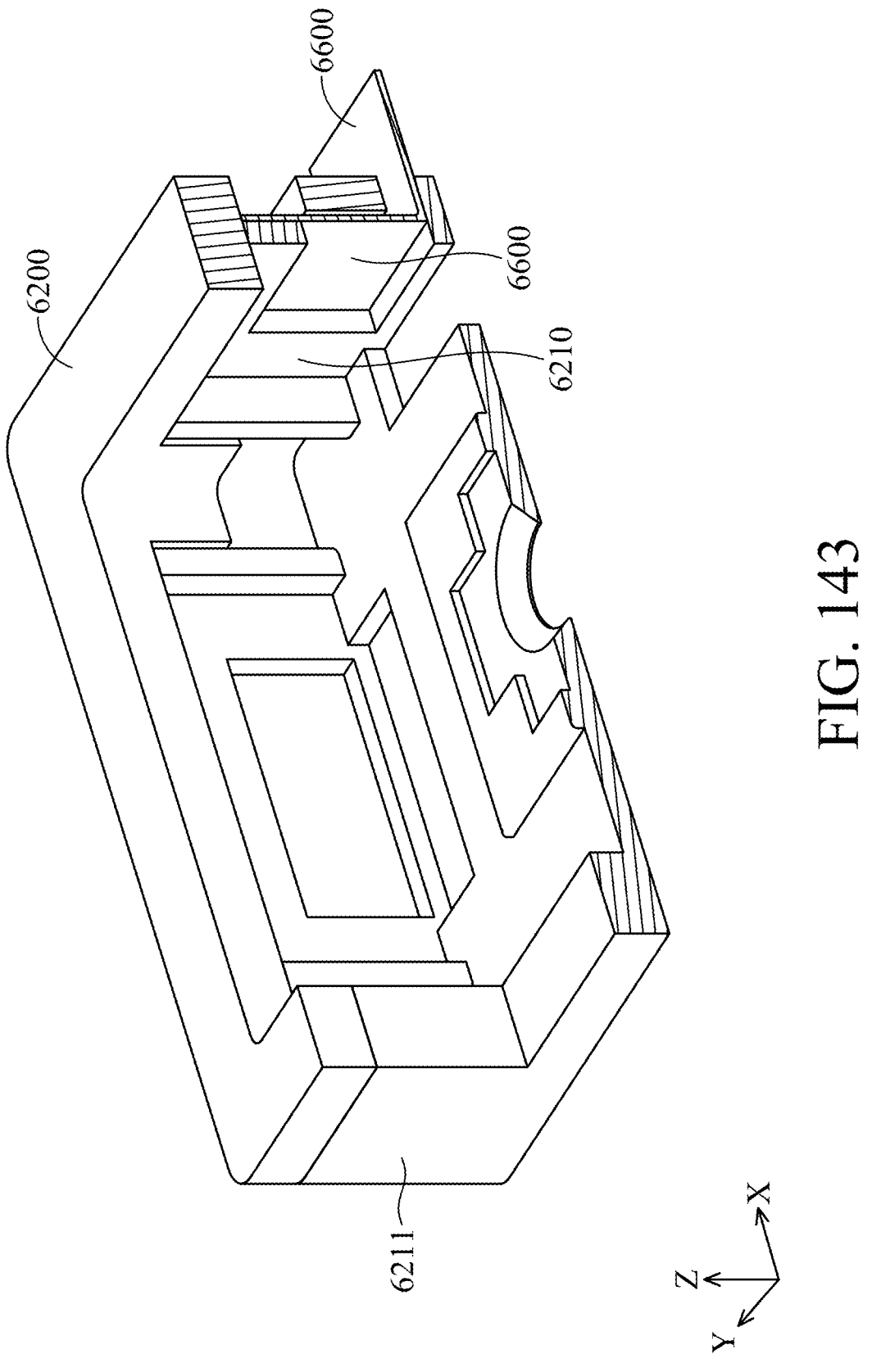

FIG. 143 is a schematic view of some elements of the optical element driving mechanism.

Figure 144:
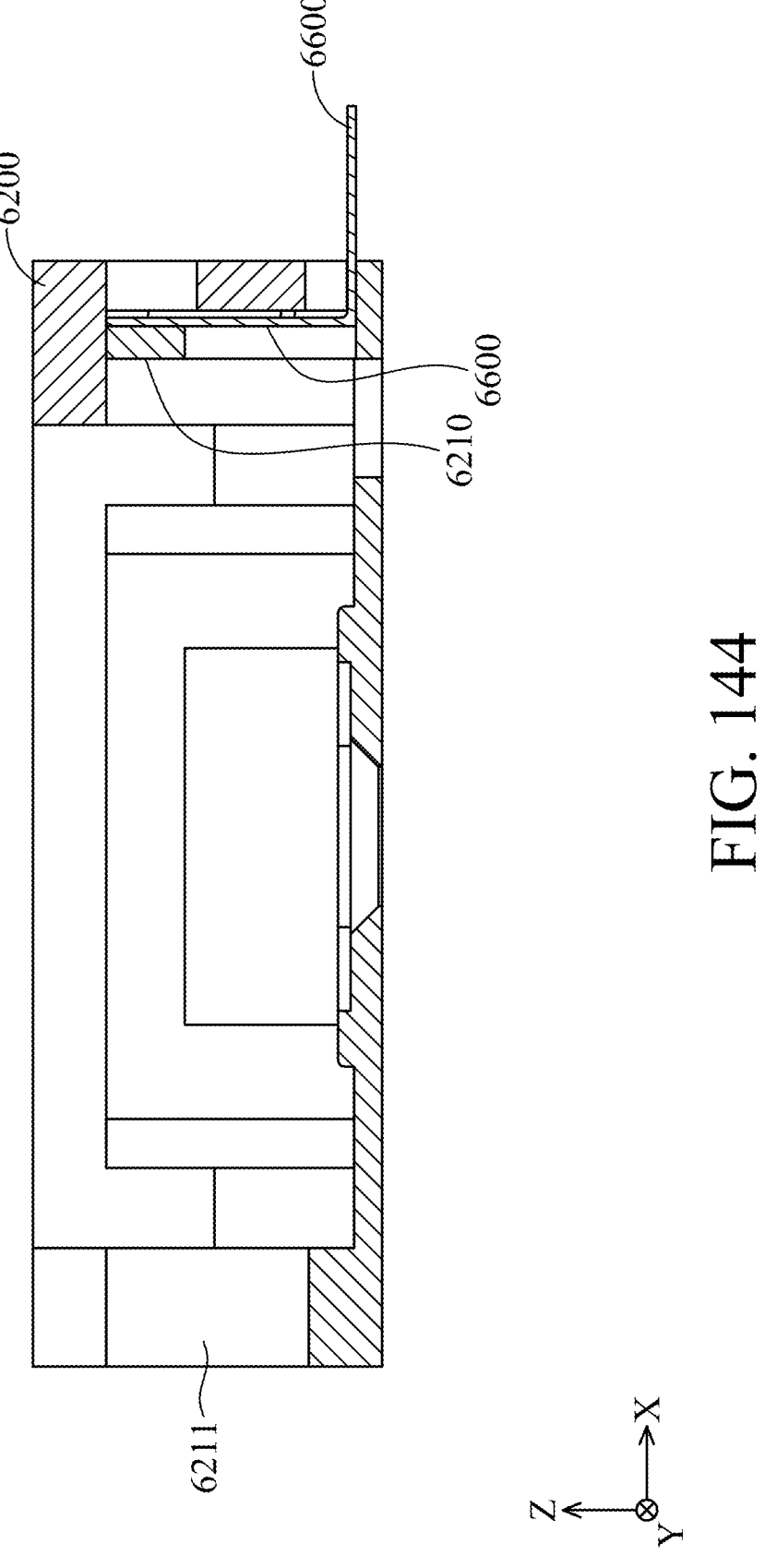

FIG. 144 is a cross-sectional view of some elements of the optical element driving mechanism.

Figure 145:
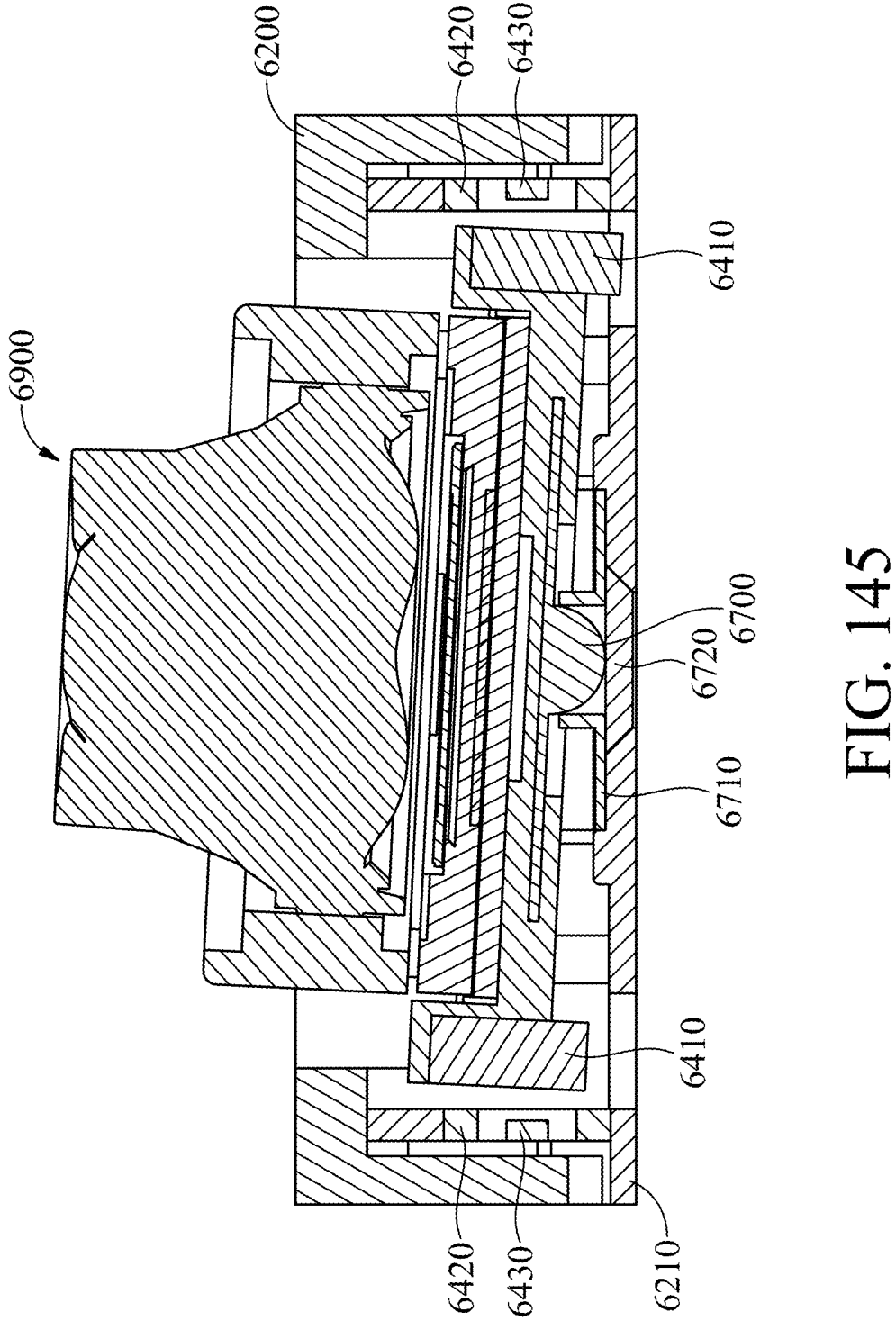

FIG. 145 is a cross-sectional view of the optical element driving mechanism when the optical element driving mechanism is moving in a direction.

Figure 146:
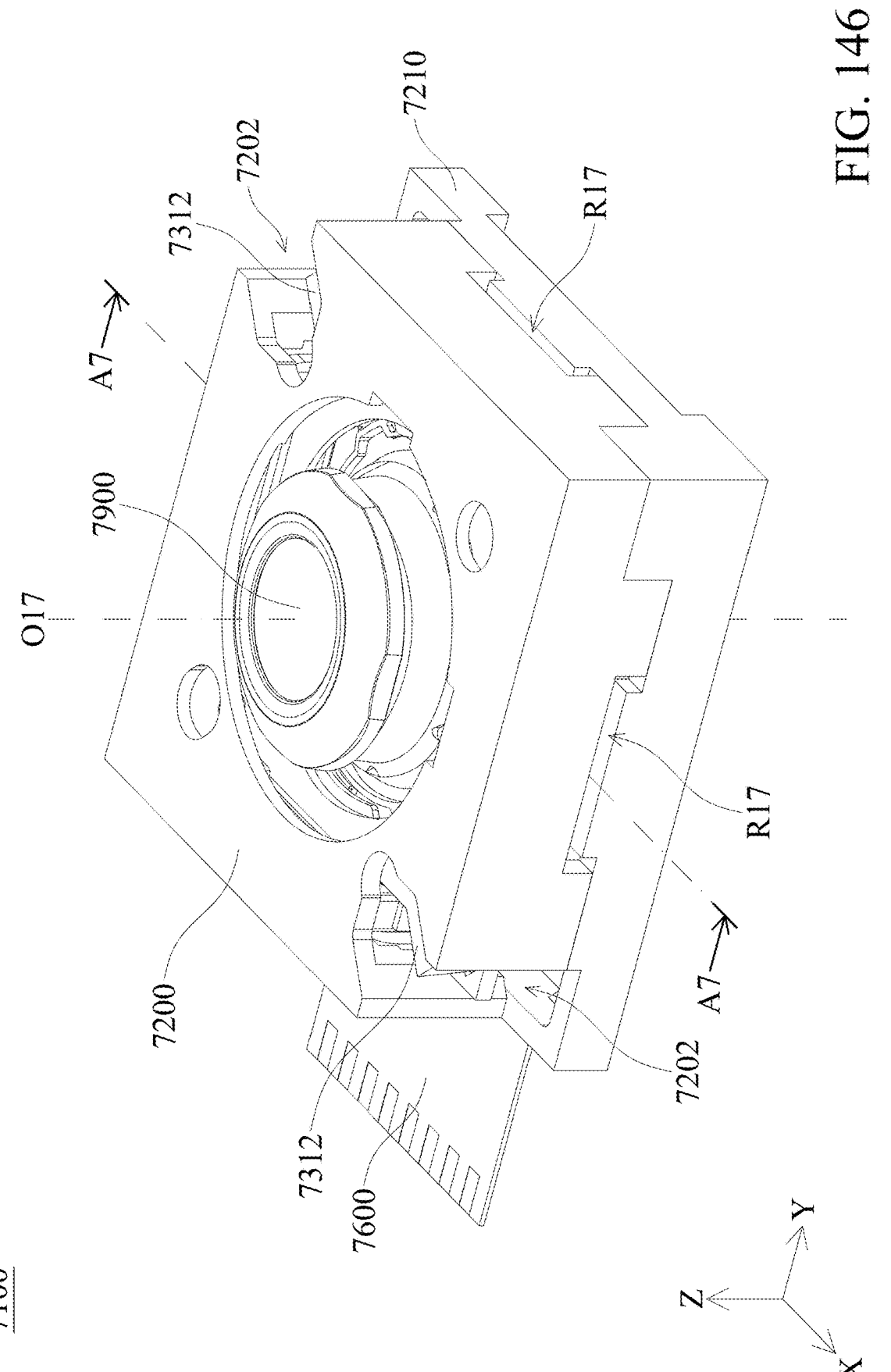

FIG. 146 is a perspective view of an optical element driving mechanism according to some embodiments of the present disclosure.

Figure 147:
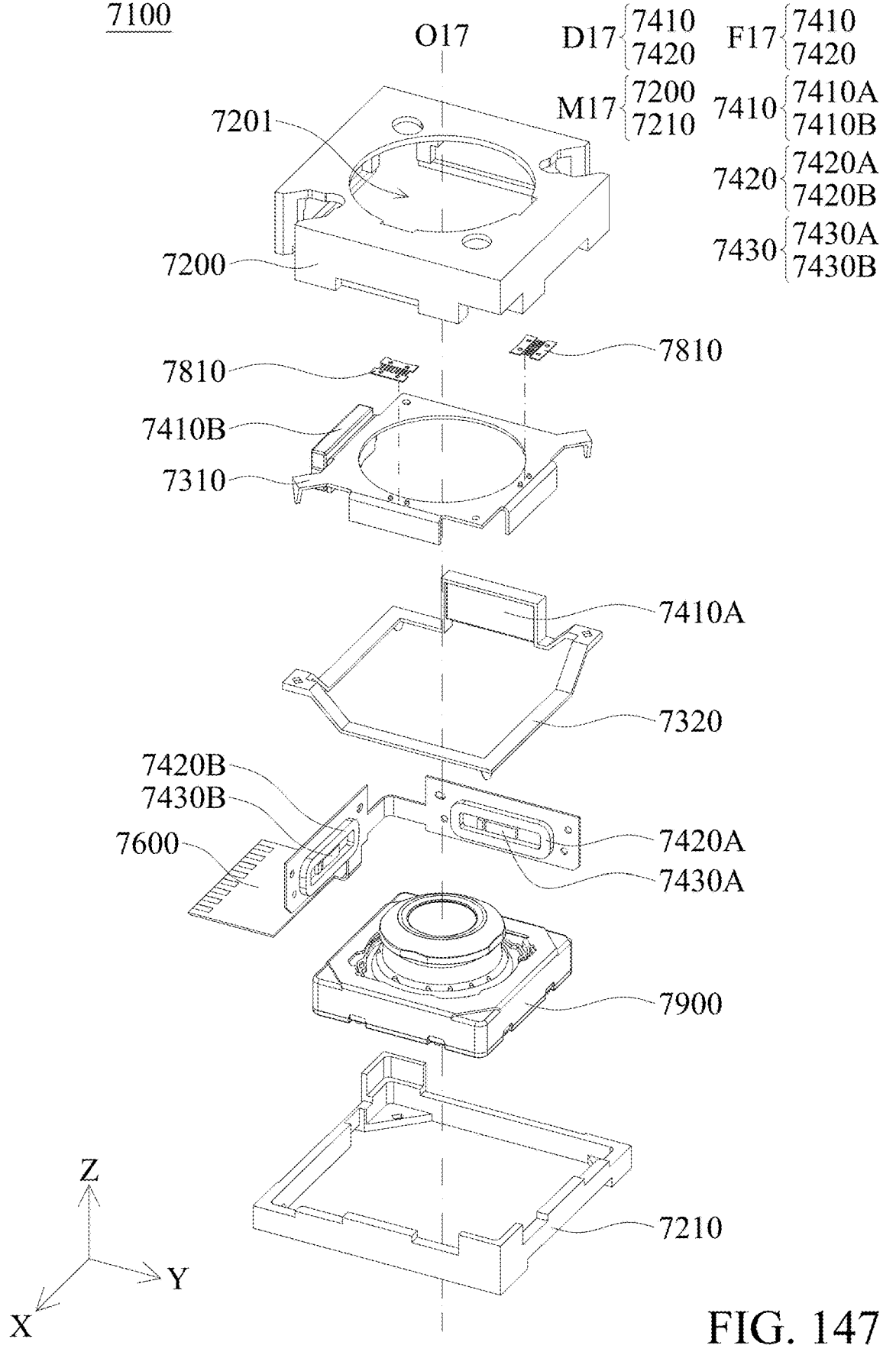

FIG. 147 is an exploded view of the optical element driving mechanism.

Figure 148:
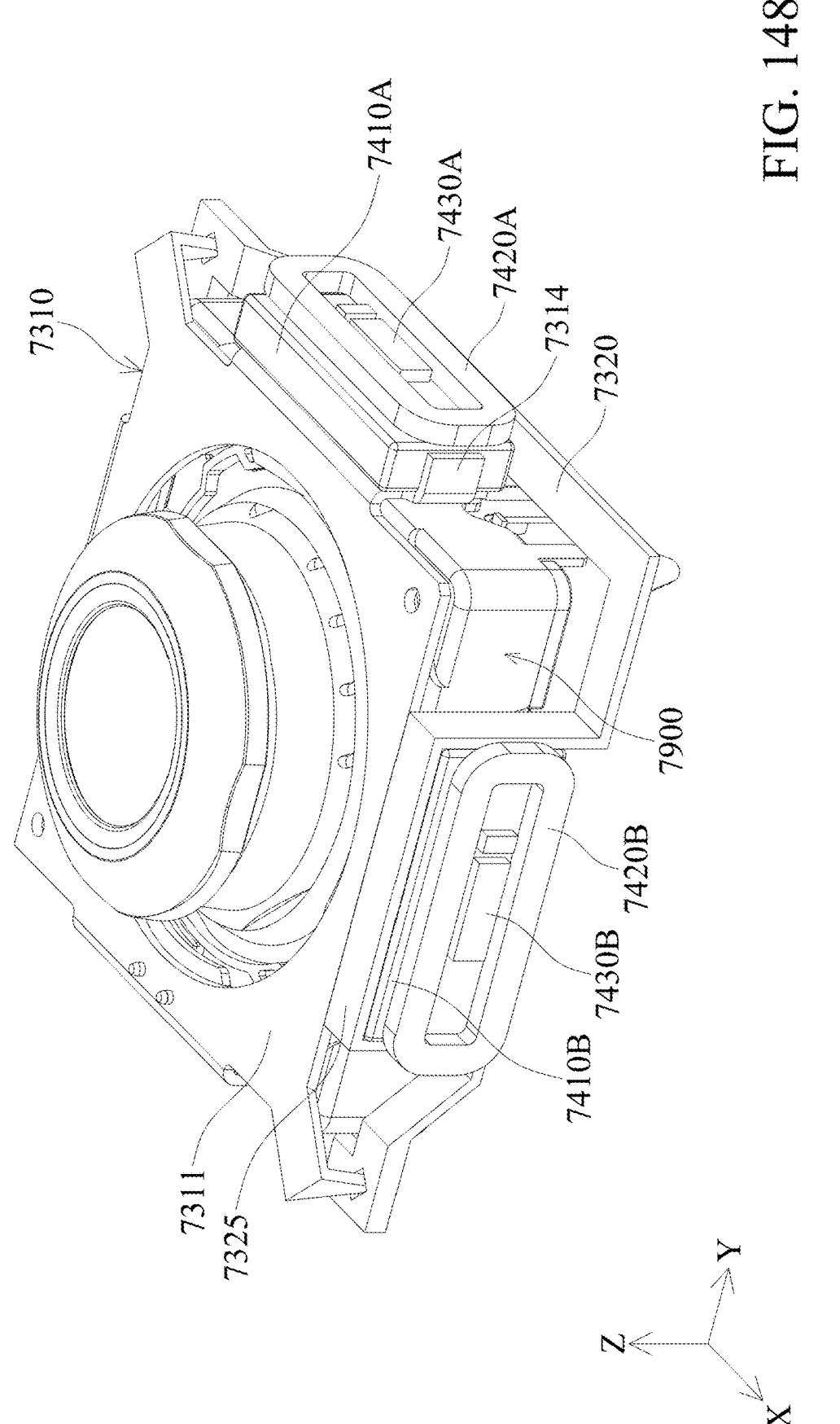

FIG. 148 is a schematic view of some elements of the optical element driving mechanism.

Figure 149:
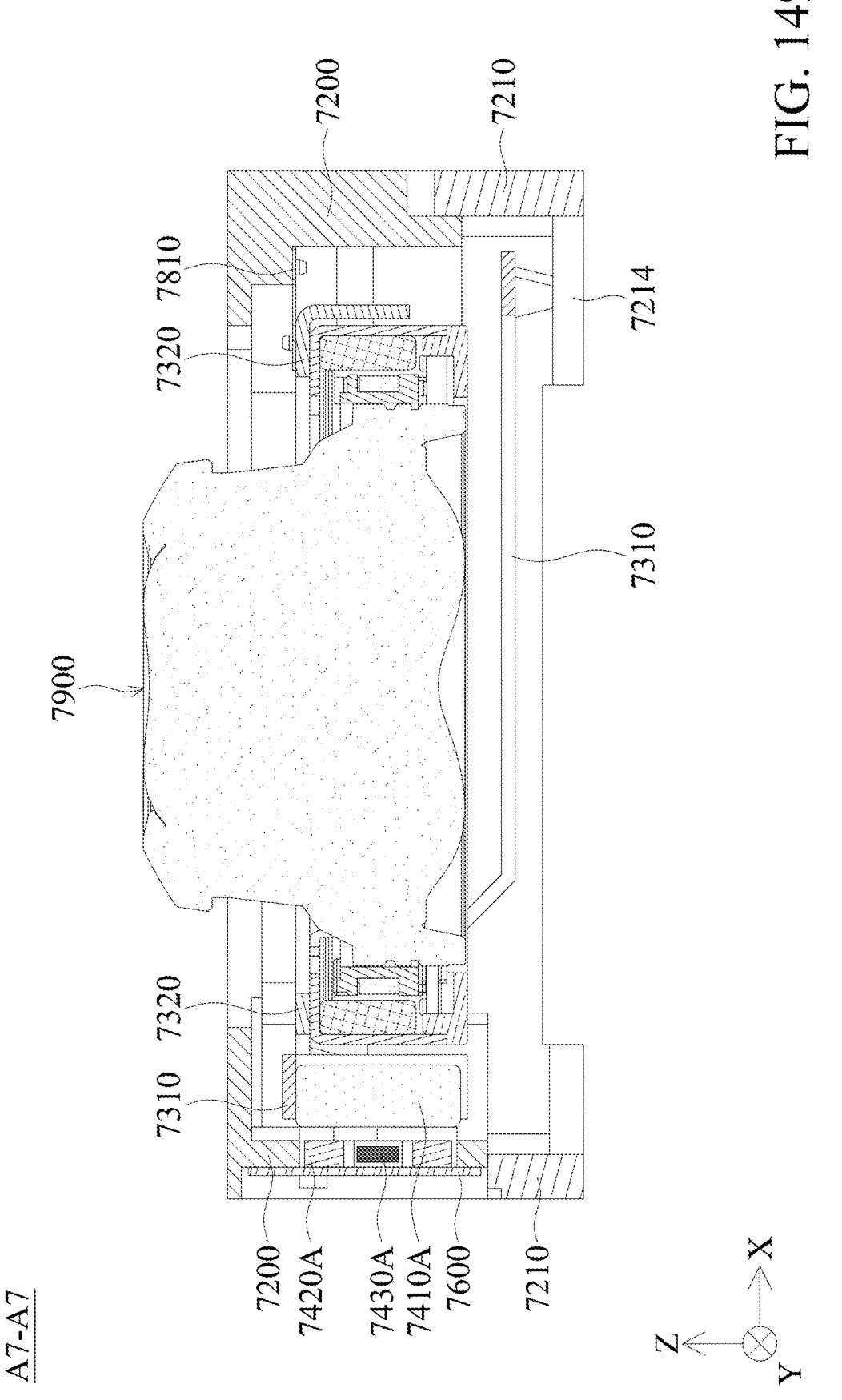

FIG. 149 is a cross-sectional view of the optical element driving mechanism.

Figure 150:
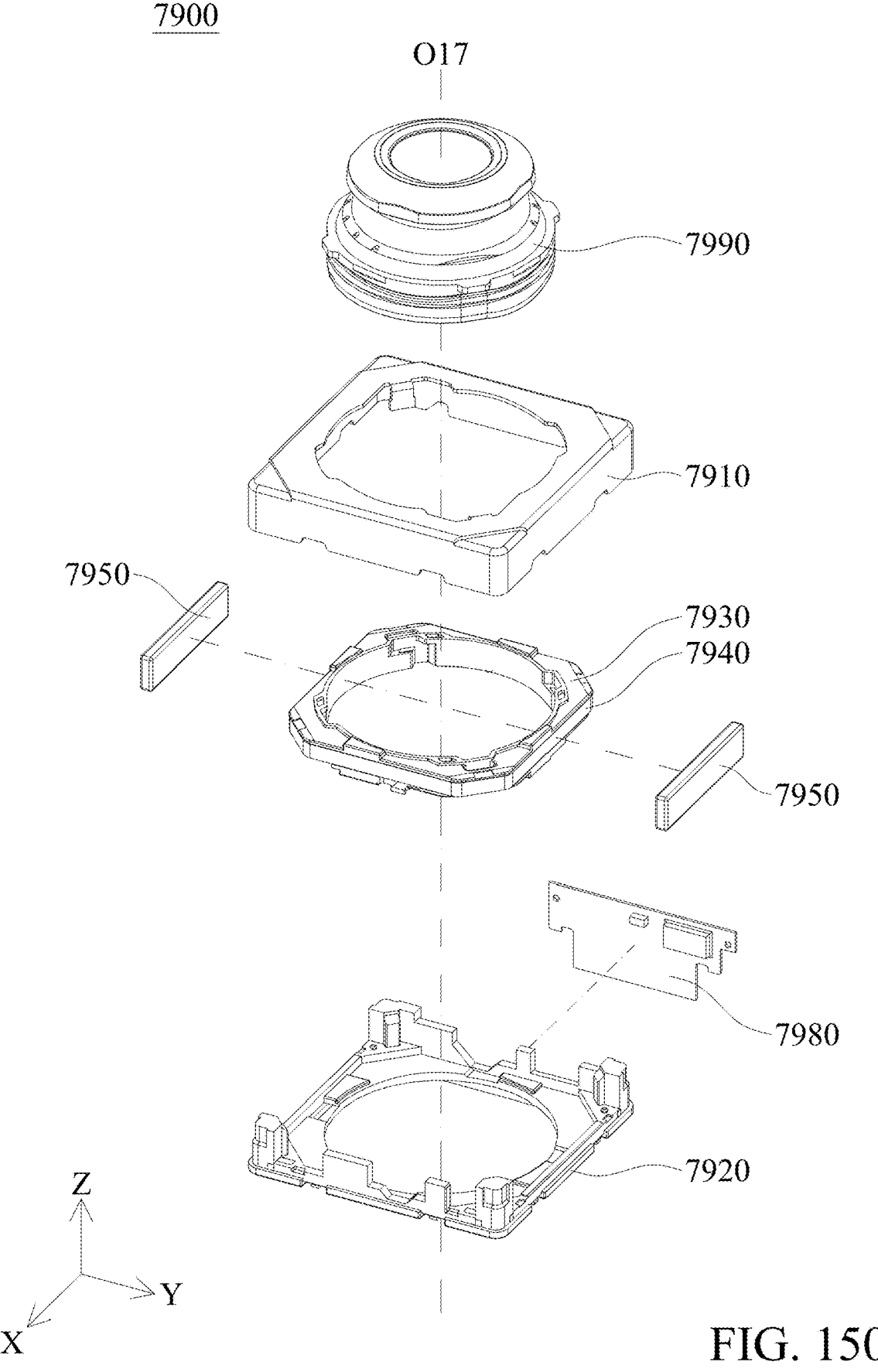

FIG. 150 is an exploded view of an optical module.

Figure 151:
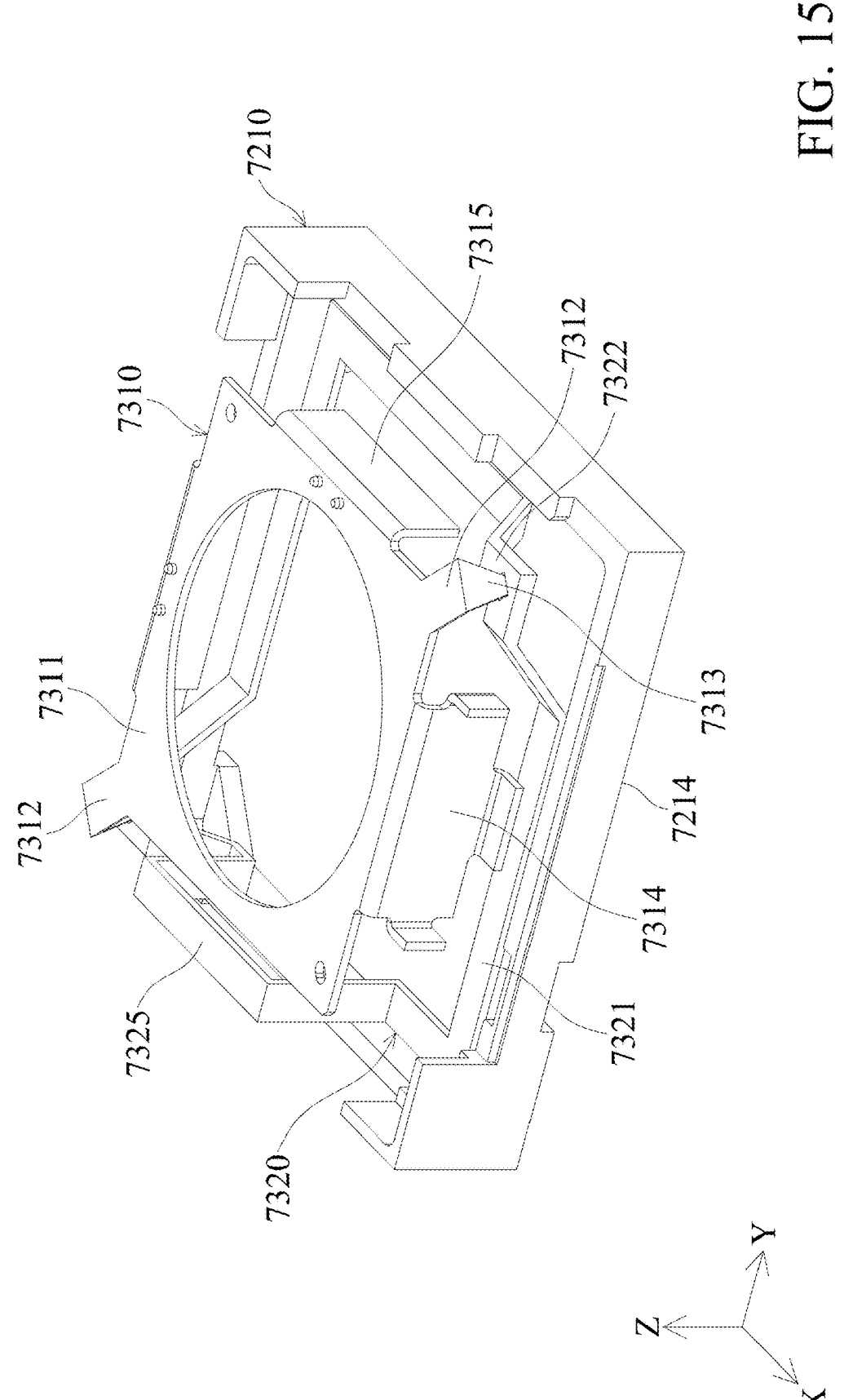

FIG. 151 is a schematic view of some elements of the optical element driving mechanism.

Figure 152:
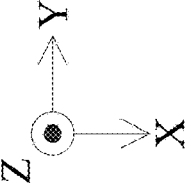

FIG. 152 is a top view of some elements of the optical element driving mechanism.

Figure 153:
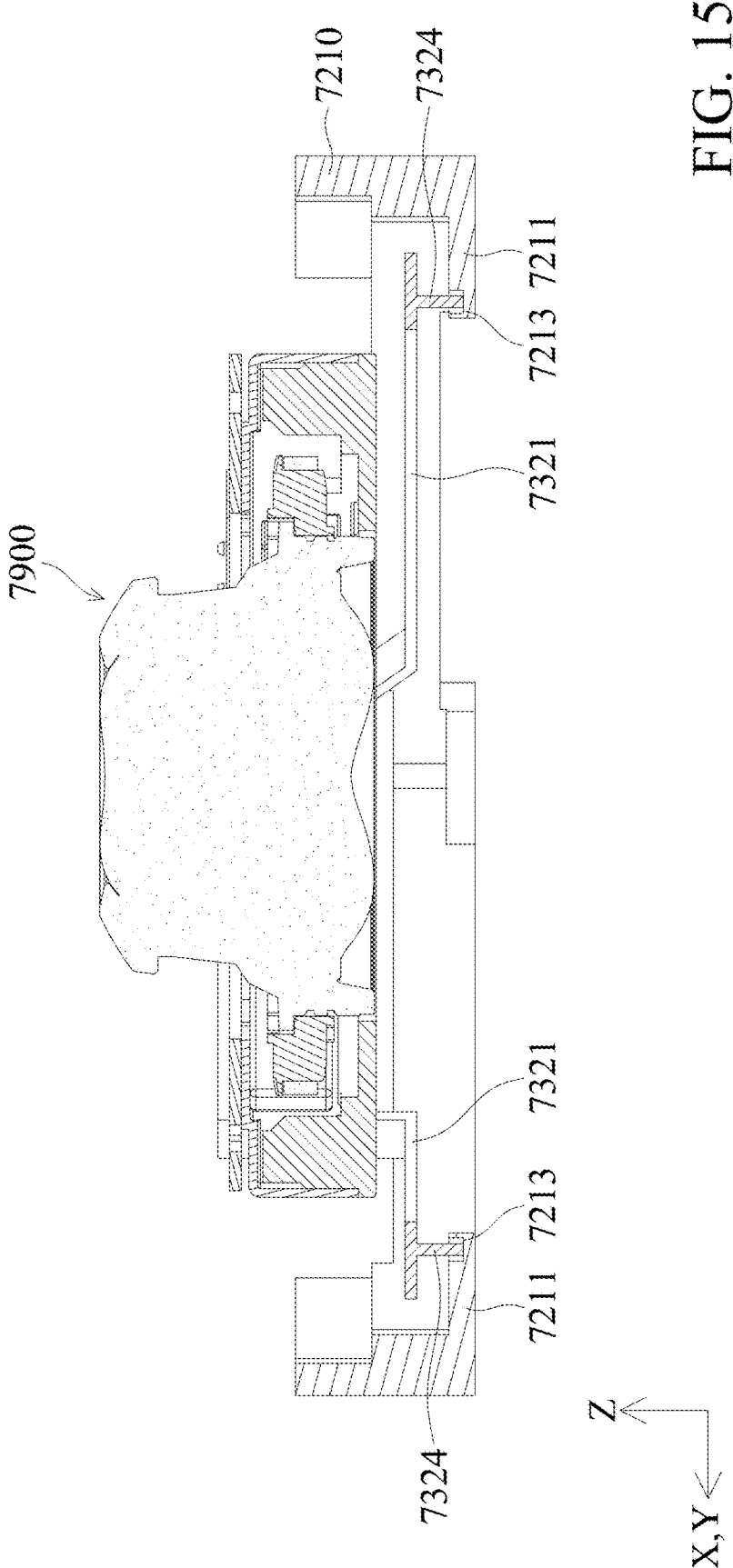

FIG. 153 is a cross-sectional view of some elements of the optical element driving mechanism.

FIG. 154 is a cross-sectional view of some elements of the optical element driving mechanism.

Figure 155:
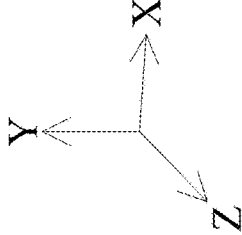

FIG. 155 is a schematic view of the base.

Figure 156:

FIG. 156 is a schematic view of the first movable portion.

Figure 157:
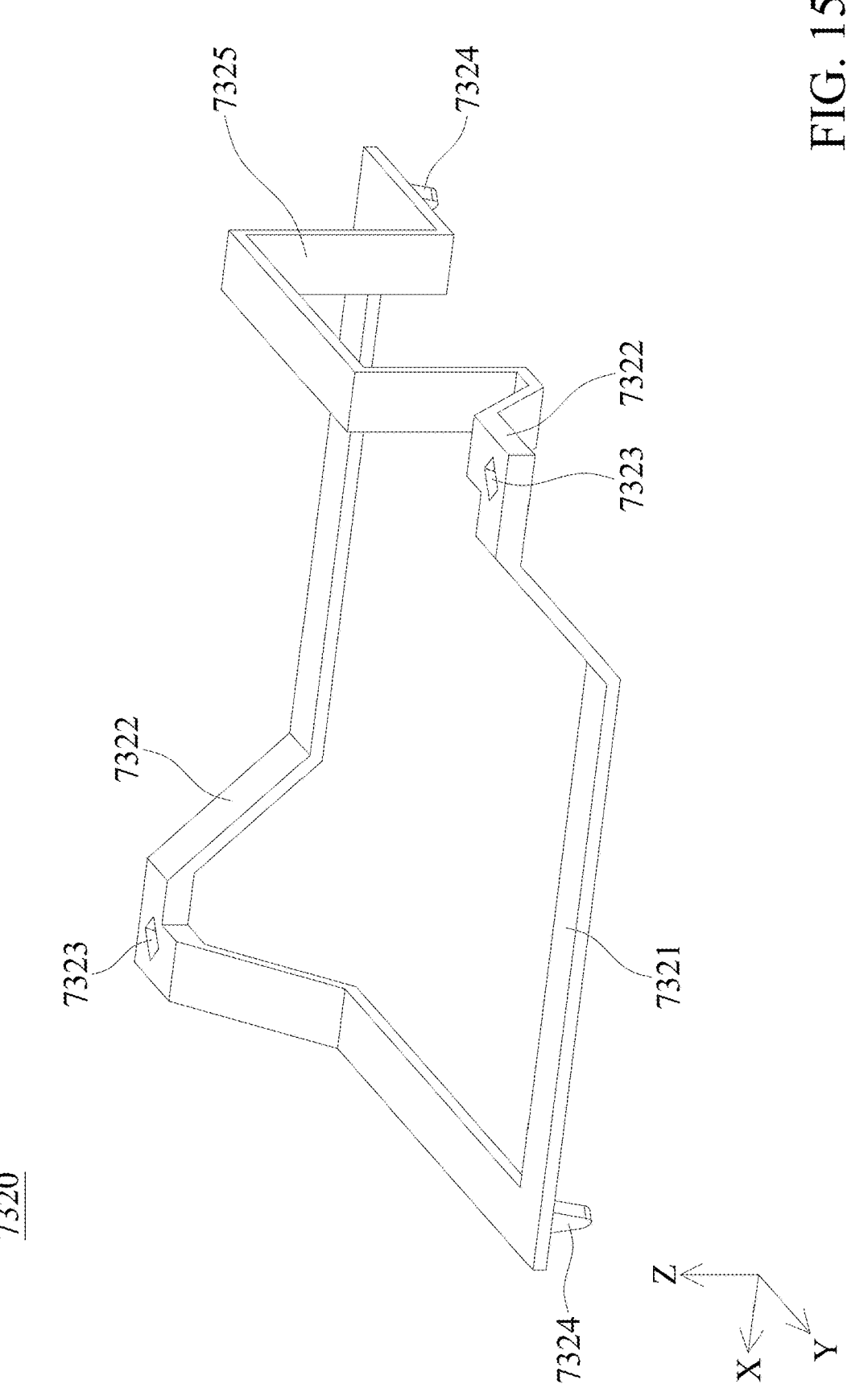

FIG. 157 is a schematic view of the second movable portion.

Figure 158:
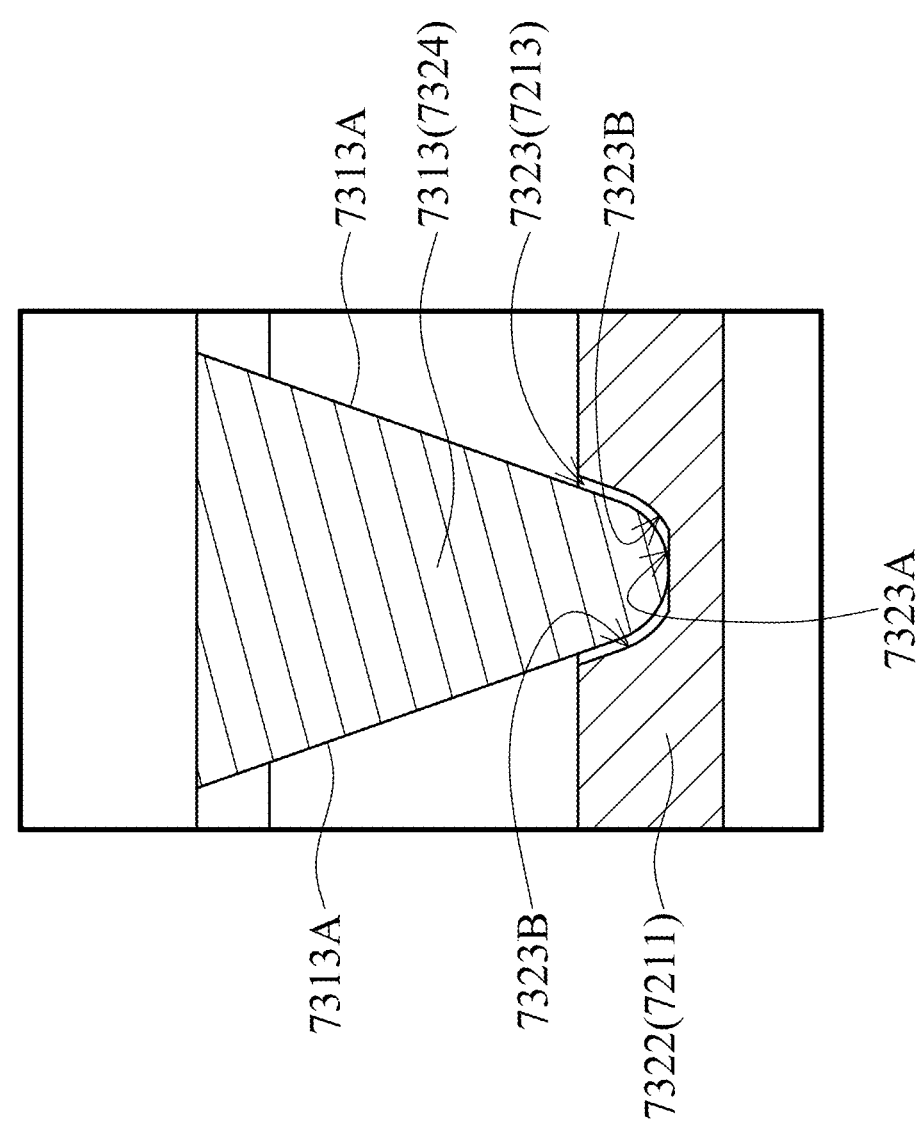

FIG. 158 is a partial cross-sectional view of some elements of the optical element driving mechanism.

Figure 159:
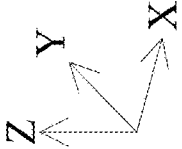

FIG. 159 is a perspective view when the second movable portion rotates relative to the base.

Figure 160:
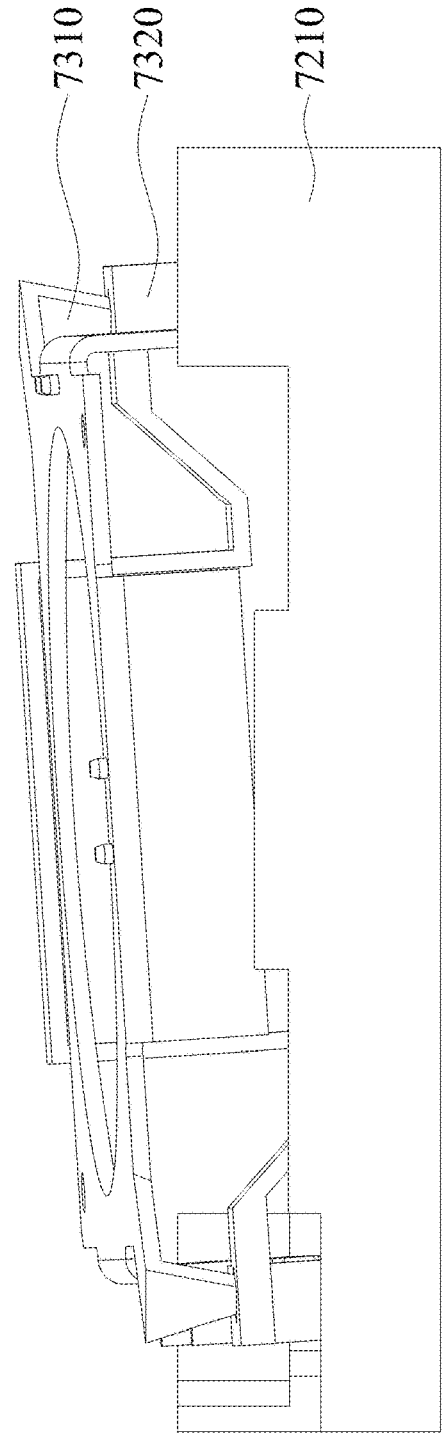

FIG. 160 is a side view when the second movable portion rotates relative to the base.

FIG. 161 is a perspective view when the first movable portion further rotates relative to the second movable portion after the condition in FIG. 159.

FIG. 162 is a side view when the first movable portion further rotates relative to the second movable portion after the condition in FIG. 159.

Figure 163:
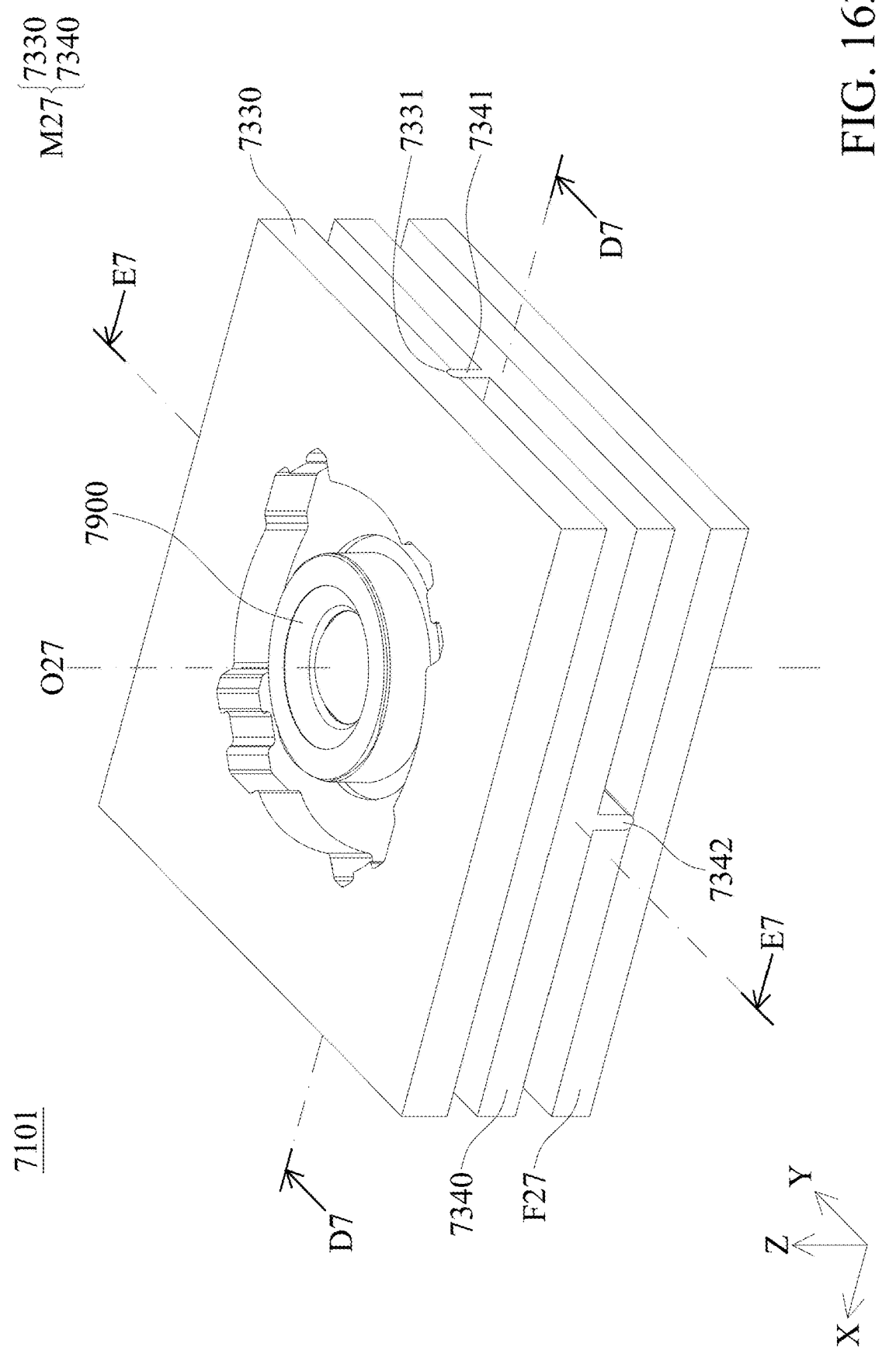

FIG. 163 is a perspective view of an optical element driving mechanism according to some embodiments of the present disclosure.

Figure 164:
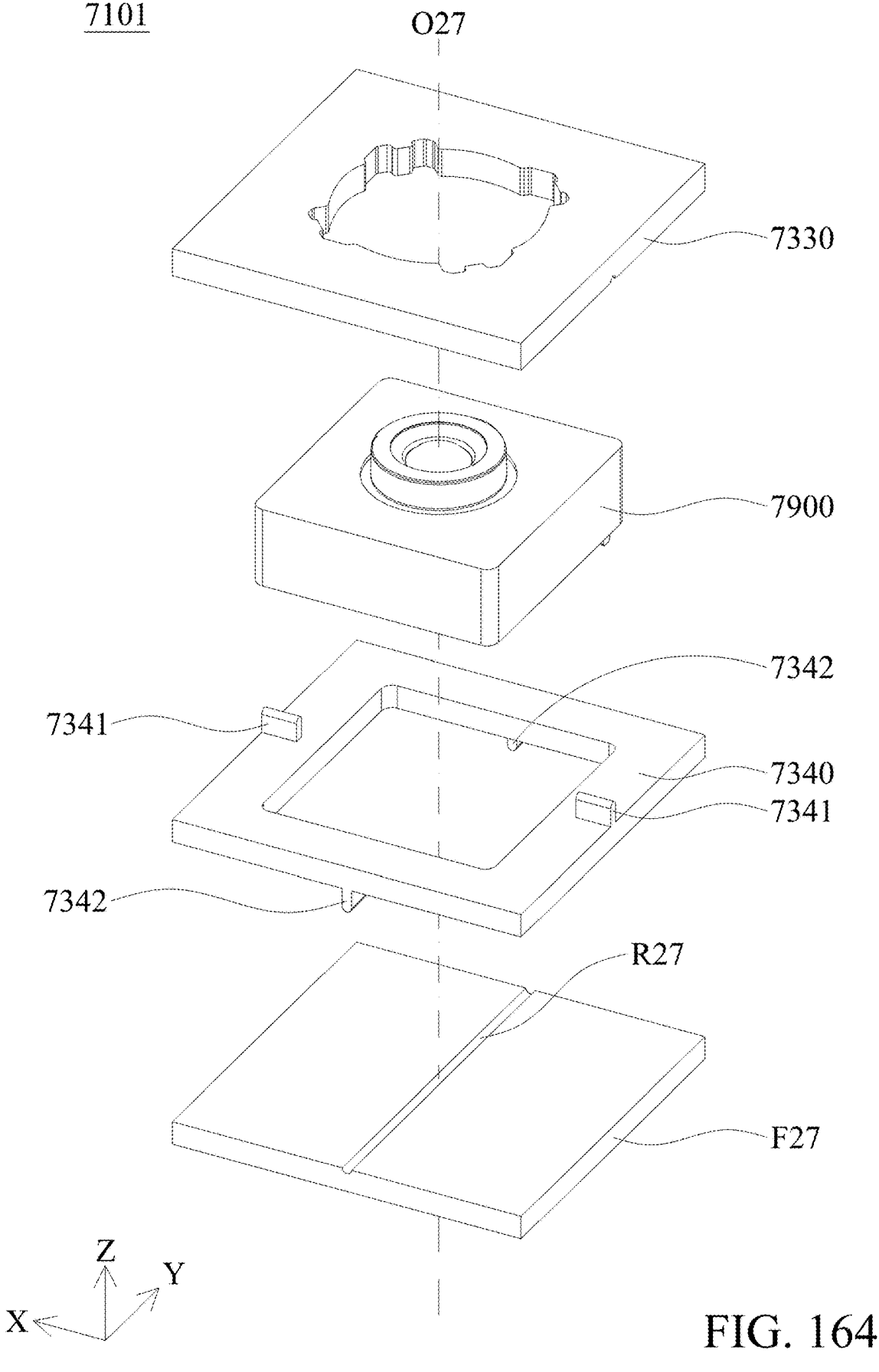

FIG. 164 is an exploded view of an optical element driving mechanism according to some embodiments of the present disclosure.

Figure 165:
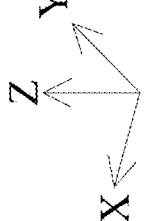

FIG. 165 is a perspective view when the first movable portion rotates relative to the second movable portion.

FIG. 166 is a perspective view when the second movable portion further rotates relative to the fixed portion after the condition in FIG. 165.

Figure 167:
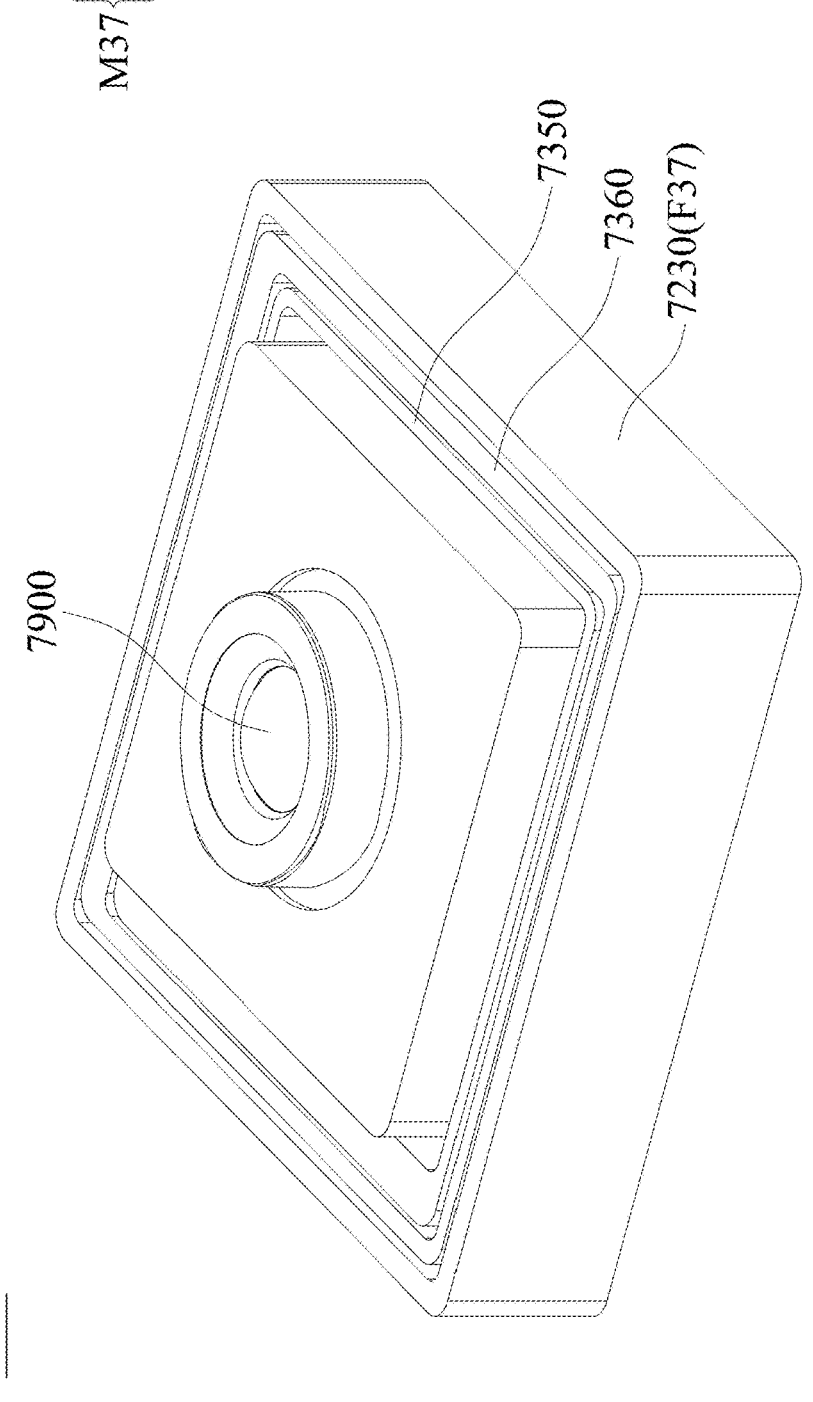

FIG. 167 is a schematic view of an optical element driving mechanism according to some embodiments of the present disclosure.

Figure 168:
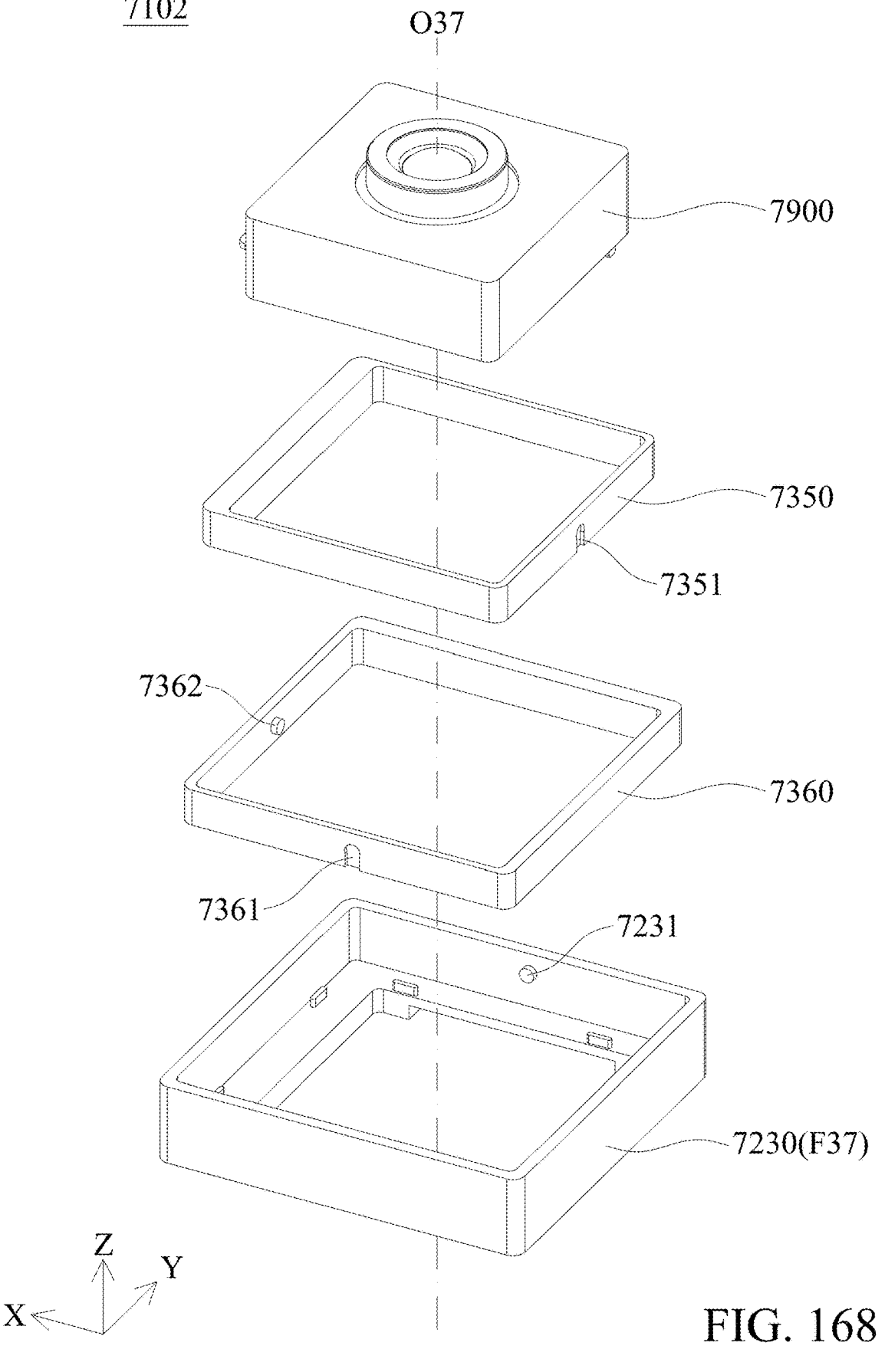

FIG. 168 is an exploded view of an optical element driving mechanism according to some embodiments of the present disclosure.

Figure 169:
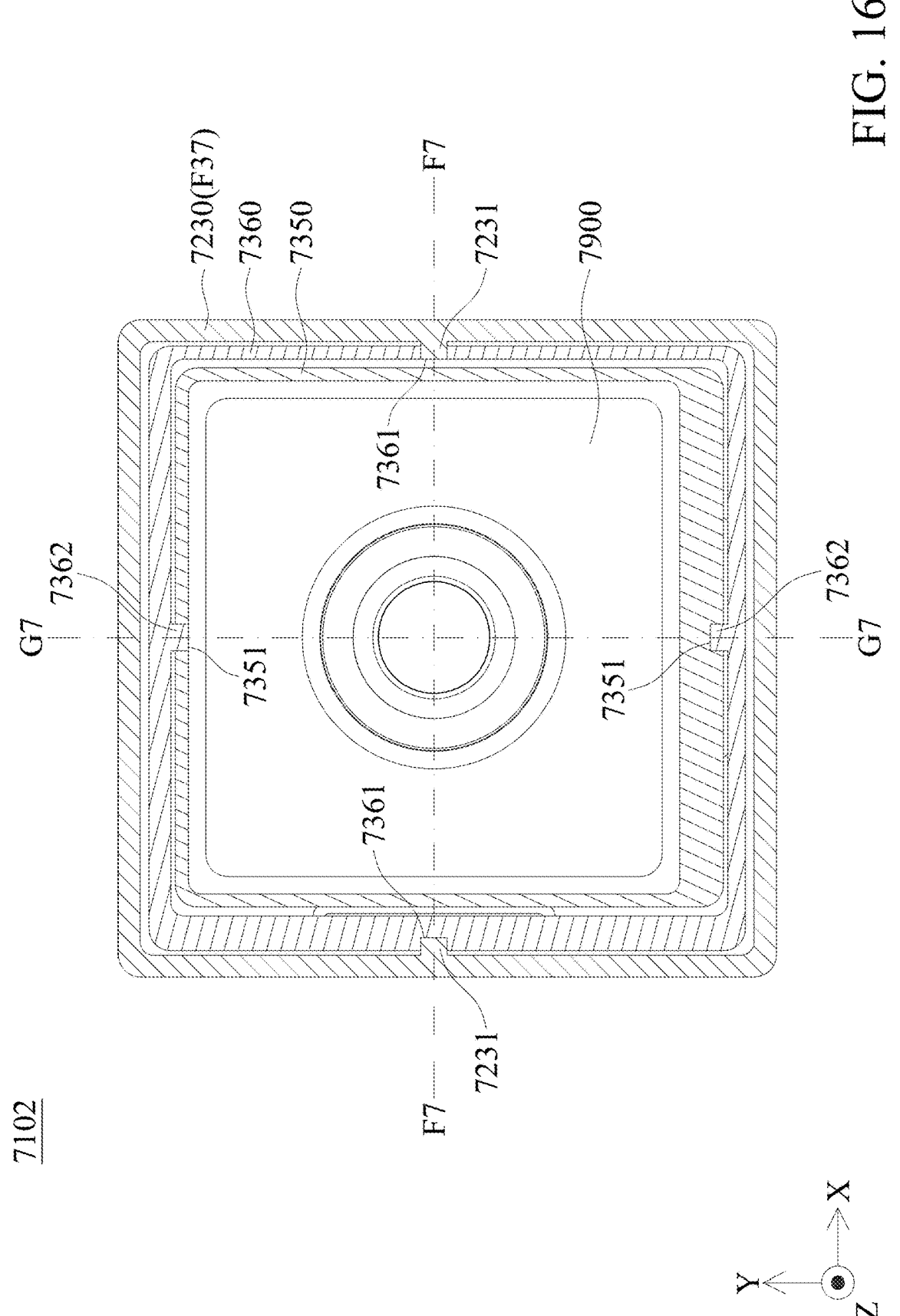

FIG. 169 is a top view of the optical element driving mechanism.

FIG. 170 is a perspective view when the second movable portion rotates relative to the base.

FIG. 171 is a perspective view when the first movable portion further rotates relative to the second movable portion after the condition in FIG. 170.

Figure 172:
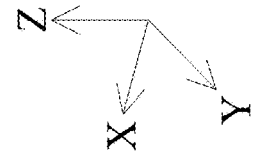

FIG. 172 is a perspective view of an optical element driving mechanism according to some embodiments of the present disclosure.

Figure 173:
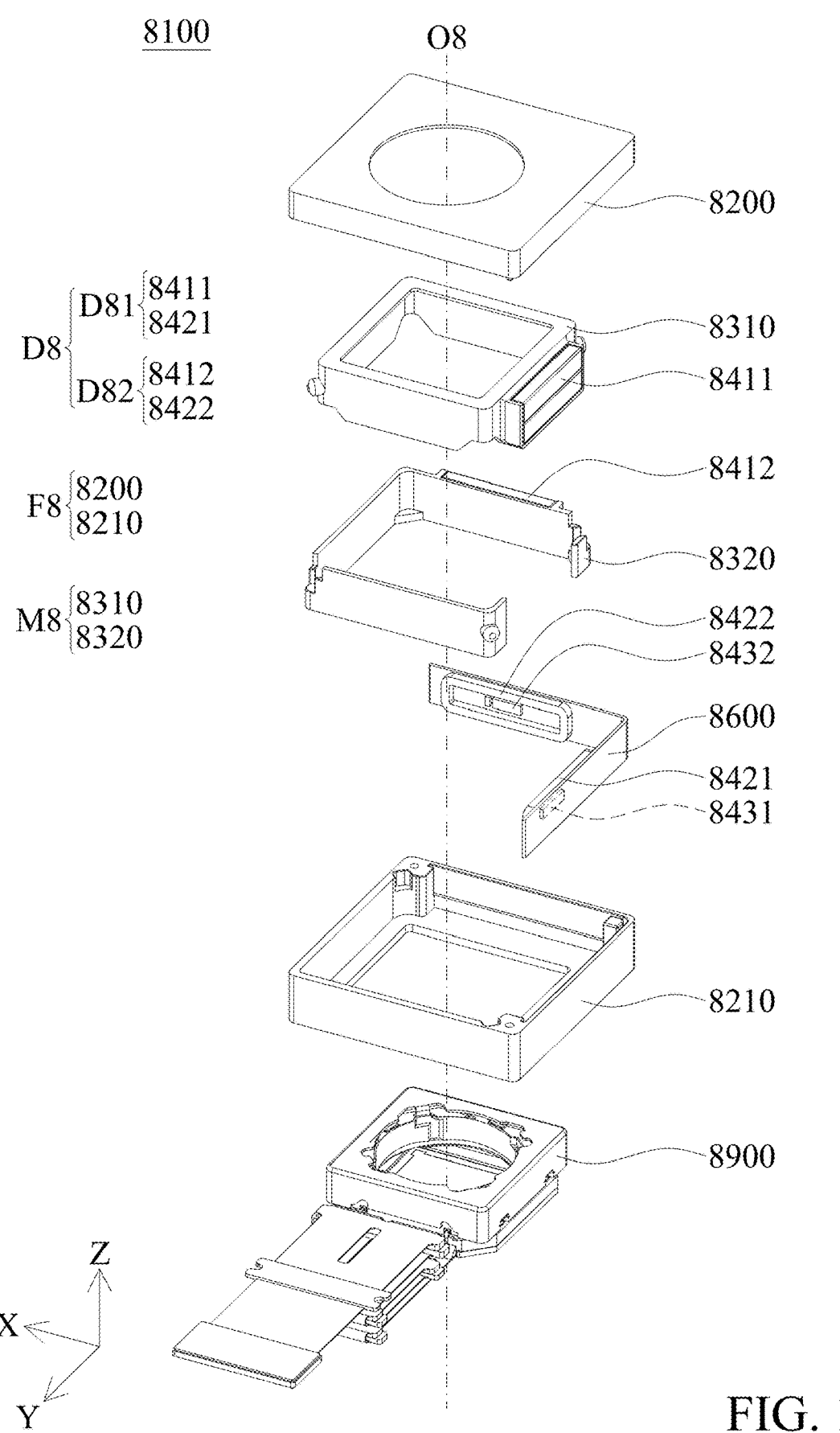

FIG. 173 is an exploded view of the optical element driving mechanism.

Figure 174:
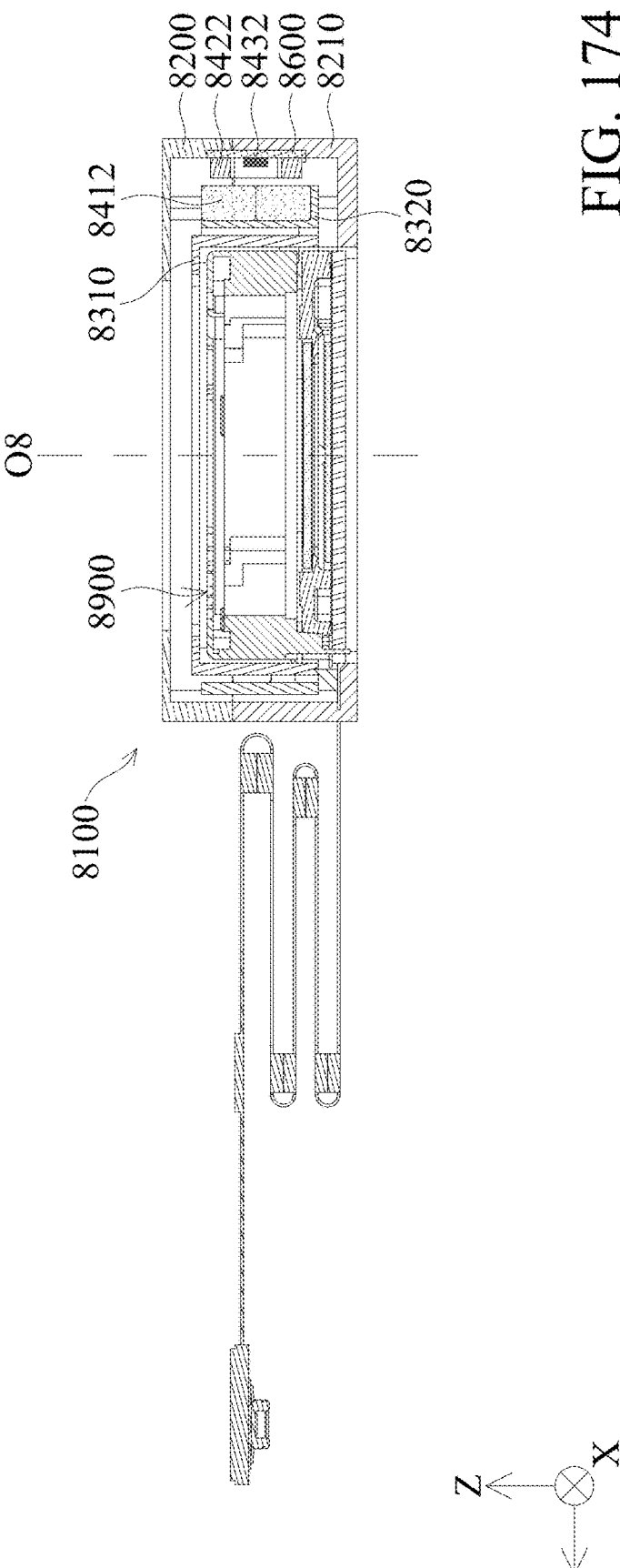

FIG. 174 is a cross-sectional view of the optical element driving mechanism.

Figure 175:
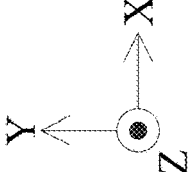

FIG. 175 is a top view of some elements of the optical element driving mechanism.

FIG. 176 is a side view of the optical element driving mechanism.

Figure 177:
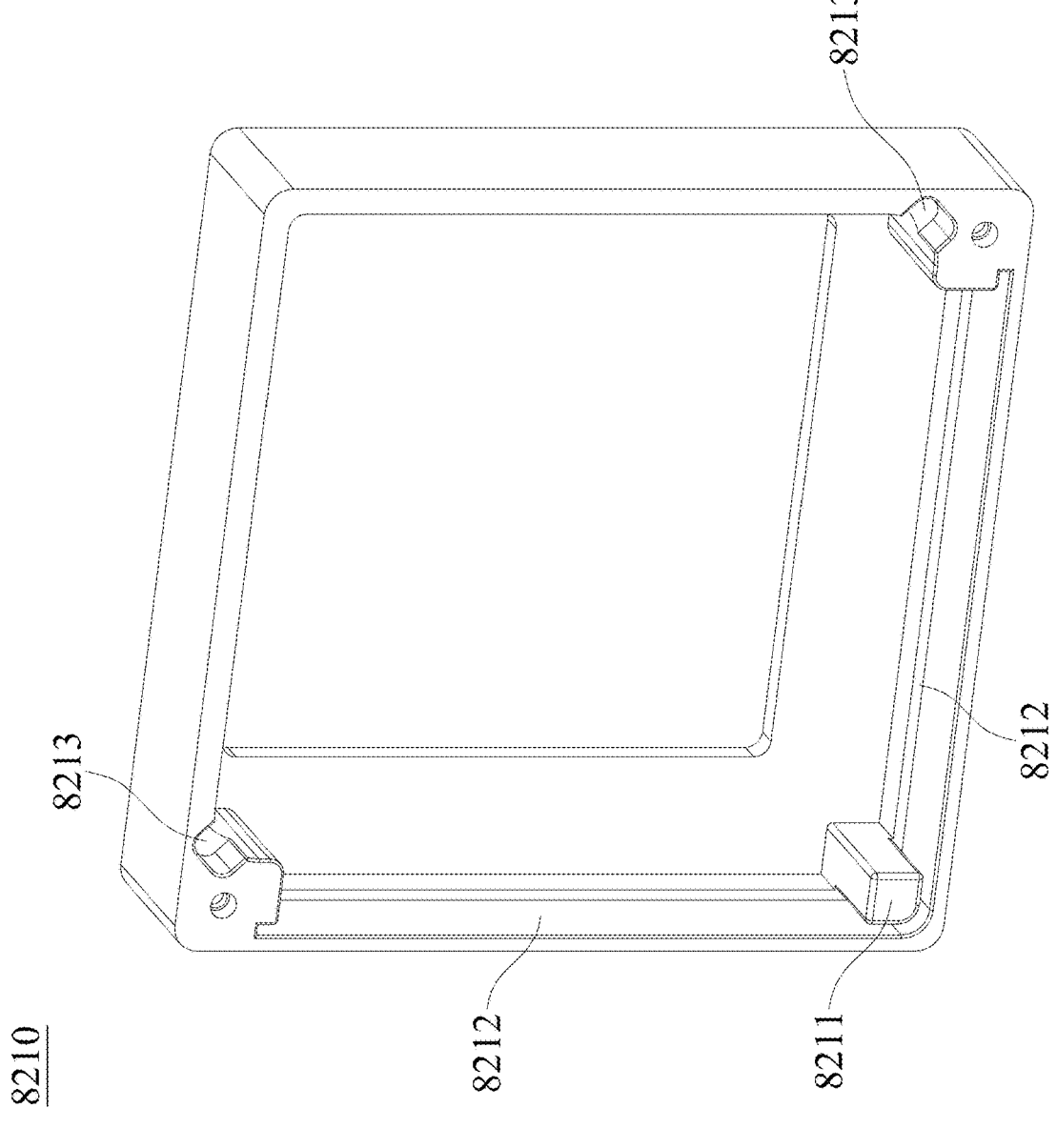

FIG. 177 is a schematic view of the base.

Figure 178:
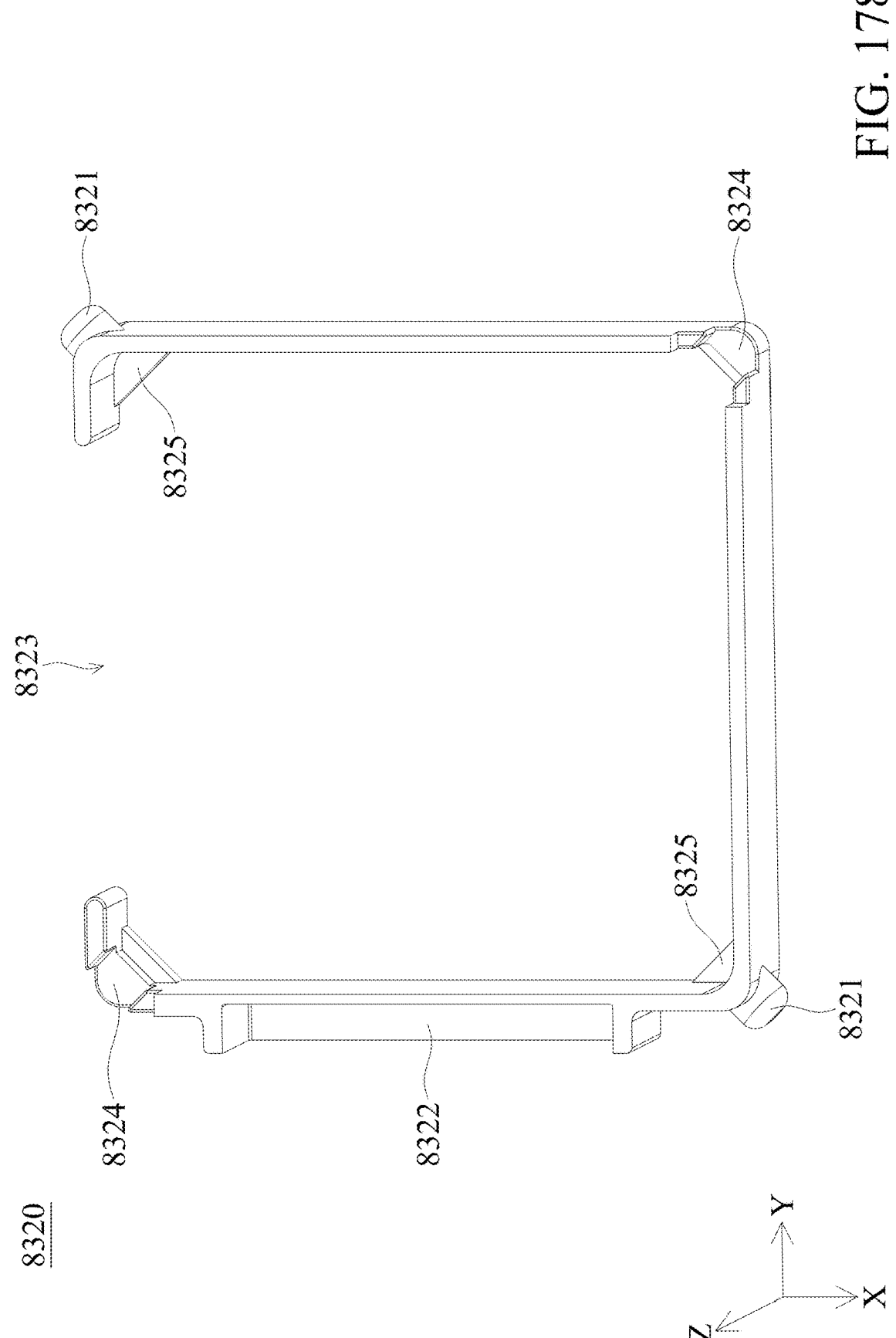

FIG. 178 is a schematic view of the second movable portion.

Figure 179:
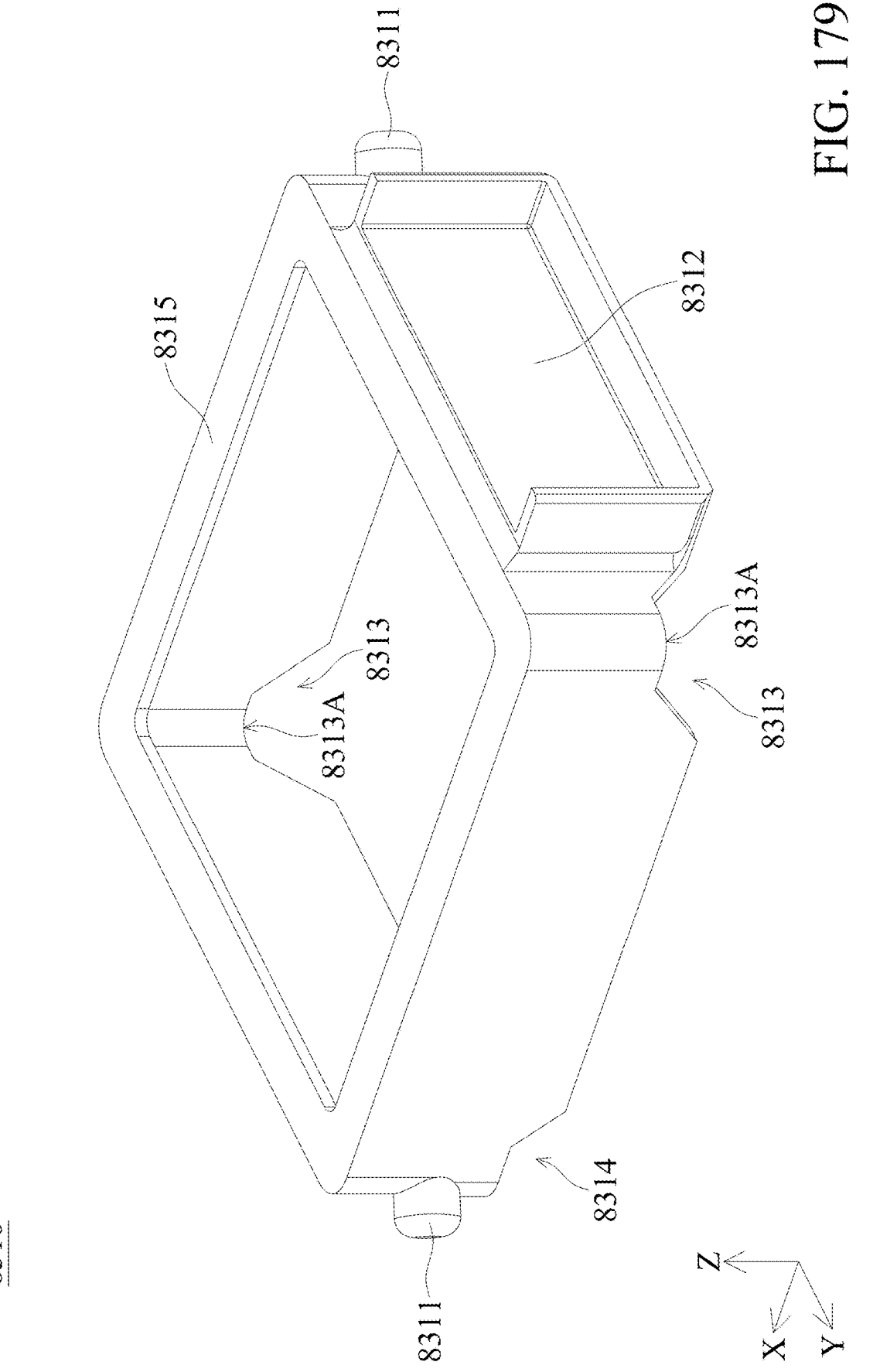

FIG. 179 is a schematic view of the first movable portion.

Figure 180:
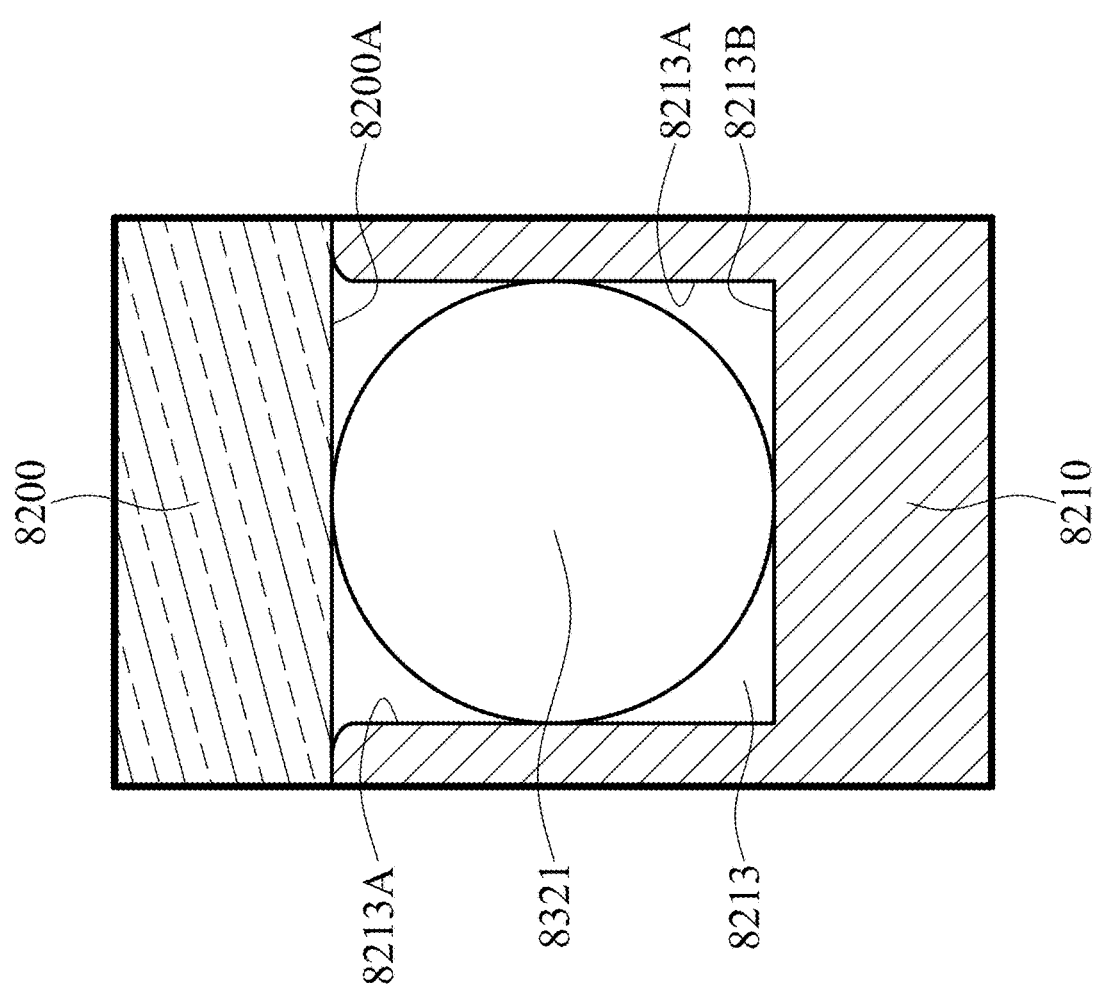

FIG. 180 is a partial cross-sectional view of the optical element driving mechanism.

Figure 181:
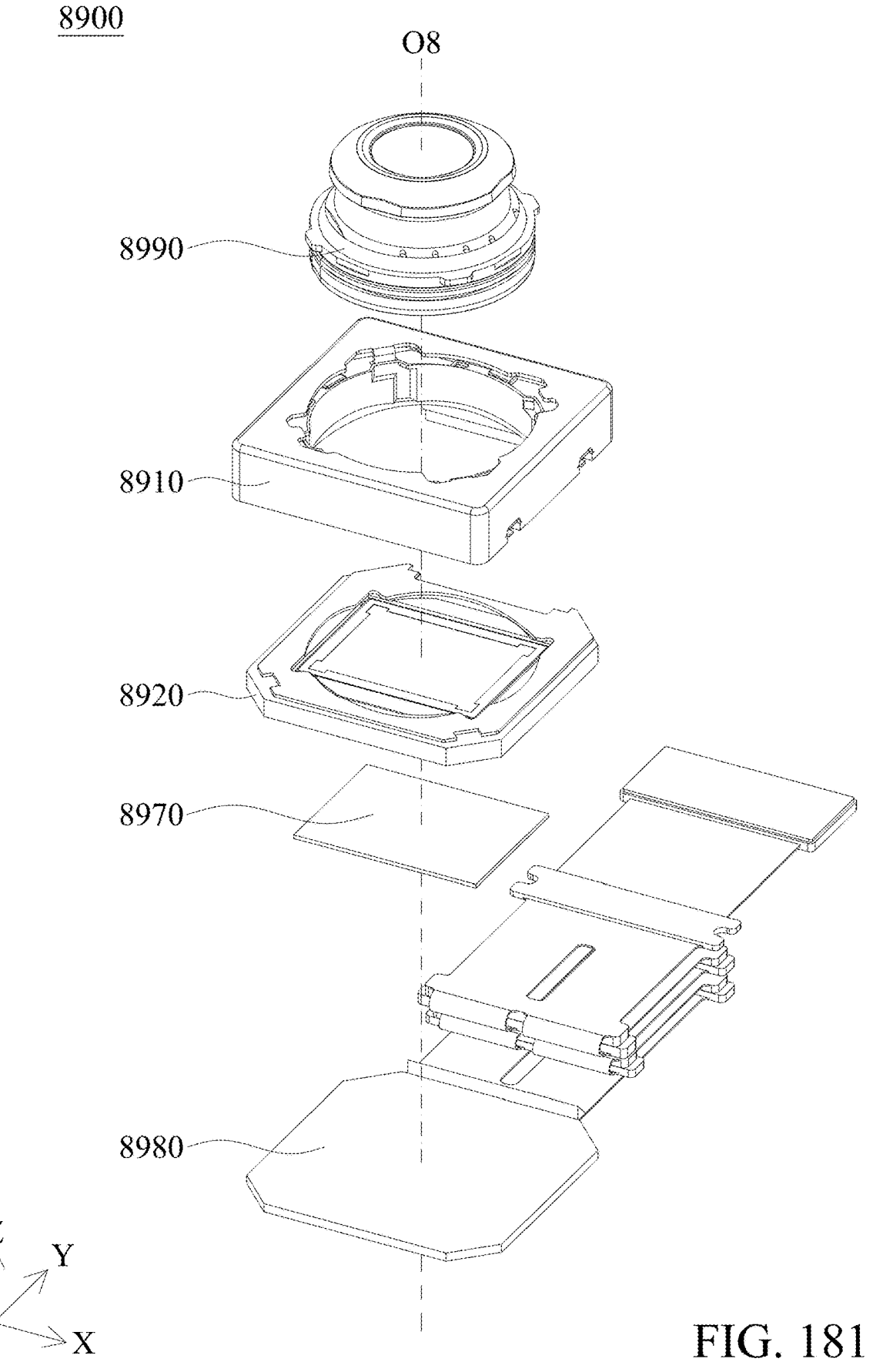

FIG. 181 is an exploded view of the optical module.

FIG. 182 is a schematic view of some elements of the optical element driving mechanism in one condition.

FIG. 183 is a side view of some elements of the optical element driving mechanism in one condition.

Figure 184:
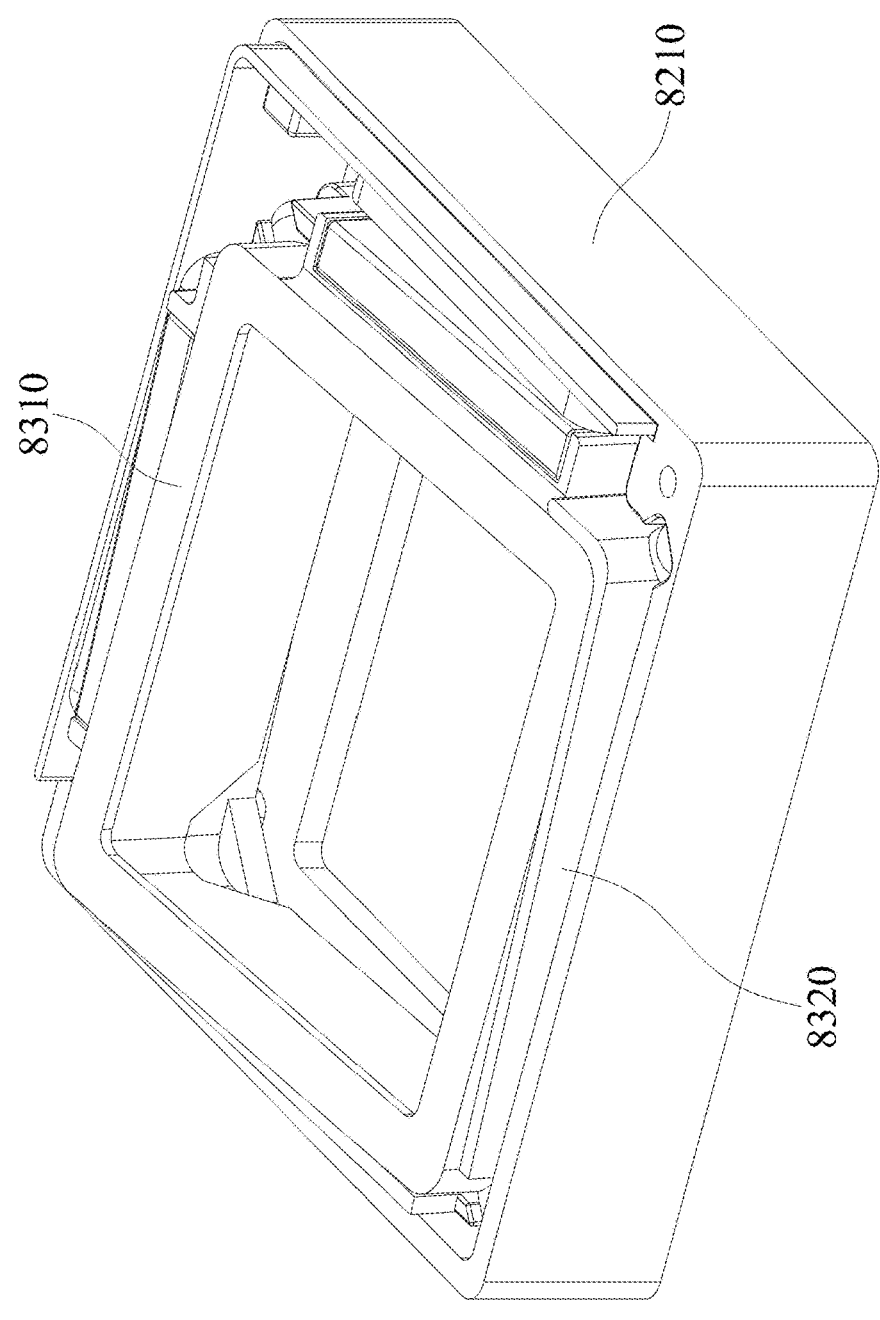

FIG. 184 is a schematic view of some elements of the optical element driving mechanism in another condition.

FIG. 185 is a side view of some elements of the optical element driving mechanism in another condition.

DETAILED DESCRIPTION OF DISCLOSURE

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are in direct contact, and may also include embodiments in which additional features may be disposed between the first and second features, such that the first and second features may not be in direct contact with each other.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are in direct contact, and may also include embodiments in which additional features may be disposed interposing the features, such that the features may not be in direct contact. In addition, spatially relative terms, for example, "vertical," "above," "over," "below,", "bottom," etc. as well as derivatives thereof (e.g., "downwardly," "upwardly," etc.) are used in the present disclosure for ease of description of one feature's relationship to another feature. The spatially relative terms are intended to cover different orientations of the device, including the features.

Unless defined otherwise, all technical and scientific terms used herein have the same meaning as commonly understood by one of ordinary skill in the art to which this disclosure belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Use of ordinal terms such as "first", "second", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

In addition, in some embodiments of the present disclosure, terms concerning attachments, coupling and the like, such as "connected" and "interconnected", refer to a relationship wherein structures are secured or attached to one another either directly or indirectly through intervening structures, as well as both movable or rigid attachments or relationships, unless expressly described otherwise.

Figure 1:
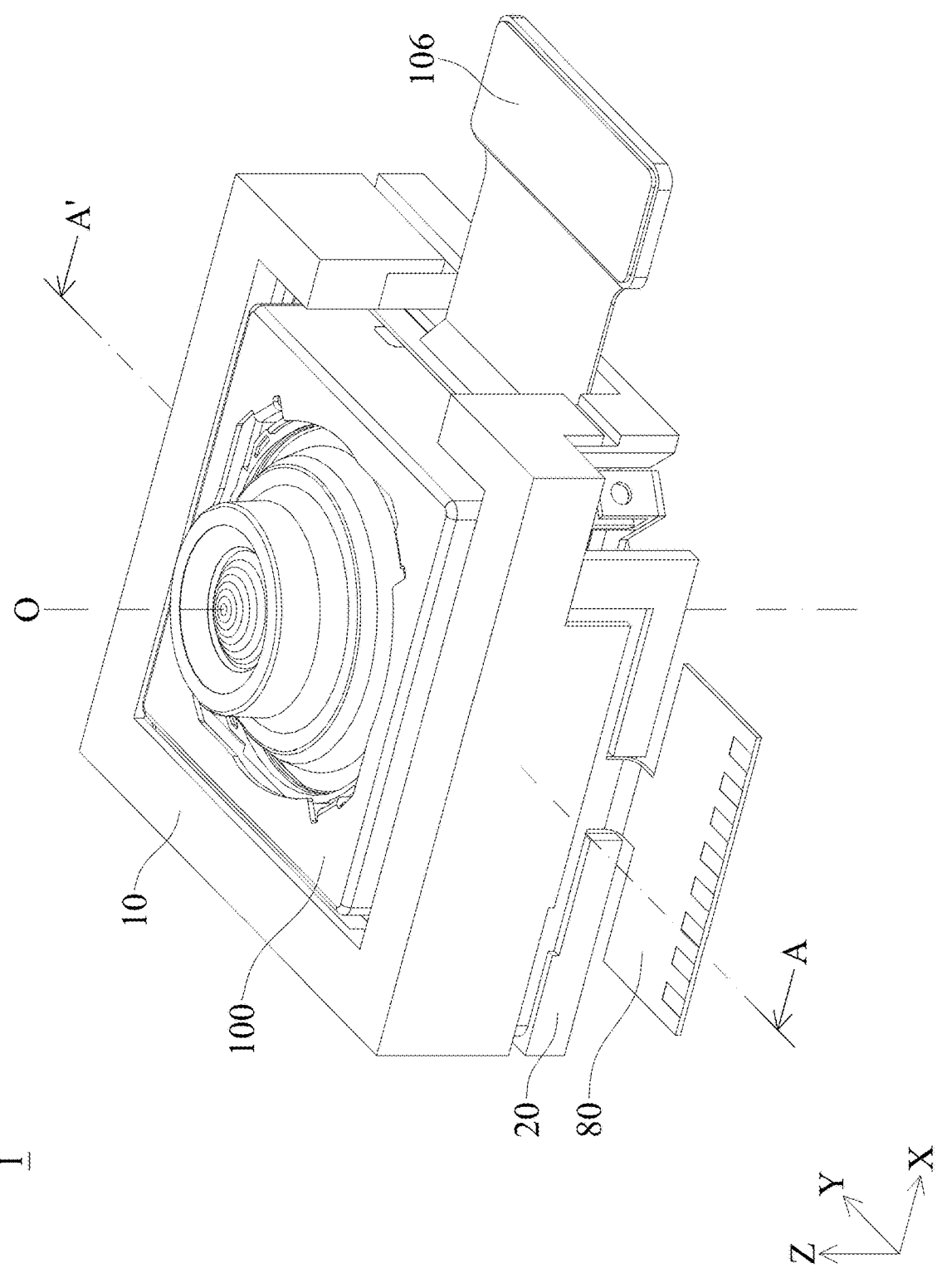
FIG. 1 is a perspective view of a driving mechanism in some embodiments of the present disclosure.
Figure 2:
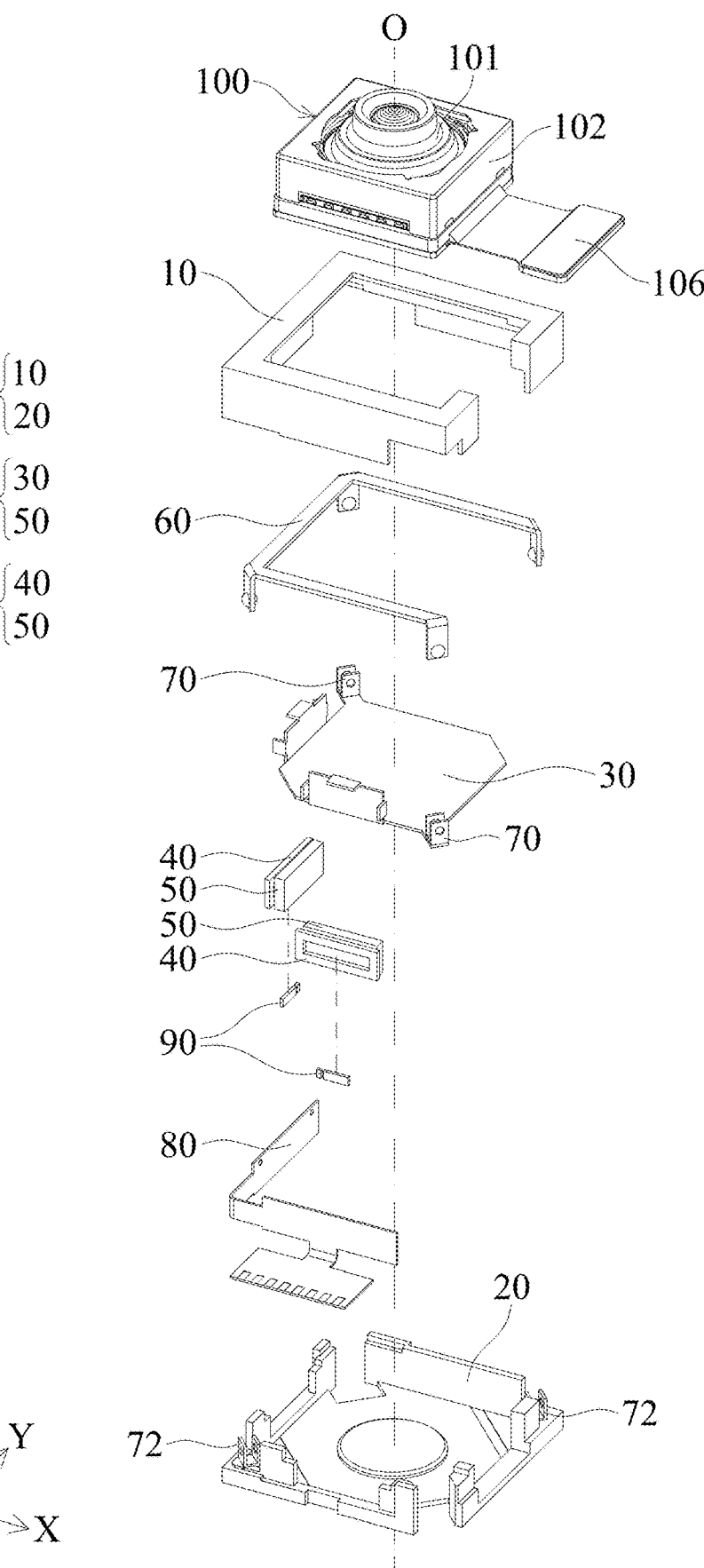
FIG. 2 is an exploded view of some embodiments of the present disclosure.
Figure 3:
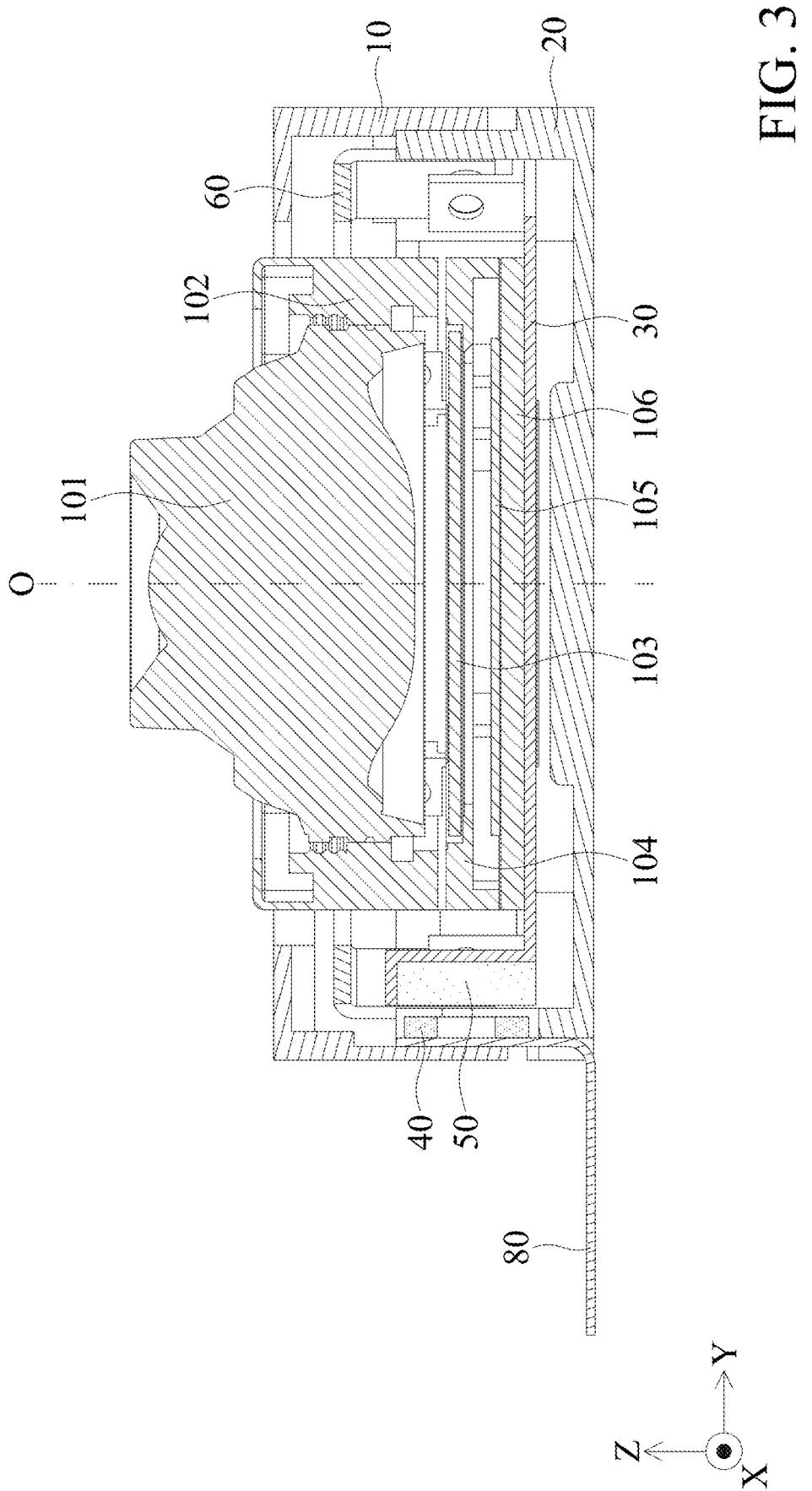
FIG. 3 is a cross-sectional view illustrated along line A-A' in FIG. 1.

First, please refer to FIGS. 1 to 3, which are a perspective view and an exploded view of a driving mechanism 1, and a cross-sectional view illustrated along the line A-A' in FIG. 1, in some embodiments of the present disclosure. The driving mechanism 1 mainly includes a frame 10, a base 20, a holder 30, a driving assembly DR (includes a first magnetic element 40 and a second magnetic element 50), a connecting element 60, a contact element 70, a contact element 72, a circuit board 80, and a position sensor 90. The driving mechanism 1 may drive the optical module 100 to move (such as rotate relative to a single axis or multiple axes) to achieve optical compensation.

The frame 10 and the base 20 may be combined to form a case of the optical module 100. The optical module 100 may be, for example, an optical module having auto focus (AF) or optical image stabilization (OIS) function. The optical module 100 may be disposed on the holder 30, such as affixed on the holder 30, and the optical module 100 may be moved with the holder 30 relative to the frame 10 and the base 20.

The first magnetic element 40 and the second magnetic element 50 may be, for example, a driving coil and a driving magnet, respectively. In some embodiments, the second magnetic element 50 may be a multipolar magnet, which includes two magnets with opposite magnetic poles. In such embodiments, the first magnetic element 40 may has a shape like capsule and may be disposed on the base 20 to correspond to the second magnetic element 50. However, the present disclosure is not limited thereto. For example, in some embodiments, the first magnetic element 40 may be a driving magnet, and the second magnetic element 50 may be a driving coil.

In this embodiment, the holder 30 and the optical module 100 disposed therein are movably disposed in the frame 10. More specifically, the holder 30 may be connected to the base 20 and being suspended in the frame 10 and the base 20 through the connecting element 60 (FIG. 3), and the holder 30 is disposed between the base 20 and the optical module 100. It should be noted that when current is passed through the first magnetic element 40, the first magnetic element 40 will interact with the magnetic field of the second magnetic element 40 to generate an electromagnetic force to move the holder 30 and the optical module 100 relative to the frame 10 and the base 20 to achieve optical compensation. As a result, the frame 10 and the base 20 may be called as a fixed portion F1, and the holder 30 and the second magnetic element 50 may be called as a movable portion M. The movable portion M is surrounded by the frame 10, and the optical module 100 does not overlap the frame 10 when viewed along the optical axis O.

It should be noted that a pair of contact elements 70 and a pair of contact elements 72 are positioned on the base 20 and the holder 30, respectively. The contact elements 70 may be positioned at the diagonal of the base 20, and the contact elements 72 may be positioned at the diagonal of the holder 30. In some embodiments, the base 20 and the contact element 70 may be disposed separately or formed integrally, and the holder 30 and the contact element 72 may be disposed separately or formed integrally.

In some embodiments, the circuit board 80 may be disposed on the base 20 and electrically connected to other electronic elements inside or outside the driving mechanism 1 to control the movement of the driving mechanism 1. Electronic signal may be transferred through the circuit board 80 to the first magnetic element 40 to control the movement of the holder 30 in X, Y or Z directions. In some embodiments, an additional reinforce structure (such a reinforce plate) may be disposed on the circuit board 80 to strengthen the circuit board 80.

The sensor 90 may be disposed on the fixed portion F1 and corresponding to the second magnetic element 50 to gain the rotate angle of the optical module 100 by detecting the position of the second magnetic element 50. In other words, the optical module 100 has a substantially rectangular shape, and the driving assembly DR and the sensor 90 are positioned on the same side of the optical module 100. The sensor 90 may be any suitable sensor, such as a Hall sensor, a magnetoresistance effect sensor (MR sensor), a giant magnetoresistance effect sensor (GMR Sensor), a tunneling magnetoresistance effect sensor (TMR Sensor), or a fluxgate sensor, but is not limited thereto.

Figure 4:
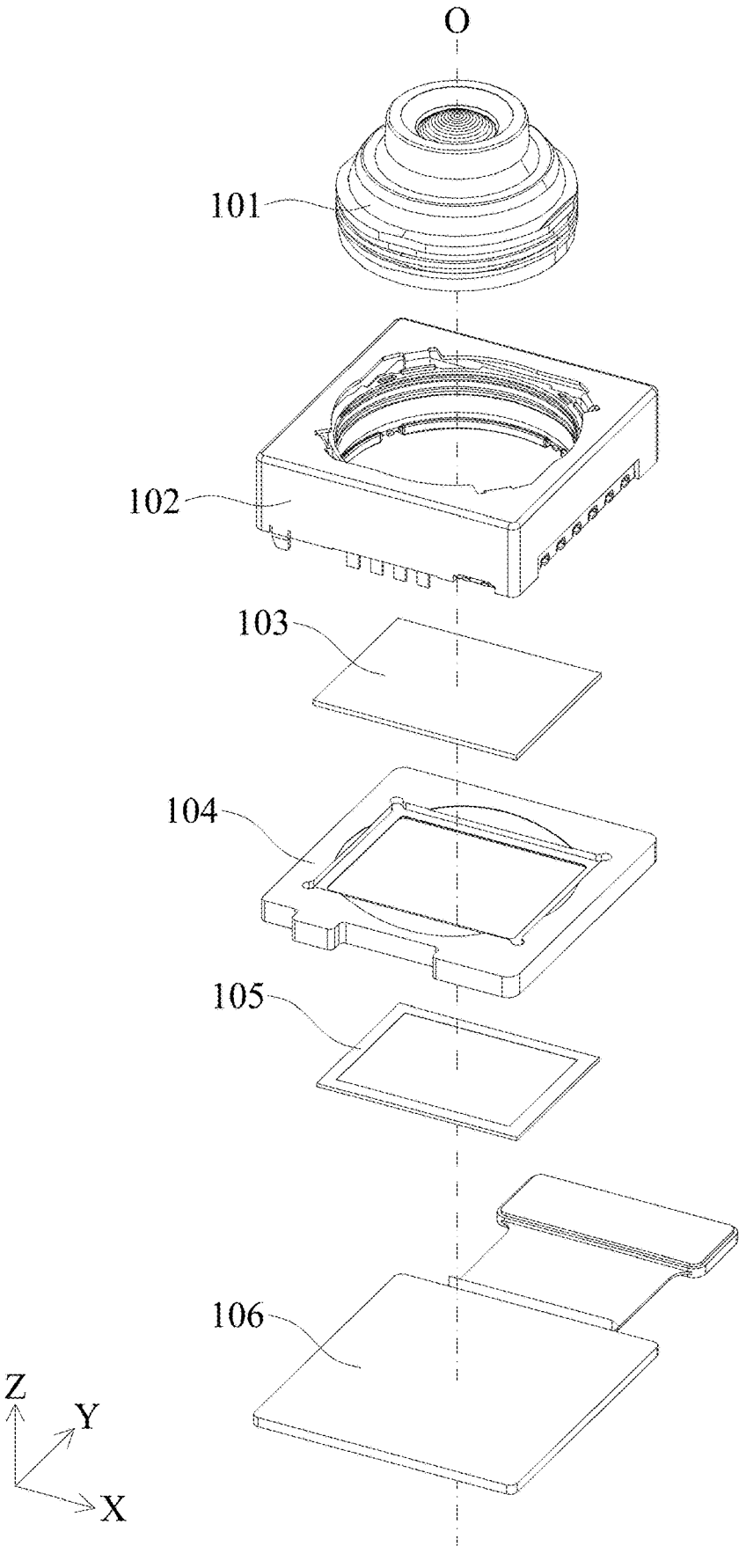
FIG. 4 is an exploded view of an optical module in some embodiments of the present disclosure.

FIG. 4 is an exploded view of the optical module 100. The optical module 100 may drive an optical element 101, and the optical module 100 further includes a driving assembly 102, a filter 103, a holder 104, an optical sensor 105, and a substrate 106 arranged along the optical axis O.

The optical element 101 may be disposed in the driving assembly 102, and the driving assembly 102 may include driving magnets and driving coils (not shown) to allow the optical element 101 to be driven by the driving assembly 102, so auto focus (AF) or optical image stabilization (OIS) may be achieved. The filter 103 may be disposed on the holder 104 and disposed between the optical element 101 and the optical sensor 105 to only allow a portion of the light to pass through the optical element 101 (such as light with a specific wavelength range) to reach the optical sensor 105, and the rest of the light is filtered. The substrate 106 may allow the elements in the optical module 100 to be electrically connected to other external elements.

In some embodiments, the optical module 100 further includes a sensor (not shown) to detect the movement of the optical element 101, wherein the optical module 100 has a substantially rectangular shape, and the driving assembly DR and the sensor are disposed at different sides of the optical module 100. As a result, magnetic interference between the driving assembly DR and the optical module 100 may be prevented.

Figure 5:
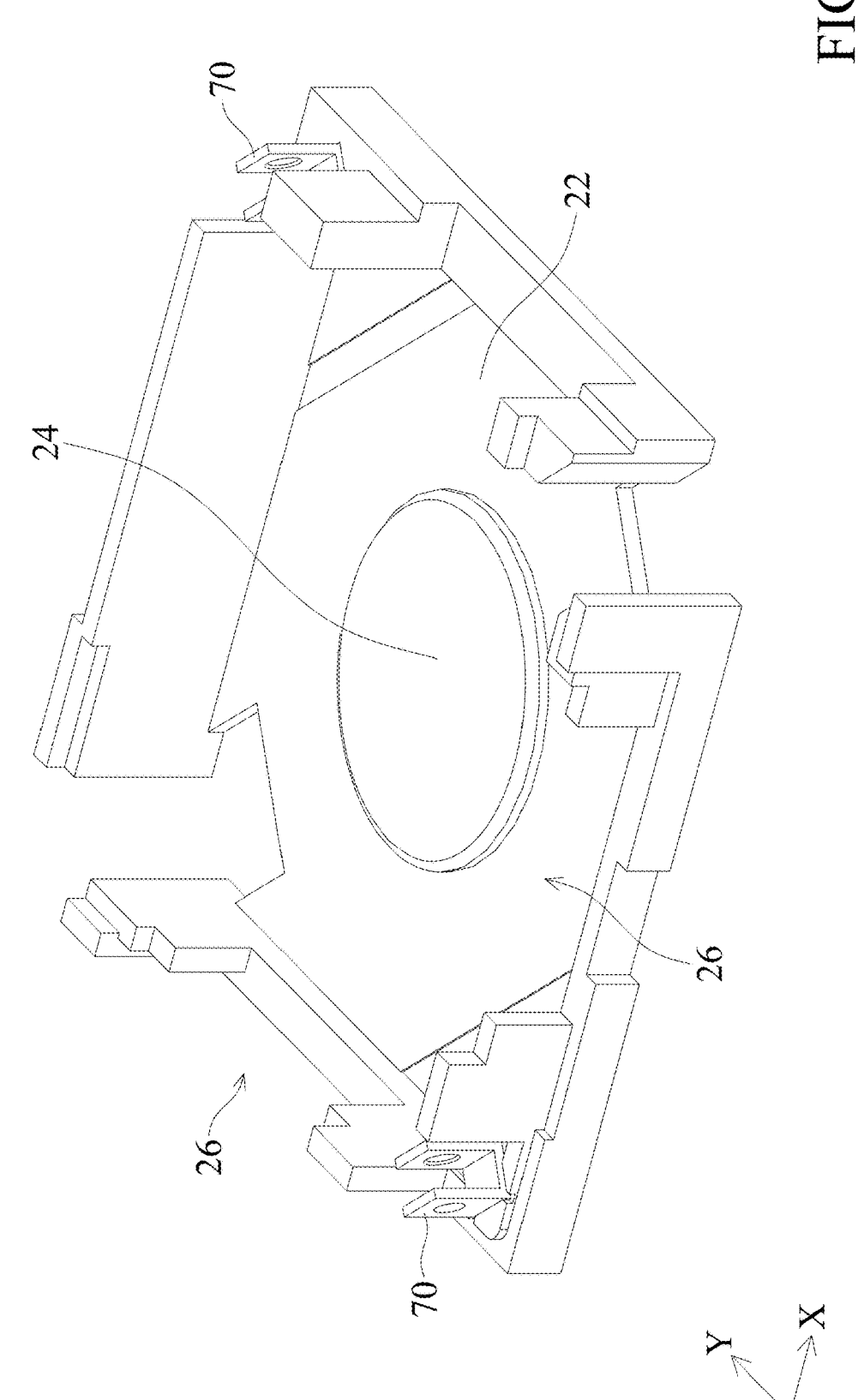
FIG. 5 is a schematic view of the base in some embodiments of the present disclosure.

FIG. 5 is a schematic view of the base 20. The base 20 may include a main body 22, a stopping portion 24 disposed at the center of the main body 22, and recesses 26 positioned on the sides of the main body 22. The stopping portion 24 may be circular to limit the moving range of the optical module 100 that is disposed on the base 20 in every direction. The first magnetic element 40 and the second magnetic element 50 may be disposed in the recesses 26 to prevent interference. Furthermore, the contact element 70 may be disposed at the corners of the base 20, such as affixed on the base 20 or formed integrally with the base 20.

Figure 6:
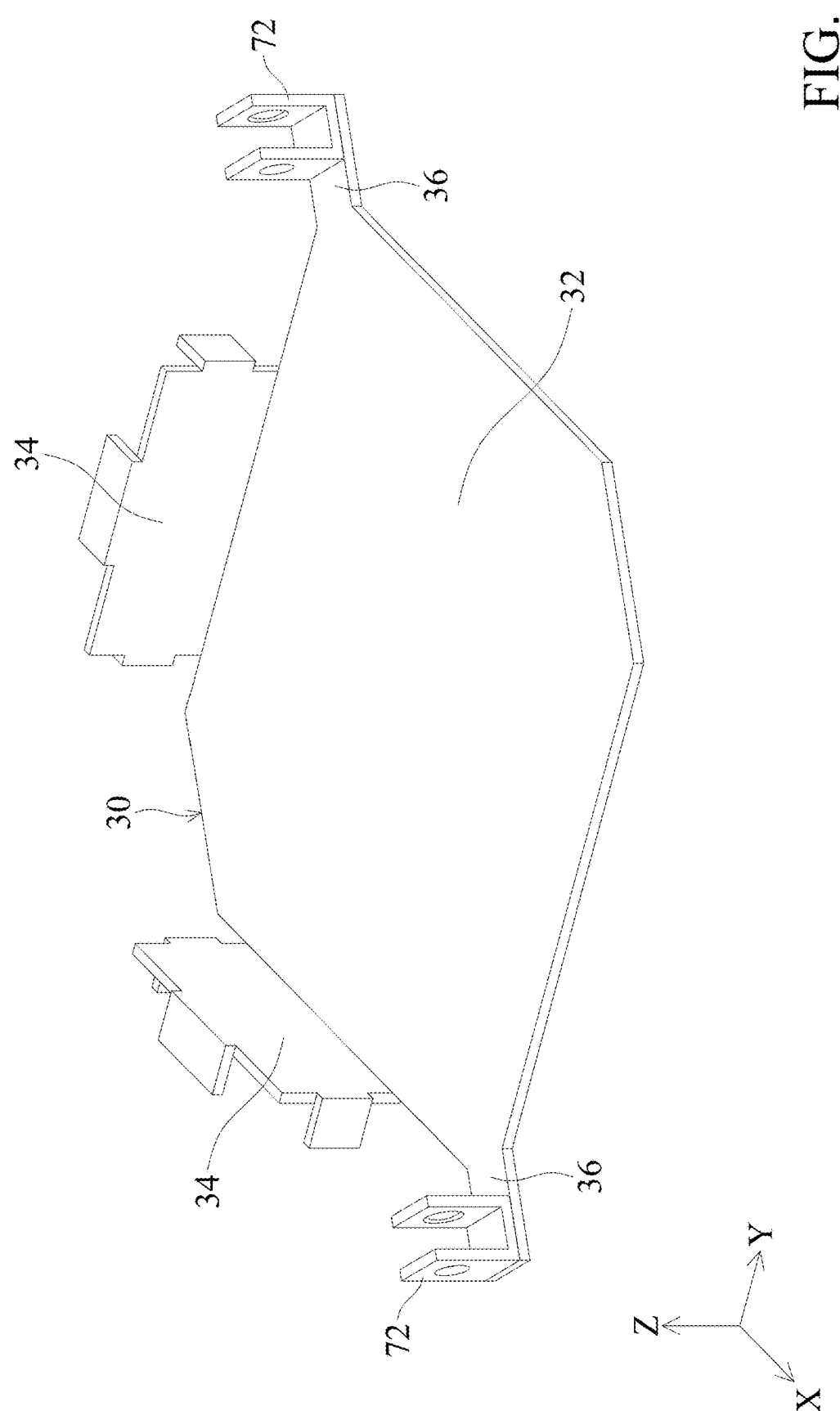
FIG. 6 is a schematic view of the holder in some embodiments of the present disclosure.

FIG. 6 is a schematic view of the holder 30. The holder 30 may include a main body 32, side plates 34 that are disposed on the sides of the main body 32 and extend from the main body 32, and extending portions 36 disposed at the corners of the main body 32. In some embodiments, two side plates 34 may be disposed on adjacent sides of the main body 32 for accommodating the second magnetic elements 50, such as affixed the second magnetic elements 50 on the side plates 34. The extending portions 36 may position at opposite corners of the main body 32, and the contact elements 72 may be disposed on the extending portions 36, such as affixed on the extending portions 36 or formed integrally with the extending portions 36.

Figure 7:
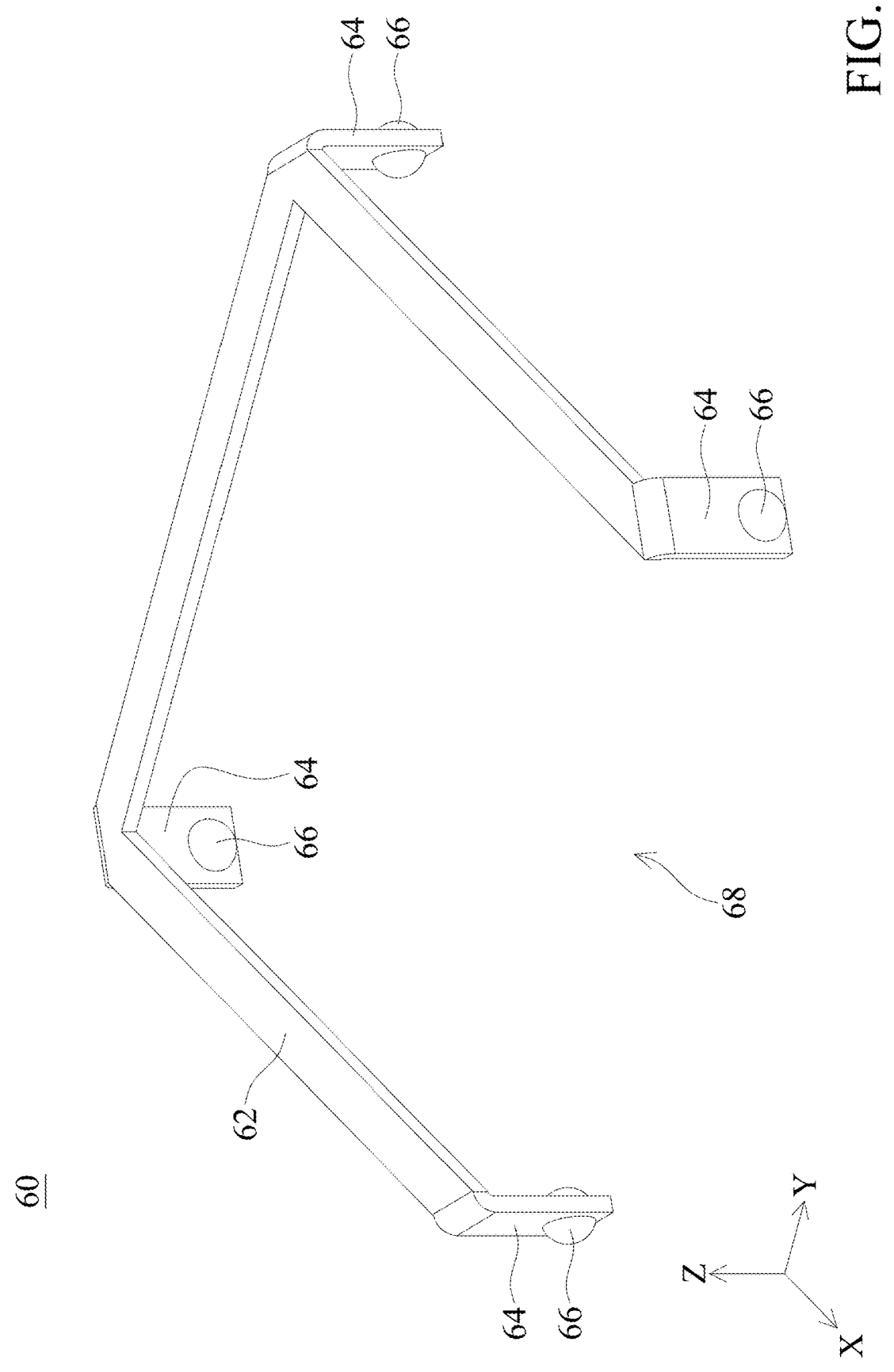
FIG. 7 is a schematic view of the connecting element in some embodiments of the present disclosure.

FIG. 7 is a schematic view of the connecting element 60. The connecting element 60 includes a main body 62, extend portions 64, and connecting portions 66. The main body 62 may include an opening 68 (such as having a U-shape), and the extending portions 64 may extend from the corners of the main body 62. The connecting portions 66 are positioned on the extending portions 64 and having circular shape. In some embodiments, the material of the connecting element 60 may be non-magnetic permeable metal to prevent magnetic interference with other elements in the driving mechanism 1 (such as the first magnetic element 40 or the second magnetic element 50) from occurring. The substrate 106 may be partially disposed at the opening 68 of the connecting element 60 to prevent interference between the substrate 106 and the connecting element 60 from occurring when assembling the driving mechanism 1.

FIG. 8 is a top view of the driving mechanism 1. It should be noted that the circuit board 80 and the substrate 106 of the driving mechanism 1 extend from different sides of the driving mechanism 1. In other words, the circuit board 80 and the substrate 106 do not overlap each other when viewed along the optical axis O. For example, in FIG. 8, the circuit board 80 extends in −Y direction from the driving mechanism 1, and the substrate extends in X direction from the driving mechanism 1. Therefore, interference between the circuit board 80 and the substrate 106 may be prevented from occurring. Furthermore, the frame 10 may have non-magnetic materials (such as plastic) to prevent magnetic interference in the driving mechanism 1 from occurring.

Figure 9:
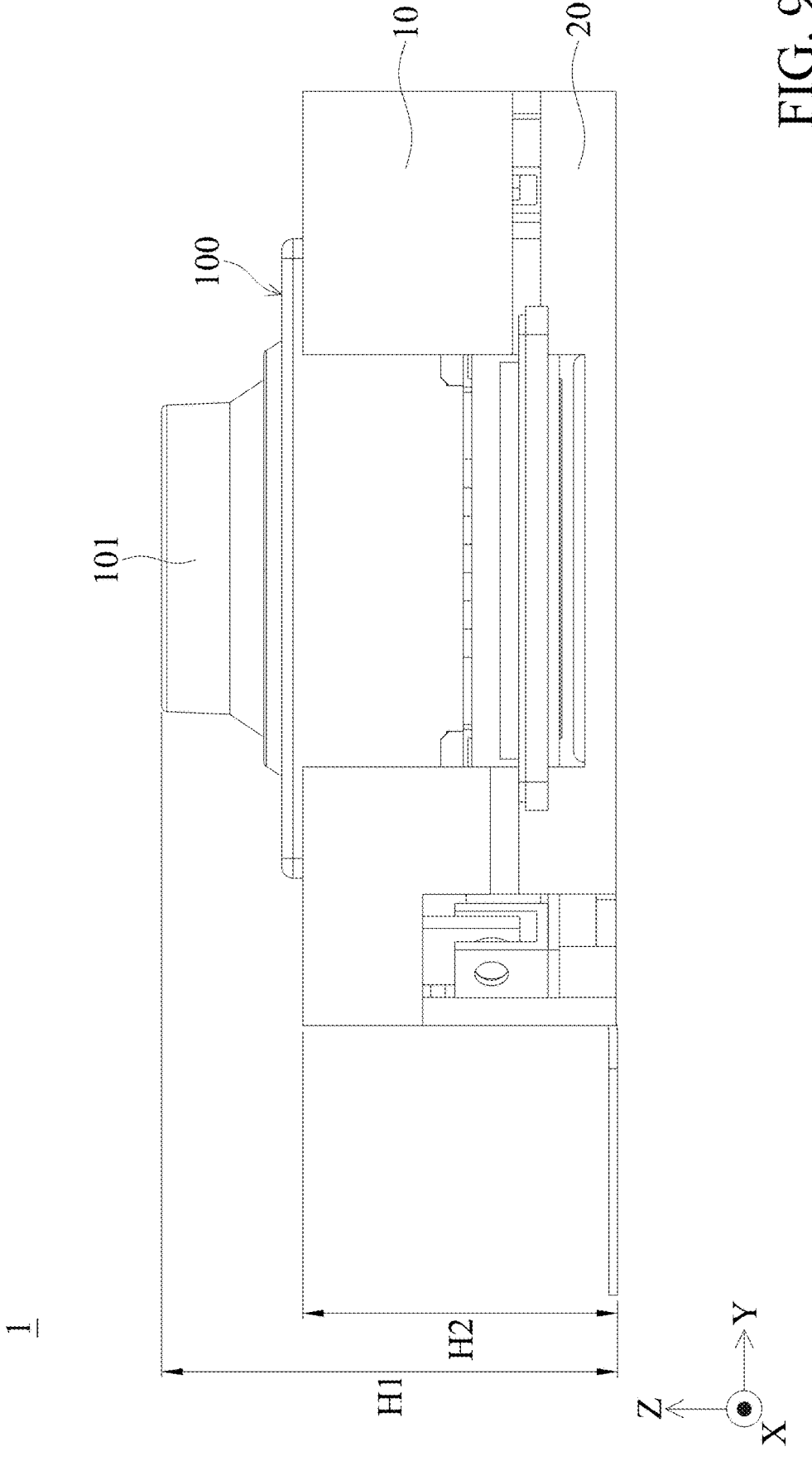
FIG. 9 is a side view of the driving mechanism in some embodiments of the present disclosure.

FIG. 9 is a side view of the driving mechanism 1. The total height (the distance between the bottom surface of the base 20 to the top of the optical element 101) is H1, the distance between the bottom surface of the base 20 to the top surface of the frame 10 is H2, and H1 is greater than H2. As a result, the size and the performance of the optical element 101 may be increased. Furthermore, additional elements (such as aperture or shutter) may be provided adjacent to a portion of the optical element 101 that is protruded from the frame 10 to further utilize the space.

Figure 10:
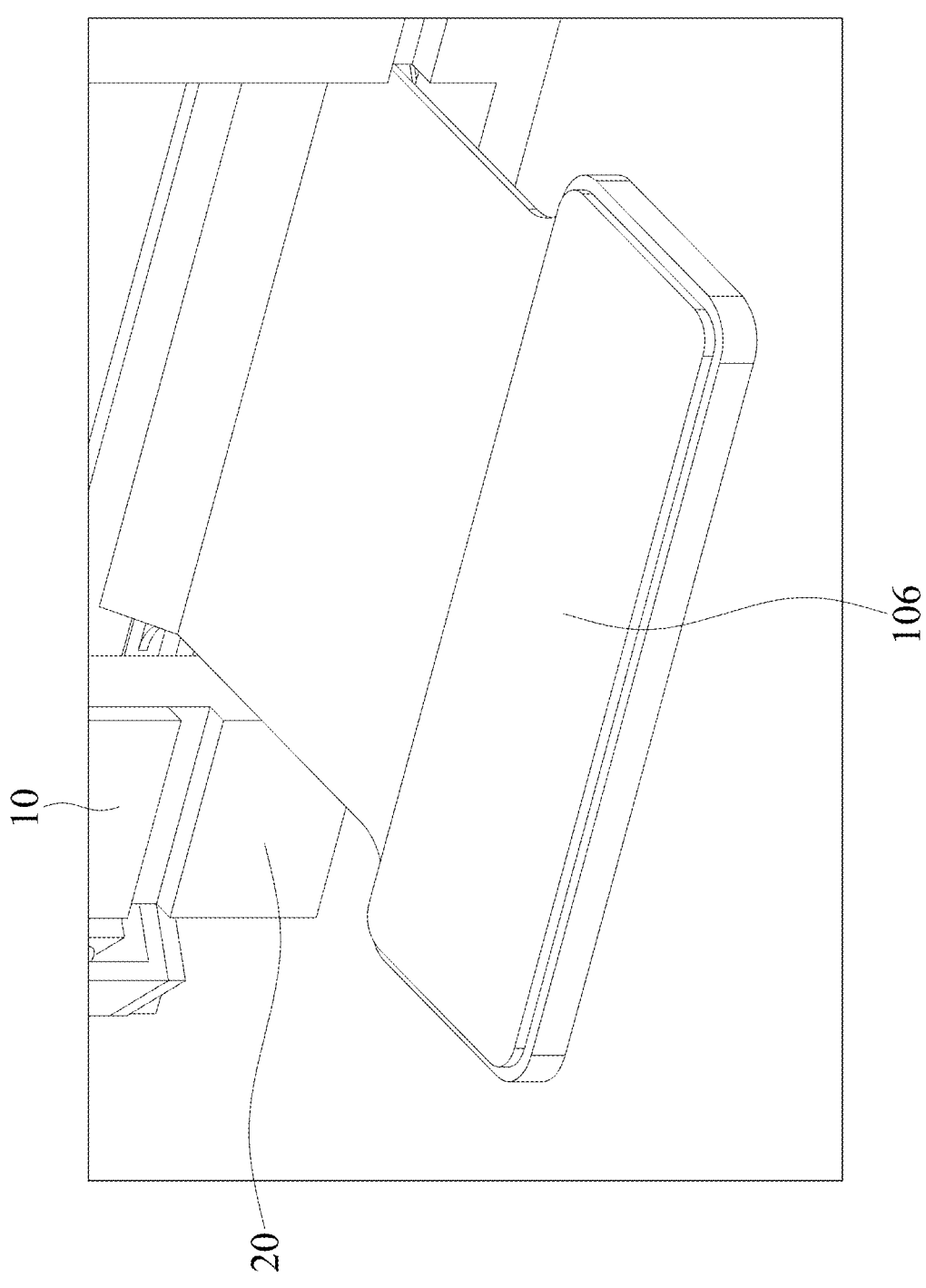
FIG. 10 is an enlarged view of a portion of the optical element in some embodiments of the present disclosure.

FIG. 10 is an enlarged view of a portion of the driving mechanism 1. The frame 10 and the base 20 may include an opening corresponding to the substrate 106, so the substrate 106 may be extended out from the opening.

Figure 11:
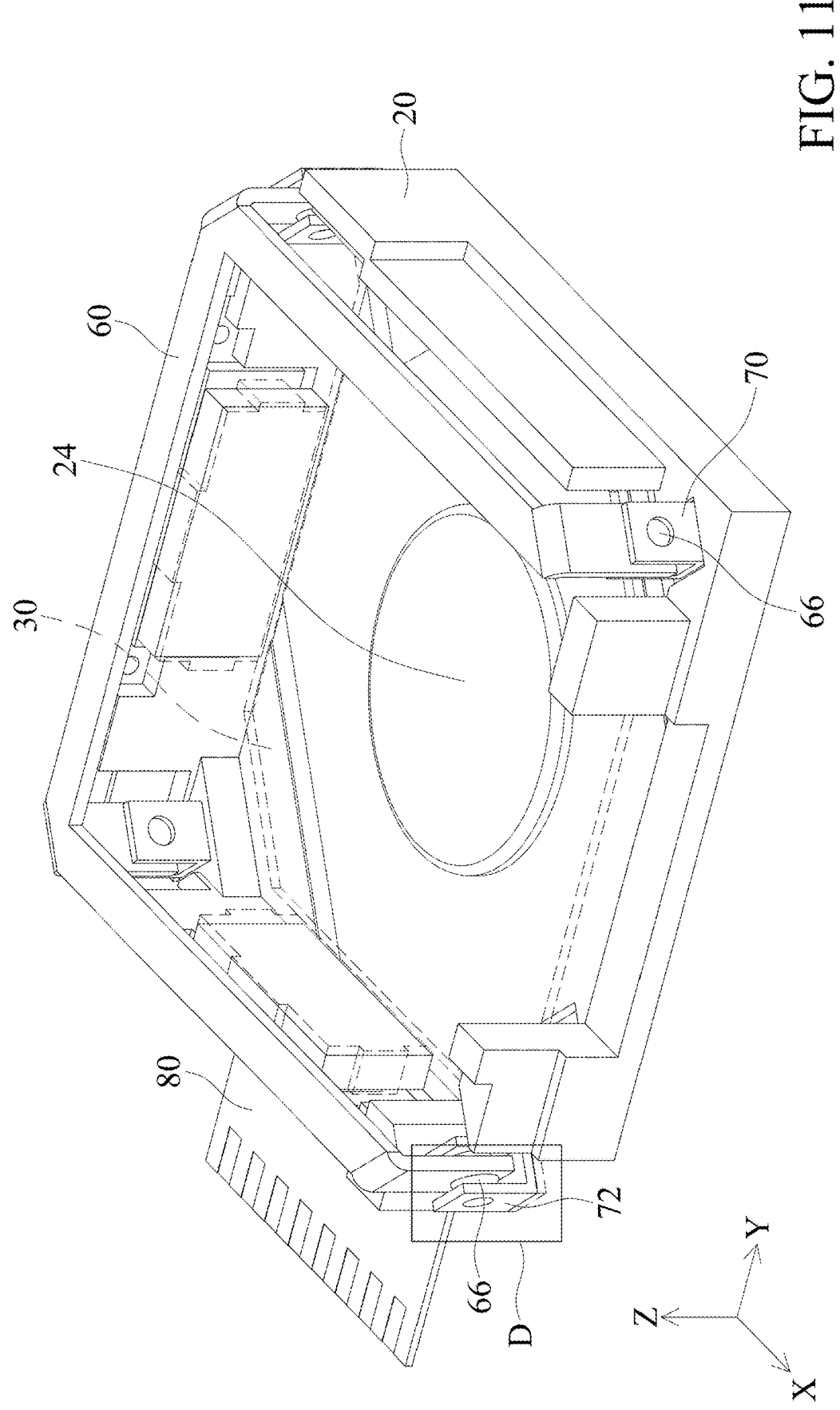
FIG. 11 is a schematic view of some elements of the driving mechanism in some embodiments of the present disclosure.

FIG. 11 is a schematic view of some elements of the driving mechanism 1, and FIG. 12 is an enlarged view of the portion D in FIG. 11. In FIG. 11, the stopping portion 24 of the base 20 extends along the Z direction to the moving portion M to limit the range of motion of the optical module 100 and the base 30 (illustrated as a dashed line in FIG. 11). It should be noted that a pair of connecting portions 66 of the connecting element 60 are disposed between the contact elements 70, and another pair of connecting portions are disposed in the contact elements 72. In other words, the contact elements 70 or 72 contact one of the connect portions 66. Furthermore, the optical axis O of the optical module 100 passes the center of the stopping portion 24, such as the circle center of the circular stopping portion 24 to balance the position limiting effect in various positions.

FIG. 13 is a schematic view of the connecting portion 66 connecting to the contact element 70 (or the contact element 72). The contact element 70 or 72 may include a pair of contact portions 74 that are extending in the Z direction. An assembly portion 76 (such as a circular opening) may be positioned at each of the two contact portions 74. Two contact portions 74 may hold the connecting portion 66 from opposite sides of the connecting portion 66. In other words, the connecting portion 66 is positioned between the two contact portions 74. Furthermore, the circular connecting portion 66 may be partially disposed in the assembly portion 76. That is, one of the connecting portion 66 contacts to one of the connecting portion 74 when viewed along the optical axis O, so the connecting element 60 may be movably connected to the base 20 (a portion of the fixed portion F1) or the holder 30 (a portion of the movable portion M). In other words, a pair of connecting portion 66 of the contact elements 70 or 72 are directly and movably connected to either the movable portion M or the fixed portion F1, and another pair of connecting portions 66 are directly and movably connected to the other of the movable portion M or the fixed portion F1. In some embodiments, the corner 78 of the assembly portion 76 that contacts the connecting portion 66 may be an angle that is not a right angle (such as a radius angle or a chamfer angle) to prevent the connecting portion 66 from directly contacting a right angle, and the connecting portion 66 may be prevented from being damaged.

As a result, the connecting element 60 may be disposed in the driving mechanism 1 by friction contact rather than being suspended by a spring in the driving mechanism, to rotate relative to a single axis or multiple axes. As a result, the driving mechanism 1 may be operated by overcoming the friction between the connecting elements 60 to the base 20 and the holder 30, so required power may be reduced. Furthermore, according to this design, the optical element 100 may rotate in a greater angle (such as ±2 degrees to ±10 degrees) by the driving mechanism 1. Moreover, the reliability of the driving mechanism 1 may be enhanced by the connecting element 60 with enhanced strength, and the optical element 100 may be prevented from sinking under its own weight.

Figure 14:
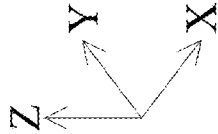
FIG. 14 is a schematic view of the base and the holder in some embodiments of the present disclosure.

FIG. 14 is a schematic view of the base 20 and the holder 30. In some embodiments, the contact portions 74 that are affixed to a single element (such as the base 20 or the holder 30) may have the same axis, and are arranged in a horizontal direction. For example, the two contact portions 74 of one contact element 70 on the base 20 are arranged in the X direction, and the two contact portion 74 of one contact element 72 on the holder 30 are arranged in the Y direction. The connecting line F between the two contact elements 70 that are affixed on the base 20 and the connecting line E between the two contact elements 72 that are affixed on the holder 30 may be substantially perpendicular to each other. In other words, the connecting element includes a pair of first connecting portions (the connecting portions 66 that are connected to the contact element 70) and a pair of second connecting portions (the connecting portions 66 that are connected to the contact element 72), the first connecting portions are directly connected to either the movable portion M or the fixed portion F1, the second connecting portions are directly connected to the other of the movable portion M or the fixed portion F1, and the connecting line between the first connecting portions is perpendicular to the connecting line between the second connecting portions.

Figure 15:
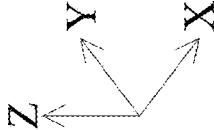
FIG. 15 is a schematic view of the base and the holder in other embodiments of the present disclosure.

The stability of the driving mechanism 1 may be enhanced by this design. However, the present disclosure is not limited thereto. For example, FIG. 15 is a schematic view of the base 20 and the holder 30 in other embodiments of the present disclosure. In FIG. 15, the contact portions 74 of the contact element 70 are arranged in the connection line F, and the contact portions 74 of the contact element 72 are arranged in the connection line E. As a result, the connecting portions 66 of the connecting element 60 may also be affixed, and interference between the contact elements 70 or the contact elements 72 to other elements may be prevented from occurring.

Figure 16:
FIG. 16 is a schematic view of some elements of the driving mechanism in some embodiments of the present disclosure.

FIG. 16 is a schematic view of some elements of the driving mechanism 1 in some embodiments, and FIG. 17 is an enlarged view of the portion G in FIG. 16. In some embodiments, the driving mechanism 1 may include a strengthening element 92 that is fit tightly to the contact portion 74 to apply a force from the contact portion 74 toward the connecting portion 66, so the connecting element 60 may be prevented from detaching from the holder 30. The strengthening element 92 may be a U-shaped metal piece (such as an iron piece).

Figure 18:
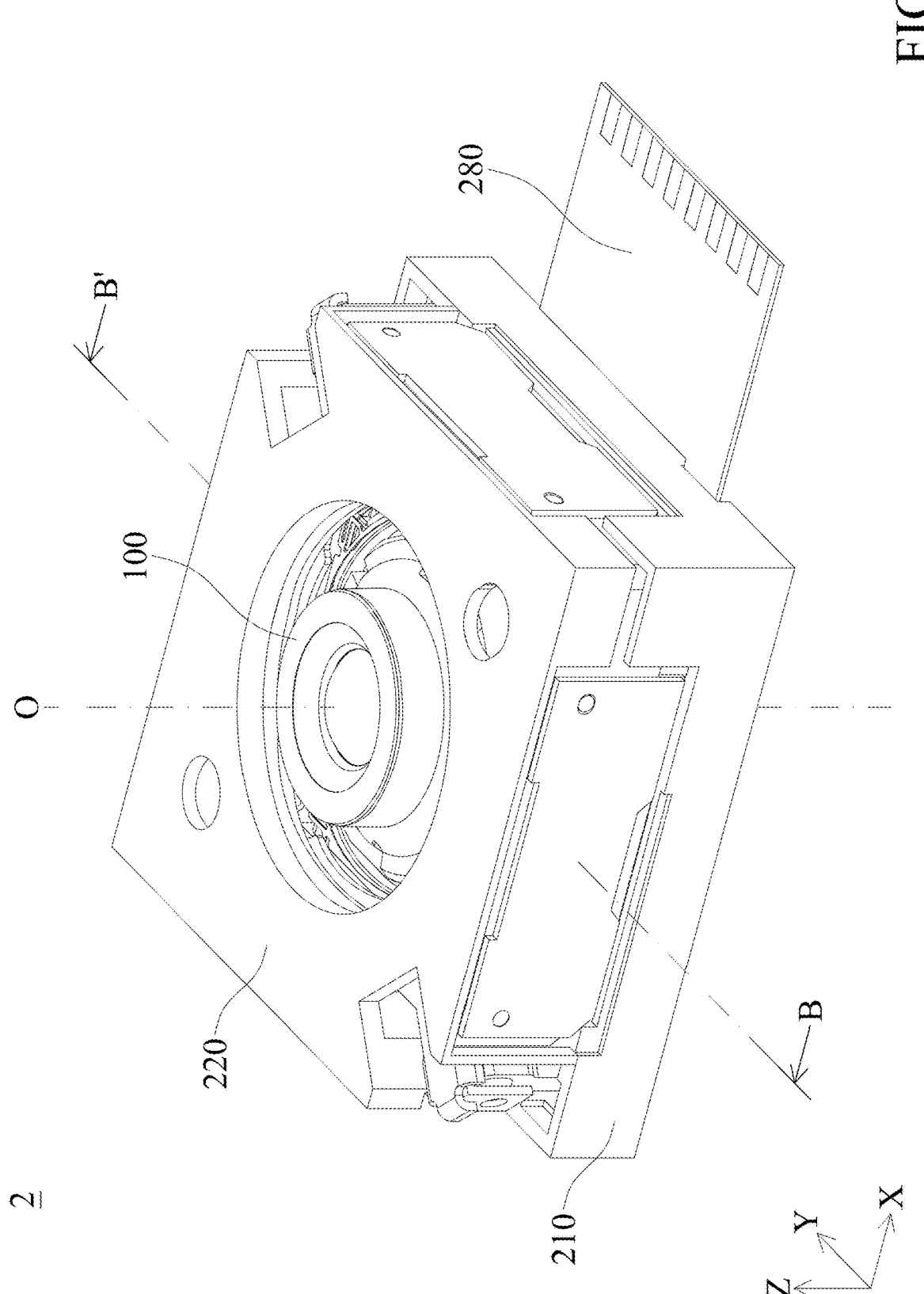
FIG. 18 is a schematic view of a driving mechanism in some embodiments of the present disclosure.
Figure 19:
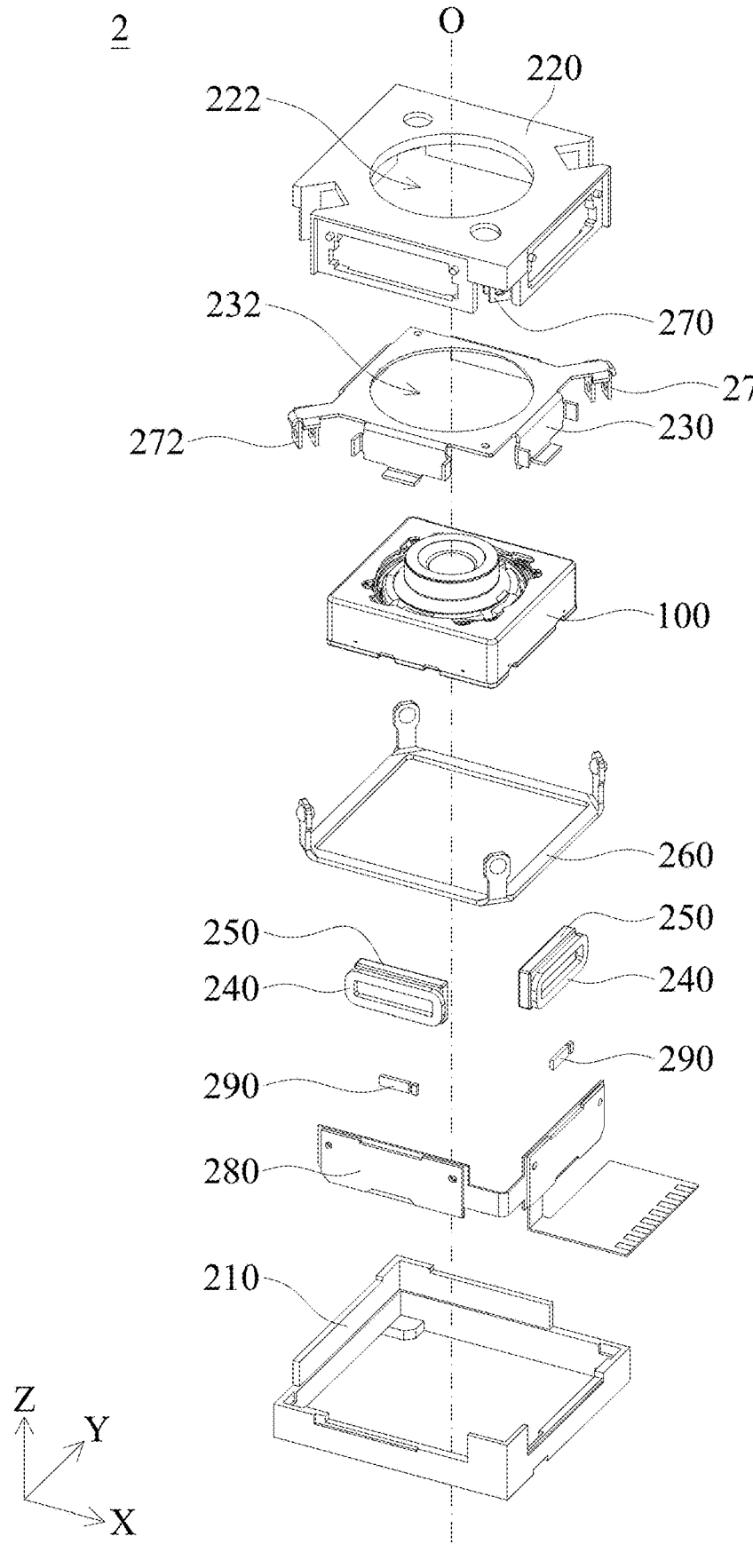
FIG. 19 is an exploded view of some embodiments of the present disclosure.
Figure 20:
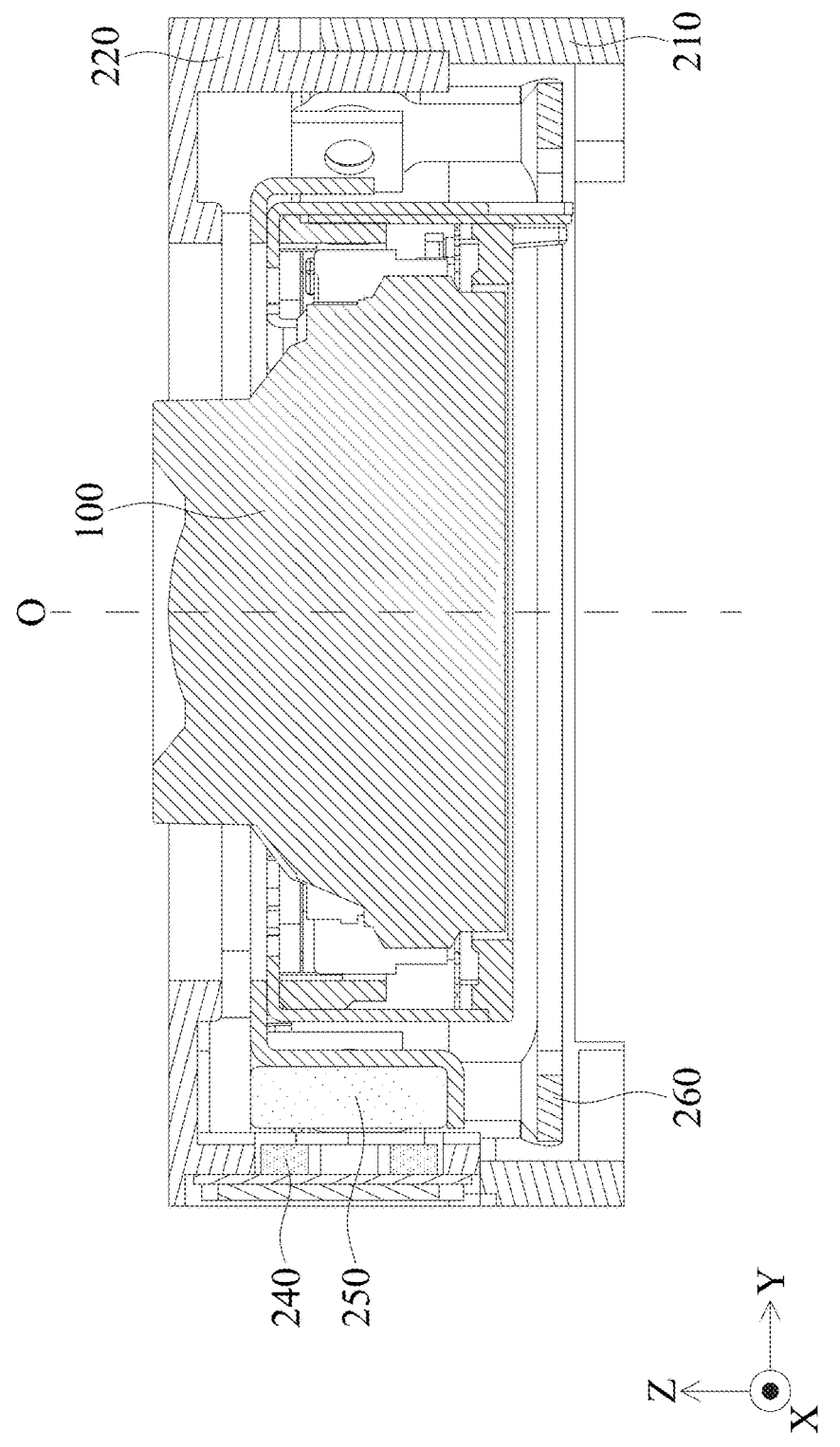
FIG. 20 is a cross-sectional view illustrated along line B-B' in FIG. 18.
Figure 21:
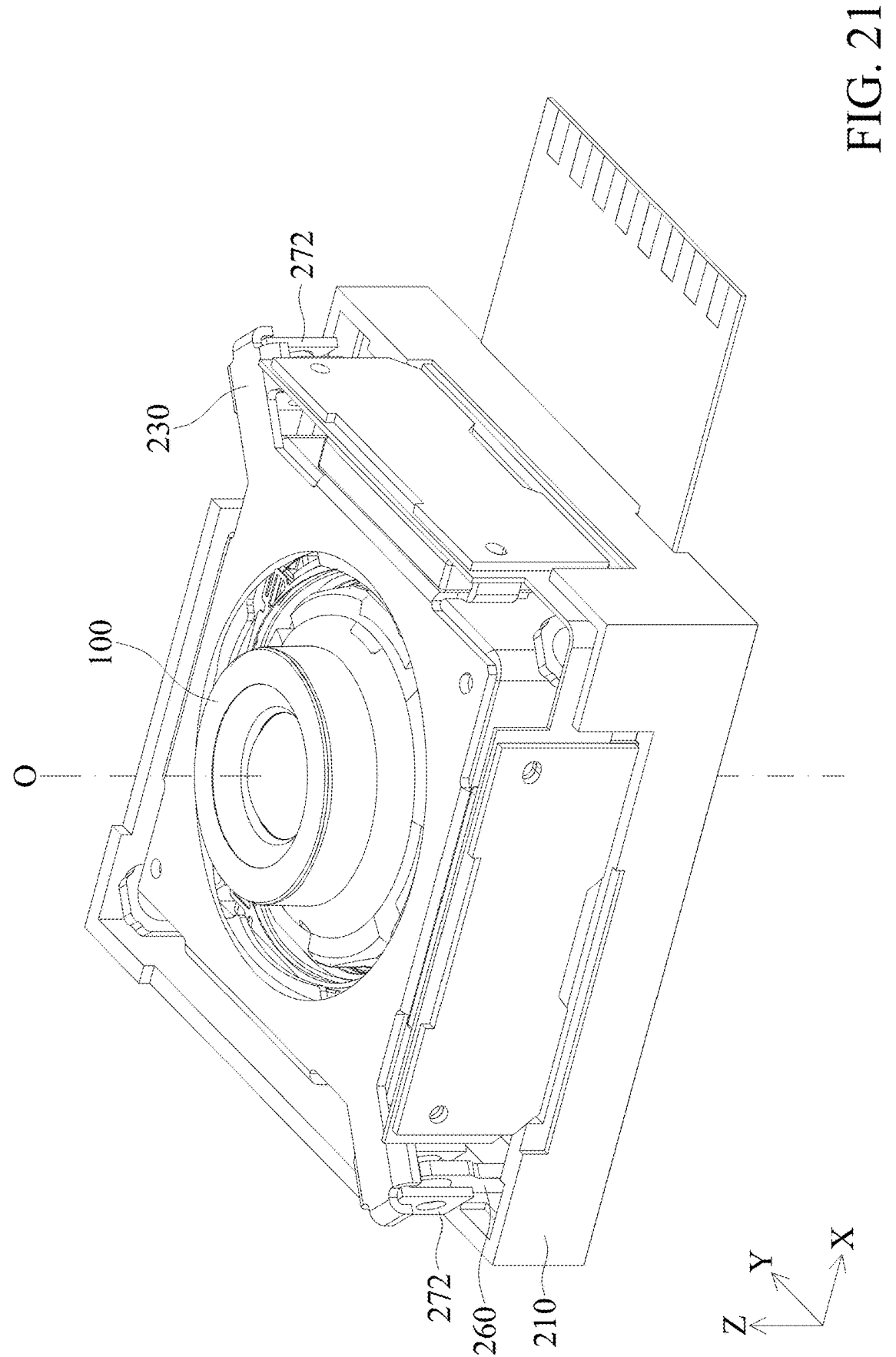
FIG. 21 is a schematic view of some elements of the driving mechanism in some embodiments of the present disclosure.

In previous embodiments, the holder 30 is disposed at the bottom of the optical module 100 (the light exit side of the optical module 100). However, the present disclosure is not limited thereto. FIG. 18 is a schematic view of the driving mechanism 2 in some embodiments of the present disclosure, FIG. 19 is an exploded view of the driving mechanism 2, FIG. 20 is a cross-sectional view of the driving mechanism 2 illustrated along the line B-B' in FIG. 18, and FIG. 21 is a schematic view of some elements of the driving mechanism 2.

The driving mechanism 2 may driving the optical module 100, and includes a frame 210, a base 220, a holder 230, a first magnetic element 240, a second magnetic element 250, a connecting element 260, contact elements 270, contact elements 272, a circuit board 280, and a sensor 290. The functions of the elements are similar to the frame 10, the base 20, the holder 30, the first magnetic element 40, the second magnetic element 50, the connecting element 60, the contact element 70, the contact element 72, the circuit board 80, and the position sensor 90 of the driving mechanism 1, and are not repeated.

In the driving mechanism 2, the holder 230 is disposed at the light incident side of the optical module 100. In other words, the optical element 101 of the optical module 100 is disposed between the substrate 106 and the holder 230, or the optical module 100 is disposed between the holder 230 and the base 220. Furthermore, a base opening 222 and a holder opening 232 may respectively position on the base 220 and the holder 230 to allow light to pass through the base opening 222 and the holder opening 232 to reach the optical module 100. The space adjacent to the optical element 101 may be further utilized by providing the holder 230 at the light incident side, so the height of the driving mechanism 2 in the Z direction may be reduced to achieve miniaturization.

Figure 22:
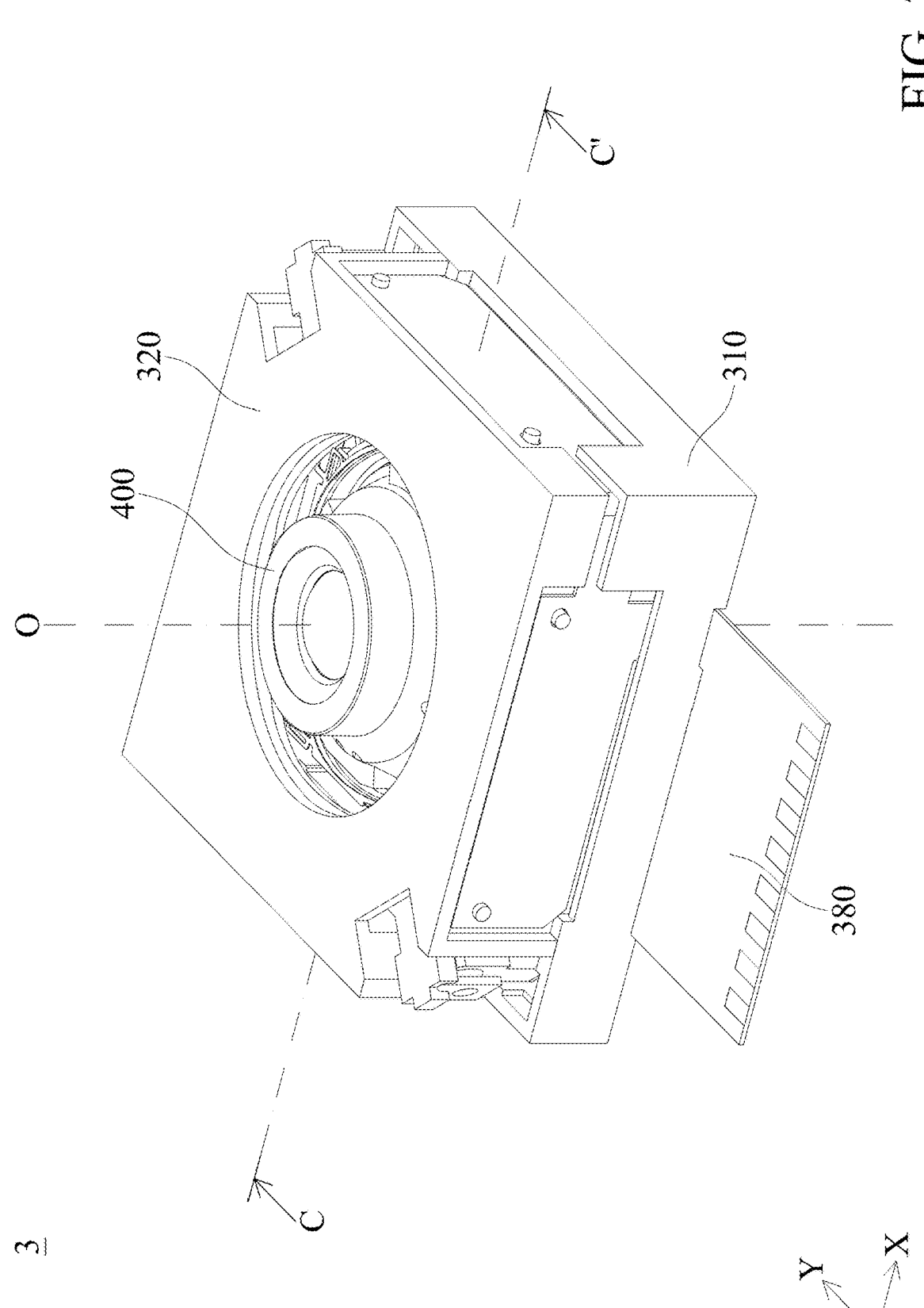
FIG. 22 is a perspective view of a driving mechanism in some embodiments of the present disclosure.
Figure 23:
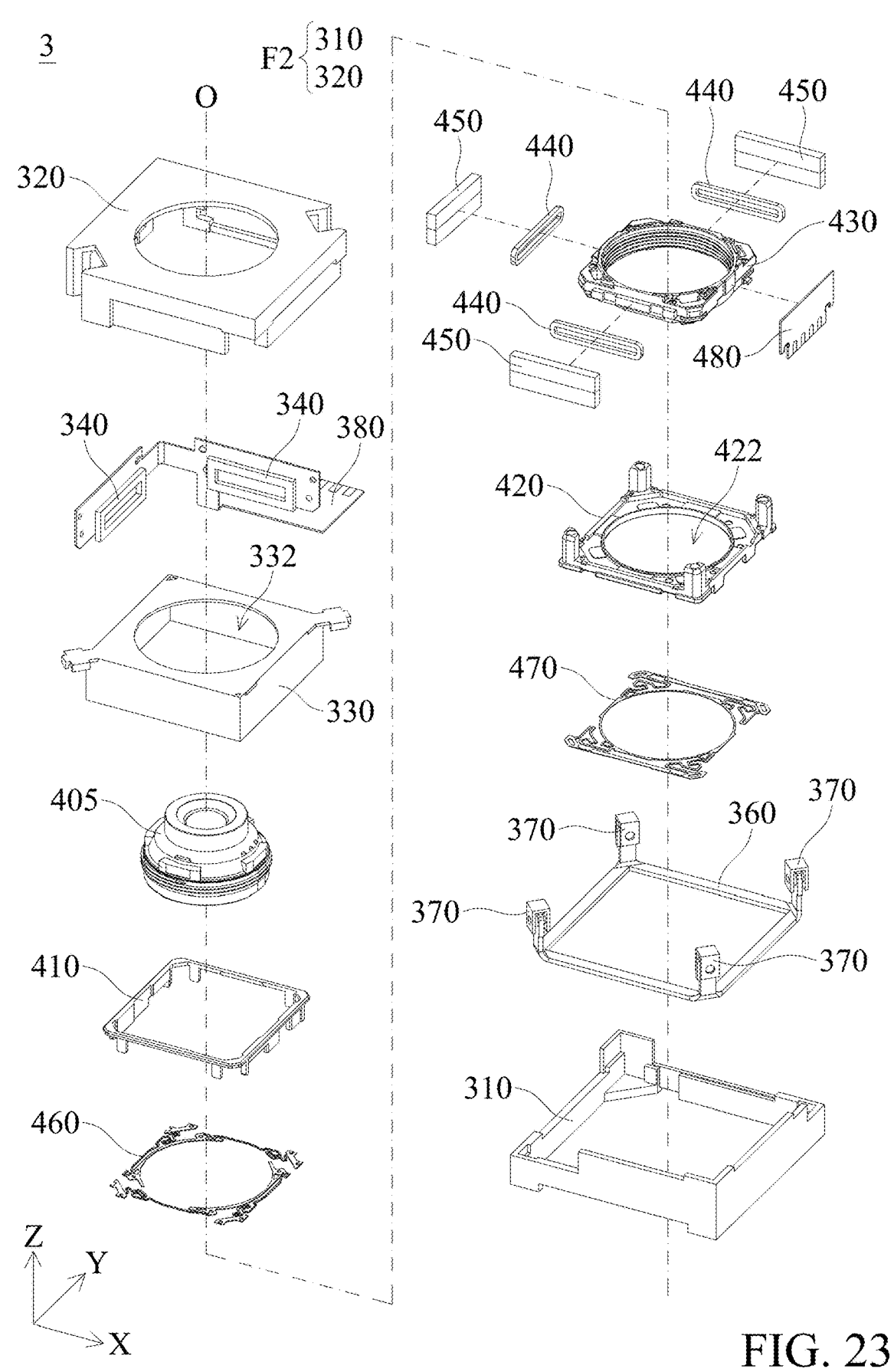
FIG. 23 is an exploded view of some embodiments of the present disclosure.

In previous embodiments, the optical module 100 and the driving mechanism 1 or 2 have their own magnetic elements (such as magnets and coils). However, the present disclosure is not limited thereto. For example, FIG. 22 is a perspective view of the driving mechanism 3 in some embodiments of the present disclosure, FIG. 23 is a exploded view of the driving mechanism 3, FIG. 24 is a cross-sectional view of the driving mechanism 3 illustrated along the line C-C' in FIG. 22, and FIG. 25 is an enlarged view of the portion H in FIG. 24.

The driving mechanism 3 may driving the optical module 400, and includes a frame 310, a base 320, a holder 330, a first magnetic element 340, a second magnetic element 350, a connecting element 360, contact elements 370, contact elements 372, and a circuit board 380. The functions of the elements are similar to the frame 10, the base 20, the holder 30, the first magnetic element 40, the second magnetic element 50, the connecting element 60, the contact element 70, the contact element 72, and the circuit board 80 of the driving mechanism 1, and are not repeated. The frame 310 and the base 320 may be called as a fixed portion F2.

The optical module 400 mainly includes an optical element 405, a frame 410, a base 420, a holder 430, a plurality of third magnetic elements 440, a plurality of fourth magnetic elements 450, a first resilient element 460, a second resilient element 470, and a substrate 480. The optical module 400 may move the optical element 405 to achieve auto focus (AF) or optical image stabilization (OIS).

The holder 330 and the base 420 may be combined to form the outer case of the optical module 400. It should be noted that a holder opening 332 and a base opening 422 may be respectively formed on the holder 330 and the base 420, the center of the holder opening 332 is corresponding to the optical axis O of the optical element 405, and the base opening 422 is corresponding to an image sensor (not shown) disposed outside the driving mechanism 3. As a result, the optical element 405 may be focused with the image sensor along the optical axis O.

The holder 430 has a through hole, wherein the optical element 405 may be affixed in the through hole, and the third magnetic element 440 may be disposed on the external surface of the holder 430. The fourth magnetic element 450 may be affixed on the frame 410 or may be movable relative to the frame 410. The third magnetic element 440 may be, for example, a driving coil, and the fourth magnetic element 450 may be, for example, a driving magnet. It should be noted that the holder 430 may be moved along the optical axis O relative to the frame 410 by the interaction between the third magnetic element 440 and the fourth magnetic element 450 to achieve fast focus.

In this embodiment, the holder 430 and the optical element 410 disposed in the holder 430 are movably disposed in the frame 410. More specifically, the holder 430 is suspended in the frame 410 by the first resilient element 460 and the second resilient element 470 made of a metal material (FIG. 24). When a current is supplied to the third magnetic element 440, the third magnetic element 440 can act with the magnetic field of the fourth magnetic element 450 to generate an electromagnetic force to move the holder 430 and the optical element 405 along the optical axis O direction relative to the frame 410 to achieve auto focusing.

Furthermore, the substrate 480 may be, for example, a flexible printed circuit (FPC), which may be affixed on the base 420 by adhering. In this embodiment, the substrate 480 is electrically connected to other electronic elements disposed in the optical module 400 or outside the optical module 400. For example, the substrate 480 may provide electronic signal to the third magnetic element 440 through the first resilient element 460 or the second resilient element 470 to control the movement of the holder 430 along the X, Y or Z axes.

It should be noted that the third magnetic element 440 and the fourth magnetic element 450 are disposed at positions that correspond to the first magnetic elements 340 (in other words, they are disposed on the same side), and only one magnet (such as the fourth magnetic element 450) is positioned between the first magnetic element 340 and the third magnetic element 440. As a result, two coils (such as the first magnetic element 340 and the third magnetic element 440) may share one magnet (such as the fourth magnetic element 450), and the number of magnets in the driving mechanism 3 may be reduced to achieve miniaturization.

Figure 26:
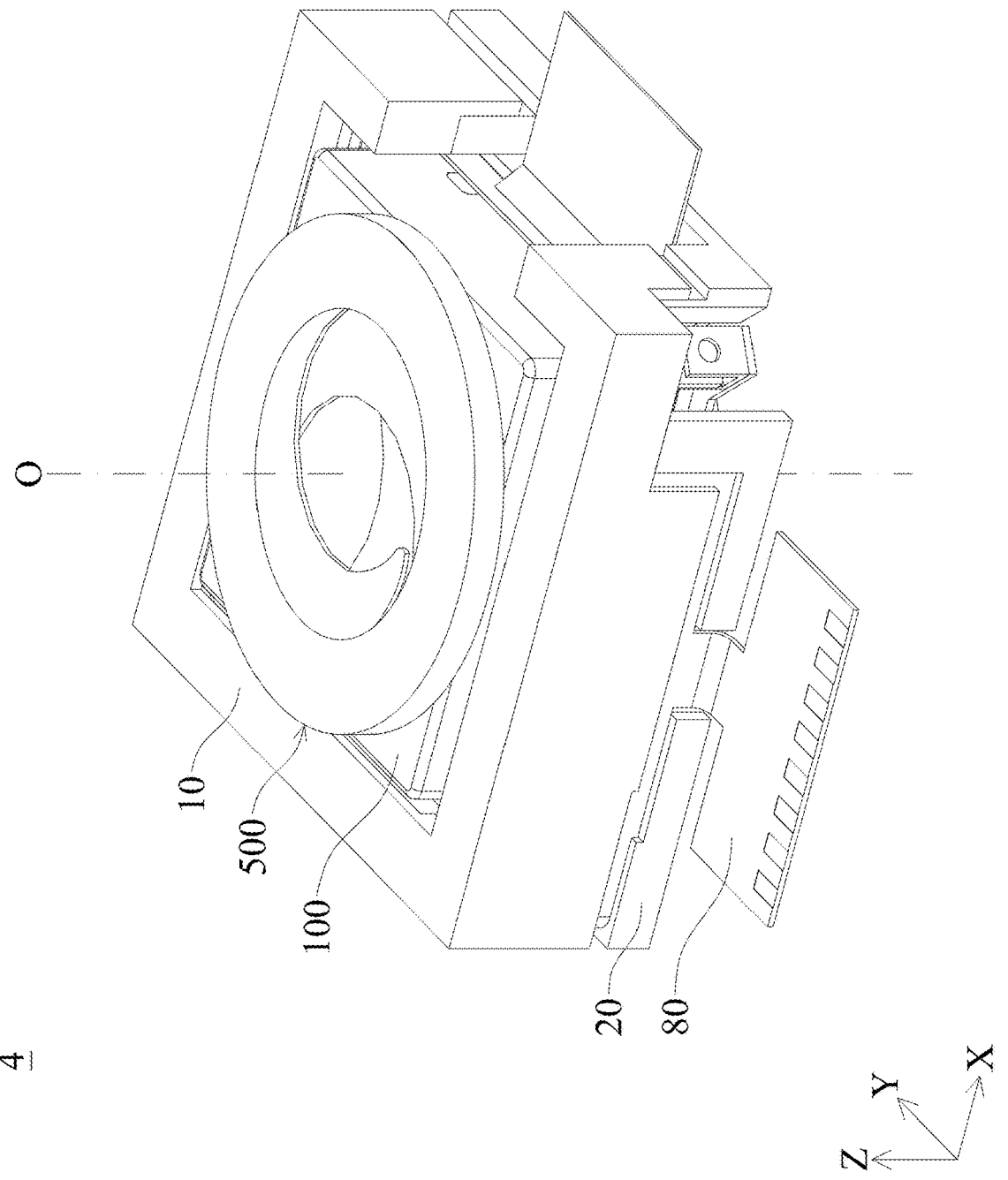
FIG. 26 is a perspective view of a driving mechanism in some embodiments of the present disclosure.

Furthermore, the driving mechanisms in the present disclosure may be used with an aperture module to enhance the performance. For example, FIG. 26 is a perspective view of a driving mechanism 4 in some embodiments of the present disclosure, and FIG. 27 is a top view of the driving mechanism 4. The driving mechanism 4 may have a similar structure to the driving mechanism 1, 2, or 3, and the difference is that the driving mechanism 4 further includes an aperture module 500 at the light incident side of an optical element (not shown). The aperture module 500 may be an element disposed on an image capturing device for controlling the aperture size of an optical element (such as a lens), so the depth of field and the quality of the image may be controlled. Furthermore, the amount of light entering the optical element may be controlled by the aperture module 500 and a shutter. For an optical element that has been produced, the diameter of the optical element cannot be changed, but the light flux of the optical element may be controlled by adding a polygon or circular aperture on the optical element, wherein the area of the aperture is adjustable. Moreover, the aperture module 500 may adjust the light intensity from every direction when the optical element is rotating, to make the received image clearer.

In some embodiments, the aperture module 500 includes a sensor 510 to detect the position of the blades of the aperture module 500. The sensor 510 may be a Hall sensor, a magnetoresistance effect sensor (MR sensor), a giant magnetoresistance effect sensor (GMR Sensor), a tunneling magnetoresistance effect sensor (TMR Sensor), or a fluxgate sensor, but is not limited thereto. The sensor 510 and the second magnetic element 50 (such as a magnet) may be disposed on different sides to prevent magnetic interference.

Figure 28:
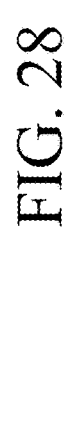
FIG. 28 is a schematic view of an optical element driving mechanism in some embodiments of the present disclosure.

FIG. 28 is a schematic of an optical element driving mechanism 1100 in some embodiments of the present disclosure. The optical element driving mechanism 1100 mainly includes a fixed portion 1110, a movable portion 1120, a driving assembly 1130, a control assembly 1140 (which may include a control unit 1142 and a position sensing unit 1144), and an inertia sensing unit 1150 (which also may be disposed outside the optical element driving mechanism 1100). The movable portion 1120 may connect to an optical element 1125 (such as a lens, an aperture, a reflective mirror, or an optical element driving module, etc.), and is movably connected to the fixed portion 1110. In other words, the movable portion 1120 is movable relative to the fixed portion 1110. The driving assembly 1130 may drive the movable portion 1120 to move relative to the fixed portion, and may include magnetic elements such as magnet or coil, or may include driving elements such as piezoelectric element or shape memory alloy, etc. The driving assembly 1130 may be disposed on the fixed portion 1110, or disposed on the movable portion 1120 (such as partially disposed on the fixed portion 1110 and partially disposed on the movable portion 1120).

The control unit 1142 may be a processor or a processing chip of the optical element driving mechanism 1100, which is configured to control the movement of the optical element driving mechanism 1100, but is not limited thereto. The position sensing unit 1144 may detect the position of the movable portion 1120 relative to the fixed portion 1110. The position sensing unit 1144 may include a Hall sensor, a magnetoresistance effect sensor (MR Sensor), a giant magnetoresistance effect sensor (GMR Sensor), a tunneling magnetoresistance effect sensor (TMR Sensor), or a fluxgate sensor, but is not limited thereto. The inertia sensing unit 1150 may be, for example, a gyro sensor to detect the attitude of the optical element driving mechanism 1100.

In some embodiments, the control unit 1142 and the position sensing unit 1144 may be packaged in a single control assembly 1140 to reduce the required space of the optical element driving mechanism 1100. In some embodiments, the control unit 1142 and the position sensing unit 1144 may be disposed separately for easily replacing the units.

Refer to FIG. 29, which is a block diagram of a control method 1000 of driving mechanism. First, at operation 1200, a first electric signal is provided by the control assembly 1140 to the driving assembly 1130.

At operation 1300, after the driving assembly 1130 receiving the first electric signal from the control assembly 1140, the movable portion 1120 is moved to an initial position relative to the fixed portion 1110 by the driving assembly 1130.

At operation 1310, the inertia sensing unit 1150 reads status signals from the elements in the optical element driving mechanism 1100, such as a position signal of the movable portion 1120 relative to the fixed portion 1110.

At operation 1320, the status signal read by the inertia sensing unit 1150 is entered into the control unit 1142 to calculate a target position by the control unit 1142, such as the target position of the movable portion 1120 relative to the fixed portion 1110. Furthermore, signal that has a greater or less frequency than a specific frequency may be filtered by the inertia sensing unit 1150, such as a signal have a frequency greater than 50 Hz or less than 1 Hz, to prevent undesired signal from being received.

At operation 1330, the control unit 1142 provides a second electric signal to the driving assembly 1130 according to the calculated target position to drive the driving assembly 1130, so the driving assembly 1130 moves the movable portion 1120 relative to the fixed portion 1110.

At operation 1340, after the movable portion 1120 is moved by the driving assembly 1130, position information is provided from the position sensing unit 1144 to the control unit 1142, such position information of the movable portion 1120.

At operation 1350, the control unit 1142 provides a third electric signal to the driving assembly 1130 according to the position information provided by the position sensing unit 1144 to drive the driving assembly 1130. It should be noted that additional operations 1340 and 1350 may be performed after the operation 1350 to achieve feedback control.

Figure 30:
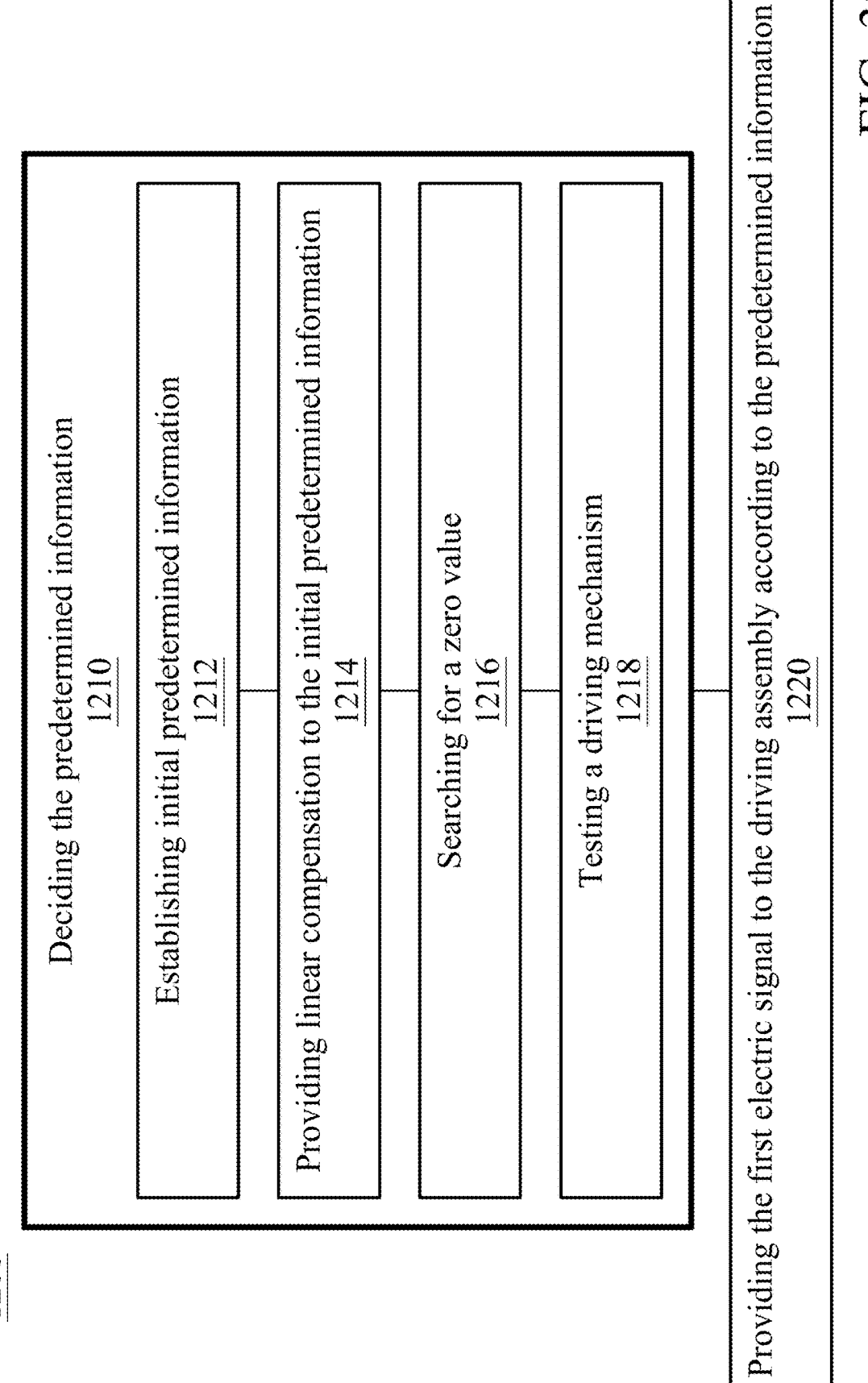
FIG. 30 is a block diagram showing the details of the control method of driving mechanism.

FIG. 30 is a block diagram shows the details of the operation 1200. As shown in FIG. 30, in some embodiments, the operation 1200 may further include an operation 1210 for deciding the predetermined information, and an operation 1220 for providing the first electric signal to the driving assembly 1130 according to the predetermined information. Furthermore, the operation 1210 may further include an operation 1212 for establishing initial predetermined information, an operation 1214 for providing linear compensation to the initial predetermined information, an operation 1216 for searching for a zero value, and an operation 1218 for testing a driving mechanism, such as the optical element driving mechanism 1100.

At the operation 1212 for establishing the initial predetermined information, a first limit value of the movable portion 1120 on a first dimension and a second limit value of the movable portion 1120 on a second dimension may be measured. The first limit value and the second limit value are the maximum values that the movable portion 1120 may move in the first dimension and in the second dimension. For example, if the first dimension and the second dimension are the rotational movement relative to X axis and Y axis, then the first limit value and the second limit value are the maximum rotation angles relative to the X axis and Y axis, respectively. If the first dimension and the second dimension are the translational movement along X axis and Y axis, then the first limit value and the second limit value are the maximum movable range along X axis and Y axis, respectively.

Figure 32:
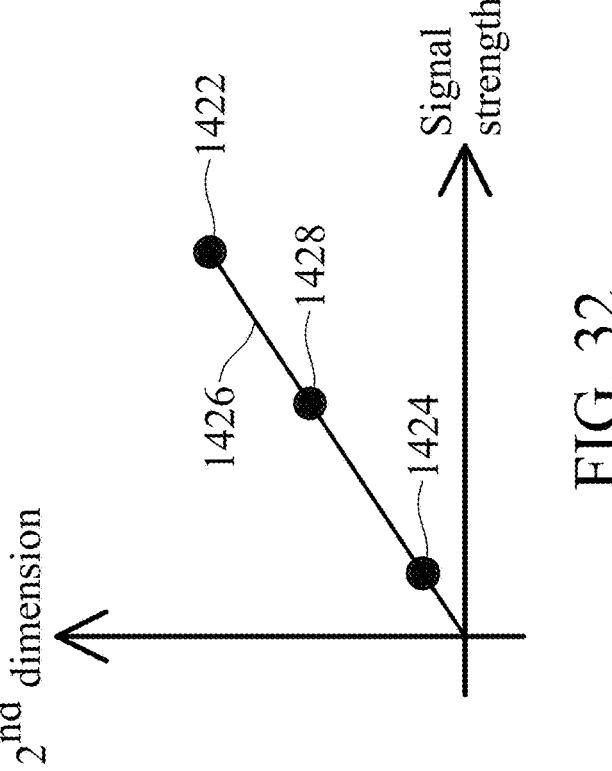
FIG. 31 and FIG. 32 show relationships between the signal strength to the first dimension and the second dimension at different positions.
Figure 31:
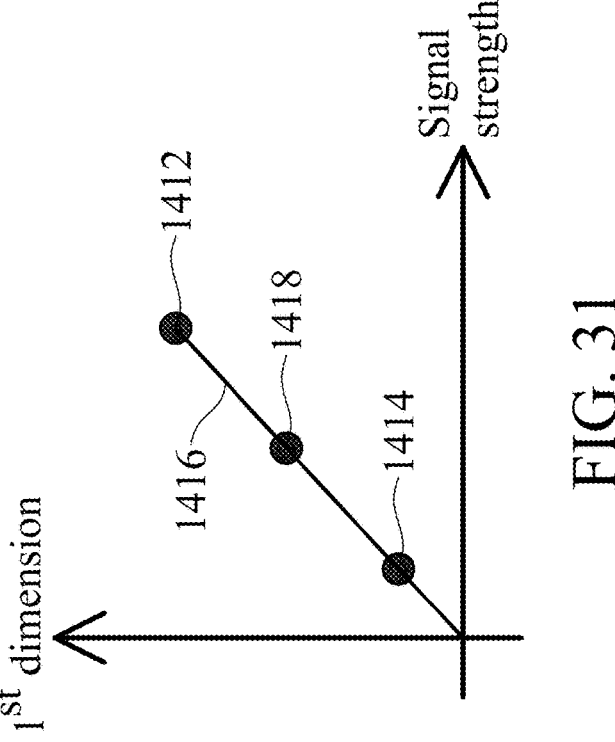

FIG. 31 and FIG. 32 show relationships between the signal strength to the first dimension and the second dimension at different positions. At the operation 1212, the first limit value of the movable portion 1120 on the first dimension (which includes a first maximum value 1412 and a first minimum value 1414) and the second limit value of the movable portion 1120 on the second dimension (which includes a second maximum value 1422 and a second minimum value 1424) may be measured. In some embodiments, the operation of measuring the first limit value of the movable portion 1120 on the first dimension and the operation of measuring the second limit value of the movable portion 1120 on the second dimension do not performed at a same time. In some embodiments, before measuring the second limit value of the movable portion 1120 on the second dimension, the first limit value of the movable portion 1120 on the first dimension is not measured. In other words, the first limit value and the second limit value are not measured simultaneously.

In some embodiments, when measuring the first limit value of the movable portion 1120 in the first dimension, the movable portion may be freely moved on the second dimension. For example, the movable portion may be freely rotated relative to Y axis when measuring the rotation of the movable portion 1120 relative to X axis.

Afterwards, an operation for measuring the second limit value of the movable portion 1120 on the second dimension is performed. It should be noted that because the first limit value of the movable portion on the first dimension, which includes a first maximum value 1412 and a first minimum value 1414, a first reference line 1416 and a first reference middle point 1418 may be illustrated, which are the connection line and the middle point of the first maximum value 1412 and the first minimum value 1414 in FIG. 31. As a result, when performing the operation for measuring the second limit value of the movable portion 1120 on the second dimension, the movable portion 1120 is fixed at the first reference middle point 1418 on the first dimension. As a result, a more accurate second limit value may be received, which includes a second maximum value 1422 and a second minimum value 1424.

After receiving the second limit value, a second reference line 1426 and a second reference middle point 1428 may be illustrated, which are the connection line and the middle point of the second maximum value 1422 and the second minimum value 1424, respectively. Afterwards, the operation for measuring the first limit value of the movable portion 1120 on the first dimension may be performed again. It should be noted that the difference between this operation to the first time performing the operation for measuring the first limit value of the movable portion 1120 on the first dimension is that the movable portion 1120 is fixed at the second reference middle point 1428 on the second dimension when the movable portion 1120 is moving on the first dimension in this operation. As a result, a more accurate first limit value may be achieved, which includes the first maximum value 1412 and the first minimum value 1414. In some embodiments, the first limit value with higher accuracy may be used for measuring the second limit value of the movable portion 1120 on the second dimension again, to gain a more accurate second limit value. It should be noted that the aforementioned operations may be performed for many times, until the first limit values and the second limit values of two operations have a difference within an acceptable range. The first maximum value 1412, the first minimum value 1414, the first reference line 1416, the first reference middle point 1418, the second maximum value 1422, the second minimum value 1424, the second reference line 1426, and the second reference middle point 1428 may be referred to as the initial predetermined information.

Figures 33, 34:
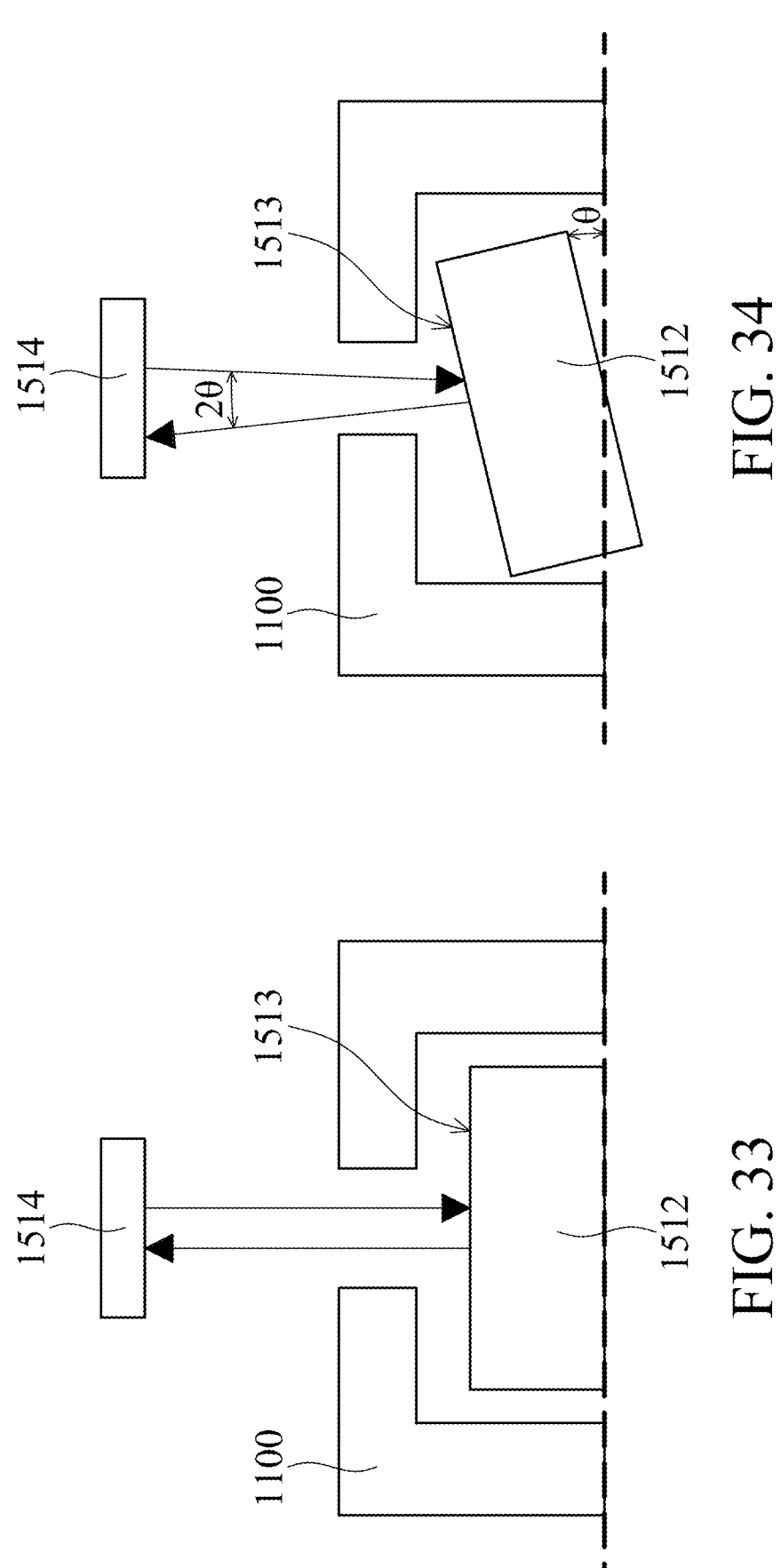
FIG. 33 and FIG. 34 are schematic views when using an external apparatus to measure the optical element driving mechanism.
Figure 35:
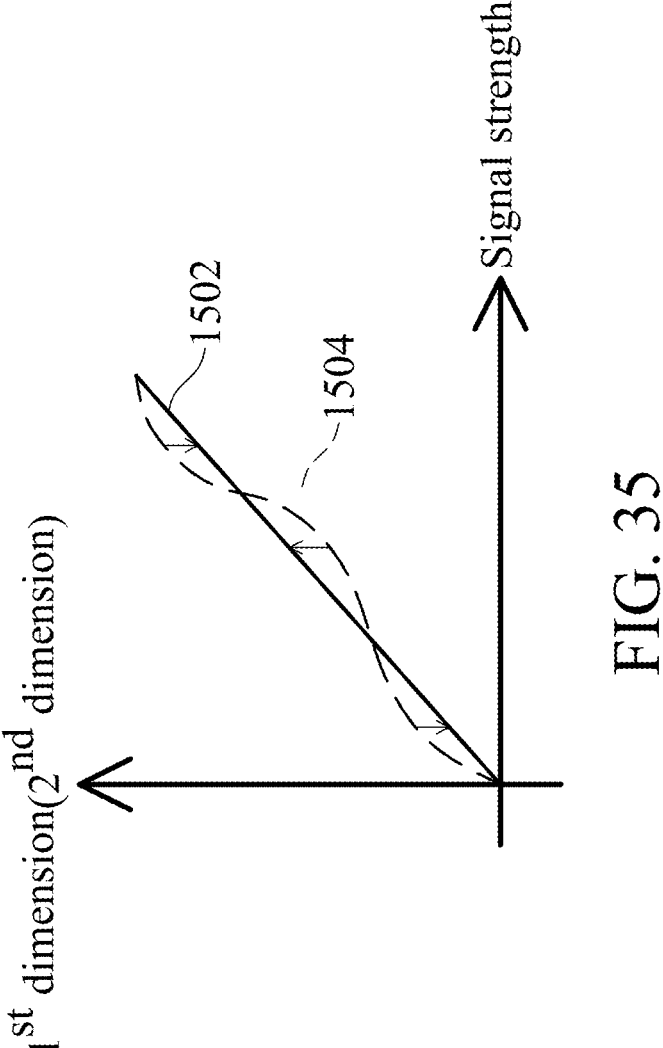
FIG. 35 shows the relationship between the signal strength to the first dimension (or the second dimension) at different positions.

At the operation 1214 for performing linear compensation to the initial predetermined information, the reference line in the initial predetermined information received in the operation 1212 is compared with an actual line measured by an external apparatus. For example, FIG. 33 and FIG. 34 are schematic views when using an external apparatus 1514 to measure the optical element driving mechanism, and FIG. 35 shows the relationship between the signal strength to the first dimension (or the second dimension) at different positions. In FIG. 33, a reference object 1512 having a reference surface 1513 is provided on the optical element driving mechanism 1100. An external apparatus 1514 may provide an input signal to the reference surface 1513. The input signal is used for measuring distance, such as light, supersonic, and is not limited. Afterwards, a reflect signal reflected by the reference surface 1513 may be received by the external apparatus 1514. In some embodiments, the reference object 1512 may be omitted, and the input signal may be provided directly on the optical element driving mechanism 1100. Afterwards, in FIG. 34, the reference object 1512 is rotated by the optical element driving mechanism 1100. When the reference object 1512 is rotated for θ angle, the input signal provided from the external apparatus 1514 to the returned reflect signal may has a 2θ angle difference. An actual line 1504 in FIG. 35 may be illustrated by recording the signal strength of the returned signal at different angles. Although this example is related to rotational movement, it should be noted that embodiments related to translational movement are also included, and is not limited thereto.

Afterwards, the reference line 1502 received in the operation 1212 (such as the first reference line and the second reference line 1426) is compared with the actual line 1504, and linear compensation is performed according to the difference. In detail, an additional compensation value is provided to the actual line 1504, for compensating the actual line 1504 to a value close to the reference line 1502, as shown by the arrow in FIG. 35. As a result, the signal strength has a linear relationship to the position in different dimensions.

Figure 36:
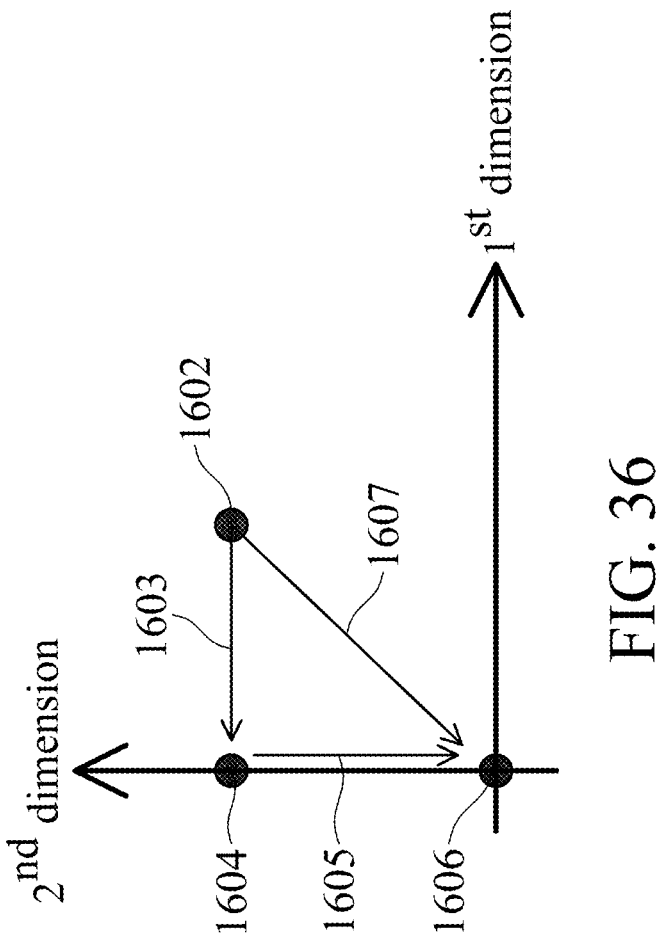
FIG. 36 shows the position of the movable portion in the first dimension (or in the second dimension).

The middle point of the movable portion 1120 is gained at the operation 1212, such as the first reference middle point 1418 and the second reference middle point 1428, but this middle point is a value measured from the elements in the optical element driving mechanism 1100, so it may be different to the actual value without deviation, such as the value when the movable portion 1120 does not rotate relative to X axis or Y axis. As a result, the operation 1216 for searching for a zero value is performed, which includes a first zero value on the first dimension and a second zero value on the second dimension. For example, FIG. 36 shows the relationship between the positions of the movable portion in the first dimension and in the second dimension. First, the movable portion 1120 is moved to a reference middle point 1602, which includes the position information of the first reference middle point 1418 and the second reference middle point 1428. Afterwards, in some embodiments, the movable portion 1120 is moved on the first dimension along the route 1603 until reaching a value 1604 which is zero on the first dimension, wherein the movable portion 1120 does not move on the first dimension. Afterwards, the movable portion 1120 is moved on the second dimension along a route 1605 until reaching a calibrated middle point 1606 which is zero on the second dimension, wherein the movable portion 1120 does not move on the first dimension. In other words, the operation for searching for the first zero value of the movable portion 1120 on the first dimension and the operation for searching for the second zero value of the movable portion 1120 on the second dimension are performed sequentially.

However, the present disclosure is not limited thereto. The movable portion 1120 may be moved along a route 1607 which is on the first dimension and the second dimension simultaneously to reach the calibrated middle point 1606. In other words, the operation for searching for the first zero value of the movable portion 1120 on the first dimension and the operation for searching for the second zero value of the movable portion 1120 on the second dimension are performed simultaneously. In some embodiments, the operation 1216 may be performed repeatedly to gain a more accurate calibrated middle point 1606, which is the zero value of the position of the movable portion 1120.

In some embodiments, the aforementioned operations may be performed again to gain a predetermined value of the movable portion 1120 at specific positions after the calibrated middle point 1606 is gained. For example, the position information of the movable portion 1120 when the movable portion 1120 is tilted relative to X axis and Y axis for a specific angle (such as ±3 degrees) may be recorded as the predetermined value to satisfy specific requirements.

Figure 37:
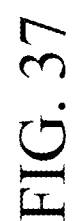
FIG. 37 and FIG. 38 show the relationship between a predetermined command to a position sensing signal at different positions.
Figure 38:
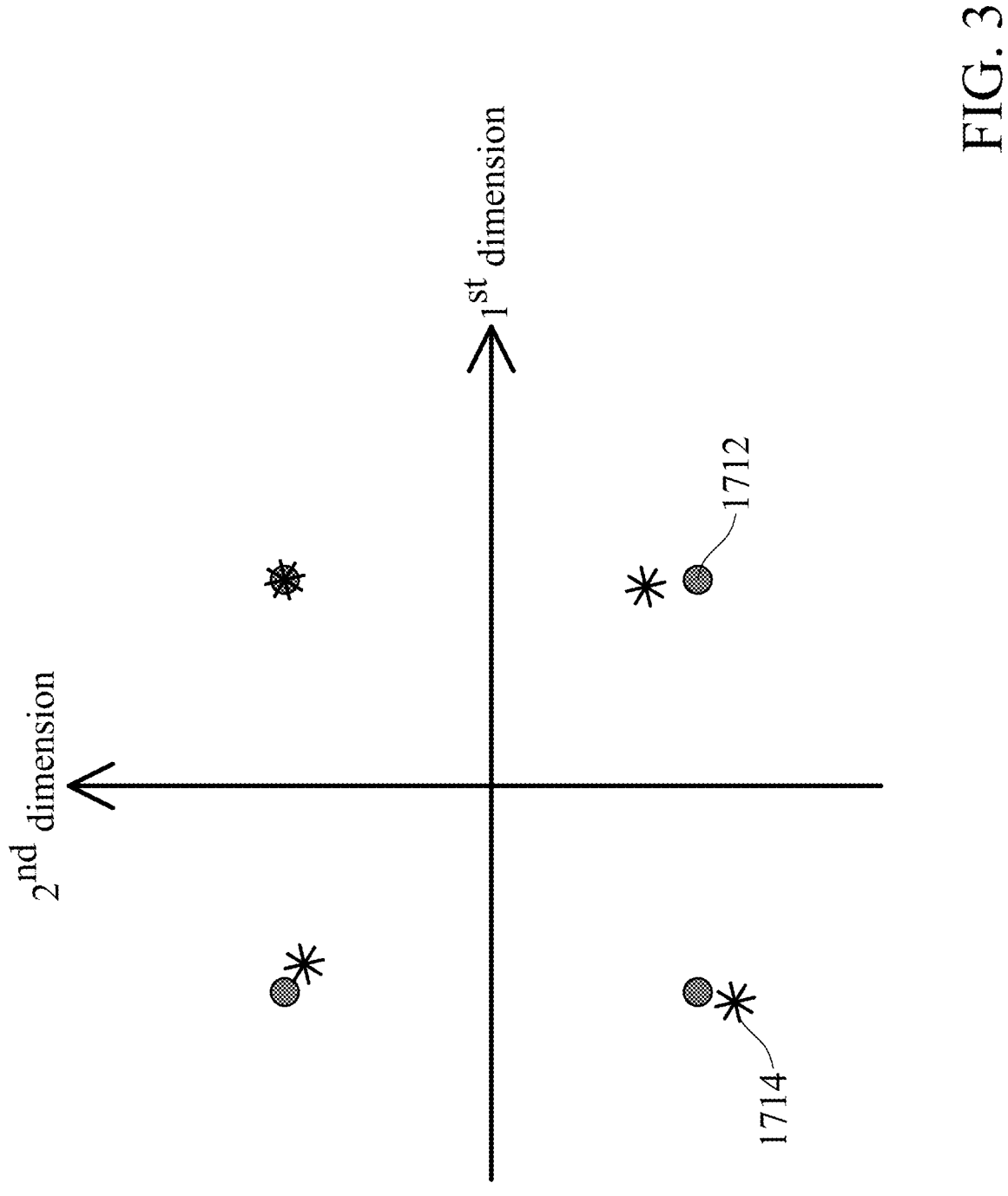

Afterwards, at the operation 1218, the optical element driving mechanism 1100 is tested to check whether the actual accuracy of the optical element driving mechanism 1100 is enough or not. For example, FIG. 37 and FIG. 38 show the relationship between a predetermined command to a position sensing signal at different positions. As shown in FIG. 37 or FIG. 38, a predetermined signal provided to the optical element driving mechanism 1100 and a position signal detected by the position sensing unit 1144 may be compared to determine whether the actual accuracy of the optical element driving mechanism 1100 is enough or not.

In FIG. 37, the predetermined command 1702 is a command provided to the optical element driving mechanism 1100, and the position signal 1704 is a returned signal from the position sensing unit 1144. The optical element driving mechanism 1100 may be tested at different locations in the two-dimensional space to gain the read values of the optical element driving mechanism 1100 at different locations. If the difference between the predetermined command 1702 to a read value of the position signal 1704 is less than an acceptable value, the optical element driving mechanism 1100 has an enough accuracy, and thus passes the test. On contrary, if the difference between the predetermined command 1702 to the read value of the position signal 1704 is greater than an acceptable value, the optical element driving mechanism 1100 does not have an enough accuracy, and thus fails the test.

Although the predetermined command 1702 and the position signal 1704 are illustrated as lines, they also may be illustrated by dots. Furthermore, as shown in FIG. 38, a predetermined command 1712 also may be provided at specific locations to gain a position signal 1714. The read value of the position signal 1714 may be used for calculating a calculated value of the signal at other positions, and then an actual value may be achieved according to the read value and the calculated value rather than measuring the signal of all positions (as shown in FIG. 37) to reduce the time and the cost of the testing.

Figure 39:
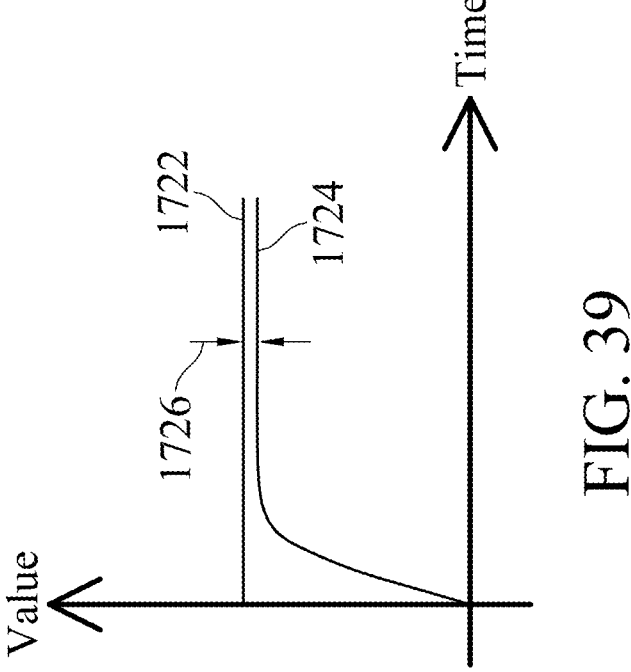
FIG. 39 shows the relationship between the signal to time from FIG. 37 or FIG. 38.

FIG. 39 shows a relationship between the signals gained in FIG. 37 or FIG. 38 to time. In FIG. 39, after a predetermined command 1722 having a specific strength is given, the received position signal 1724 will increase with time at the beginning, until reaching a stable value. As a result, the stable value is compared with the predetermined command 1722 to get a difference value 1726 after a period of time, and then the difference value 1726 is compared with the acceptable value to determine whether the accuracy of the optical element driving mechanism 1100 is enough or not.

In summary, a method for controlling a driving mechanism is provided in this disclosure. As a result, the accuracy of the optical element driving mechanism may be enhanced to satisfy its performance requirement. It should be noted that the optical element driving mechanism 1100 may be replaced by the optical element driving mechanisms 1800, 2100, 3101, 3102, 3103, 3104, 4101, 4102, 4103, 4104, 5100, 6100, 7100, 7101, 7102, 8100 in subsequent embodiments without exceed the scope of the present disclosure.

Figure 40:
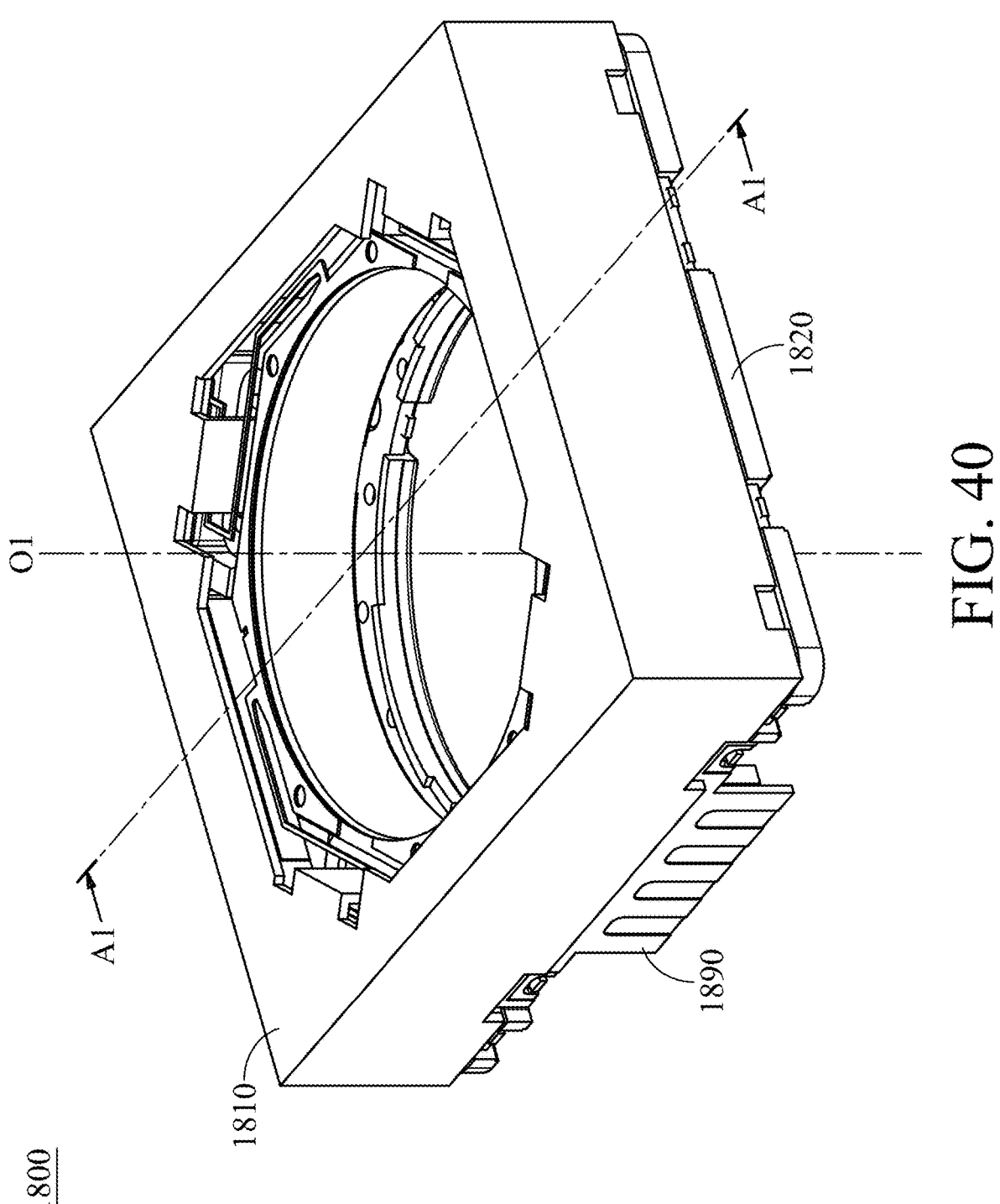
FIG. 40 is a perspective view of an optical element driving mechanism in some embodiments of the present disclosure.
Figure 41:
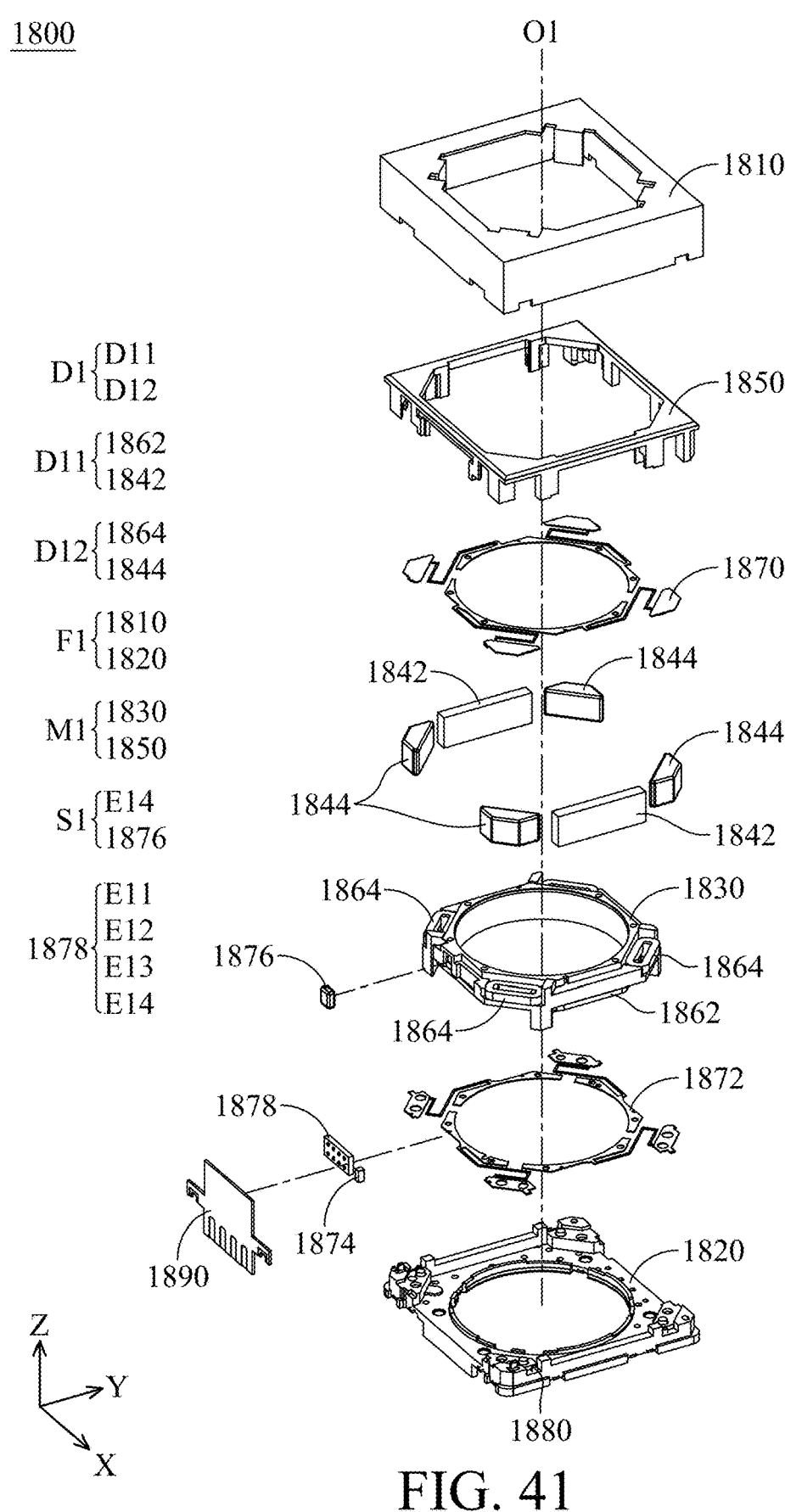
FIG. 41 is an exploded view of the optical element driving mechanism.
Figure 42:
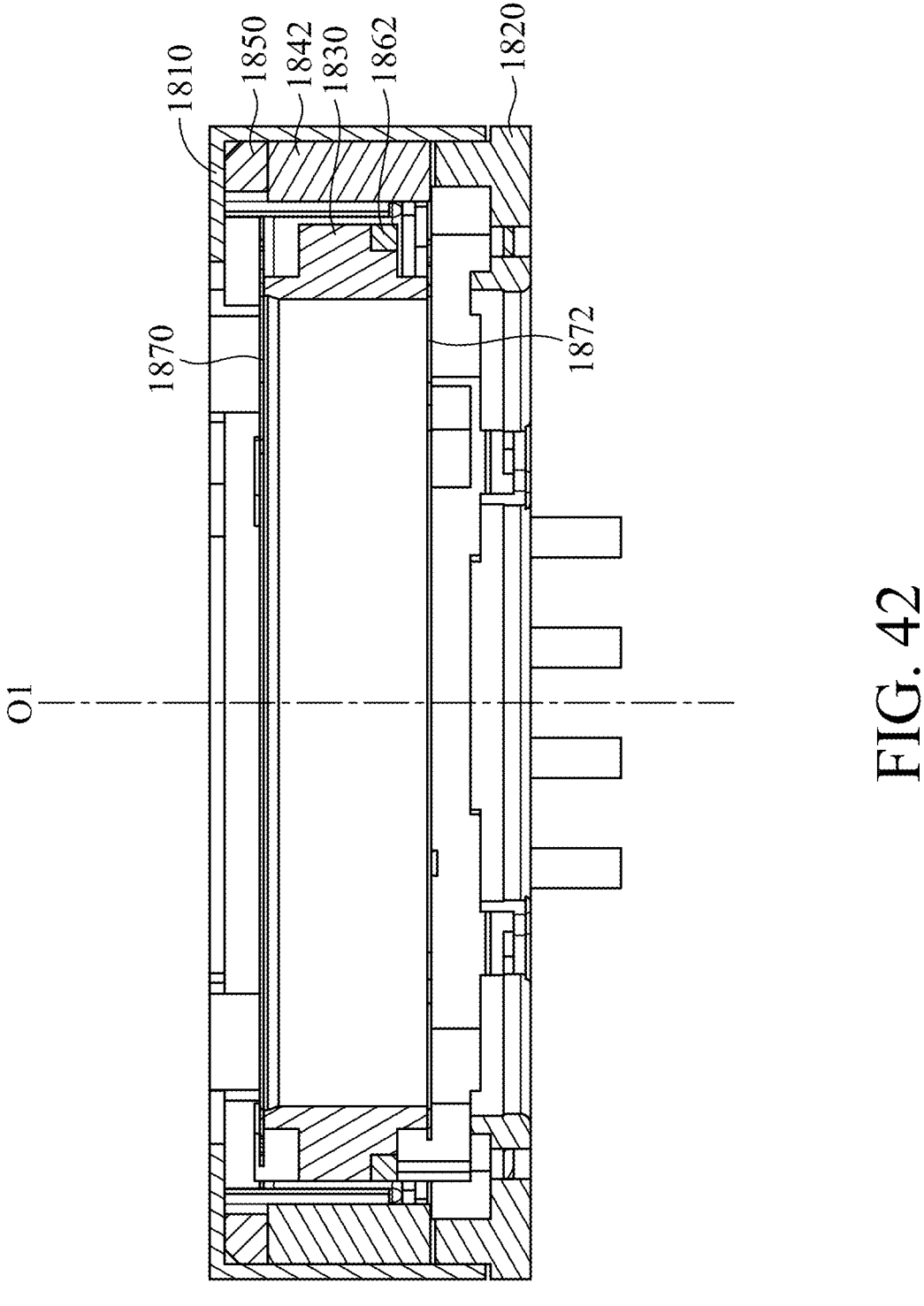
FIG. 42 is a cross-sectional view of the optical element driving mechanism.

FIG. 40 is a perspective view of an optical element driving mechanism 1800 in some embodiments of the present disclosure, FIG. 41 is an exploded view of the optical element driving mechanism 1800, and FIG. 42 is a cross-sectional view illustrated along the line A1-A1 in FIG. 40. In FIG. 40, the optical element driving mechanism 1800 mainly includes a case 1810, a base 1820, a movable portion M1 (which includes a holder 1830 and a frame 1850), a first driving assembly D11 (which includes a first magnetic element 1842 and a second magnetic element 1862), a second driving assembly D12 (which includes a third magnetic element 1844 and a fourth magnetic element 1864), a first resilient element 1870, a second resilient element 1872, a filter element 1874, a sensed object 1876, a processing module 1878, circuit 1880, and a circuit board 1890 arranged in a main axis O1. The optical element driving mechanism 1800 may be used for driving an optical module, or may be used for driving different optical elements, such as a lens, a mirror, a prism, a beam splitter, or an aperture (not shown).

In some embodiments, the case 1810 and the base 1820 may be combined to form the outer case of the optical element driving mechanism 1800. Furthermore, the case 1810 and the base 1820 may be called as a fixed portion F1. It should be noted that a case opening and a base opening may be formed on the case 1810 and the base 1820, respectively. The center of the case opening corresponds to the main axis O1 of the optical element, and the base opening corresponds to an image sensor (not shown) outside the optical element driving mechanism 1800. As a result, the optical element disposed in the optical element driving mechanism 1800 may perform focusing with the image sensor in the main axis O1.

The holder 1830 has a through hole, and the optical element may be affixed in the through hole, such by securing or gluing. The frame 1850 is disposed between the case 1810 and the base 1820, and the holder 1830 may be disposed in the frame 1850. The first magnetic element 1842 may be, for example, a driving magnet, and may be disposed at the sides of the optical element driving mechanism 1800. The second magnetic element 1862 may be, for example, a driving coil, which may be wounded on the outer surface of the holder 1830. The third magnetic element 1844 may be, for example, a driving magnet, and may be disposed at the corners of the optical element driving mechanism 1800. The fourth magnetic element 1864 may be, for example, a driving coil, and may be disposed at the corners of the holder 1830. The first magnetic element 1842 may correspond to the second magnetic element 1862, and the third magnetic element 1844 may correspond to the fourth magnetic element 1864.

Magnetic forces may be generated by the interaction between the first magnetic element 1842 and the second magnetic element 1862, and the interaction between the third magnetic element 1844 and the fourth magnetic element 1864, to move the holder 1830 relative to the fixed portion F1. For example, the interaction between the first magnetic element 1842 and the second magnetic element 1862 may move the holder 1830 in the main axis O1, and the interaction between the third magnetic element 1844 and the fourth magnetic element 1864 may change the tilting angle of the holder 1830 relative to the fixed portion F1.

In this embodiment, the holder 1830 and the optical element disposed therein is movably disposed in the frame 1850. Specifically, the holder 1830 may be connected to frame 1850 and suspended in the frame 1850 by the first resilient element 1870 and the second resilient element 1872 formed from metal (FIG. 42).

The first driving assembly D11 and the second driving assembly D12 may be referred to as a driving assembly D1. When current is applied to the second magnetic element 1862 or the fourth magnetic element 1864, the second magnetic element 1862 or the fourth magnetic element 1864 interact with the magnetic fields of the first magnetic element 1842 or the third magnetic element 1844, respectively. Afterwards, an electromagnetic force is generated to move the holder 1830 and the optical element relative to the fixed portion F1. For example, the first magnetic element 1842 and the third magnetic element 1844 may include at least one multipole magnet to perform magnetic interaction with the second magnetic element 1862 and the fourth magnetic element 1864, respectively, so the holder 1830 and the optical element may be moved relative to the fixed portion F1.

The position sensor E14 may be disposed on the fixed portion F1 (such as disposed in the processing module 1878) to detect the position of the movable portion M1 (such as the holder 1830) relative to the fixed portion F1. For example, the position sensor E14 may detect the position of the sensed object 1876 (such as a magnet) disposed on the holder 1830 to get the position of the holder 1830. The position sensor E14 may include a Hall effect sensor, a magnetoresistance effect sensor (MR sensor), a giant magnetoresistance effect sensor (GMR sensor), a tunneling magnetoresistance effect sensor (TMR sensor), or a fluxgate sensor. The position sensor E14 (the processing module 1878) and the sensed object 1876 do not overlap with each other when viewed along the main axis O1. The position sensor E14 and the sensed object 1876 do not overlap each other when viewed in a direction that is perpendicular to the main axis O1.

The processing module 1878 may include, for example, an integrated circuit (IC) element, which may include an adjust element E11, a switch element E12, a control element E13, and the position sensor E14 disposed therein, to control the movement of the optical element driving mechanism 1800. In some embodiments, the position sensor E14 and the processing module 1878 may be integrated as one piece to reduce the amount of the required elements of the optical element driving mechanism 1800. The adjust element E11 may adjust the tilting angle of the holder 180 relative to the main axis O1. The switch element E12 may switch the optical element driving mechanism 1800 in a close-loop mode and an open-loop mode. During the close-loop mode, the movable portion M1 is moved based on the information provided by the position sensor E14. During the open-loop mode, the movable portion M1 is not moved based on the information provided by the position sensor E14. The control element E13 may control the optical element driving mechanism 1800 to input current corresponding to a target position of the movable portion M1 when the movable portion M1 is moving relative to the fixed portion F1. The filter element 1874 may include elements such as a capacitor for filtering the noise in the signal provided to the processing module.

In this embodiment, circuit 1880 may be disposed on the base 1820, such as be formed on or formed in the base 1820 by insert molding or molded interconnect object technology, such as laser direct structuring (LDS), microscopic integrated processing technology (MIPTEC), laser induced metallization (LIM), laser restructuring print (LRP), aerosol jet process, or two-shot molding method, etc.

The circuit board 1890 may be, for example, a flexible printed circuit board (PCB), which may be affixed on the fixed portion F1. In this embodiment, the circuit board 1890 is electrically connected to a driving unit (not shown) outside the optical element driving mechanism 1800 for performing auto focus (AF) or optical image stabilization (OIS).

It should be noted that electric signal may be provided to the circuit 1880 on the base 1820 from the circuit board 1890, and may be provided to the second driving assembly D12 from the circuit board 1890 through the first resilient element 1870 to control the movement of the holder 1830.

Figure 43:
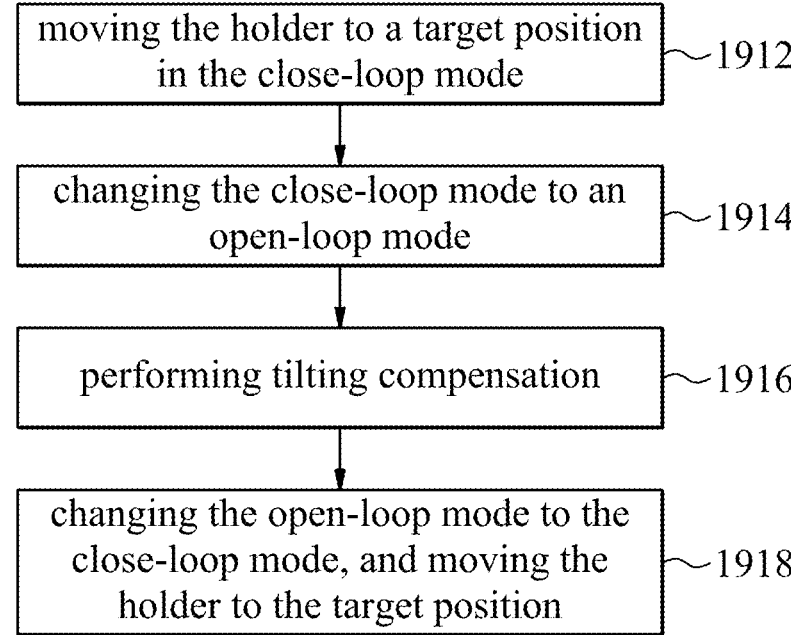
FIG. 43 is a block diagram of a compensation method of the optical element driving mechanism.

FIG. 43 is a block diagram of a compensation method 1910 in some embodiments of the present disclosure, wherein the compensation method 1910 sequentially includes a first step 1912, a second step 1914, a third step 1916, and a fourth step 1918. FIG. 44 to FIG. 47 are schematic views showing the relationship between the holder 1830 and the fixed portion F1 when performing the compensation method 1910. The tilting of the holder 1830 during its movement, such as during auto focus, may be compensated by the compensation method 1910.

Figure 44:
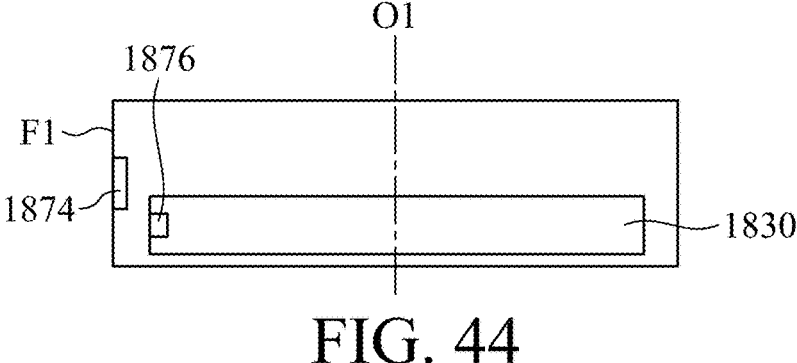
FIG. 44 to FIG. 47 are schematic views showing the relationship between the holder and the fixed portion when performing the compensation method.
Figure 45:
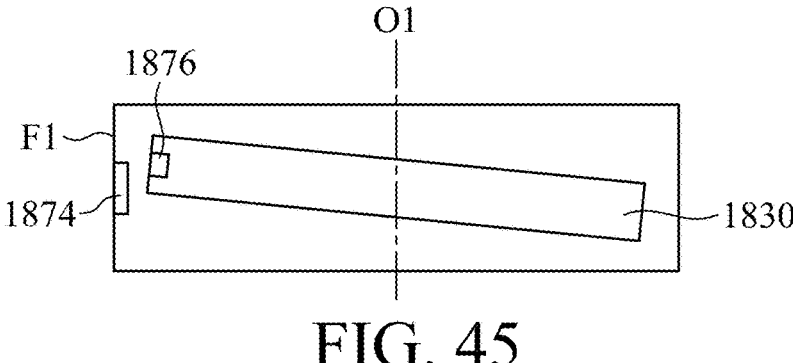

In the first step 1912, the optical element driving mechanism 1800 is at a close-loop mode. In other words, the position of the holder 1830 is controlled by signal feedback from a position sensing assembly S1 (which includes the position sensor E14 and the sensed object 1876). As a result, as shown in FIG. 44 and FIG. 45, the holder 1830 may be moved to a target position along the main axis O1.

Afterwards, using the control element E13 in the processing module 1878 and referring to corresponding position information, to input corresponding current into the optical element driving mechanism 1800 based on the target position. The corresponding position information includes information between the stroke and the code of the holder 1830.

Afterwards, in the second step 1814, the optical element driving mechanism 1800 is changed to an open-loop mode from the close-loop mode by the switch element E12 in the processing module 1878, and the holder 1830 is maintained in a target position. It should be noted that the position of the holder 1830 is not controlled by the position sensing assembly S1, but is controlled by the control element E13 at this time. In particular, the current provided to the optical element driving mechanism 1800 is maintained at a fixed current gained in the first step 1912, so the holder 1830 may be maintained at the target position.

It should be noted that the fixed current is an average current to maintain the holder 1830 at this target position. In other words, the fixed current is the average current provided to the optical element driving mechanism 1800 when the holder 1830 is stable. The relative position of the holder 1830 to the fixed portion F1 is shown in FIG. 45. When comparing to FIG. 44, the holder 1830 is moved to the target position, and the angle between the holder 1830 and the main axis O1 is changed.

Next, in the third step 1916, the tilting angle of the holder 1830 relative to the fixed portion F1 is adjusted by the adjust element E11 in the processing module 1878 to allow the holder 1830 being aligned with the main axis O1. For example, electrical signal may be provided from the adjust element E11 to the second driving assembly D12 to adjust the angle of rotation of the holder 1830. The adjust element E11 organizes the corresponding information, which records the relationship between the stroke and the compensated angle of the holder 1830, to create tilting angle information, and the tilting angle information is calculated to be corresponding tilting information. The corresponding tilting information is stored into the adjust element E11 to adjust the tilting angle of the holder 1830 based on the target position, so the tilting caused from the movement in previous steps may be compensated. It should be noted that the holder 1830 is moved by the adjust element E11 in the open-loop mode.

Figure 46:
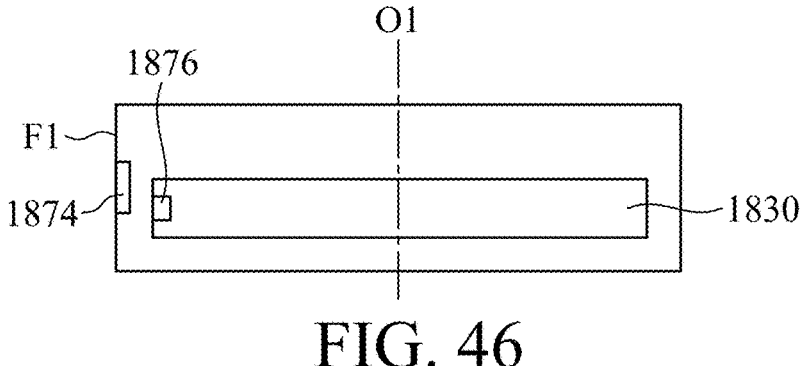

After the tilting angle of the holder 1830 is adjusted by the adjust element E11, the control element E13 refers to the corresponding position to determine the position of the holder 1830. The position of the holder 1830 relative to the fixed portion F1 is shown in FIG. 46. It should be noted that the optical element driving mechanism 1800 is at the open-loop mode now. In other words, the position of the holder 1830 relative to the fixed portion F1 is not controlled by the position sensing assembly S1, so the holder 1830 may move relative to the fixed portion rather than being restricted by the sensing assembly S1 and the close-loop mode.

Figure 47:
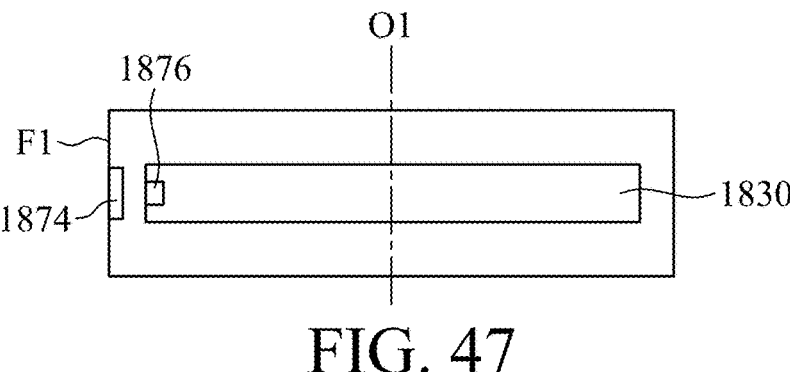

Afterwards, in the fourth step 1918, the optical element driving mechanism 1800 is changed from the open-loop mode to the close-loop mode by the switch element E12, and the holder 1830 is maintained at the target position. The position of the holder 1830 relative to the fixed portion F1 is shown in FIG. 46 or FIG. 47. In some embodiments, the holder 1830 may deviate from the target position along the main axis O1 when compensating the tilting of the holder 1830 in the third step 1916, as shown in FIG. 46. As a result, the fourth step 1918 may also include an operation to move the holder 1830 to a new target position. As shown in FIG. 7 and FIG. 47, wherein the holder 1830 is moved to the new target position along the main axis O1.

Figure 48:
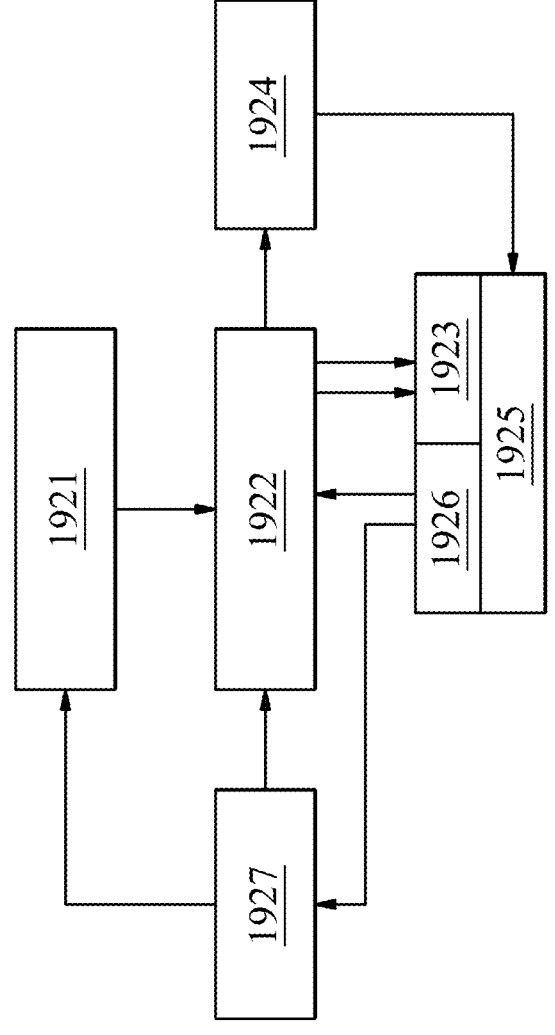
FIG. 48 is a block diagram of control architecture in some embodiments of the present disclosure.

FIG. 48 is a block diagram of control architecture 1920 of the optical element driving mechanism 1800. Corresponding tilting information is stored in an adjust element 1921 (such as the adjust element E11), and the corresponding tilting information may be provided to a control element 1922 (such as the control element E13), so the amount of movement of the holder 1830 may be calculated by the corresponding tilting information and may be calculated by corresponding position information stored in the control element 1922.

The calculated amount of movement of the holder 1830 is transformed to electrical signal by the control element 1922, and the electric signal is provided to a first driving unit 1923 and a second driving unit 1924 to allow the driving assembly 1925 moving the holder 1830 along the main axis O1, and to tilt the holder 1830 relative to the main axis, by the driving assembly 1925. Afterwards, the position of the holder 1830 (such as including the position in the main axis O1 and the tilting relative to the main axis O1) may be detected by a position sensing assembly 1926 disposed on the driving assembly 1925, and the position information is provided to the control element 1922 to perform close-loop control to the position of the holder 1830.

Figure 49:
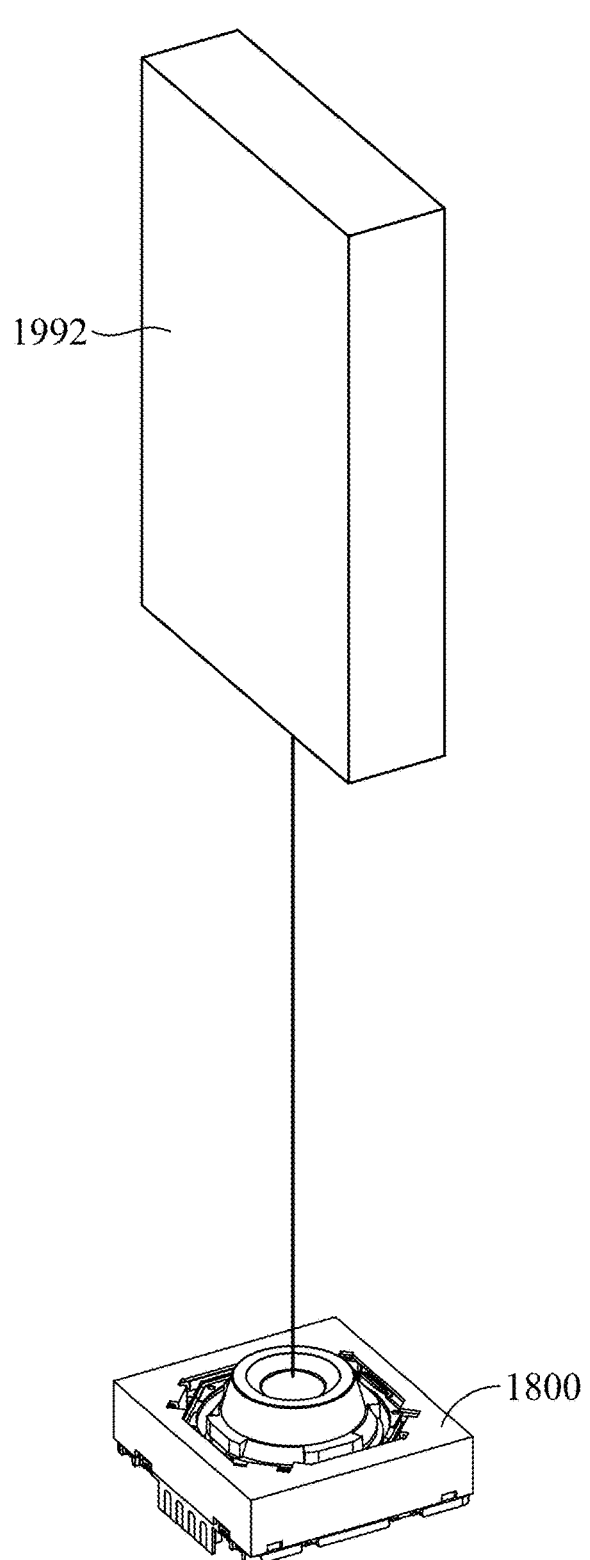
FIG. 49 is a schematic view of an image capturing device in some embodiments of the present disclosure.
Figure 50:
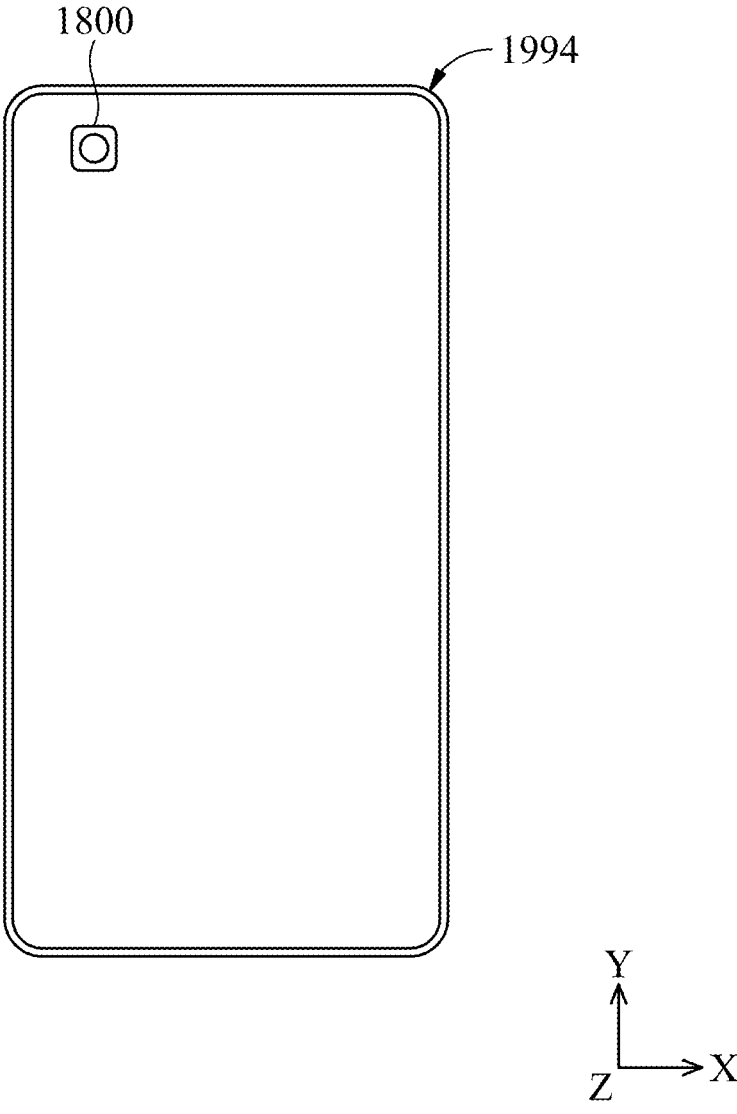
FIG. 50 is a block diagram of control architecture.

In some embodiments, if the optical element driving mechanism 1800 requires being further calibrated, such as when facing excess impact, the compensation method 1910 may further include a zero step of using an external device to perform calibration. FIG. 48 is a schematic view of an optical element driving system 1990. The optical element driving system 1990 has an external device 1992 for measuring the tilting angles of the holder 1830 at different positions, and then the data is organized as tilting angle information. In operation 1927, the tilting angle information is calculated to get corresponding tilting information. The corresponding tilting information is thus written into the adjust element 1921 to replace the corresponding tilting information before calibration. The external device 1992 may be, for example, a collimator. In some embodiments, the operation of converting the tilting angle information to the corresponding tilting information in the operation 1927 is performed by software. In some embodiments, as shown in FIG. 49, the optical element driving mechanism 1800 is disposed in an image capturing device 1994, such as a mobile device like a cell phone, and the software is the built-in software of the image capturing device 1994.

Figure 51:
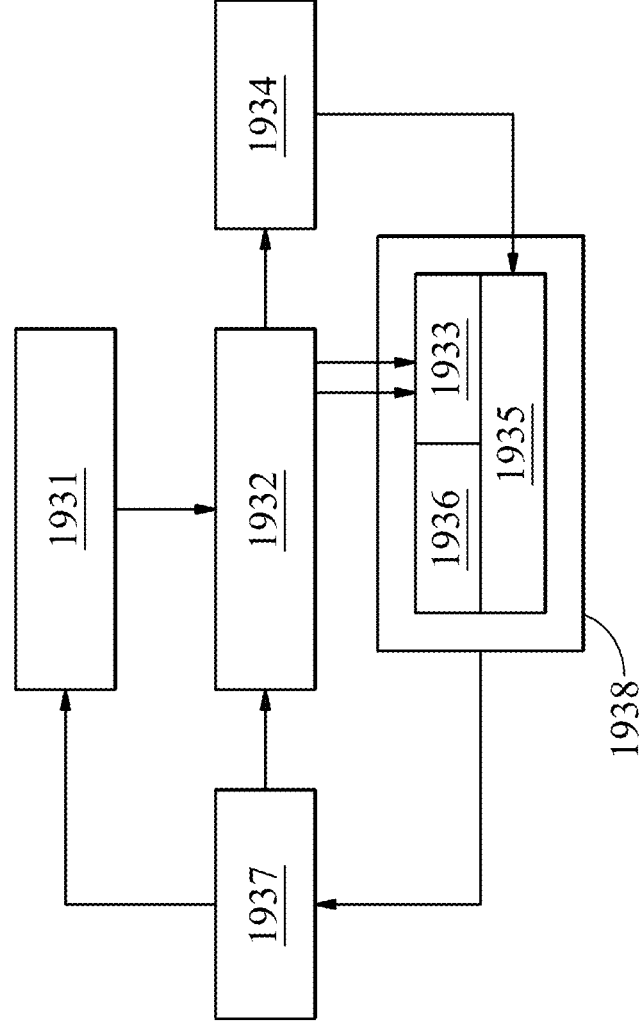
FIG. 51 is a block diagram of control architecture of the optical element driving mechanism.

FIG. 51 is a block diagram of control architecture 1930 of the optical element driving mechanism 1800. Corresponding tilting information is stored in an adjust element 1931 (such as the adjust element E11), and the corresponding tilting information may be provided to a control element 1932 (such as the control element E13), so the amount of movement of the holder 1830 may be calculated by the corresponding tilting information and corresponding position information stored in the control element 1932.

It should be noted that the corresponding tilting information of the control architecture 1920 may be gained according to the signal provided from the position sensing assembly S1 and the signal provided from the tilting of the holder 1830. However, in the control architecture 1930, the corresponding tilting information in the adjust element 1931 may be achieved by comparing an image captured by the optical element (not shown) in the optical element driving mechanism 1800 to a predetermined image. The comparing method may include spatial frequency response (SFR) method or modulation transfer function (MTF) method.

The calculated amount of movement of the holder 1830 is transformed to electrical signal by the control element 1932, and the electric signal is provided to a first driving unit 1933 and a second driving unit 1934 to allow the driving assembly 1935 moving the holder 1830 along the main axis O1, and to tilt the holder 1830 relative to the main axis, by the driving assembly 1935. Afterwards, the position of the holder 1830 (such as including the position in the main axis O1 and the tilting relative to the main axis O1) may be detected by a position sensing assembly 1936 disposed on the driving assembly 1935, and the position information is provided to the control element 1932 to perform close-loop control to the position of the holder 1830.

In some embodiments, if the optical element driving mechanism 1800 requires being further calibrated, such as when facing excess impact, the compensation method 1910 may further include a zero step of using an external device to perform calibration. FIG. 48 is a schematic view of an optical element driving system 1990. The optical element driving system 1990 has an external device 1992 for measuring the tilting angle of the holder 1830 at different positions, and then the data is organized as tilting angle information. In operation 1937, the tilting angle information is calculated to get corresponding tilting information. The corresponding tilting information is thus written into the adjust element 1931 to replace the corresponding tilting information before calibration. The external device 1992 may be, for example, a collimator. In some embodiments, the operation of converting the tilting angle information to the corresponding tilting information in the operation 1937 is performed by software. In some embodiments, as shown in FIG. 49, the optical element driving mechanism 1800 is disposed in an image capturing device 1994, such as a mobile device like a cell phone, and the software is the built-in software of the image capturing device 1994.

Furthermore, as shown in FIG. 51, the first driving unit 1933, the driving assembly 1935, and the position sensing assembly 1936 may be packaged as one piece, such as a processing module 1938, to reduce the number of the elements in the optical element driving mechanism 1800, so the process may be simplified.

Figure 52:
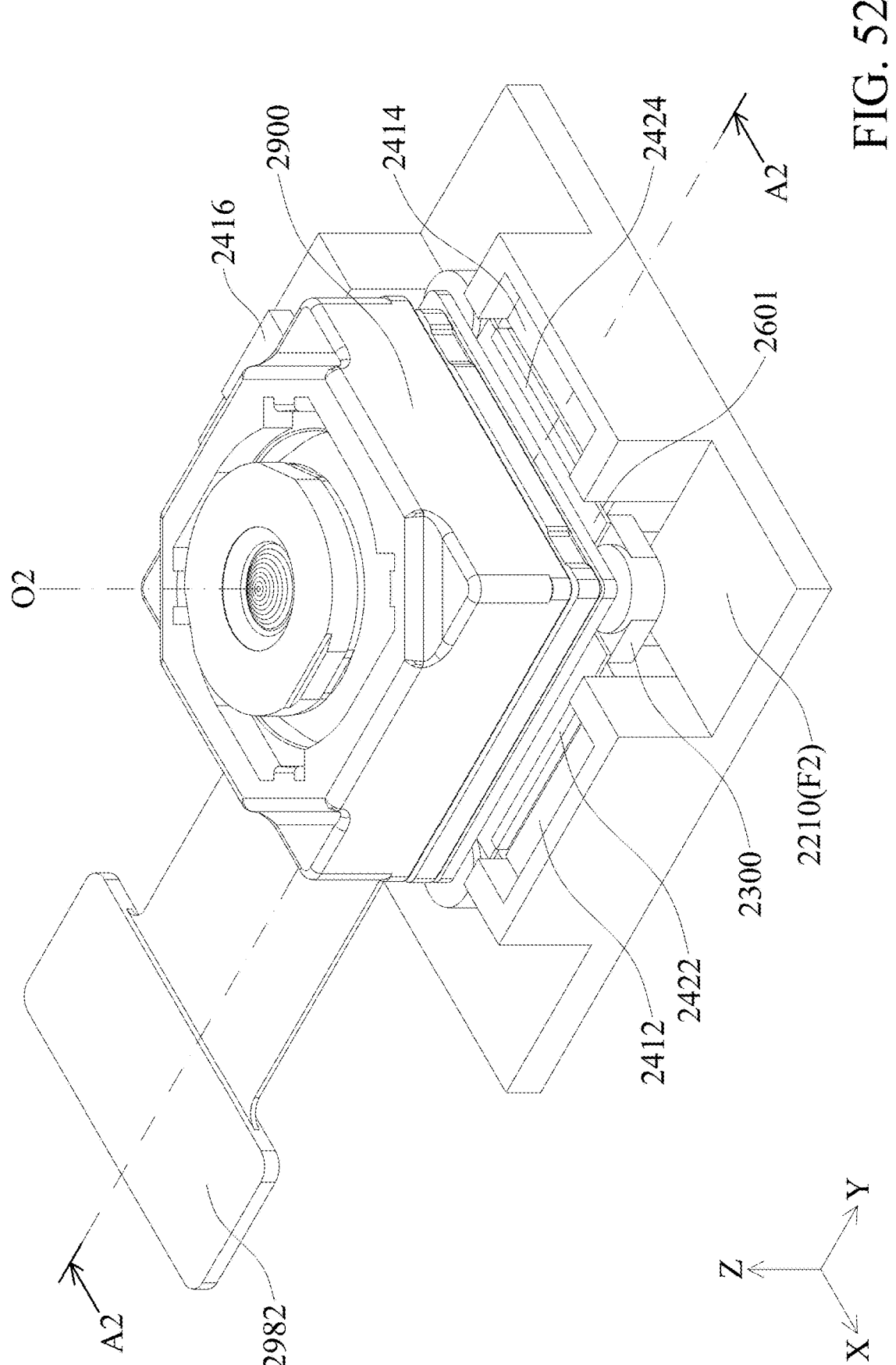
FIG. 52 is a schematic view of an optical element driving mechanisms in some embodiments of the present disclosure.
Figure 53:
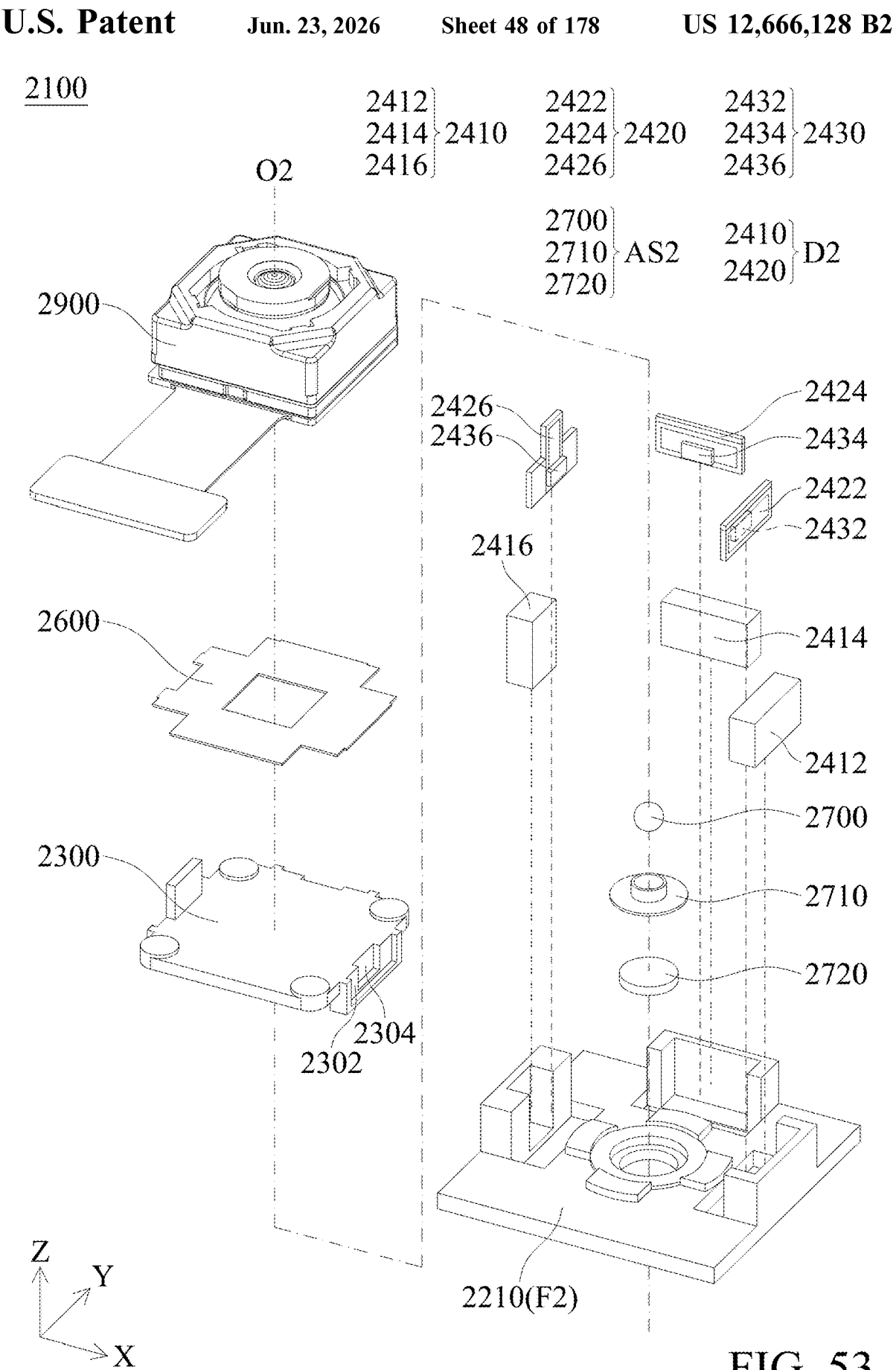
FIG. 53 is an exploded view of the optical element driving mechanism.

In some embodiments of the present disclosure, FIGS. 52 to 55 are a perspective view and an exploded view of an optical element driving mechanism 2100, a cross-sectional view illustrated along a line A2-A2 in FIG. 52, and a side view of the optical element driving mechanism 2100, respectively. In FIG. 52, the optical element driving mechanism 2100 mainly includes a base 2210, a movable portion 2300, a first magnetic assembly 2410 (includes three first magnetic elements 2412, 2414, 2416), a second magnetic assembly 2420 (includes three second magnetic elements 2422, 2424, 2426), a position sensor assembly 2430 (includes three position sensors 2432, 2434, 2436), a circuit board 2600, a support element 2700, a limit element 2710, and a magnetic permeable element 2720 arranged in a main axis O2. The optical element driving mechanism 2100 may be used for driving an optical module 2900, or may be used for driving various optical elements, such as a lens, a mirror, a prism, a beam splitter, or an aperture.

In some embodiments, the base 2210 may be called as a fixed portion F2, and the movable portion 2300 may move relative to the fixed portion F2. As a result, the optical module 2900 disposed on the movable portion 2300 may be moved by the movable portion 2300 to achieve auto focus (AF) or optical image stabilization (OIS).

In some embodiments, the first magnetic assembly 2410 and the second magnetic assembly 2420 may be called as a driving assembly D2 to drive the movable portion 2300 moving relative to the fixed portion F2. For example, the first magnetic assembly 2410 and the second magnetic assembly 2420 may include a combination of a driving coil and a driving magnet. For example, the first magnetic assembly 2410 may be a driving magnet, and the second magnetic assembly 2420 may be a driving coil. In another example, the first magnetic assembly 2410 may be a coil, and the second magnetic assembly 2420 may be a driving magnet, and is not limited thereto. The first magnetic assembly 2410 and the second magnetic assembly 2420 may be positioned on the fixed portion F2 and the movable portion 2300, respectively. In some embodiments, the positions of the fixed portion F2 and the movable portion 2300 may be interchanged. It should be noted that the interaction between the first magnetic assembly 2410 and the second magnetic assembly 2420 may create a magnetic force to move the optical module 2900 relative to the fixed portion, so auto focus (AF) or optical image stabilization (OIS) may be achieved. In some embodiments, the driving assembly D2 may include other driving elements, such as piezoelectric elements, shape memory alloys, etc.

Furthermore, the circuit board 2600 may be, for example, a flexible printed circuit, which may be affixed on the movable portion 2300 by adhesion. In some embodiments, the circuit board 2600 is electrically connected to other electronic elements disposed inside or outside the optical element driving mechanism 2100. For example, the circuit board 2600 may send electric signal to the driving assembly D2 to control the movement of the movable portion 2300.

In some embodiments, position sensor assembly 2430 may be used for detecting the position of the movable portion 2300 relative to the fixed portion F2. The position sensor assembly 2430 may include Hall sensor, magnetoresistance effect sensor (MR Sensor), giant magnetoresistance effect sensor (GMR sensor), tunneling magnetoresistance effect sensor (TMR sensor), or fluxgate sensor.

Furthermore, the position sensor assembly 2430 may include three position sensors 2432, 2434, and 2436, disposed on the same side of the optical element driving mechanism with the first magnetic elements 2412, 2414, and 2416, respectively. In some embodiments, two of the position sensors may detect magnetic fields having parallel directions, and the other position sensor may detect magnetic field having different direction to the two magnetic fields. For example, the position sensors 2432 and 2436 may detect magnetic fields in parallel directions (such as the YZ plane), and the position sensor 2434 may detect a magnetic field in the XZ plane, which is not parallel to the magnetic fields detected by the position sensors 2432 and 2436 (the magnetic field in the YZ plane). However, the present disclosure is not limited thereto. For example, in some embodiments, the position sensors 2432, 2434, and 2436 may detect magnetic fields which are not parallel. As a result, a magnetic field change in different directions may be detected.

Furthermore, a photo sensor 2970 and an optical element 2990 may at least partially overlap the driving assembly D2 (which includes the first magnetic assembly 2410 and the second magnetic assembly 2420). As a result, the space required by the optical element driving mechanism 2100 may be reduced to achieve miniaturization.

Figure 54:
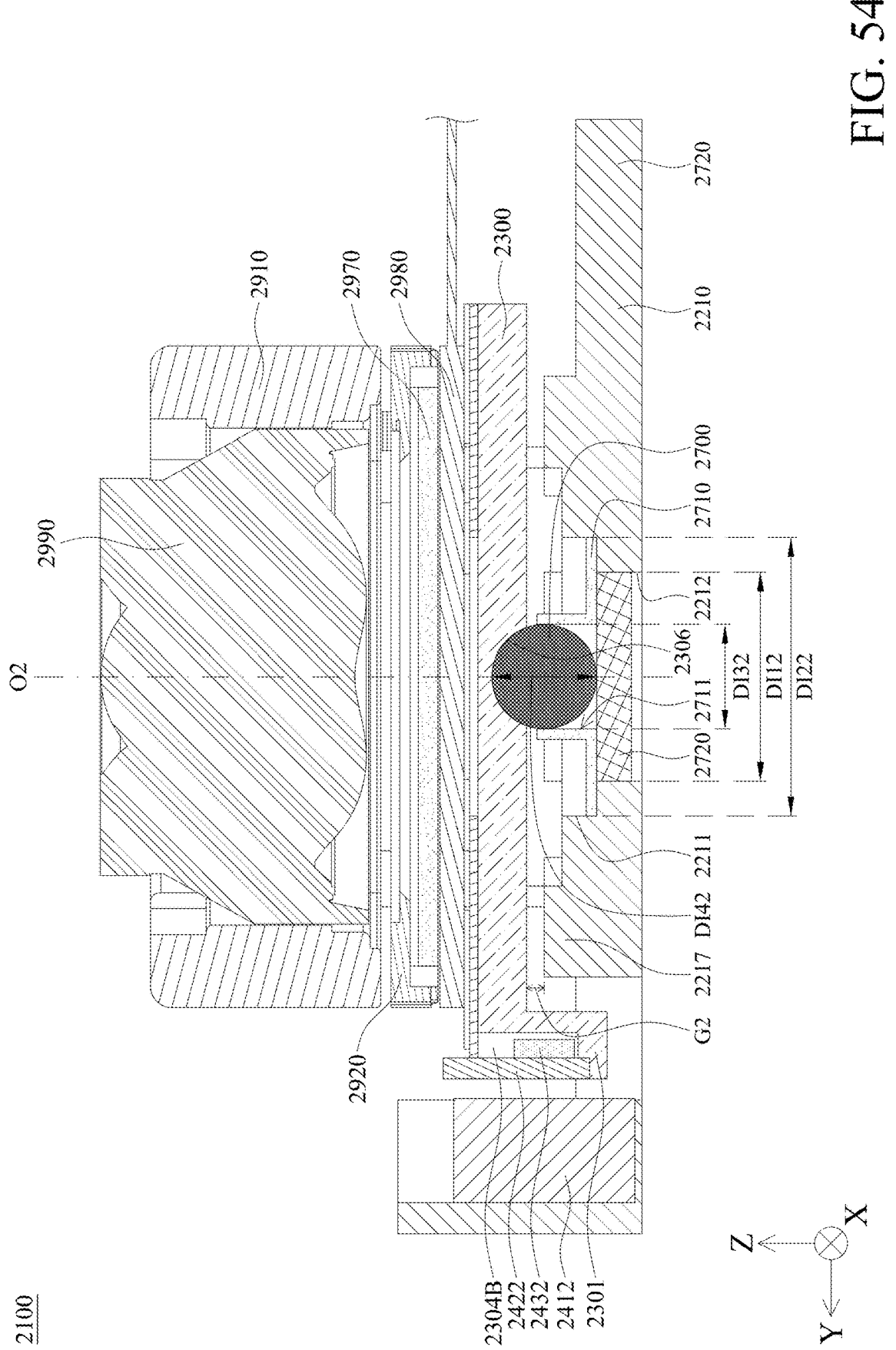
FIG. 54 is a cross-sectional view of the optical element driving mechanism.
Figure 55:
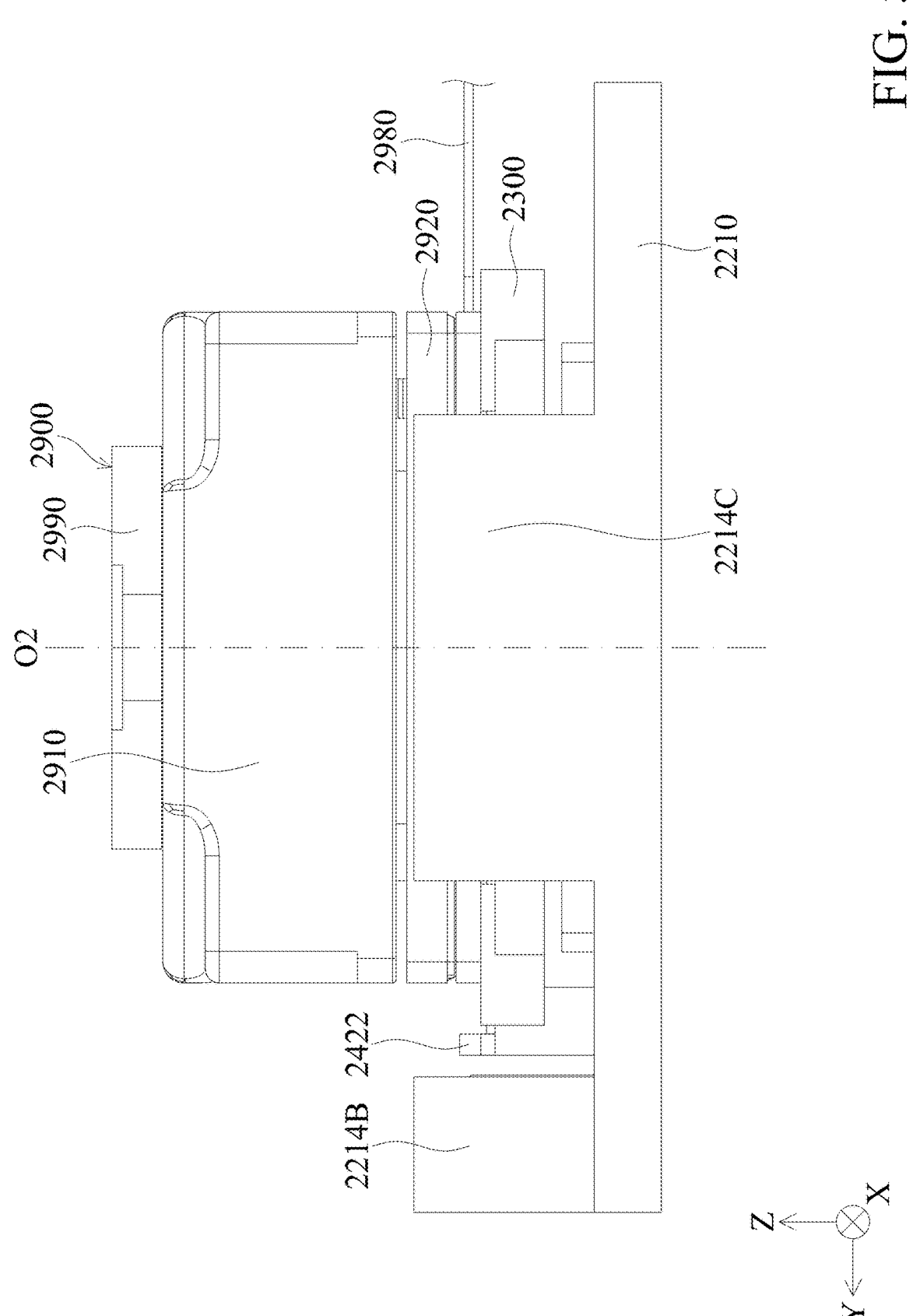
FIG. 55 is a side view of the optical element driving mechanisms.

In some embodiments, the support element 2700, the limit element 2710, and the magnetic permeable element 2720 may be called as an assist assembly AS2 to limit the movement of the movable portion 2300 relative to the fixed portion F2. As shown in FIG. 54, the support element 2700 may have a spherical shape and may be disposed in an opening 2711 of the limit element 2710, the limit element 2710 may be disposed at a recess 2211 of the base 2210, and the magnetic permeable element 2720 may be disposed at an opening 2212 of the base 2210. The diameter DI12 of the opening 221 is less than the diameter DI22 of the limit element 2710 to prevent the limit element 2710 falling out from the opening 2212.

The support element 2700 and the magnetic permeable element 2720 may include metal, and a magnetic force may be generated between the support element 2700 and the magnetic permeable element 2720 to fix the position of the support element 2700. The diameter DI32 of the opening 2711 of the limit element 2710 may be greater or substantially equal to the diameter DI42 of the support element 2700 to allow the support element 2700 to be disposed in the opening 2711 of the limit element 2710, and the moving range of the support element 2700 may be restricted. In some embodiments, the support element 2700 has an adjustable range rather than fully fixed in the opening 2711. Furthermore, in the Z direction, the diameter DI42 of the support element 2700 (maximum dimension) is greater than the distance G2 between the limit portion 2217 and the movable portion 2230. In other words, when the movable portion 2300 moving relative to the fixed portion, the support element 2700 does not fall out between the movable portion 2300 and the fixed portion F2.

Figure 56:
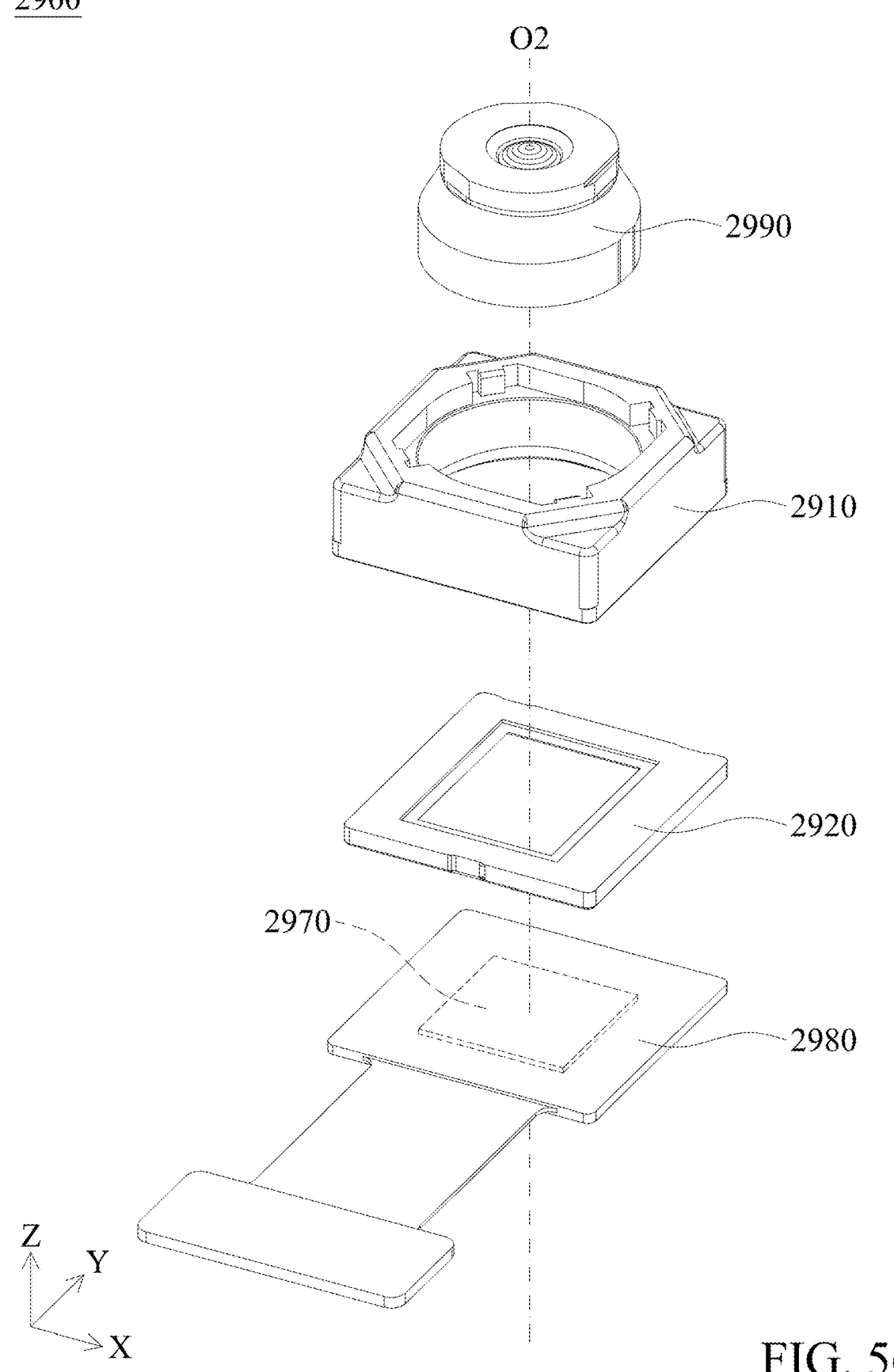
FIG. 56 is an exploded view of the optical module.

FIG. 56 is an exploded view of the optical module 2900. The optical module 2900 may include a case 2910, a base 2920, a substrate 2980, a photo sensor 2970 disposed on the substrate 2980, and an optical element 2990 disposed between the case 2910 and the base 2920. It should be noted that a case opening and a bottom opening are formed on the case 2910 and the base 2920, respectively. The center of the case opening corresponds to the main axis O2 of the optical element 2990, and the base opening corresponds to a photo sensor 2970, and the photo sensor 2970 may be disposed on a substrate 2980. As a result, the optical element 2990 disposed in the optical module 2900 may focus with the photo sensor 2970 along the main axis O2 (i.e. Z direction).

Furthermore, a moving assembly (not shown) which is movable relative to the case 2910 and the base 2920 may be disposed in the optical module 2900, and the optical element 2990 may be fixed on the movable assembly, such as by locking, gluing, or engaging. Furthermore, additional driving component may be provided in the optical module 2900, such as an assembly of a magnet and a coil (not shown), to move the optical element 2990 with the movable assembly in a direction that is different than the moving direction of the movable portion 2300. As a result, the optical element 2990 may be moved in more directions.

The substrate 2980 may be, for example, a flexible printed circuit, which may be affixed on the base 2920 by adhesion. In some embodiments, the substrate 2980 is electrically connected to other electronic elements disposed inside or outside the optical module 2900. For example, the substrate 2980 may send electric signal to the driving component to control the movement of the movable assembly in X, Y or Z direction, and thus achieving. In some embodiments, as shown in FIG. 52, an extension 2982 of the substrate 2980 and an extension 2601 of the circuit board 2600 may position at different sides of the optical element driving mechanism 2100 to be electrically connected to different elements, such as control units. Furthermore, as shown in FIG. 54, the circuit board 2600 and the substrate 2980 may partially overlap each other in the Z axis to reduce the amount of space required.

Figure 57:
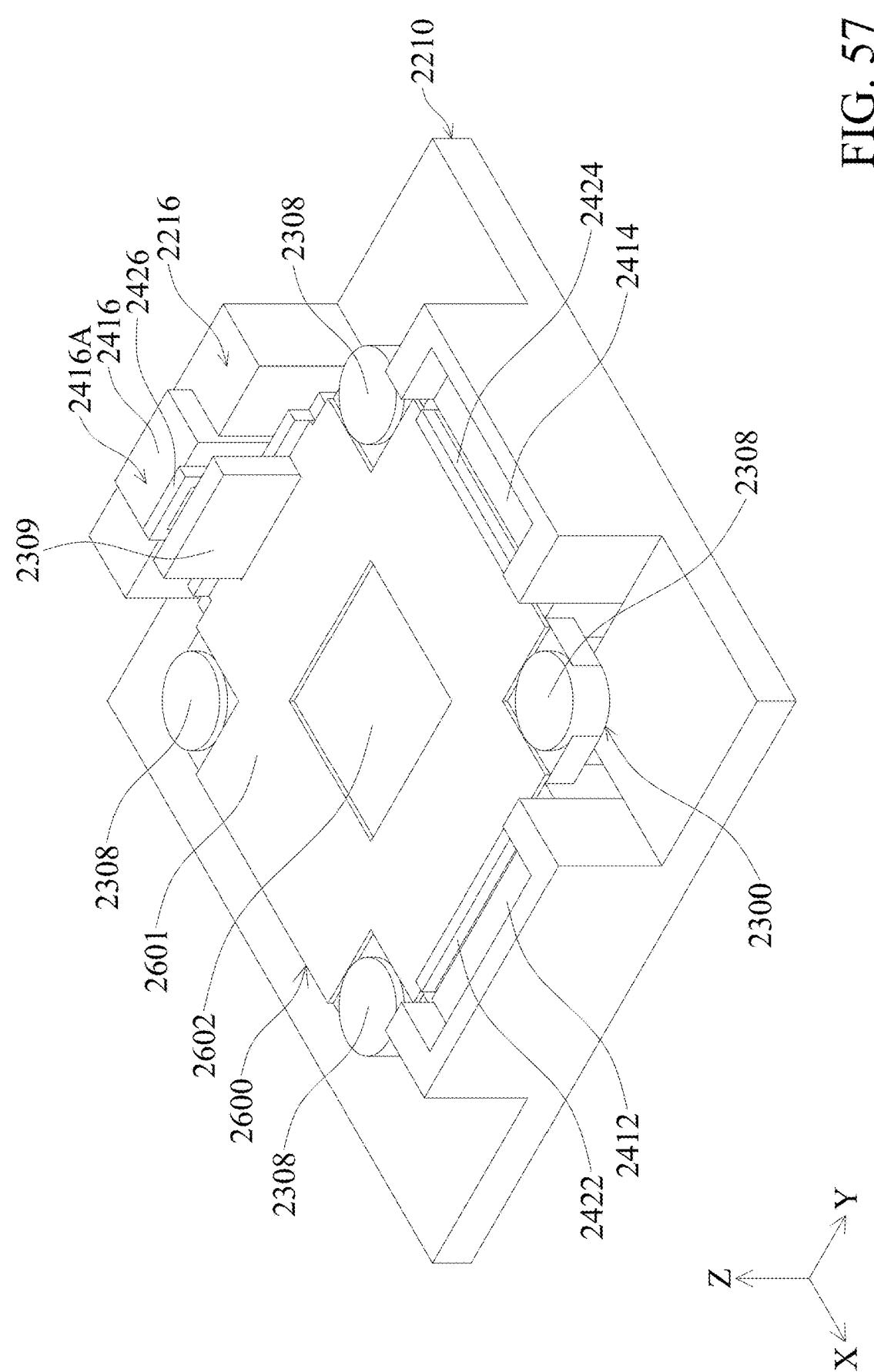
FIG. 57 is a schematic view of some elements of the optical element driving mechanism.

FIG. 57 is a schematic view of some elements of the optical element driving mechanism 2100. The circuit board 2600 may be disposed on the movable portion 2300. An opening 2602 may formed on the circuit board 2600, and other elements may be disposed in the opening 2602 to achieve miniaturization. In some embodiments, a top surface 2216 of the base 2210 may be lower than a top surface 2416A of the first magnetic element 2416 in the Z direction, so the first magnetic element 2416 which is greater in the Z direction than in other directions may be disposed on the movable portion 2300 to increase the driving force of the driving assembly D2 in the Z direction. However, the present disclosure is not limited thereto. The top surface 2416A of the first magnetic element 2416 may be lower than the top surface 2216 of the base 2210 to achieve miniaturization.

FIG. 58 is a schematic view of some elements of the optical element driving mechanism 2100. It should be noted that at least one of the first magnetic elements 2412, 2414, and 2416 may have a different shape to other first magnetic elements. For example, the height H12 of the first magnetic element 2412 or the height H22 of the first magnetic element 2414 (the dimension in the Z direction) may be lower than the height H32 of the first magnetic element 2416, and the length L12 of the first magnetic element 2412 or the length L22 of the first magnetic element 2414 (the dimension in the X or Y direction) may be greater than the length L32 of the first magnetic element 2416 to allow the first magnetic elements 2412, 2414, and 2416 to provide driving forces in different directions. Alternatively, in some embodiments, the sizes of the first magnetic elements 2412, 2414, and 2416 may be identical, but disposed in different ways. For example, the first magnetic elements 2412 and 2414 may be disposed in a horizontal way, and the first magnetic element 2416 may be disposed in a vertical way, so the driving forces in different directions may be changed.

Furthermore, FIG. 58 also shows the magnetic pole directions of the first magnetic elements 2412, 2414, and 2416 if the first magnetic elements 2412, 2414, and 2416 are magnets. For example, the first magnetic elements 2412, 2414, and 2416 may be multipolar magnets having different magnetic pole directions. As shown in FIG. 58, the magnetic pole directions of the first magnetic elements 2412 and 2414 on their upper sides and lower sides are different in the Z direction, and the magnetic pole directions of the first magnetic element 2416 on its upper side and lower side are different in the Y direction. In other words, the first magnetic elements 2412, 2414, and 2416 may have different magnetic pole directions from each other.

The second magnetic elements 2422, 2424, and 2426 may have shapes that correspond to the first magnetic elements 2412, 2414, and 2416 to provide current with different directions. As shown in FIG. 58, the main current direction of the second magnetic element 2422 is in the Y direction, the main current direction of the second magnetic element 2424 is in the X direction, and the main current direction of the second magnetic element 2426 is in the Z direction. As a result, the electromagnetic induction between the first magnetic element 2412 and the second magnetic element 2422 may rotate the movable portion 2300 relative to the Y axis, the electromagnetic induction between the first magnetic element 2414 and the second magnetic element 2424 may rotate the movable portion 2300 relative to the X axis, and the electromagnetic induction between the first magnetic element 2416 and the second magnetic element 2426 may rotate the movable portion 2300 relative to the Z axis, so the movable portion 2300 may be rotated in different directions.

Figure 59:
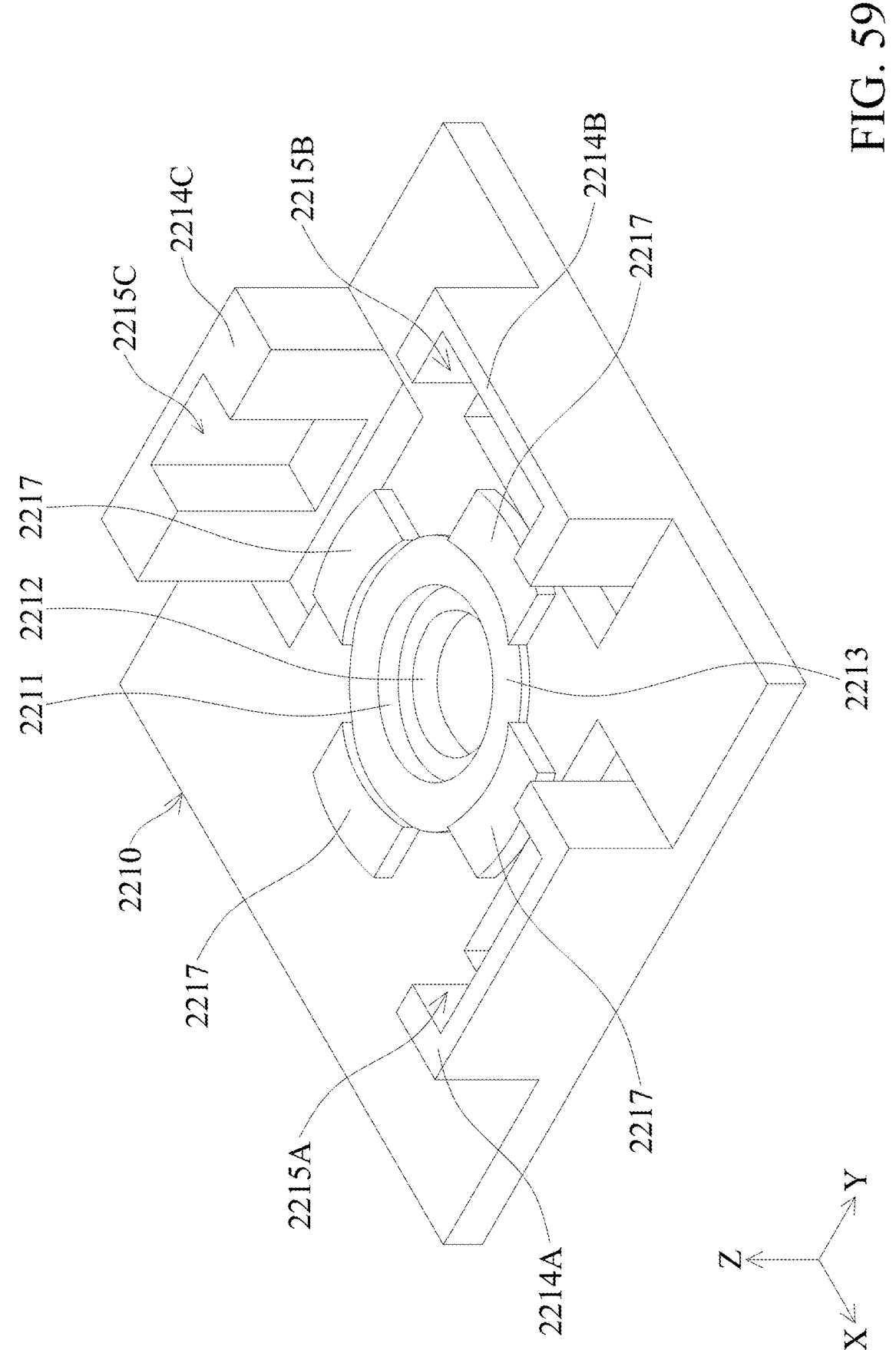
FIG. 59 is a schematic view of the base.

FIG. 59 is a schematic view of the base 2210. The base 2210 may include a recess 2211 and an opening 2212 in the recess 2211. The limit element 2710 may be disposed in the recess 2211, and the magnetic permeable element 2720 may be disposed in the opening 2212. Furthermore, in some embodiments, a ring portion 2213 that is surrounding the recess 2211 may be provided to further secure the limit element 2710.

Protrusions 2214A, 2214B and 2214C may be formed on different sides of the opening 2212 of the base 2210, and may have recesses 2215A, 2215B, and 2215C for accommodating the first magnetic elements 2412, 2414, and 2416, respectively. The first magnetic elements 2412, 2414, and 2416 have different sizes, so the protrusions 2214A, 2214B and 2214C, and the recesses 2215A, 2215B, and 2215C may have different sizes to meet different requirements.

In some embodiments, the first magnetic elements 2412, 2414, and 2416 have different lengths along the Z axis, but the height of the protrusions 2214A, 2214B, and 2214C may be substantially identical along the Z axis to balance the weight of the base 2210. In some embodiments, the base 2210 may have a limit portion 2217 that is surrounding the opening 2212 and extending in the Z direction, and is used for limiting the moving range of the movable portion 2300 relative to the fixed portion F2.

Figure 60:
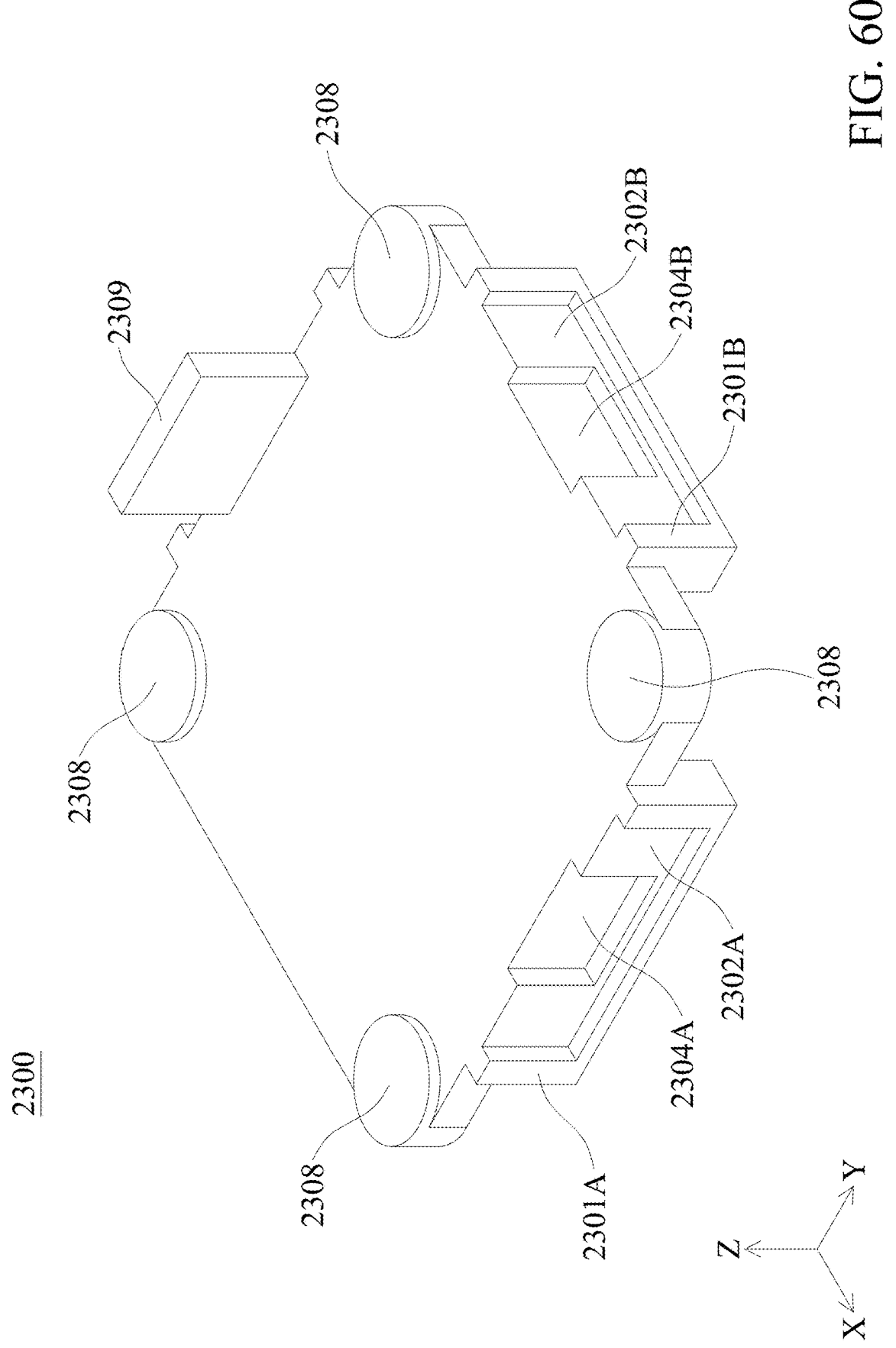
FIG. 60 and FIG. 61 are schematic views of the movable portion.
Figure 61:
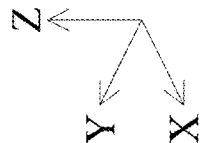

FIG. 60 and FIG. 61 are schematic views of the movable portion 2300 viewed in different directions. The movable portion 2300 may have protrusions 2301A, 2301B, and 2301C on different sides of the movable portion 2300, and recesses 2302A, 2302B, 2302C (may be called as a recess 2302) and recesses 2304A, 2304B, 2304C (may be called as a recess 2304) may be formed in the protrusions 2301A, 2301B, and 2301C, wherein the recesses 2304A, 2304B, 2304C may be formed in the recesses 2302A, 2302B, and 2302C, respectively. The recesses 2302A, 2302B, and 2302C may be used for accommodating the second magnetic elements 2422, 2424, and 2426, and the recesses 2304A, 2304B, 2304C may be used for accommodating the position sensors 2432, 2434 and 2436, respectively.

A concave portion 2306 may be positioned at the back side of the movable portion 2300, and the concave portion 2306 may have a shape corresponding to the support element 2700 for accommodating the support element 2700, such as a half-spherical shape. Columns 2308 may be positioned at the corners of the movable portion 2300 to fix the position of the circuit board. Furthermore, in some embodiments, the first magnetic element 2416 and the second magnetic element 2426 have greater sizes in the Z direction, so an additional wall 2309 may be provided on the movable portion 2300. The wall 2309 corresponds to the position of the first magnetic element 2416 and the second magnetic element 2426. For example, it may be adjacent to the first magnetic element 2416 and the second magnetic element 2426, to prevent the first magnetic element 2416 and the second magnetic element 2426 from being damaged when the movable portion 2300 is moving relative to the fixed portion F2.

Figure 62:
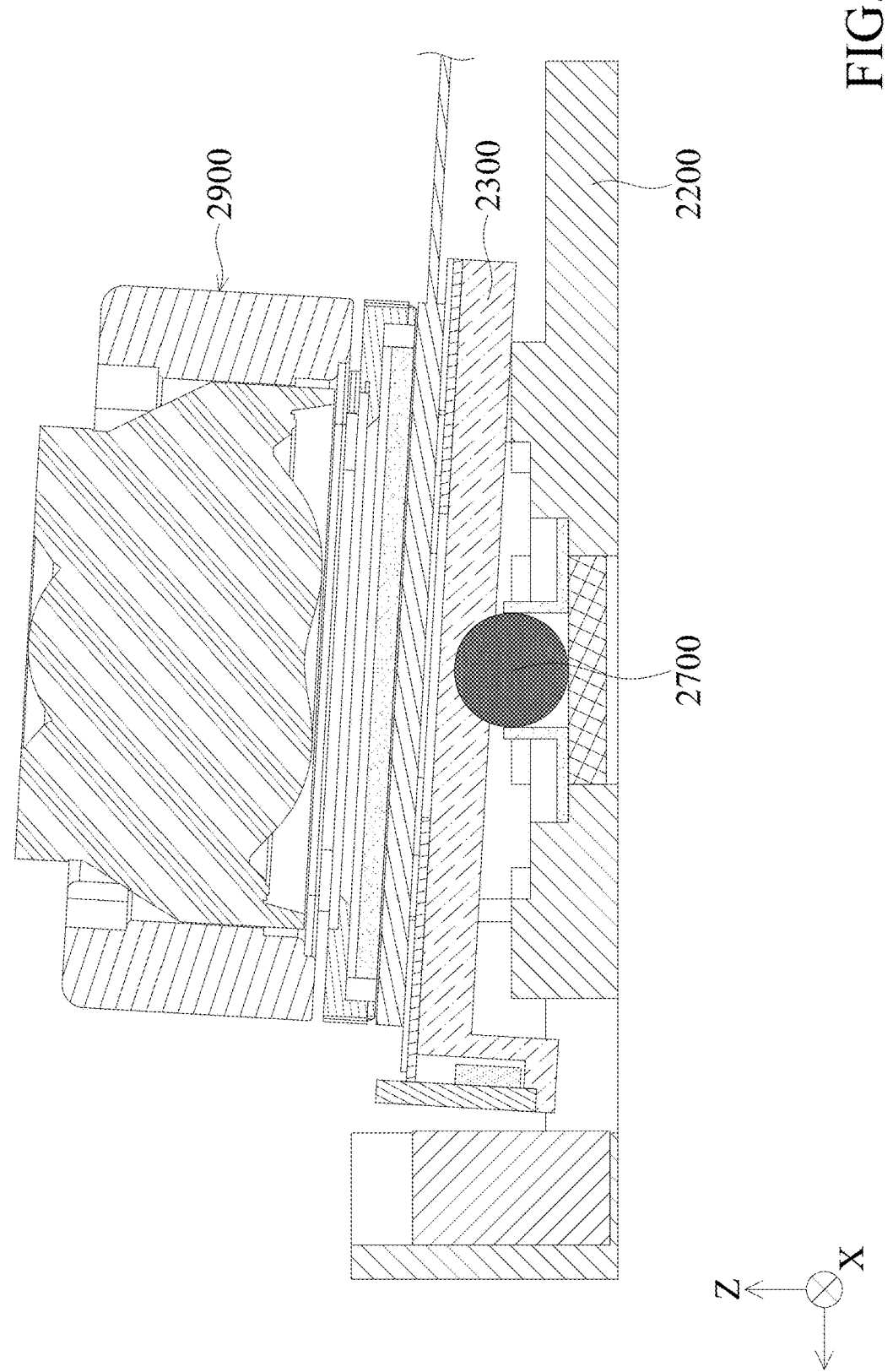
FIG. 62 is a cross-sectional view of the optical element driving mechanism when the optical element driving mechanism is moving in a direction.

FIG. 62 is a schematic view when the movable portion 2300 of the optical element driving mechanism 2100 and other elements disposed on the movable portion 2300 rotate relative to the fixed portion F2 in X axis, and FIG. 63 is a schematic view when the movable portion 2300 of the optical element driving mechanism 2100 and other elements disposed on the movable portion 2300 rotate relative to the fixed portion F2 along the Z axis. As shown in FIG. 11 and FIG. 63, the movable portion 2300 and the optical module 2900 disposed on the movable portion 2300 may rotate by the driving force generated by the driving assembly D2 in different directions using the spherical support element 2700 as a fulcrum. Although the embodiments in FIG. 62 and FIG. 63 only show the conditions that the movable portion 2300 rotate relative to a single axis, but it should be realized that the movable portion may be rotate relative to more than one axis to achieve optical image stabilization. For example, it may rotate in the X, Y and Z axes.

Figure 64:
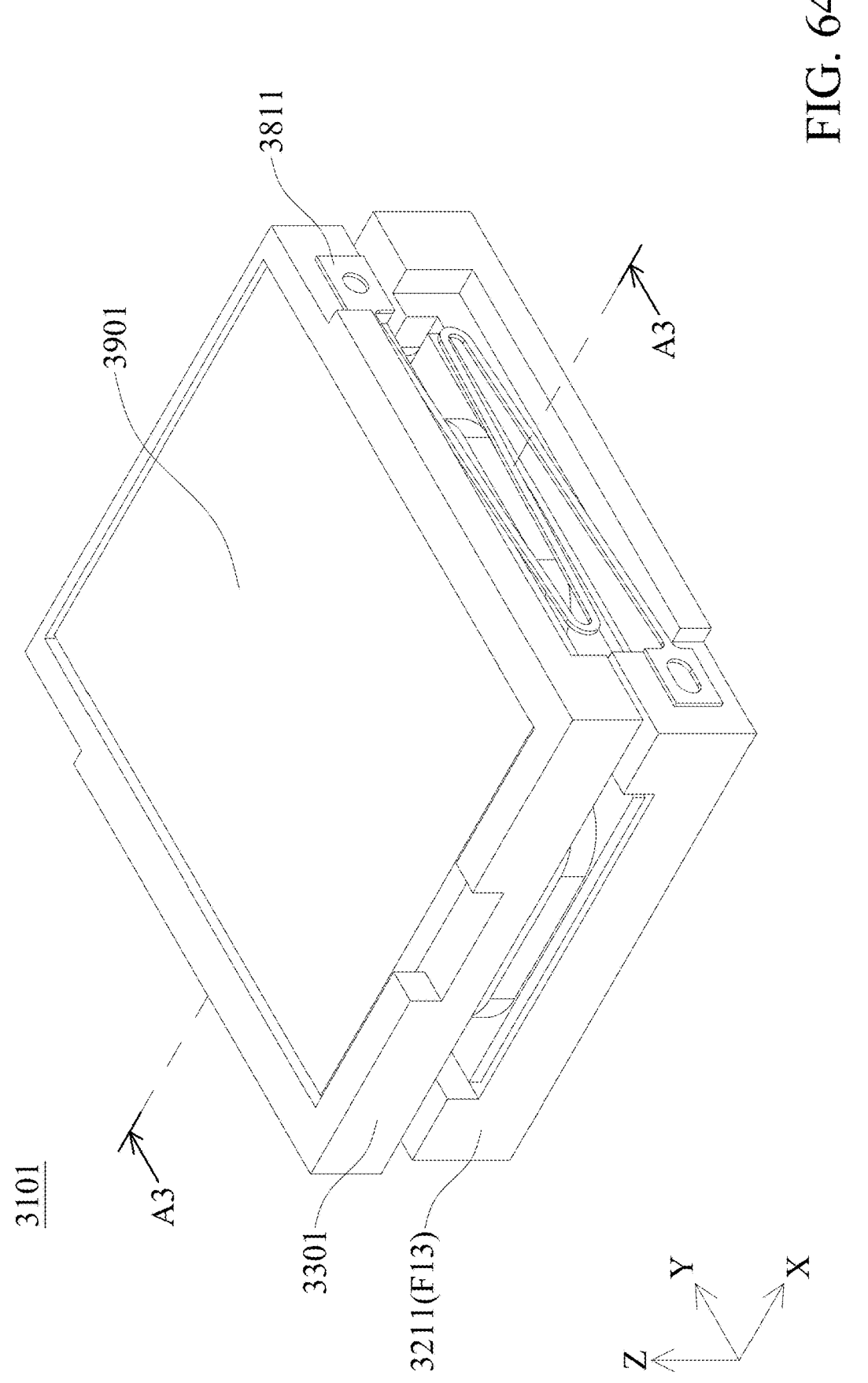
FIG. 64 is a perspective view of an optical element driving mechanism in some embodiments of the present disclosure.
Figure 65:
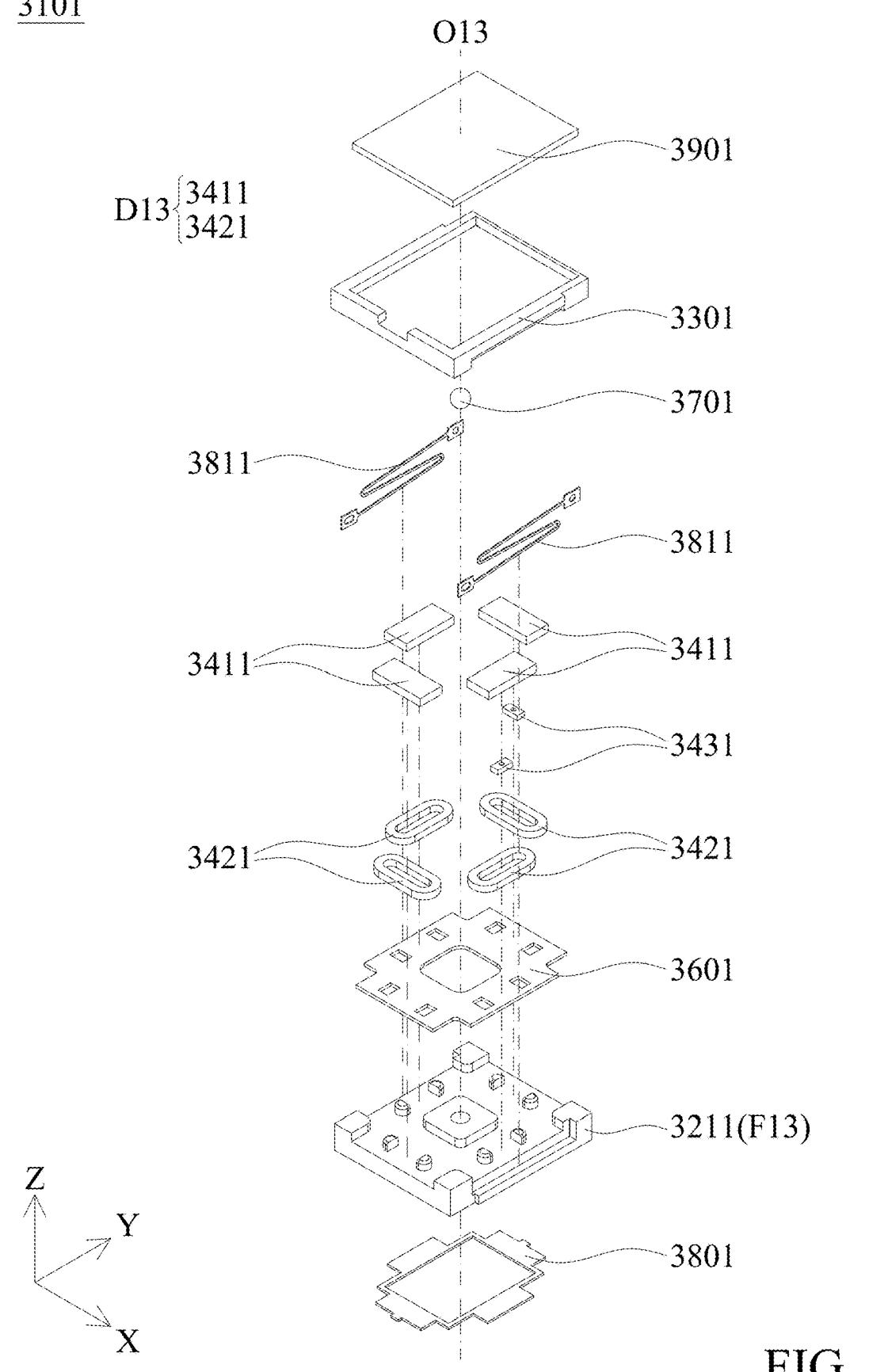
FIG. 65 is an exploded view of the optical element driving mechanism.
Figure 66:
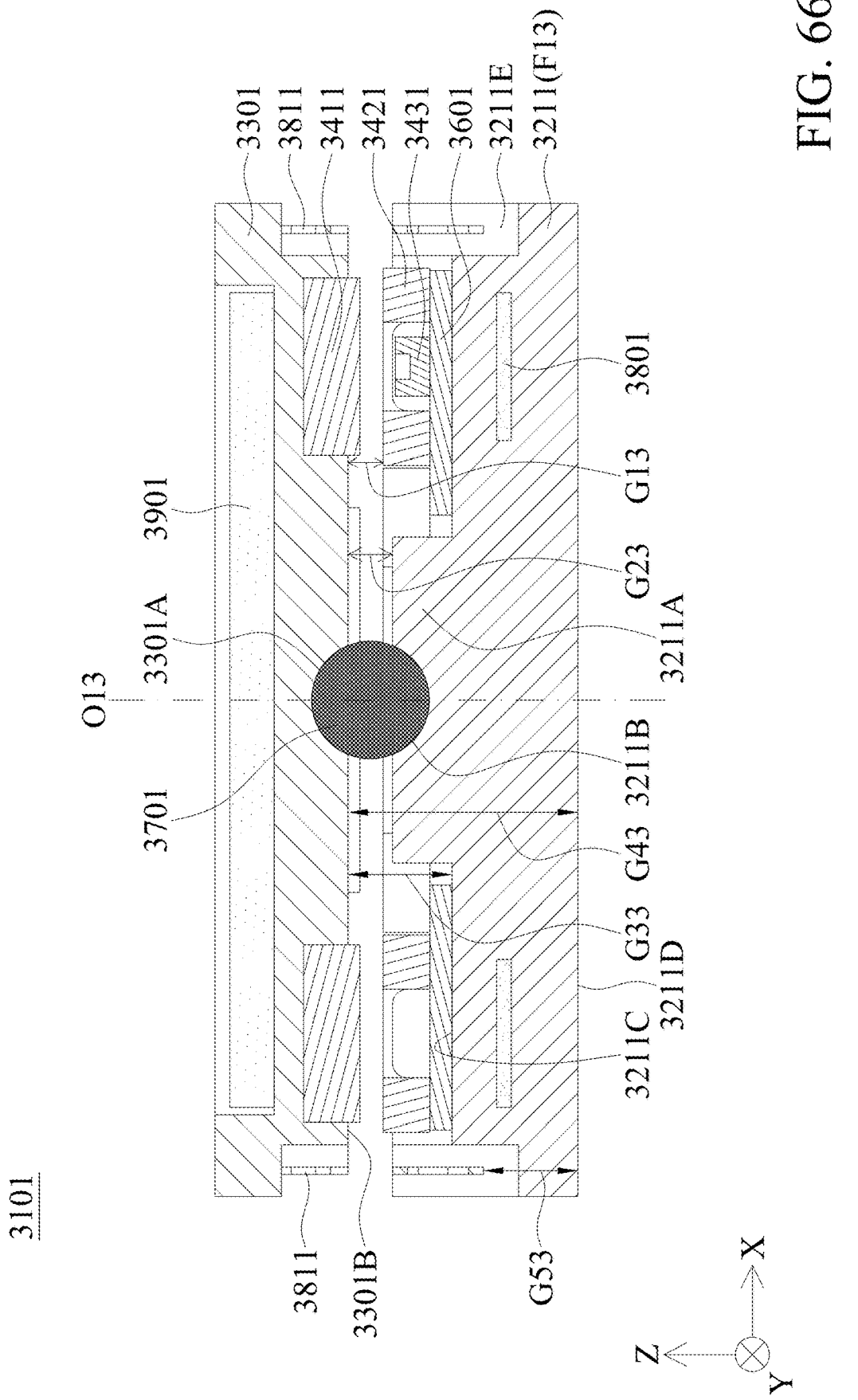
FIG. 66 is a cross-sectional view of the optical element driving mechanism.

In some embodiments of the present disclosure, FIG. 64 to FIG. 66 are a perspective view and an exploded view of an optical element driving mechanism 3101, and a cross-sectional view illustrated along a line A3-A3 in FIG. 64, respectively. In FIG. 65, the optical element driving mechanism 3101 mainly includes a base 3211 (also referred to as a fixed portion F13), a movable portion 3301, a first magnetic element 3411, a second magnetic element 3421, a position sensor 3431, a circuit board 3601, a support element 3701, a magnetic permeable element 3801, and resilient elements 3811. The optical element driving mechanism 3101 may be used for driving an optical module 3901, or it may be used for driving various optical elements, such as a lens, a mirror, a prism, a beam splitter, or an aperture.

In some embodiments, the first magnetic element 3411 and the second magnetic element 3421 may serve as a driving assembly D13 to drive the movable portion 3301 to move relative to the fixed portion F13. For example, the first magnetic element 3411 and the second magnetic element 3421 may include a combination of a driving coil and a driving magnet. For example, the first magnetic element 3411 may be a driving magnet, and the second magnetic element 3421 may be a driving coil. In another example, the first magnetic element 3411 may be a coil, and the second magnetic element 3421 may be a driving magnet, and is not limited thereto. The first magnetic element 3411 and the second magnetic element 3421 may be positioned on the fixed portion F13 and the movable portion 3301, respectively. In some embodiments, the positions of the fixed portion F13 and the movable portion 3301 may be interchanged, depending on design requirement. As a result, the movable portion 3301 may be moved relative to the fixed portion F13 through the driving assembly D13, and the optical module 3901 disposed on the movable portion 3301 may also be moved with the movable portion 3301 to achieve auto focus (AF) or optical image stabilization (OIS). In some embodiments, the driving assembly D13 may include other driving elements, such as piezoelectric elements, shape memory alloys, etc.

In some embodiments, the first magnetic element 3411 may extend in a direction that is perpendicular to the main axis O13, such as the X axis or Y axis, to allow the movable portion 3311 rotate relative to the X axis or Y axis. In some embodiments, as shown in FIG. 66, the driving assembly D13 and the optical module 3901 do not overlap each other in a direction that is perpendicular to the main axis O13 to achieve miniaturization. It should be noted that the interaction between the first magnetic element 3411 and the second magnetic element 3421 may create a magnetic force to move the optical module 3901 relative to the fixed portion F13, so auto focus (AF) or optical image stabilization (OIS) may be achieved.

Furthermore, the circuit board 3601 may, for example, be a flexible printed circuit, which may be affixed to the fixed portion F13 by adhesion. In some embodiments, the circuit board 3601 is electrically connected to other electronic elements disposed inside or outside the optical element driving mechanism 3101. For example, the circuit board 3601 may send electric signals to the driving assembly D13 to control the movement of the movable portion 3301. In some embodiments, the circuit board 3601 may be positioned between the base 3211 and the movable portion 3301 along the Z axis.

In some embodiments, a position sensor 3431 may be disposed in the optical element driving mechanism 3101 to detect the position of the movable portion 3301 relative to the fixed portion F13. The position sensor 3431 may include a Hall sensor, a magnetoresistance effect sensor (MR Sensor), a giant magnetoresistance effect sensor (GMR sensor), a tunneling magnetoresistance effect sensor (TMR sensor), or a fluxgate sensor. For example, a plurality of convex portions 3211F may be positioned on the base 3211, the position sensor 3431 may be positioned between two convex portions 3211F, and the second magnetic element 3421 may surround the two convex portions 3211F and the position sensor 3431 to protect the position sensor 3431.

The support element 3701 may have a spherical shape for connecting the movable portion 3301 and the fixed portion F13 to allow the movable portion 3301 may be moved relative to the fixed portion F13 through the support element 3701. In detail, the movable portion includes a recess 3301A, the base 3211 includes a convex portion 32111A extending to the movable portion 3301 and a concave portion 3211B positioned in the convex portion 3211A. The support element 3701 is partially disposed in the recess 3301A of the movable portion 3301 and the concave portion 3211B of the base 3211 to limit the position of the support element 3701. As shown in FIG. 66, the recess 3301A and the concave portion 3211B has half-spherical shapes, so the spherical support element 3701 may roll in the recess 3301A and the concave portion 3211B, and the friction between the movable portion 3301 and the fixed portion F13 may be reduced. As a result, the movable portion 3301 may rotate relative to the fixed portion F13.

As shown in FIG. 66, the distance between the second magnetic element 3421 and a bottom surface 3301B of the movable portion 3301 is G13, the distance between the convex portion 3211A and the bottom surface 3301B of the movable portion 3301 is G23, and the distance G13 is less than the distance G23. As a result, the electromagnetic forces of the first magnetic element 3411 disposed on the movable portion 3301 and the second magnetic element 3421 disposed on the base 3211 may be increased. Furthermore, the base 3211 has a top surface 3211C and a bottom surface 3211D, the distance G33 between the top surface 3211C and the movable portion 3301 is less than the distance G43 between the bottom surface 3211D and the movable portion 3301, and the distance G53 between the resilient element 3811 and the bottom surface 3211D is less than the distance G43 between the bottom surface 3211D and the movable portion 3301 along the main axis O13. As a result, the size of the optical element driving mechanism 3101 in the main axis O13 may be reduced to achieve miniaturization.

Figure 68:
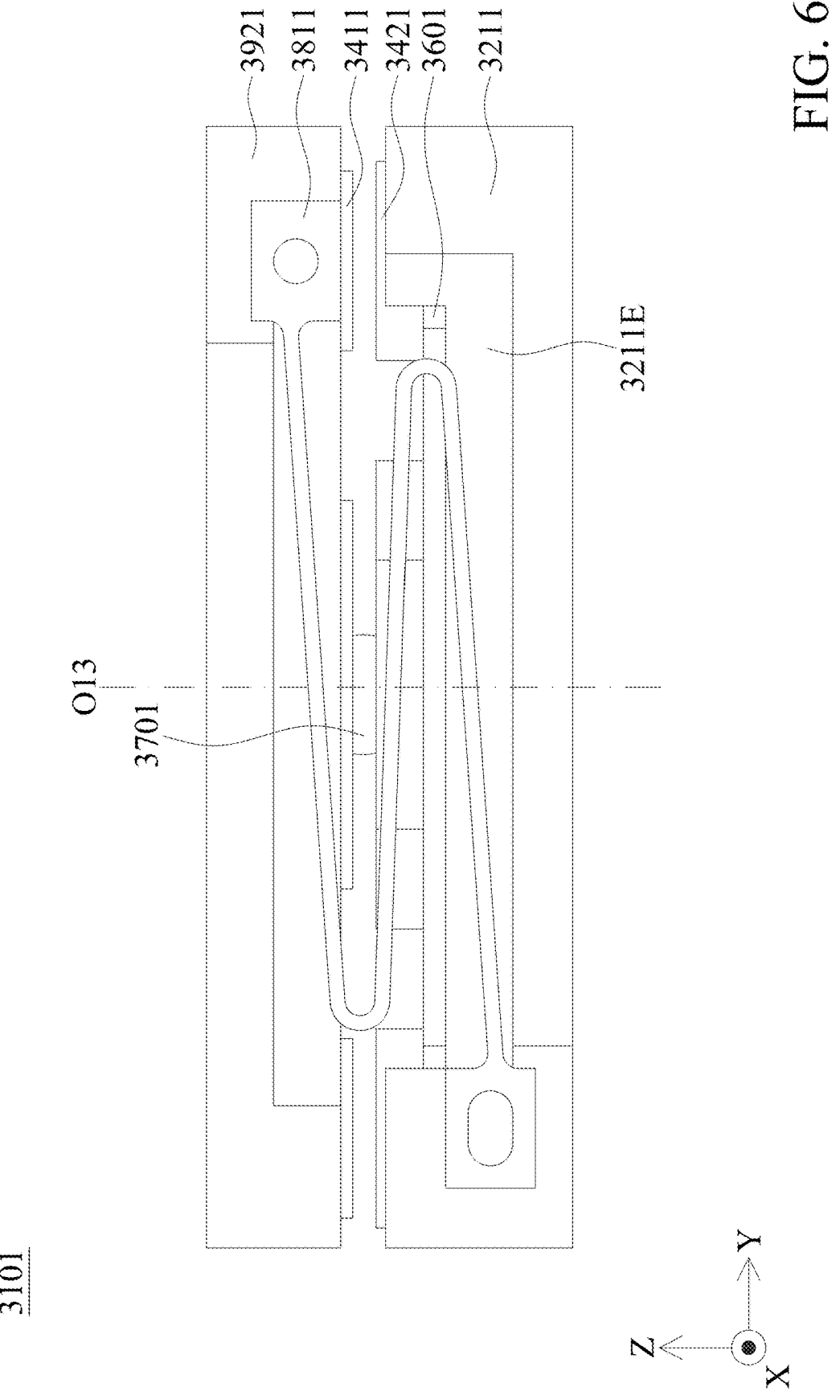
FIG. 68 is a side view of the optical element driving mechanism.

The resilient elements 3811 may be disposed on the sides of the optical element driving mechanism 3101, such as disposed on opposite sides (i.e. the main axis O13 is positioned between the two resilient elements 3811), and may be disposed on a plane that is parallel to the main axis O13. Furthermore, the resilient element 3811 may be S-shaped. The resilient element 3811 may connect the fixed portion F13 (the base 3211) and the movable portion 3301 to restrict the movable range of the movable portion 3301 relative to the fixed portion F13. Moreover, as shown in FIG. 66, FIG. 67, and FIG. 68, the base 3211 may has a recess 3211E, and the resilient element 3811 may be partially disposed in the recess 3211E to protect the resilient element 3811 from being damaged. The resilient elements 3811 does not overlap the driving assembly D13 when viewed along the main axis O13, so the size of the optical element driving mechanism 3101 in Z axis may be reduced.

Furthermore, as shown in FIG. 66, the magnetic permeable element 3801 may be disposed in the base 3211, such as embedded in the base 3211 and does not expose from the base 3211. The magnetic permeable element 3801, the first magnetic element 3411 and the second magnetic element 3421 may at least partially overlap each other along the main axis O13, and the material of the magnetic permeable element 3801 may include metal. As a result, the magnetic field of the first magnetic element 3411 and the second magnetic element 3421 may be adjusted, and miniaturization may be achieved.

Figure 69:
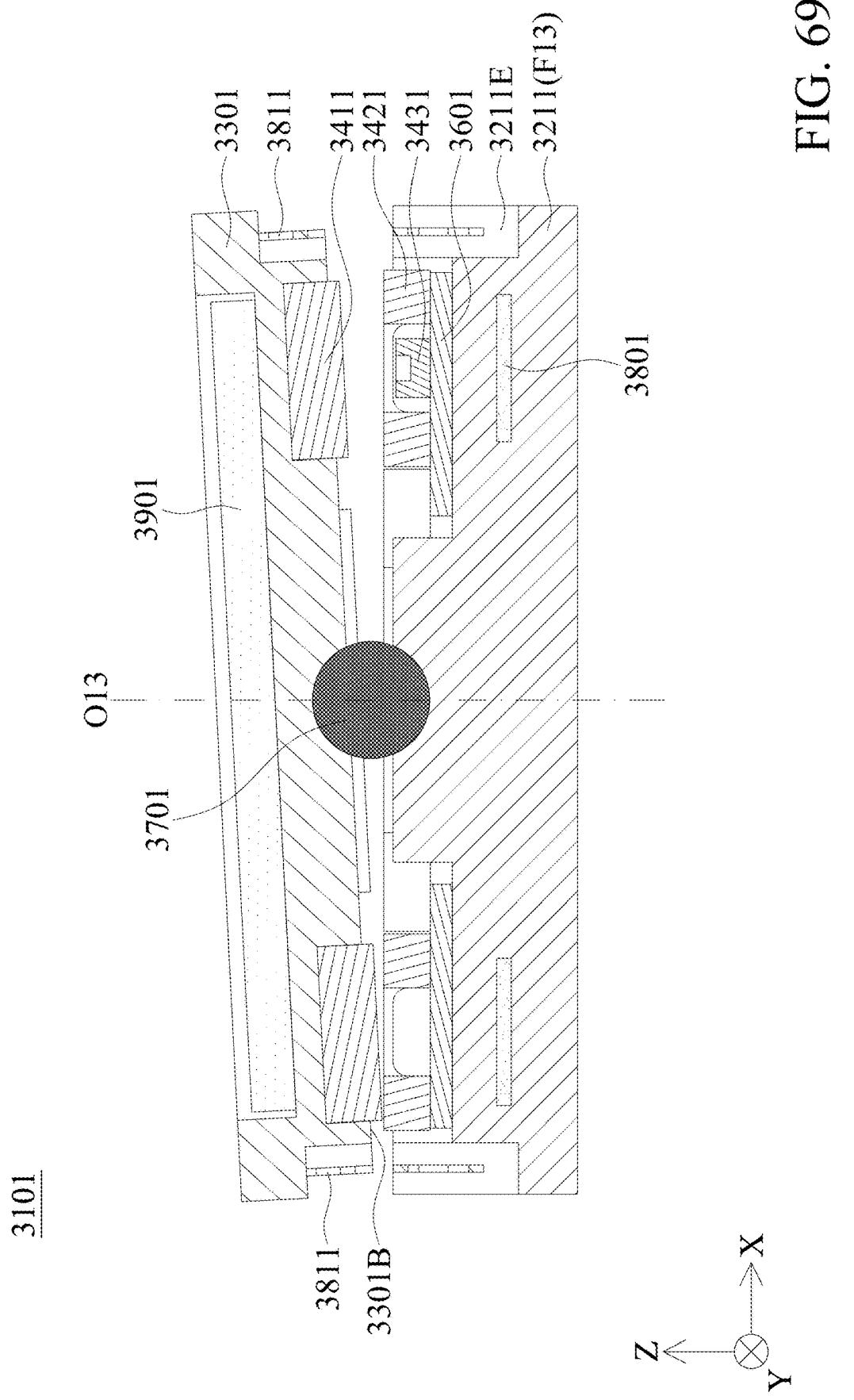
FIG. 69 is a schematic view of the optical element driving mechanism when the optical element driving mechanism is operating.

FIG. 69 is a cross-sectional view of the movable portion 3301 of the optical element driving mechanism 3101 and other elements disposed on the movable portion 3301 when these elements rotate in Y axis relative to the fixed portion. As shown in FIG. 69, the movable portion 3301 and the optical module 3901 disposed on the movable portion 3301 may use the spherical support element 3701 as a fulcrum to rotate in different directions by the force generated from the driving assembly D13. Although the embodiment in FIG. 69 only shows the movable portion 3301 rotating in a single axis, but it should be noted that the movable portion 3301 may rotate in more than one axes, such as X, Y, and Z axes, to achieve optical image stabilization (OIS).

Figure 70:
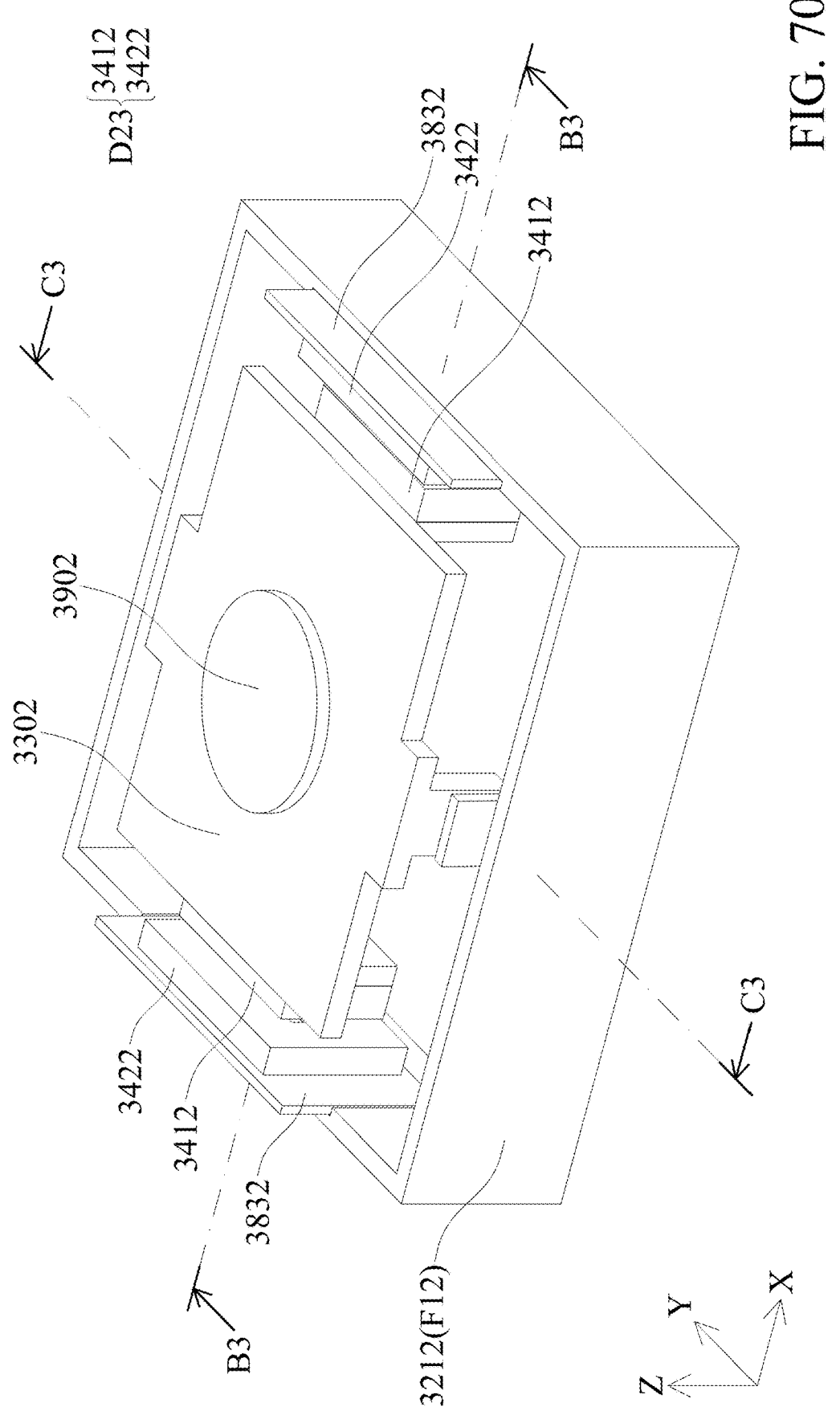
FIG. 70 is a perspective view of an optical element driving mechanism in some embodiments of the present disclosure.
Figure 71:
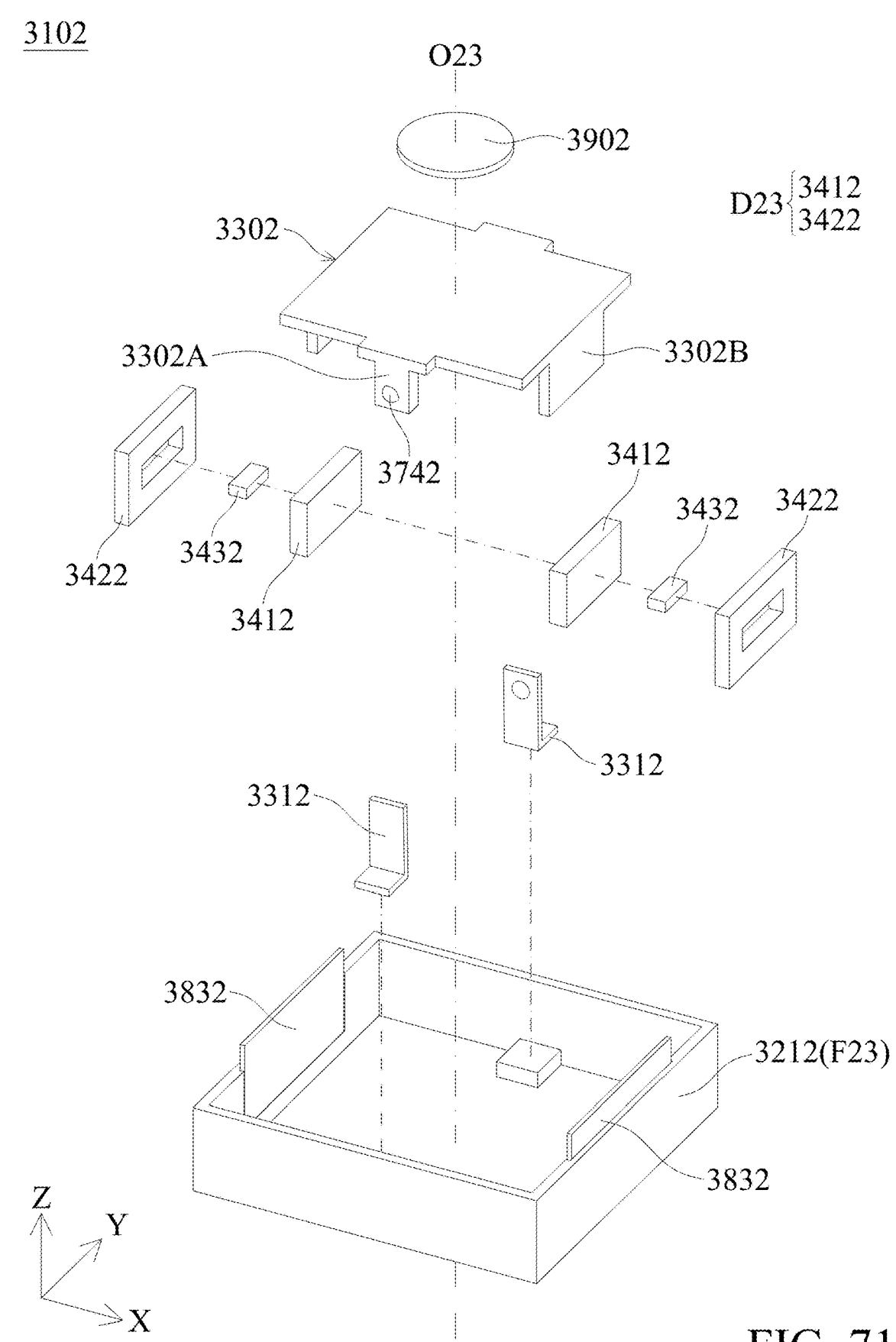
FIG. 71 is an exploded view of the optical element driving mechanism.

In some embodiments of the present disclosure, FIG. 70 to FIG. 73 are a perspective view and an exploded view of an optical element driving mechanism 3102, a cross-sectional view illustrated along a line B3-B3 in FIG. 70, and a cross-sectional view illustrated along a line C3-C3 in FIG. 70, respectively. In FIG. 71, the optical element driving mechanism 3102 mainly includes a base 3212 (also referred to as a fixed portion F23), a movable portion 3302, a connecting element 3312, a first magnetic element 3412, and a second magnetic element 3422. The optical element driving mechanism 3102 may be used for driving an optical module 3902, or it may be used for driving various optical elements, such as a lens, a mirror, a prism, a beam splitter, or an aperture.

Figure 73:
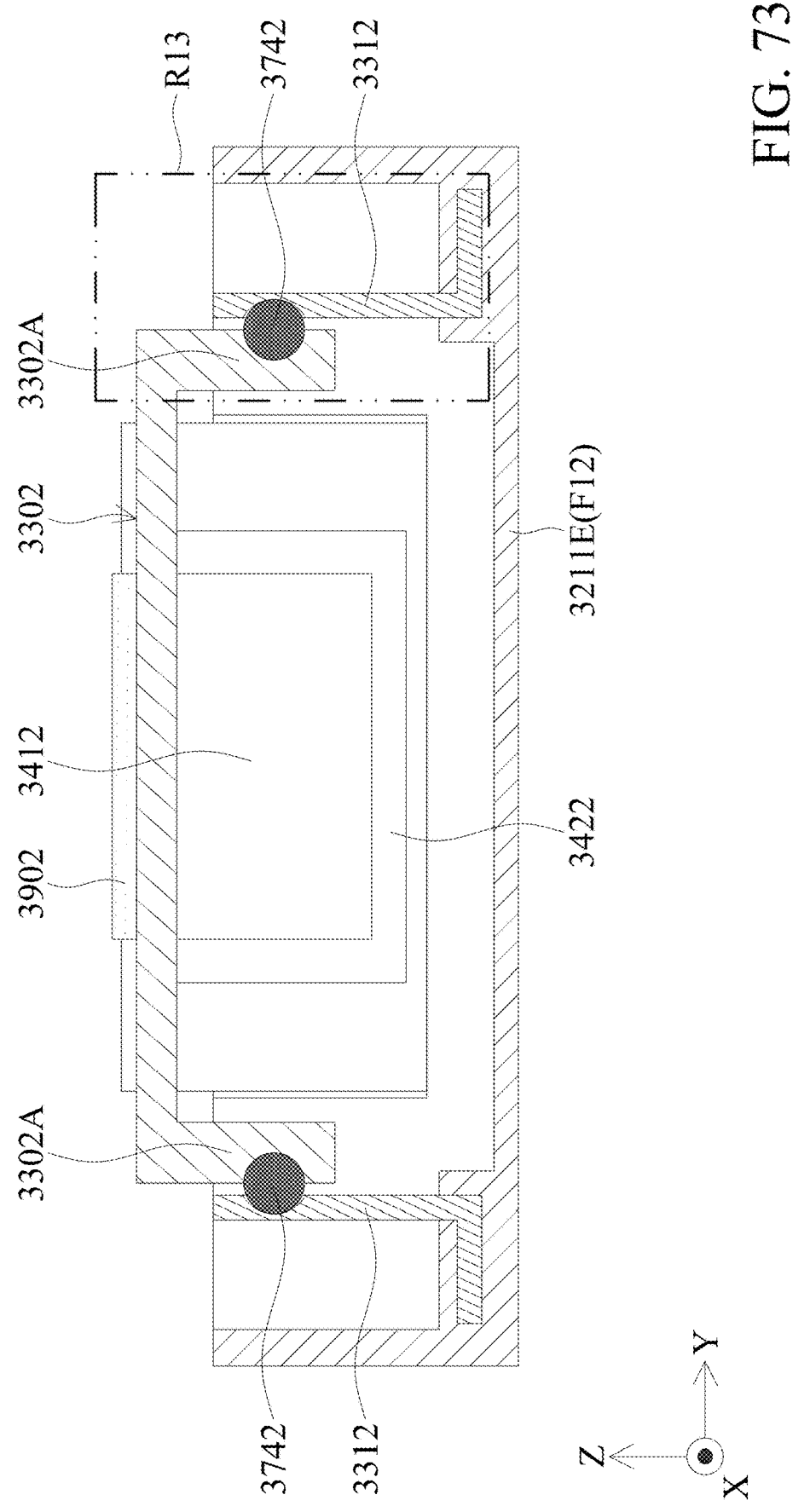
FIG. 73 is a cross-sectional view of the optical element driving mechanism.
Figure 74:
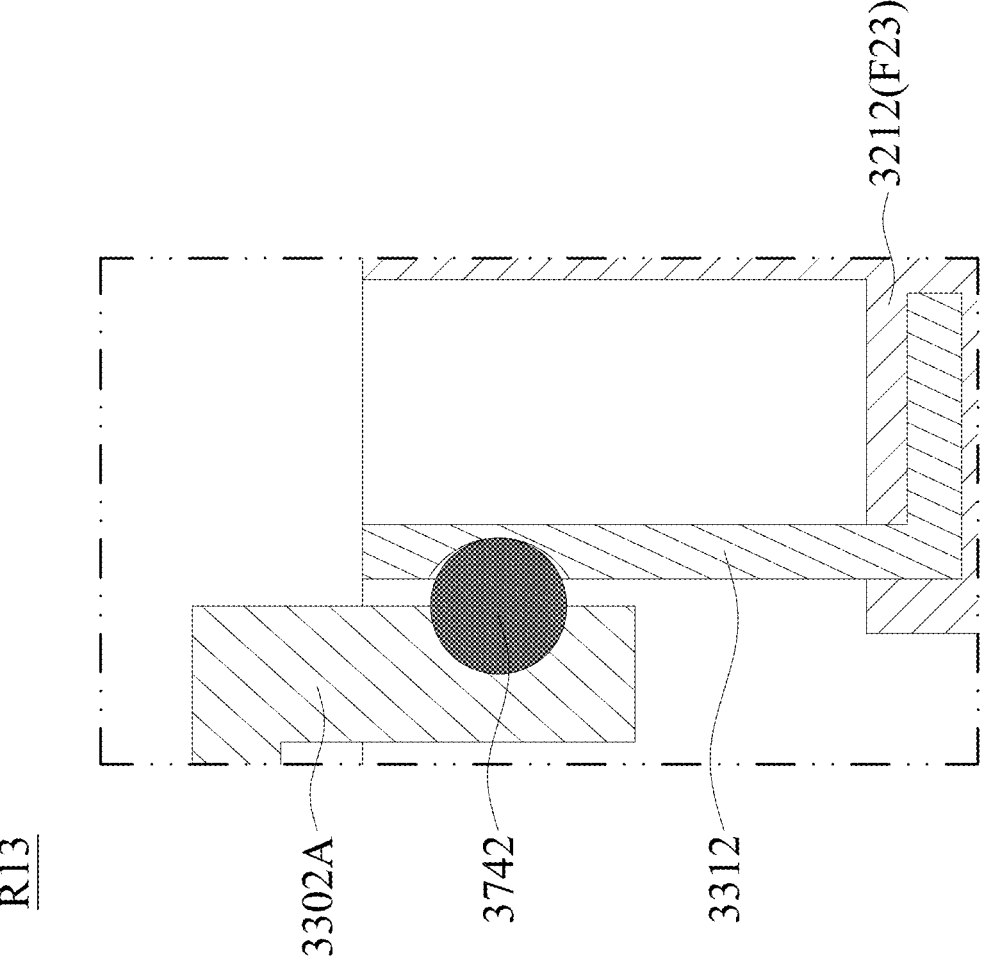
FIG. 74 is an enlarged view of the portion R13 in FIG. 73.

FIG. 74 is an enlarged view of the portion R13 in FIG. 73. In some embodiments, the connecting element 3312 may be affixed to the base 3212, the movable portion 3302 may be connected to the base 3212 (the fixed portion F23) through the connecting element 3312 and moved relative to the fixed portion F23. In detail, extending portions 3302A are positioned at the sides of the movable portion 3302, and the extending portions 3302A extends to the base 3212. A recess is formed on the extending portion 3302A, another recess is formed on the connecting element 3312, and a friction element 3742 may ne disposed on the recesses of the extending portion 3302A and the connecting element 3312. As shown in FIG. 74, the recesses may have half-spherical shapes, so the spherical friction element 3742 may roll in the recesses, and the friction between the movable portion 3302 and the fixed portion F23 may be reduced. As a result, the movable portion 3302 may rotate using the connection of the two friction elements 3742 as a rotational axis, and the optical module 3902 disposed on the movable portion 3302 may be moved with the movable portion 3302 to achieve, for example, optical image stabilization (OIS).

Figure 72:
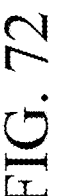
FIG. 72 is a cross-sectional view of the optical element driving mechanism.

In some embodiments, the first magnetic element 3412 and the second magnetic element 3422 may serve as a driving assembly D23 to drive the movable portion 3302 to move relative to the fixed portion F23. For example, the first magnetic element 3412 and the second magnetic element 3422 may include a combination of a driving coil and a driving magnet. For example, the first magnetic element 3412 may be a driving magnet, and the second magnetic element 3422 may be a driving coil. In another example, the first magnetic element 3412 may be a coil, and the second magnetic element 3422 may be a driving magnet, and is not limited thereto. The first magnetic element 3412 and the second magnetic element 3422 may be positioned on the fixed portion F23 and the movable portion 3302, respectively. In some embodiments, the positions of the fixed portion F23 and the movable portion 3302 may be interchanged, depending on design requirement. For example, as shown in FIG. 71 and FIG. 72, a sidewall 3302B may be positioned on the movable portion 3302 and extending to the base 3212, and the first magnetic element 3412 or the second magnetic element 3422 may be affixed to the sidewall 3302B by, for example, adhesion.

In some embodiments, the first magnetic element 3412 may extend in a direction that is perpendicular to the main axis O23, such as the Y axis, to allow the movable portion 3302 rotate relative to Y axis. In some embodiments, as shown in FIG. 72, the driving assembly D23 and the optical module 3902 do not overlap each other in a direction that is perpendicular to the main axis O23. It should be noted that the interaction between the first magnetic element 3412 and the second magnetic element 3422 may create a magnetic force to move the optical module 3902 relative to the fixed portion F23, so optical image stabilization (OIS) may be achieved.

In some embodiments, magnetic permeable elements 3832 may be provided corresponding to the first magnetic element 3412 and the second magnetic element 3422. The material of the magnetic permeable element 3832 may include metal to enhance the electromagnetic driving force between the first magnetic element 3412 and the second magnetic element 3422. In some embodiments of the present disclosure, the magnetic permeable element 3832 may be affixed to the base 3212 (the fixed portion F23) by, for example, adhesion.

In some embodiments, a position sensor 3432 may be disposed in the optical element driving mechanism 3102, such as disposed on the fixed portion F23, to detect the position of the movable portion 3302 relative to the fixed portion F23. The position sensor 3432 may include Hall sensor, magnetoresistance effect sensor (MR Sensor), giant magnetoresistance effect sensor (GMR sensor), tunneling magnetoresistance effect sensor (TMR sensor), or fluxgate sensor. In some embodiments, a plurality of position sensors 3432 may be provided, and the first magnetic element 3412, the second magnetic element 3422, and the position sensors 3432 may be arranged in the X axis.

Figure 75:
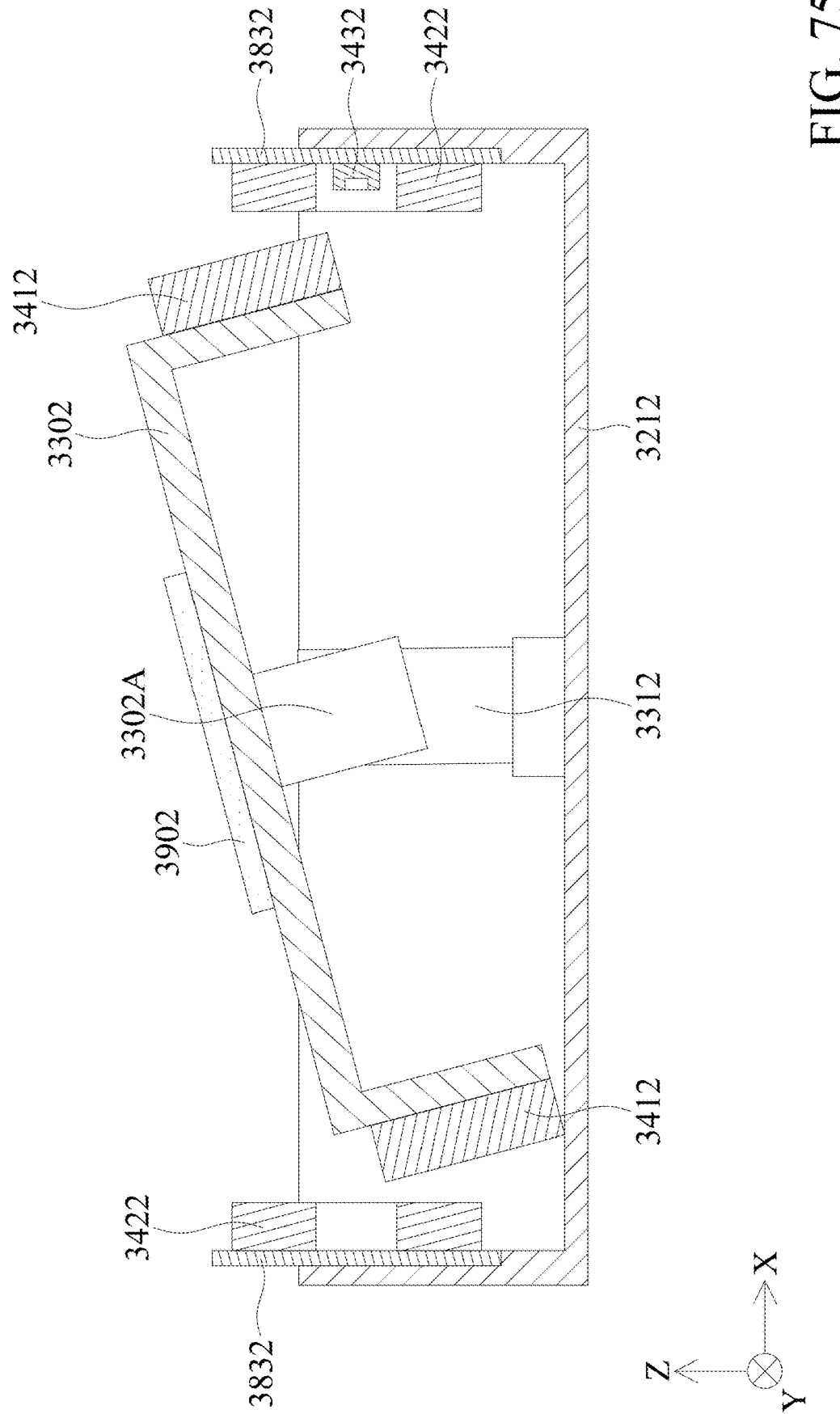
FIG. 75 is a schematic view of the optical element driving mechanism when the optical element driving mechanism is operating.

FIG. 75 is a cross-sectional view of the movable portion 3302 of the optical element driving mechanism 3102 and other elements disposed on the movable portion 3302 when these elements rotate in Y axis relative to the fixed portion F23. As shown in FIG. 75, the movable portion 3302 and the optical module 3902 disposed on the movable portion 3302 may use a combination of the spherical friction element 3742 and the recesses as fulcrums to rotate by the force generated from the driving assembly D23.

Figure 76:
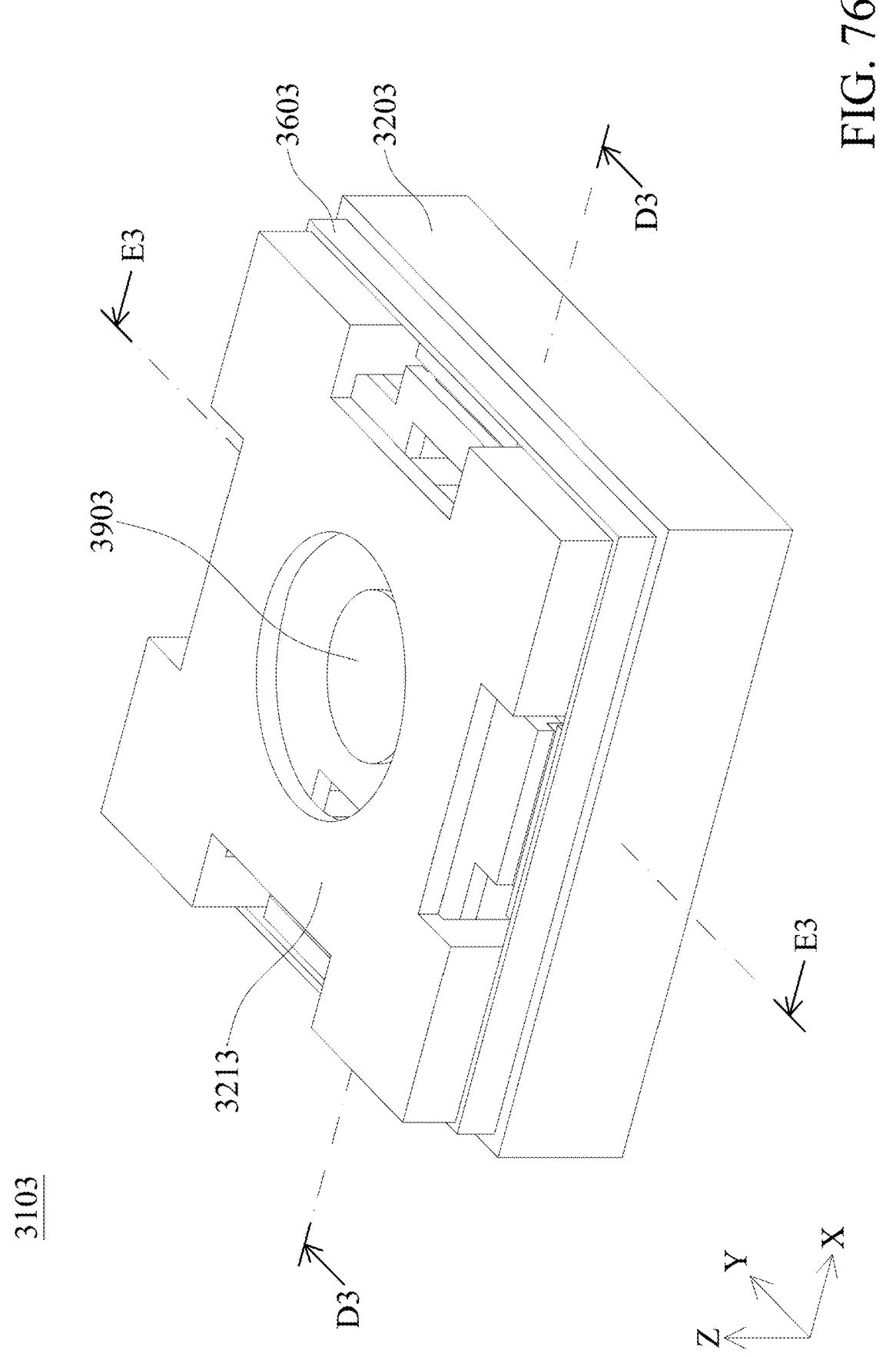
FIG. 76 is a perspective view of an optical element driving mechanism in some embodiments of the present disclosure.
Figure 77:
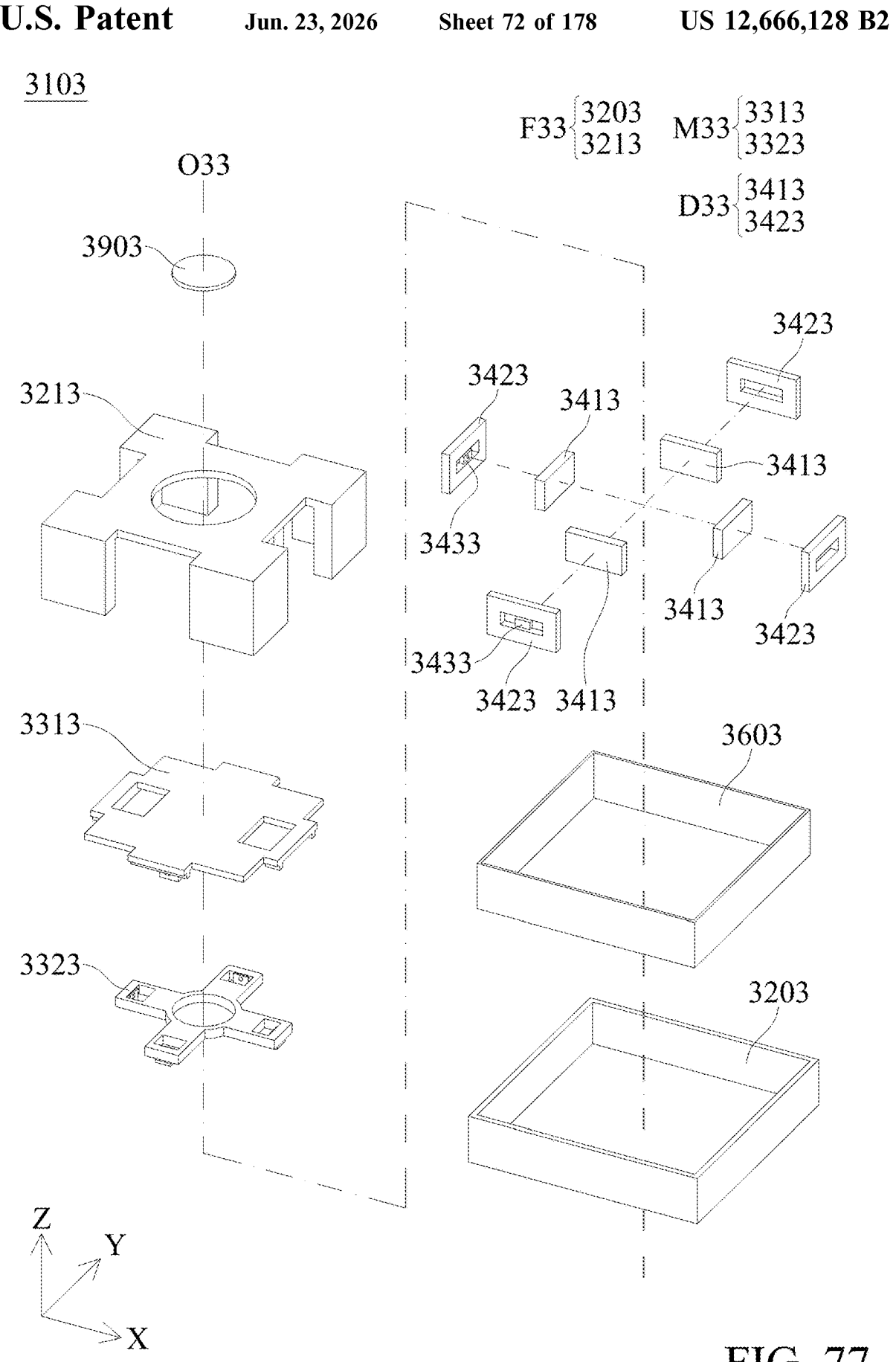
FIG. 77 is an exploded view of the optical element driving mechanism.

In some embodiments of the present disclosure, FIG. 76 to FIG. 79 are a perspective view and an exploded view of an optical element driving mechanism 3103, a cross-sectional view illustrated along a line D3-D3 in FIG. 76, and a cross-sectional view illustrated along a line E3-E3 in FIG. 76, respectively. In FIG. 76, the optical element driving mechanism 3103 mainly includes a fixed portion F33 (includes a case 3203 and a base 3213), a first movable portion 3313, a second movable portion 3323, a first magnetic element 3413, and a second magnetic element 3423, and a circuit board 3603. The optical element driving mechanism 3103 may be used for driving an optical module 3903, or it may be used for driving various optical elements, such as a lens, a mirror, a prism, a beam splitter, or an aperture.

In some embodiments, the first movable portion 3313 and the second movable portion 3323 may serve as a movable portion M33, and the first movable portion 3313 and the second movable portion 3323 may be moved relative to the fixed portion F33. In other words, the movable portion M33 is movable relative to the fixed portion F33. In some embodiments, the second movable portion 3323 may be moved relative to the first movable portion 3313, and the moving directions of the first movable portion 3313 and the second movable portion 3323 are different (such as rotatable relative to different axes). As a result, the optical module 3903 may move with the movable portion M33 to achieve auto focus (AF) or optical image stabilization (OIS).

In some embodiments, the first magnetic element 3413 and the second magnetic element 3423 may serve as a driving assembly D33 to drive the movable portion 3303 to move relative to the fixed portion F33. For example, the first magnetic element 3413 and the second magnetic element 3423 may include a combination of a driving coil and a driving magnet. For instance, the first magnetic element 3413 may be a driving magnet, and the second magnetic element 3423 may be a driving coil. In another example, the first magnetic element 3413 may be a driving coil, and the second magnetic element 3423 may be a driving magnet, and the present disclosure is not limited thereto. The first magnetic element 3413 and the second magnetic element 3423 may be positioned on the fixed portion F33 and the movable portion M33, respectively. In some embodiments, the positions of the fixed portion F33 and the movable portion M33 may be interchanged, depending on design requirement.

In some embodiments, the first magnetic element 3413 may extend in a direction that is perpendicular to the main axis O33, such as the X axis or Y axis, to allow the movable portion M33 rotate relative to the X axis or Y axis. It should be noted that the interaction between the first magnetic element 3413 and the second magnetic element 3423 may create a magnetic force to move the optical module 3903 relative to the fixed portion F33, so optical image stabilization (OIS) may be achieved.

In some embodiments, a position sensor 3433 may be disposed in the optical element driving mechanism 3103 to detect the position of the movable portion M33 relative to the fixed portion F33, such as disposed on the fixed portion F33. The position sensor 3433 may include Hall sensor, magnetoresistance effect sensor (MR Sensor), giant magnetoresistance effect sensor (GMR sensor), tunneling magnetoresistance effect sensor (TMR sensor), or fluxgate sensor.

Figure 78:
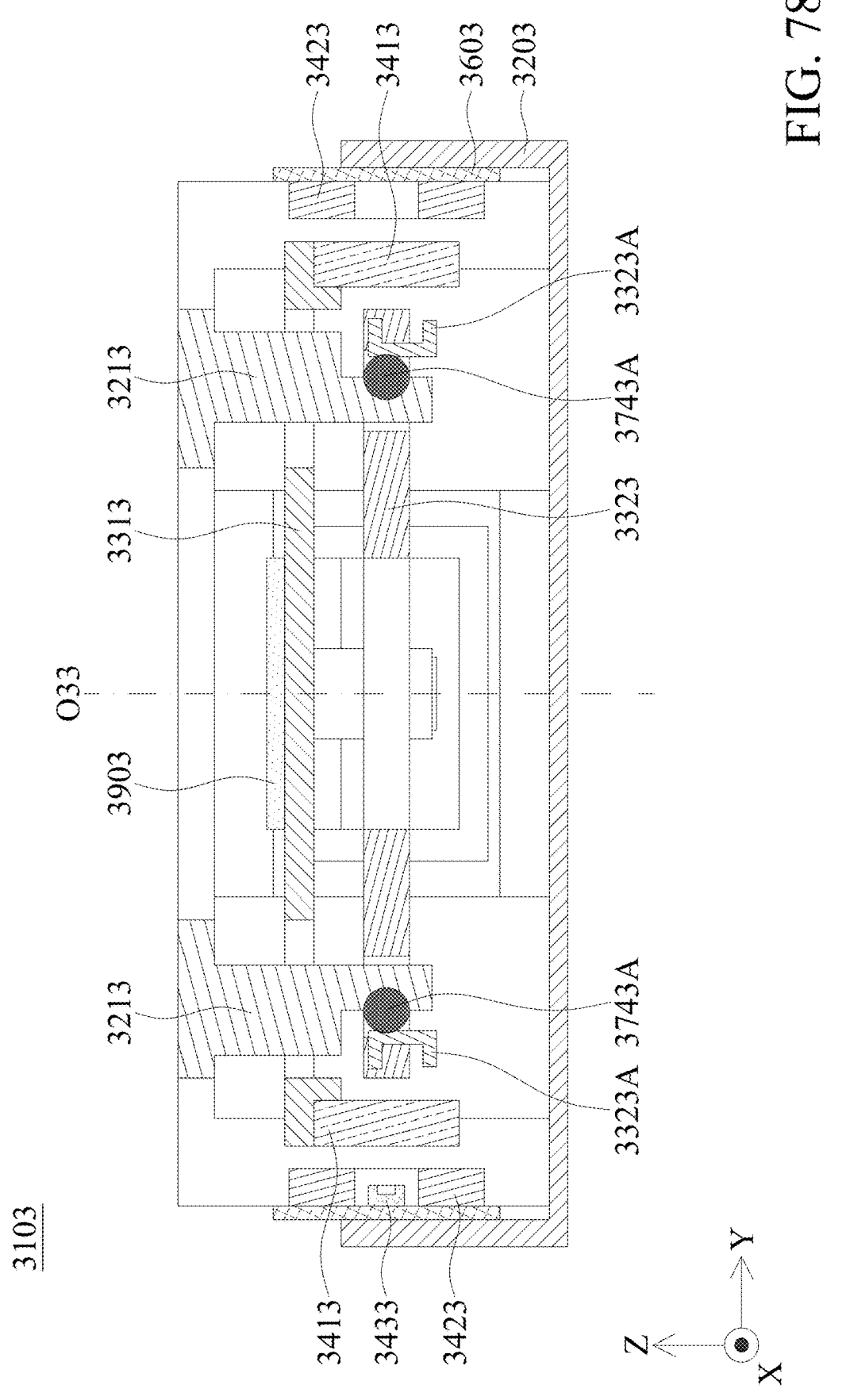
FIG. 78 is a cross-sectional view of the optical element driving mechanism.
Figure 79:
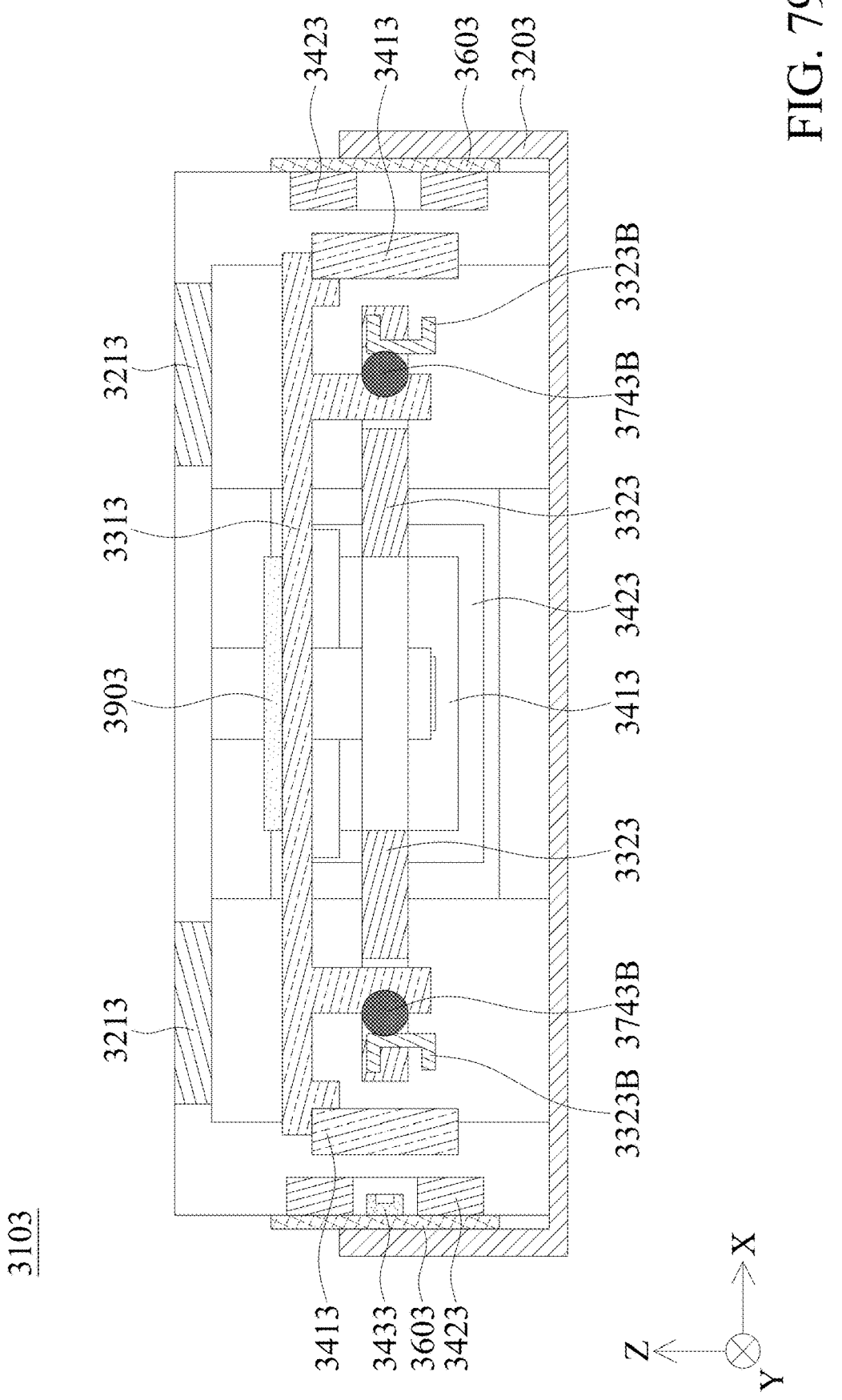
FIG. 79 is a cross-sectional view of the optical element driving mechanism.

As shown in FIG. 78 and FIG. 79, a connecting element 3323A and a connecting element 3323B may be positioned on the second movable portion 3323, wherein the connecting element 3323A is connected to the base 3213 through the spherical friction element 3743A, and the connecting element 3323B is connected to the first movable portion 3313 through the friction element 3743B. In particular, the friction element 3743A may be disposed in recesses of the connecting element 3323A and the base 3213, and the friction element 3743B may be disposed in recesses of the connecting element 3323B and the first movable portion 3313. As a result, the friction element 3743A and the friction element 3743B may roll in the recesses to allow the second movable portion 3323 moving relative to the first movable portion 3313, and to allow the second movable portion 3323 to move relative to the base 3213. In other words, the movable portion M33 (includes the first movable portion 3313 and the second movable portion 3323) may move relative to the fixed portion F33 by friction contact. As a result, the optical element driving mechanism may be operated after overcoming the maximum static friction between the elements, and required electricity for operation may be reduced.

Figure 80:
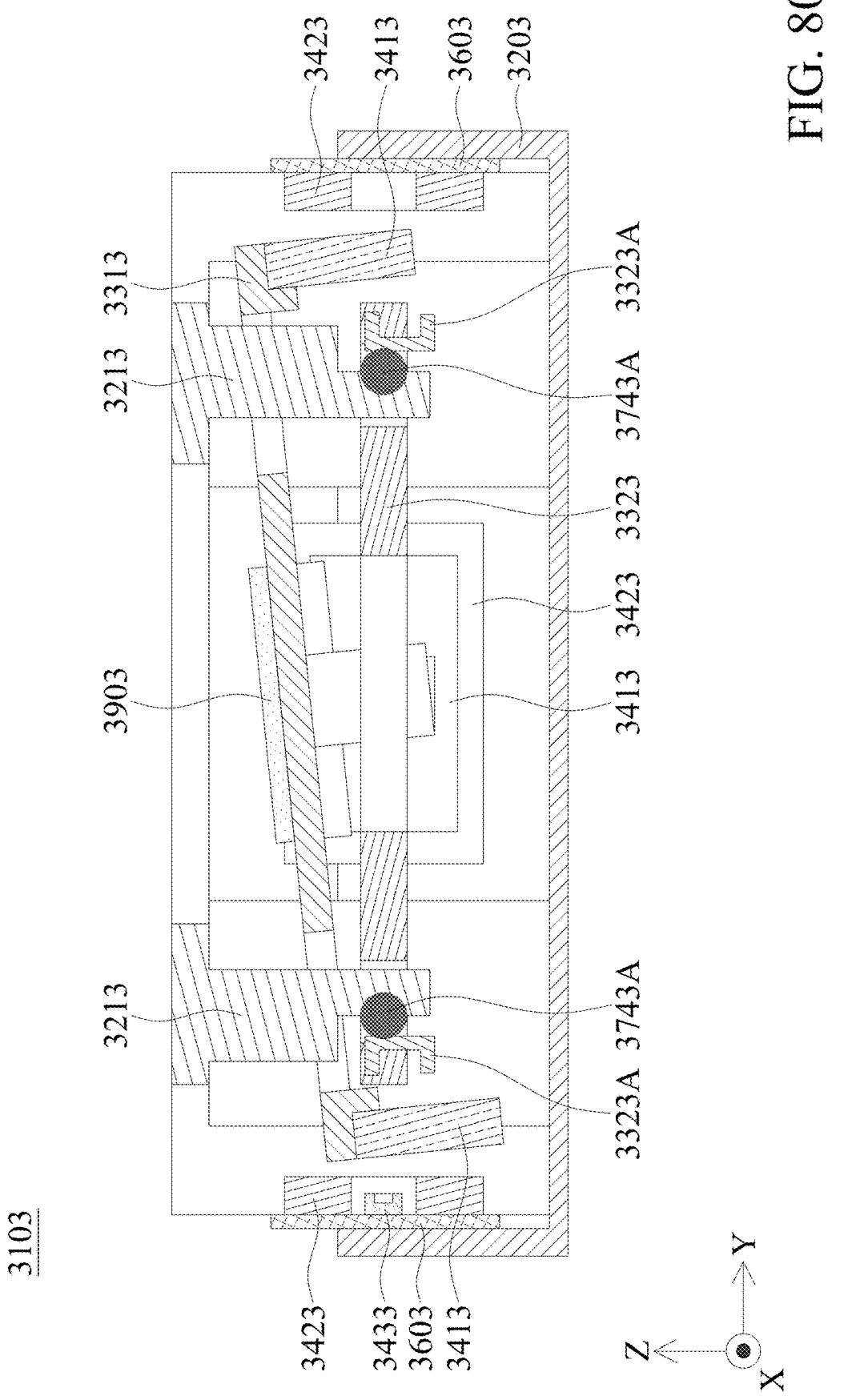
FIG. 80 is a schematic view of the optical element driving mechanism when the optical element driving mechanism is operating.

FIG. 80 is a cross-sectional view of the movable portion M33 of the optical element driving mechanism 3103 and other elements disposed on the movable portion M33 when these elements rotate in X axis relative to the fixed portion F33. As shown in FIG. 80, the movable portion M33 and the optical module 3903 disposed on the movable portion M33 may use the friction element 3743B (FIG. 79) as fulcrum to rotate by the force generated from the driving assembly D33. Although the embodiment in FIG. 80 only shows the movable portion M33 rotating in a single axis, but it should be noted that the movable portion M33 may rotate in more than one axes, such as X, Y, and Z axes, to achieve optical image stabilization (OIS).

Figure 81:
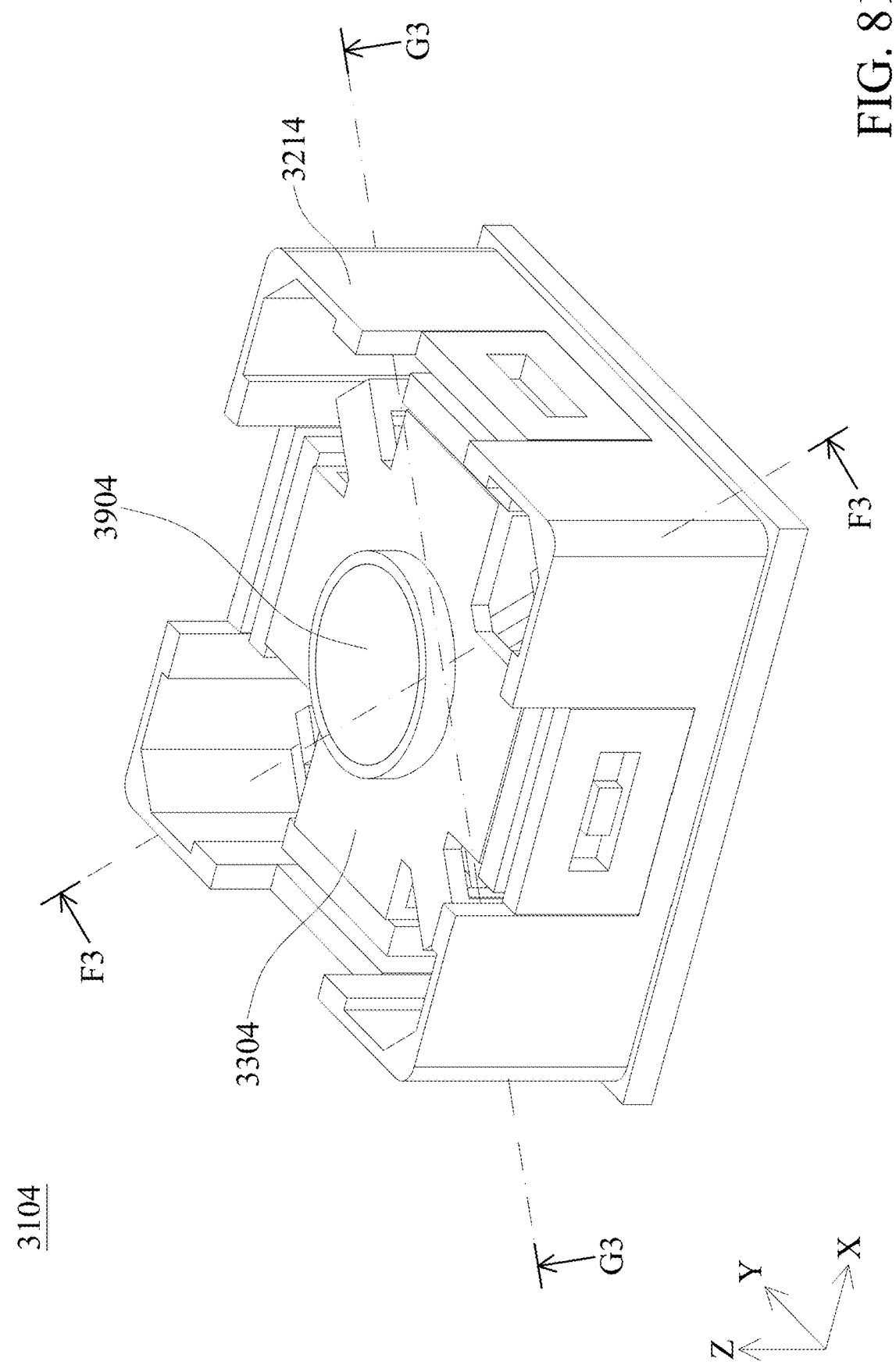
FIG. 81 is a perspective view of an optical element driving mechanism in some embodiments of the present disclosure.
Figure 82:
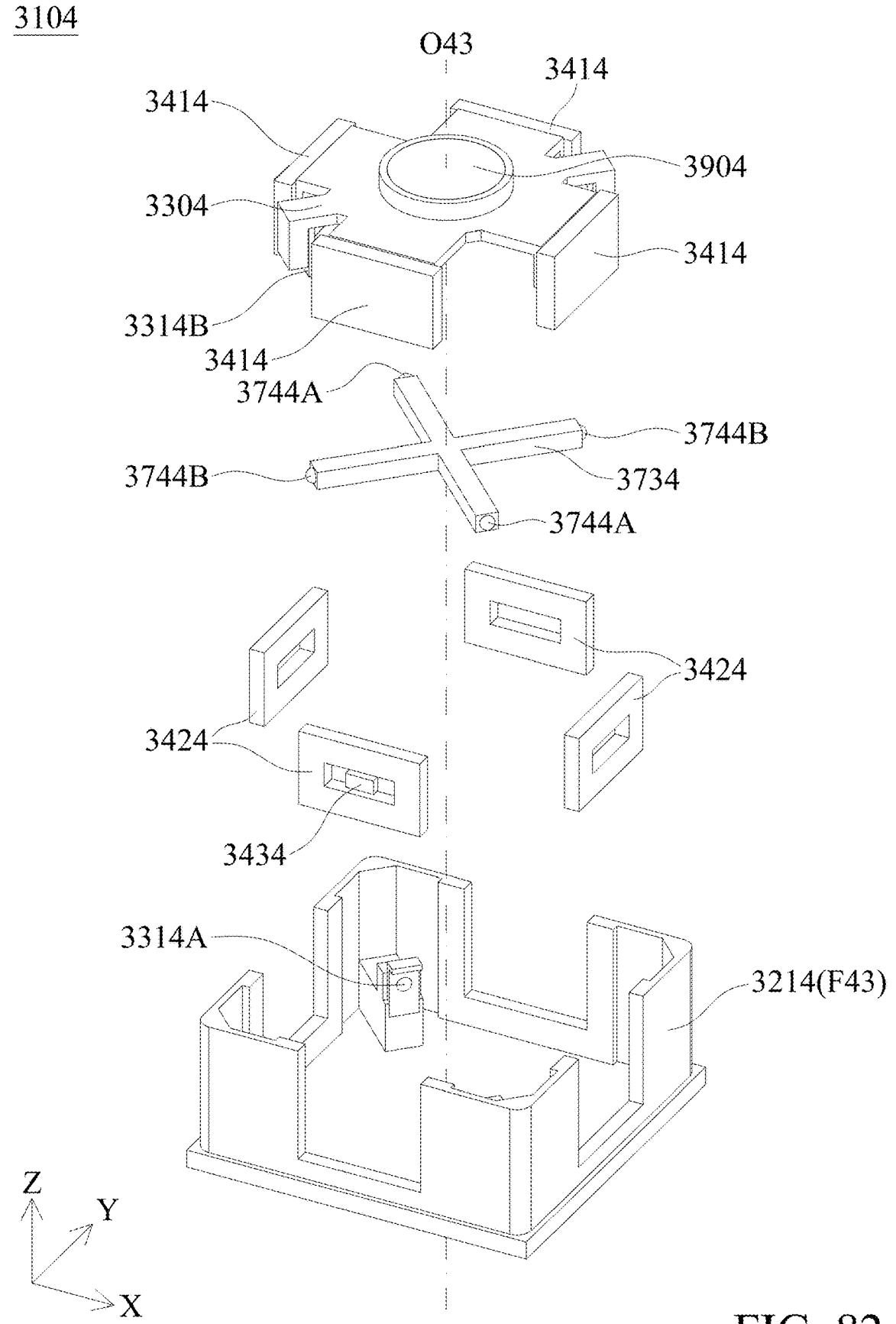
FIG. 82 is an exploded view of the optical element driving mechanism.

In some embodiments of the present disclosure, FIG. 81 to FIG. 84 are a perspective view and an exploded view of an optical element driving mechanism 3104, a cross-sectional view illustrated along a line F3-F3 in FIG. 81, and a cross-sectional view illustrated along a line G3-G3 in FIG. 81, respectively. In FIG. 81, the optical element driving mechanism 3104 mainly includes a base 3214 (fixed portion F43), a movable portion 3304, a first magnetic element 3414, and a second magnetic element 3424, and a rotate element 3734. The optical element driving mechanism 3104 may be used for driving an optical module 3904, or it may be used for driving various optical elements, such as a lens, a mirror, a prism, a beam splitter, or an aperture.

Figure 85:
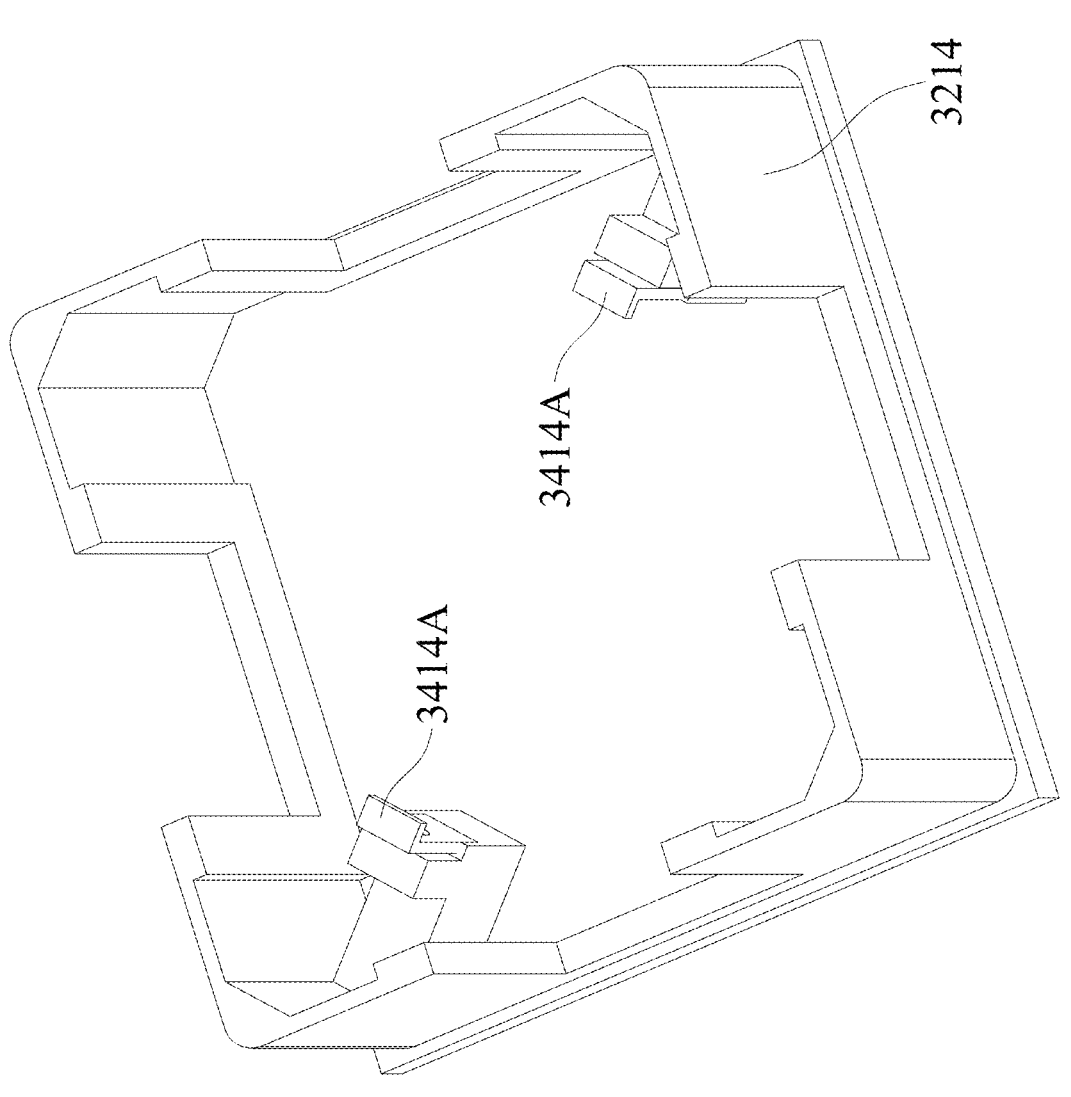
FIG. 85 is a schematic view of the base.
Figure 86:
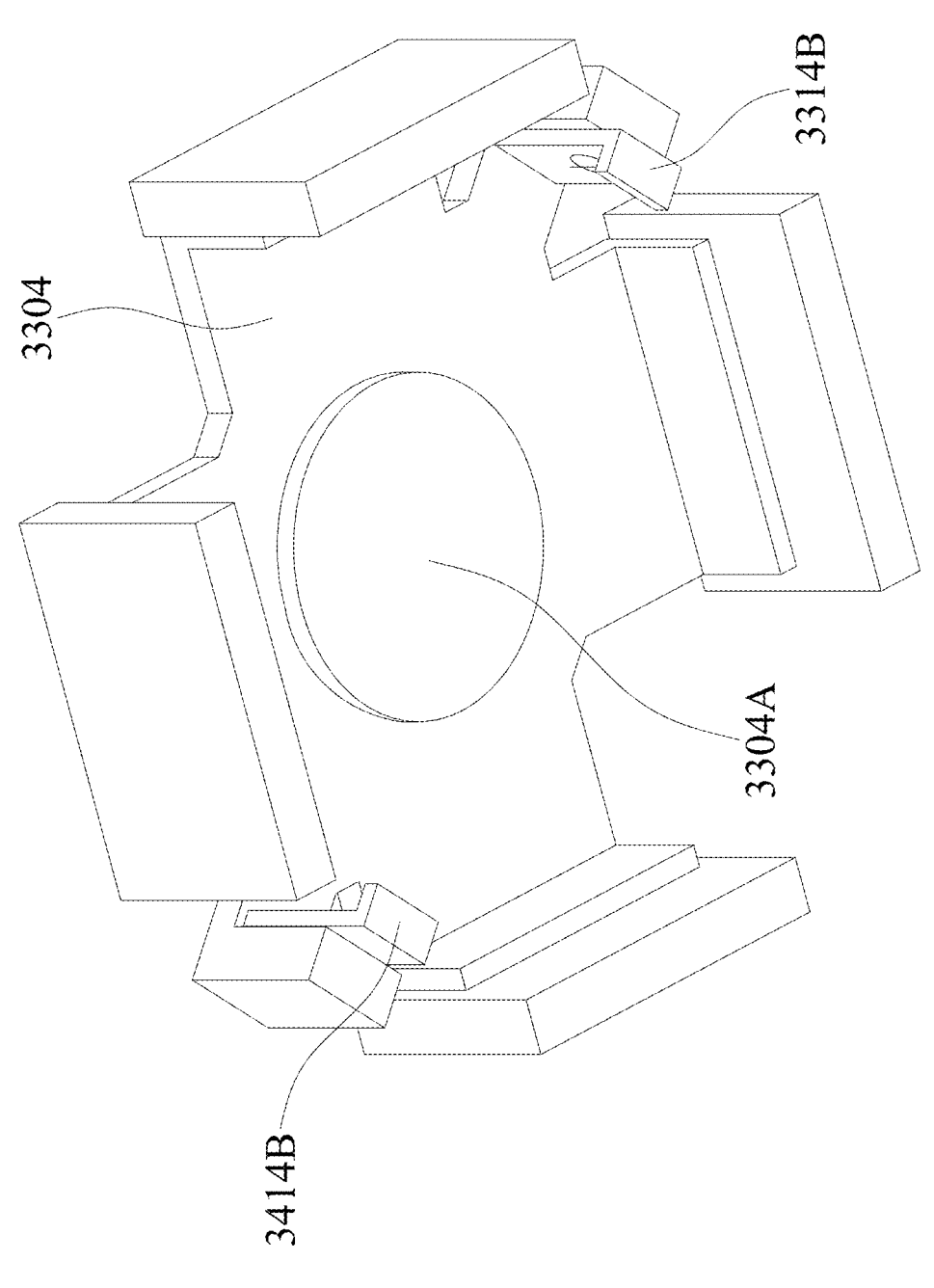
FIG. 86 is a schematic view of the movable portion.

FIG. 85 is a schematic view of the base 3214, and FIG. 86 is a schematic view of the movable portion 3304. In some embodiments, a connecting element 3314A may be affixed to the base 3214, and a connecting element 3314B may be affixed to the movable portion 3304. For example, the connecting element 3314A may be partially embedded in the base 3214, and the connecting element 3314 may be partially embedded in the movable portion 3304 to fix their position. A rotate element 3734 may has a criss-cross shape, and may be connected to the connecting element 3314A and the connecting element 3314B. A stopping portion 3304A may be positioned at a side of the movable portion 3304 that faces the connecting element 3743, the stopping portion 3304A protrudes from the movable portion 3304, and is used for restrict the moving range of the movable portion 3304 relative to the fixed portion F43. In some embodiments, the shape of the stopping portion 3304A may be symmetrical to the main axis O43, such having a circular shape, to balance the moving range of the movable portion 3304 in different directions.

Figure 84:
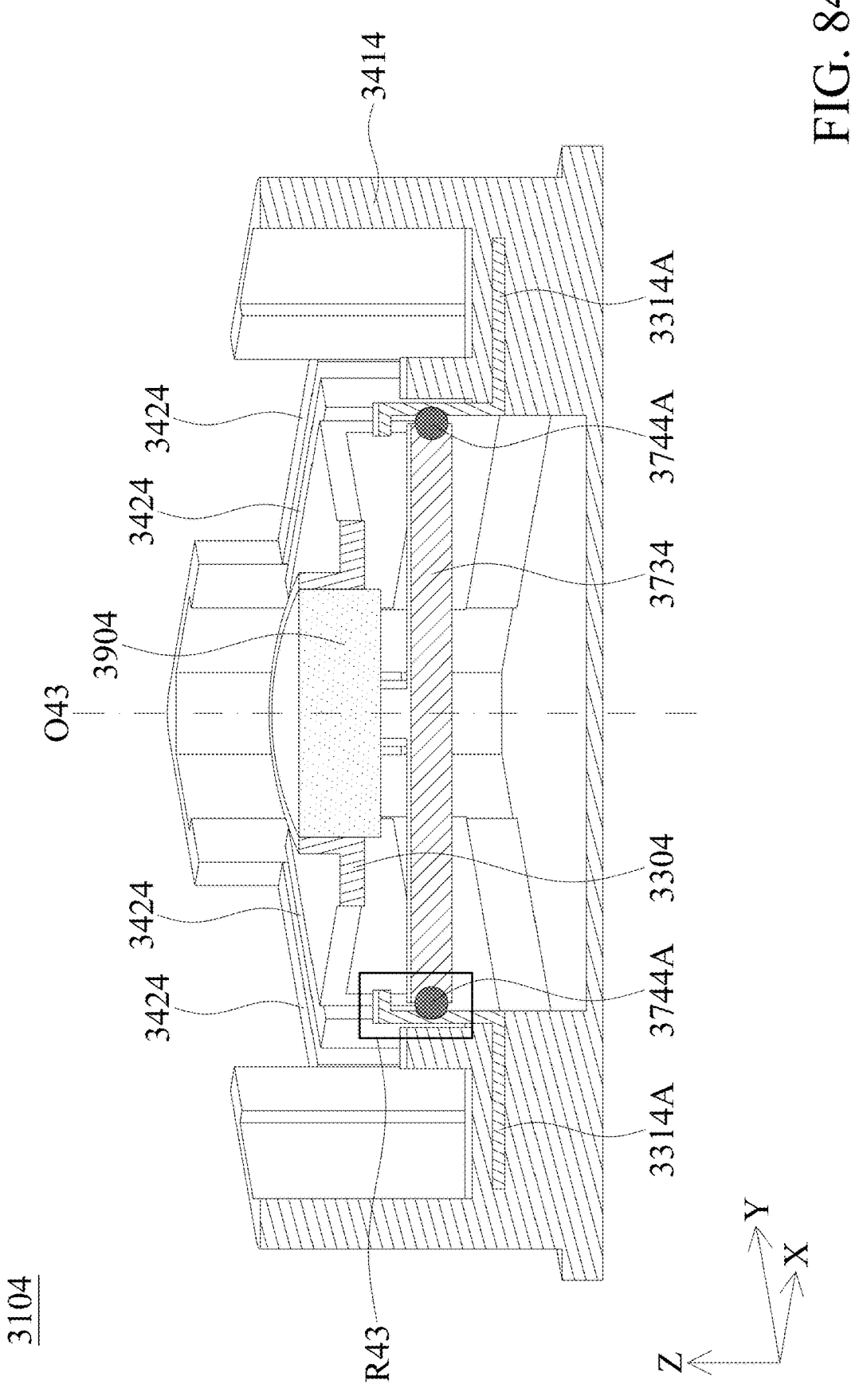
FIG. 84 is a cross-sectional view of the optical element driving mechanism.
Figure 87:
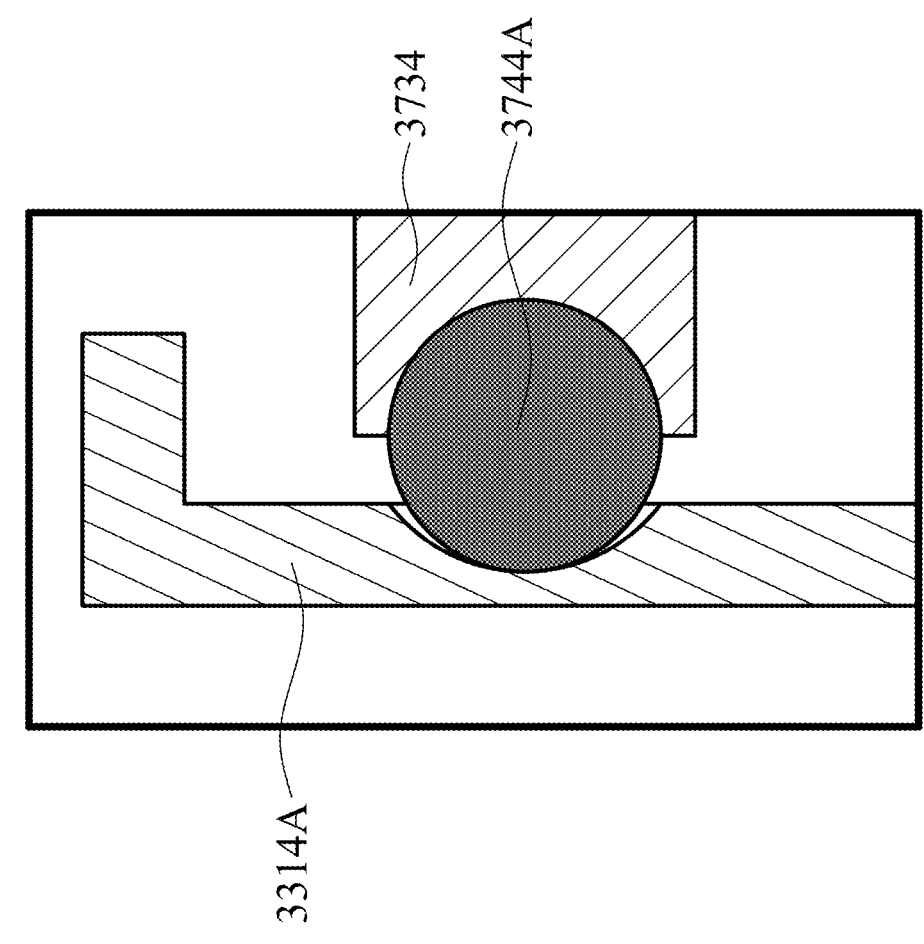
FIG. 87 is an enlarged view of the portion R43 in FIG. 84.

FIG. 87 is an enlarged view of the region R43 in FIG. 84. In detail, a recess is formed at the end of the rotate element 3734, another recess is formed on the connecting element 3314A, and the spherical friction element 3744A and the friction element 3744B may be disposed in the recesses to allow the rotate element 3734 to rotate relative to the connecting element 3314A by friction contact. As a result, the rotate element 3734 may rotate relative to the base 3214 by using a connection of the two friction elements 3744A as a rotation axis, such as the line F3-F3 in FIG. 81.

Figure 83:
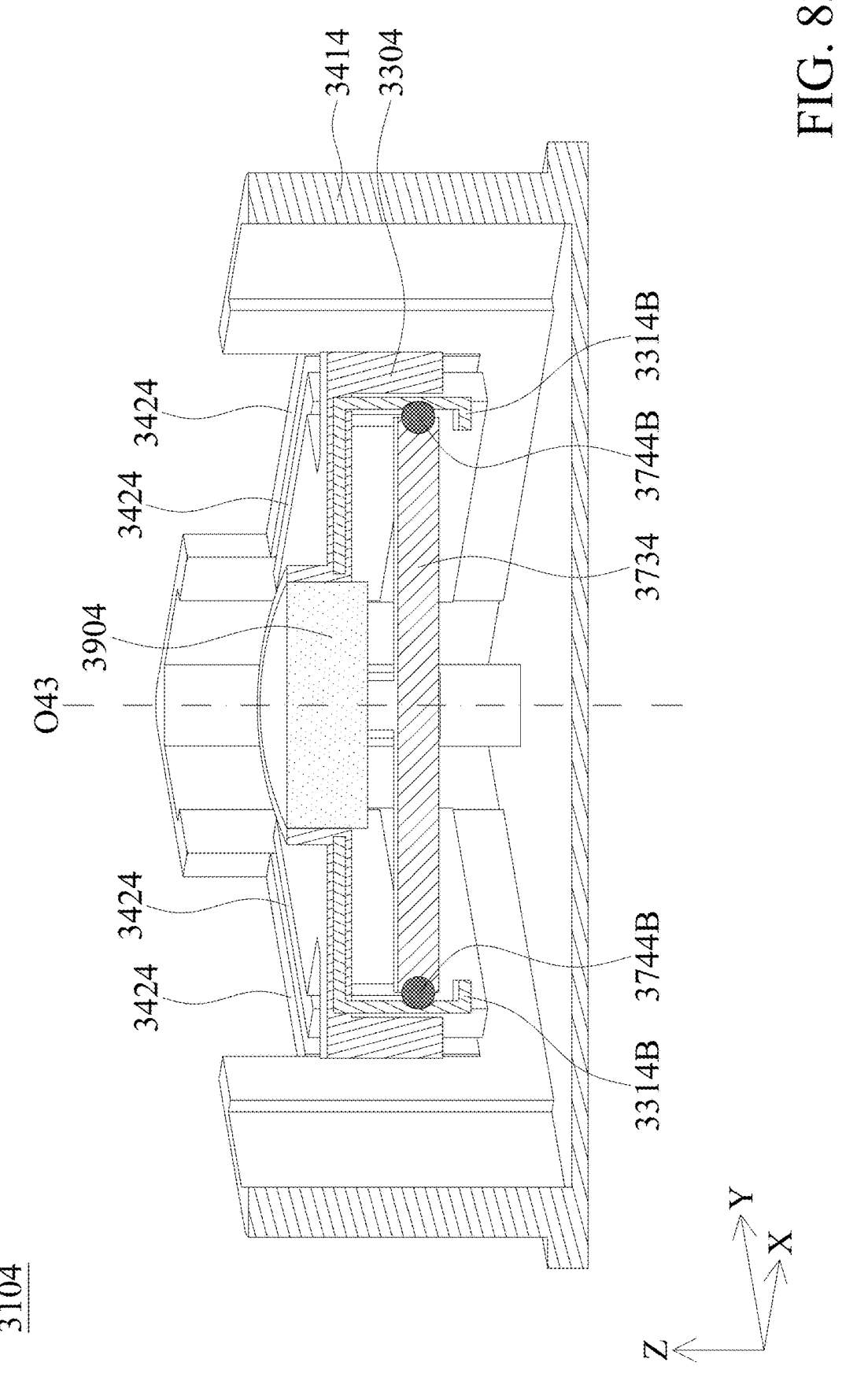
FIG. 83 is a cross-sectional view of the optical element driving mechanism.

Furthermore, as shown in FIG. 83, recesses may be formed on the connecting element 3314B, and the friction elements 3744B positioned on other two ends of the rotate element 3734 may be positioned in the recesses of the connecting element 3314B. Similarly, the rotate element 3734 may rotate relative to the movable portion 3304 by using a connection of the two friction elements 3744B as a rotation axis, such as the line G3-G3 in FIG. 81. In some embodiments, the friction elements 3744A and the friction elements 3744B may be formed as one piece with the rotate element 3734, so the required number of elements may be reduced to facilitate assembling.

In other words, the movable portion 3304 may move relative to the base 3214 (the fixed portion F43) through the rotate element 3734. As a result, the optical module 3904 disposed on the movable portion 3304 may be moved with the movable portion 3304, so optical image stabilization (OIS) may be achieved.

In some embodiments, the first magnetic element 3414 and the second magnetic element 3424 may serve as a driving assembly D43 to drive the movable portion 3304 to move relative to the fixed portion F43. For example, the first magnetic element 3414 and the second magnetic element 3424 may include a combination of a driving coil and a driving magnet. For example, the first magnetic element 3414 may be a driving magnet, and the second magnetic element 3424 may be a driving coil. In another example, the first magnetic element 3414 may be a coil, and the second magnetic element 3424 may be a driving magnet, and is not limited thereto. The first magnetic element 3414 and the second magnetic element 3424 may be positioned on the fixed portion F43 and the movable portion M43, respectively. In some embodiments, the position of the fixed portion F43 and the position of the movable portion M43 are interchangeable, depending on design requirement.

In some embodiments, the first magnetic element 3414 may extend in a direction that is perpendicular to the main axis O43, such as the X axis or Y axis, to allow the movable portion 3304 rotate relative to the X axis or Y axis. It should be noted that the interaction between the first magnetic element 3414 and the second magnetic element 3424 may create a magnetic force to move the optical module 3904 relative to the fixed portion F43, so optical image stabilization (OIS) may be achieved.

In some embodiments, a position sensor 3434 may be disposed in the optical element driving mechanism 3104 to detect the position of the movable portion 3304 relative to the fixed portion F43, such as disposed on the fixed portion F43. The position sensor 3434 may include Hall sensor, magnetoresistance effect sensor (MR Sensor), giant magnetoresistance effect sensor (GMR sensor), tunneling magnetoresistance effect sensor (TMR sensor), or fluxgate sensor.

Figure 88:
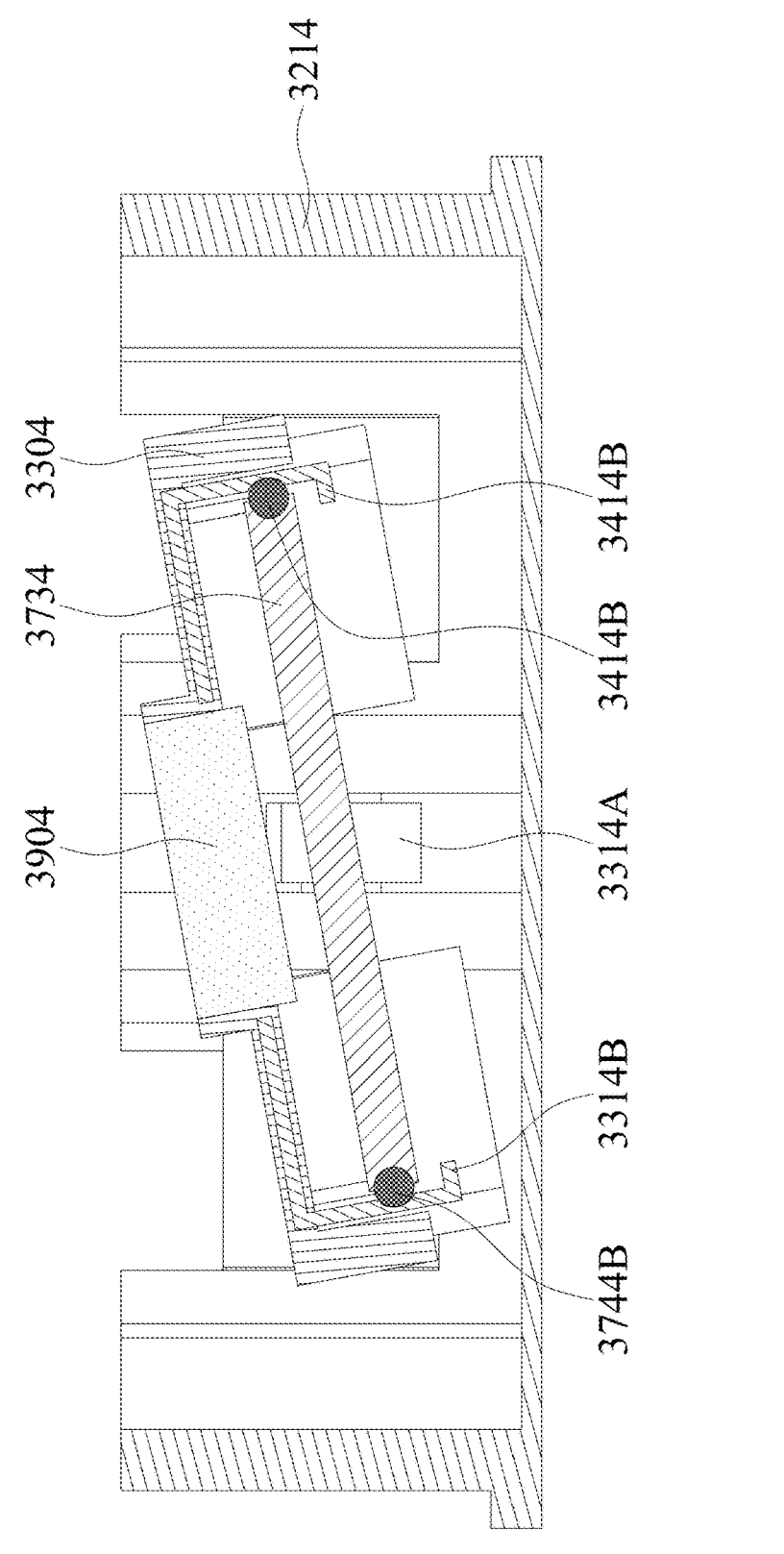
FIG. 88 is a schematic view of the optical element driving mechanism when the optical element driving mechanism is operating.

FIG. 88 is a cross-sectional view of the movable portion 3304 of the optical element driving mechanism 3104 and other elements disposed on the movable portion 3304 when these elements rotate relative to the fixed portion F43. As shown in FIG. 88, the movable portion 3304 and the optical module 3904 disposed on the movable portion 3304 may use a combination of the rotate element 3734, the friction element 3744A, the connecting element 3314A, the friction element 3744B, and the connecting element 3314B as fulcrums to rotate relative to the fixed portion F43 by the force generated from the driving assembly D43.

Figure 89:
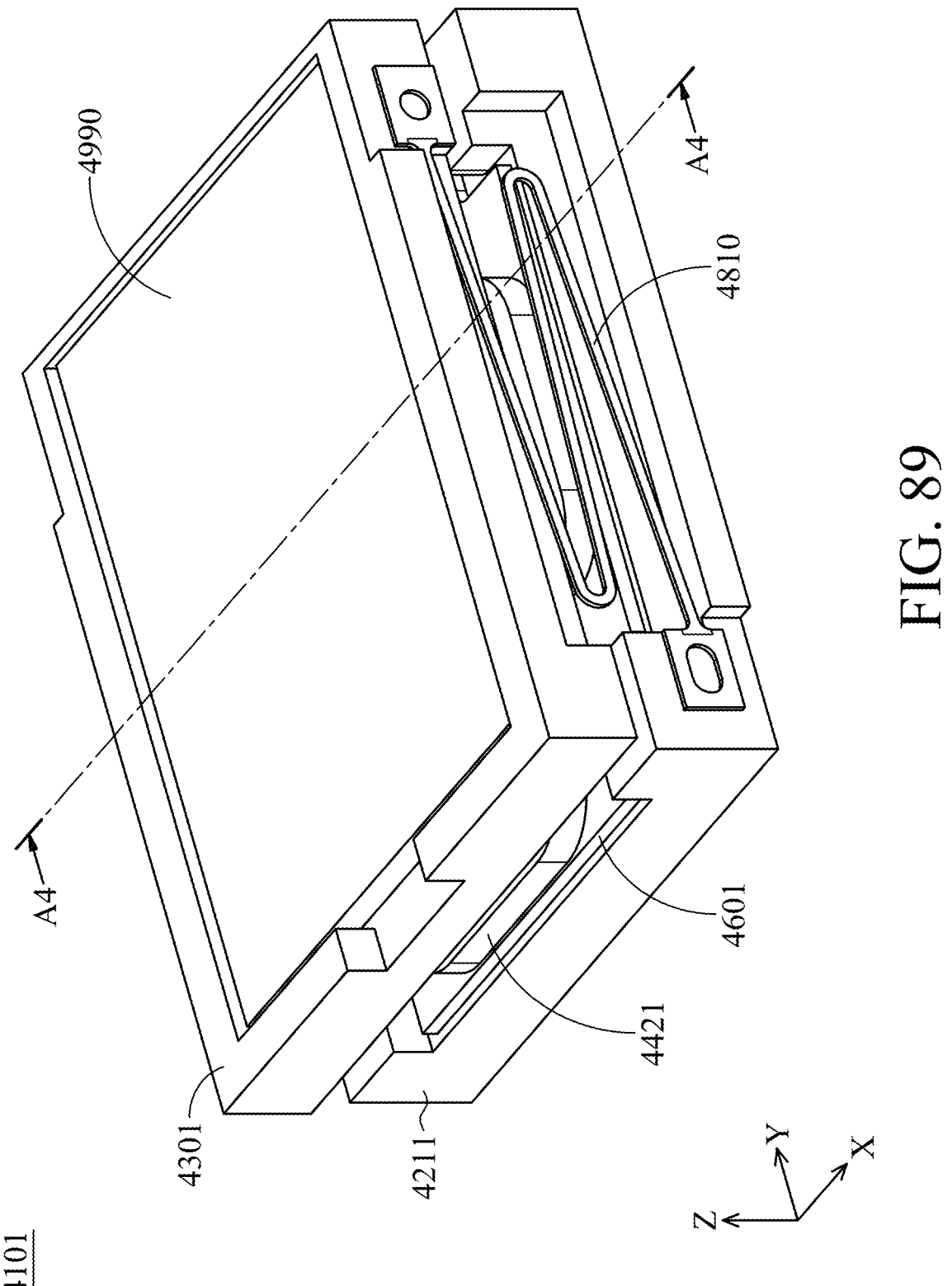
FIG. 89 is a perspective view of an optical element driving mechanism according to some embodiments of the present disclosure.
Figure 90:
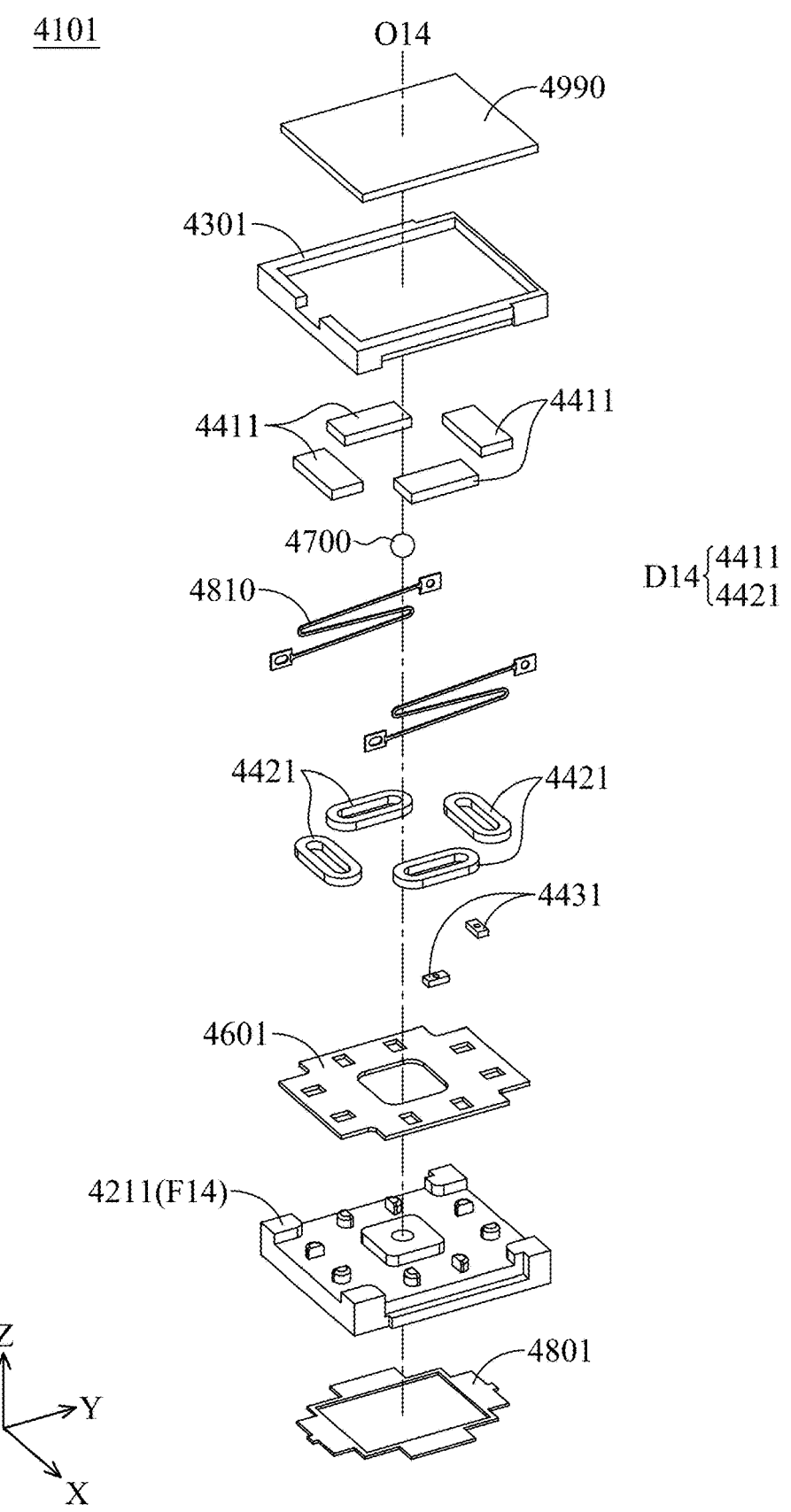
FIG. 90 is an exploded view of the optical element driving mechanism.

In some embodiments of the present disclosure, FIG. 89 to FIG. 93 are a perspective view and an exploded view of an optical element driving mechanism 4101, and a cross-sectional view illustrated along a line A4-A4 in FIG. 89, a schematic view and a side view of some elements of the optical element driving mechanism 4101, respectively. In FIG. 90, the optical element driving mechanism 4101 mainly includes, a base 4211 (or called as a fixed portion F14), a movable portion 4301, a first magnetic element 4411, a second magnetic element 4421, a position sensor 4431, a circuit board 4601, a support element 4701, a magnetic permeable element 4801, and a resilient element 4811. The optical element driving mechanism 4101 may be used for driving an optical module 4990, or it may be used for driving various optical elements, such as a lens, a mirror, a prism, a beam splitter, or an aperture.

In some embodiments, the first magnetic element 4411 and the second magnetic element 4421 may be called as a driving assembly D14 to drive the movable portion 4301 moving relative to the fixed portion F14. For example, the first magnetic element 4411 and the second magnetic element 4421 may include a combination of a driving coil and a driving magnet. For example, the first magnetic element 4411 may be a driving magnet, and the second magnetic element 4421 may be a driving coil. In another example, the first magnetic element 4411 may be a coil, and the second magnetic element 4421 may be a driving magnet, and is not limited thereto. The first magnetic element 4411 and the second magnetic element 4421 may be positioned on the fixed portion F14 and the movable portion 4301, respectively. In some embodiments, the positions of the fixed portion F14 and the movable portion 4301 may be interchanged. As a result, the movable portion 4301 may be driven by the driving assembly D14 to move relative to the fixed portion F14, and the optical module 4990 disposed on the movable portion 4301 may move with the movable portion 4301 to achieve auto focus (AF) or optical image stabilization (OIS). In some embodiments, the optical element driving mechanism 4101 may has a rectangular shape, and the driving assembly D14 may be disposed on the sides or the corners of the optical element driving mechanism 4101. In some embodiments, the driving assembly D14 may include other driving elements, such as piezoelectric elements, shape memory alloys, etc.

Figure 91:
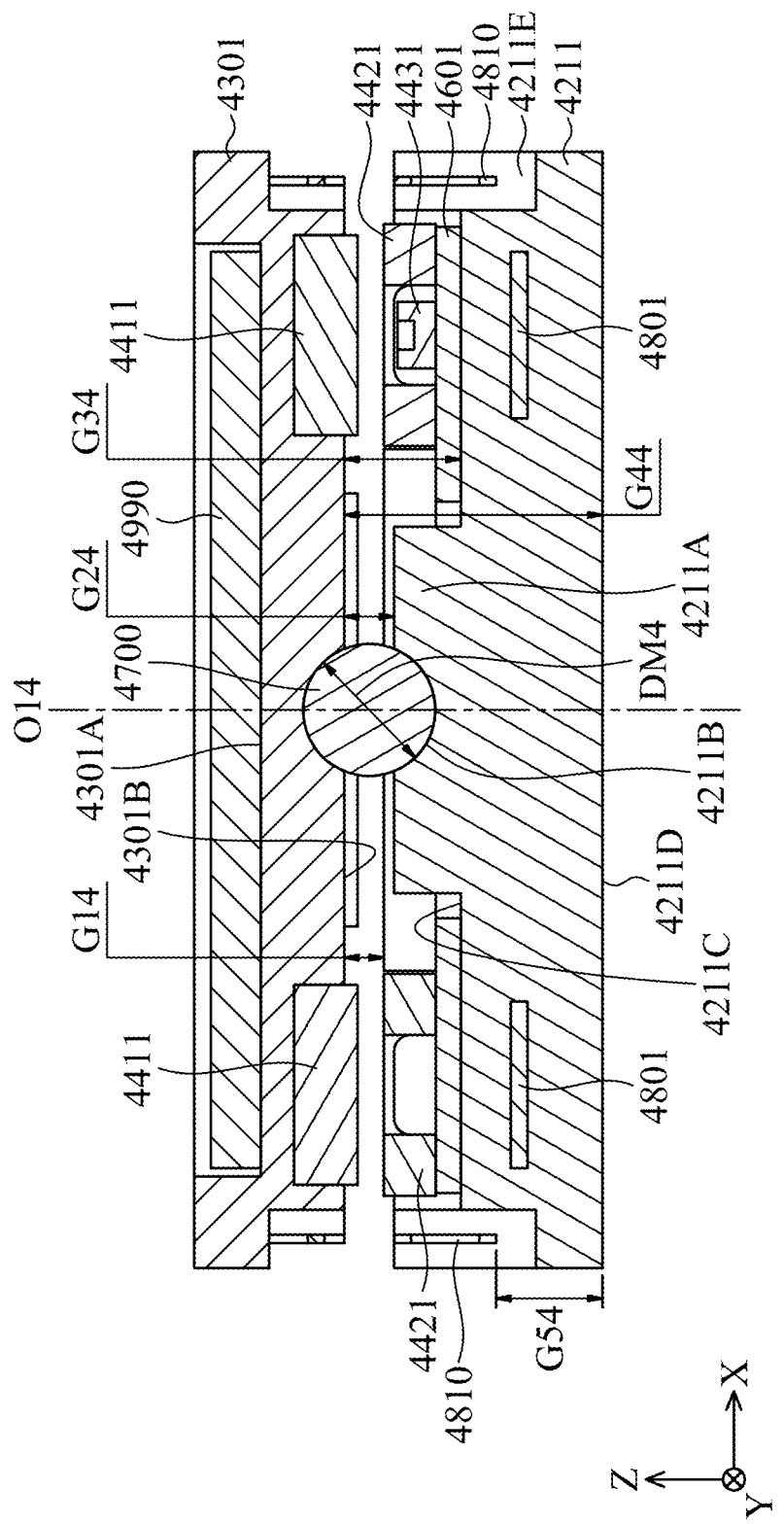
FIG. 91 is a cross-sectional view of the optical element driving mechanism.

In some embodiments, the first magnetic element 4411 may extend in a direction that is perpendicular to the main axis O14, such as along X axis or Y axis, to allow the movable portion 4301 rotate relative to X axis or Y axis. In some embodiments, as shown in FIG. 91, the driving assembly D14 and the optical module 4990 does not overlap each other in a direction that is perpendicular to the main axis O14 to achieve miniaturization. It should be noted that the interaction between the first magnetic element 4411 and the second magnetic element 4421 may create a magnetic force to move the optical module 4990 relative to the fixed portion F14, so auto focus (AF) or optical image stabilization (OIS) may be achieved.

Furthermore, the circuit board 4601 may be, for example, a flexible printed circuit, which may be affixed on the fixed portion F14 by adhesion. In some embodiments, the circuit board 4601 is electrically connected to other electronic elements disposed inside or outside the optical element driving mechanism 4101. For example, the circuit board 4601 may send electric signal to the driving assembly D14 to control the movement of the movable portion 4301. In some embodiments, the circuit board 4601 may position between the base 4211 and the movable portion 4301 in Z direction. In some embodiments, the circuit board 4601 may include magnetic permeable material to increase the electromagnetic force generated by the driving assembly D14.

In some embodiments, a position sensor 4431 may be disposed in the optical element driving mechanism 4101 to detect the position of the movable portion 4301 relative to the fixed portion F14. The position sensor 43431 may include Hall sensor, magnetoresistance effect sensor (MR Sensor), giant magnetoresistance effect sensor (GMR sensor), tunneling magnetoresistance effect sensor (TMR sensor), or fluxgate sensor. For example, a plurality of convex portions 4211F may be positioned on the base 4211 (FIG. 94), the position sensor 4431 may be positioned between two convex portions 4211F, and the second magnetic element 4421 may surround the two convex portions 4211F and the position sensor 4431 to protect the position sensor 4431.

The support element 4700 may have a spherical shape for connecting the movable portion 4301 and the fixed portion F14 to allow the movable portion 4301 may be moved relative to the fixed portion F14 through the support element 4700. In detail, the movable portion 4301 includes a recess 4301A, the base 4211 includes a convex portion 4211A extending to the movable portion 4301, and a concave portion 4211B positioned in the convex portion 4211A. The support element 4700 is partially disposed in the recess 4301A of the movable portion 4301 and the concave portion 4211B of the base 4211 to limit the position of the support element 4700. As shown in FIG. 91, the recess 4301A and the concave portion 4211B has half-spherical shapes, so the spherical support element 4700 may roll in the recess 4301A and the concave portion 4211B, and the friction between the movable portion 4301 and the fixed portion F14 may be reduced. As a result, the movable portion 4301 may rotate relative to the fixed portion F14. In some embodiments, the material of the support element 4700 may include ceramic or resin to prevent magnetic interference from occurring between the support element 4700 and the driving assembly D14. Furthermore, the minimum distance G24 between the concave portion 4211A and the movable portion 4301 is less than the distance DM4 of the support element 4700 along the main axis O14, so the support element 4700 may be prevented from falling out from the recess 4301A of the movable portion 4301 and the concave portion 4211B of the base 4211 when the movable portion 4301 moving relative to the fixed portion F14.

As shown in FIG. 91, the distance between the second magnetic element 4421 and the movable portion 4301 is G14, the distance between the convex portion 4211A and a bottom surface 4301B of the movable portion 4301 is G24, and the distance G14 is less than the distance G24. As a result, the electromagnetic force between the first magnetic element 4411 disposed on the movable portion 4301 and the second magnetic element 4421 disposed on the base 4211. Furthermore, the base 4211 includes a top surface 4211C and a bottom surface 4211D, the distance G34 between the top surface 4211C and the movable portion 4301 may be less than the distance G44 between the bottom surface 4211D and the movable portion 4301, and the minimum distance G54 between the resilient element 4810 and the bottom surface 4211D may be less than the distance G44 between the bottom surface 4211D and the movable portion 4301. As a result, the size of the optical element driving mechanism 4101 along the main axis O14 may be reduced to achieve miniaturization.

Figure 92:
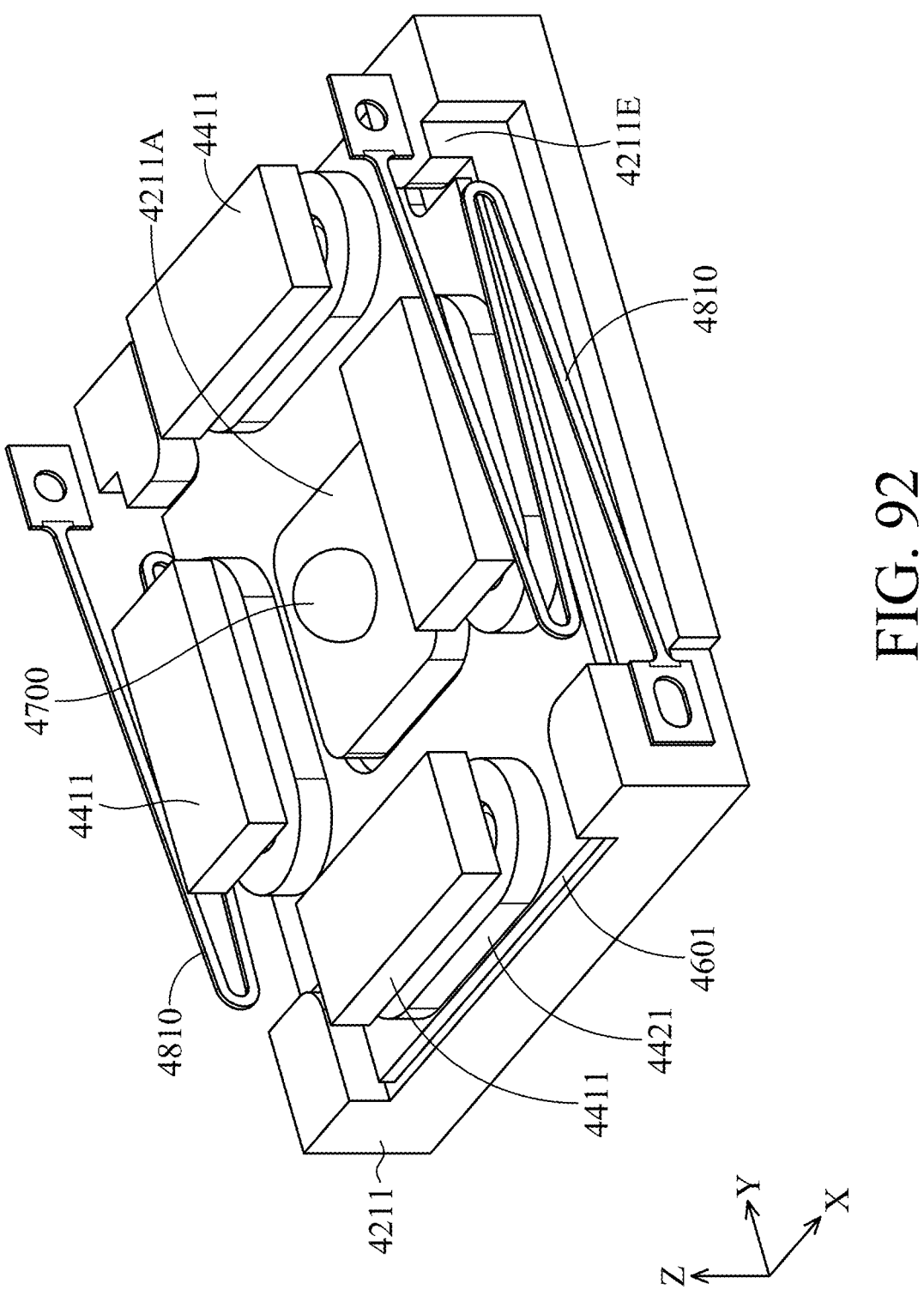
FIG. 92 is a schematic view of some elements of the optical element driving mechanism.
Figure 93:
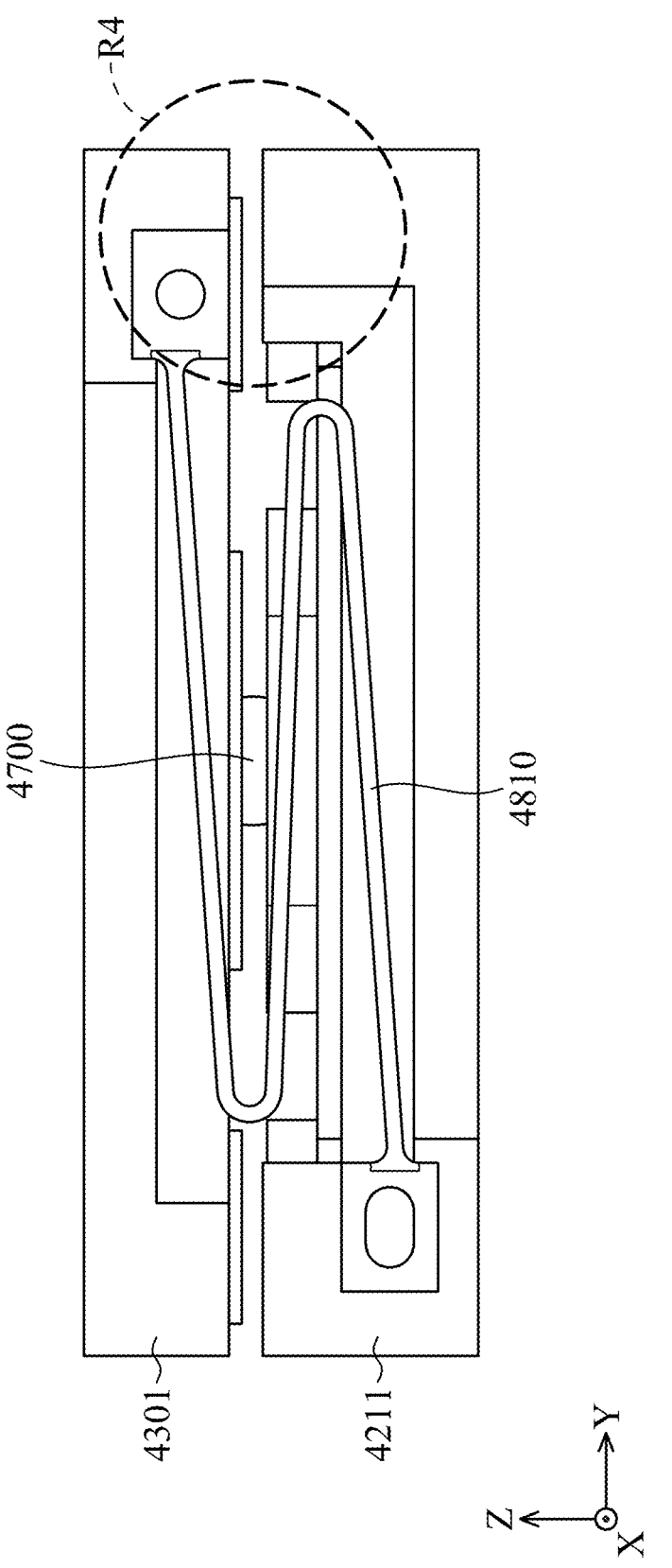
FIG. 93 is a side view of the optical element driving mechanism.

The resilient elements 4810 may be disposed on the sides of the optical element driving mechanism 4101, such as disposed on opposite sides of the optical element driving mechanism 4101, and the main axis O14 is positioned between two resilient elements 4810. Furthermore, the resilient elements 4810 may be disposed on a plane that is perpendicular to the main axis O14. Furthermore, the resilient element 4810 may be S-shaped. The resilient element 4810 may connect the fixed portion F14 (the base 4211) and the movable portion 4301 to restrict the movable range of the movable portion 4301 relative to the fixed portion F14. Moreover, as shown in FIG. 91, FIG. 92, and FIG. 93, the base 4211 may has a recess 4211E at its side, and the resilient element 4810 may be partially disposed in the recess 4211E to protect the resilient element 4810 from being damaged. The resilient elements 4810 does not overlap the driving assembly D14 when viewed along the main axis O14, so the size of the optical element driving mechanism 4101 in Z axis may be reduced.

As shown in FIG. 91, the magnetic permeable element 4801 may be disposed in the base 4211—for example, it may be embedded in the base 4211—and is not exposed from the base 4211. The magnetic permeable element 4801, the first magnetic element 4411 and the second magnetic element 4421 may at least partially overlap each other along the main axis O14, and the material of the magnetic permeable element 4801 may include metal. As a result, the magnetic field of the first magnetic element 4411 and the second magnetic element 4421 may be adjusted, and miniaturization may be achieved. Furthermore, a magnetic force may be generated between the first magnetic element 4411 or the second magnetic element 4421 and the magnetic permeable element 4801, so the elements disposed between the first magnetic element 4411, the second magnetic element 4421 and the magnetic permeable element 4801 may be fixed.

Figure 94:
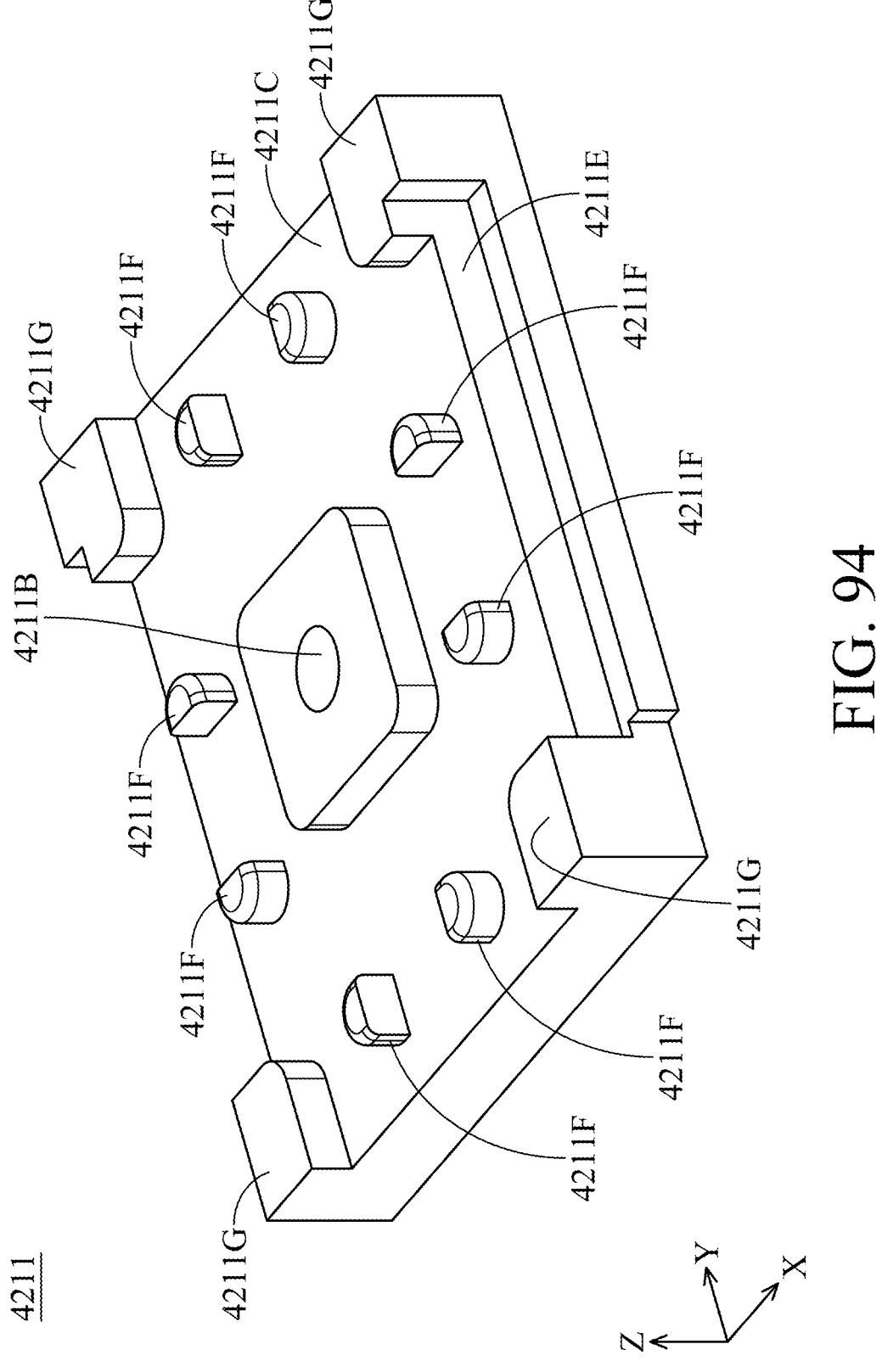
FIG. 94 is a schematic view of the base.

FIG. 94 is a schematic view of the base 4211. The base 4211 may include convex portions 4211F that extend pair by pair in Z direction. The second magnetic element 4421 may surround two convex portions 4211F, the position sensor 4431 may be positioned between two convex portions 4211F, and the second magnetic element 4421 may surround the position sensor 4431. Furthermore, the base 4211 may include stopping portions 4211G to limit the movable range of the movable portion 4301 relative to the base 4211. In some embodiments, the circuit may be provided in the base 4211—for example, it may be embedded in the base 4211 (not shown)—and it may be electrically connected to the driving assembly D14 to provide an electrical signal. In some embodiments, the stopping portions 4211G may be positioned at the corners of the base 4211 to further utilize the space at the corners. However, the present disclosure is not limited thereto. For example, stopping portions that extends to the movable portion 4301 may be disposed on the sides of the base 4211 (not shown).

Figure 95:
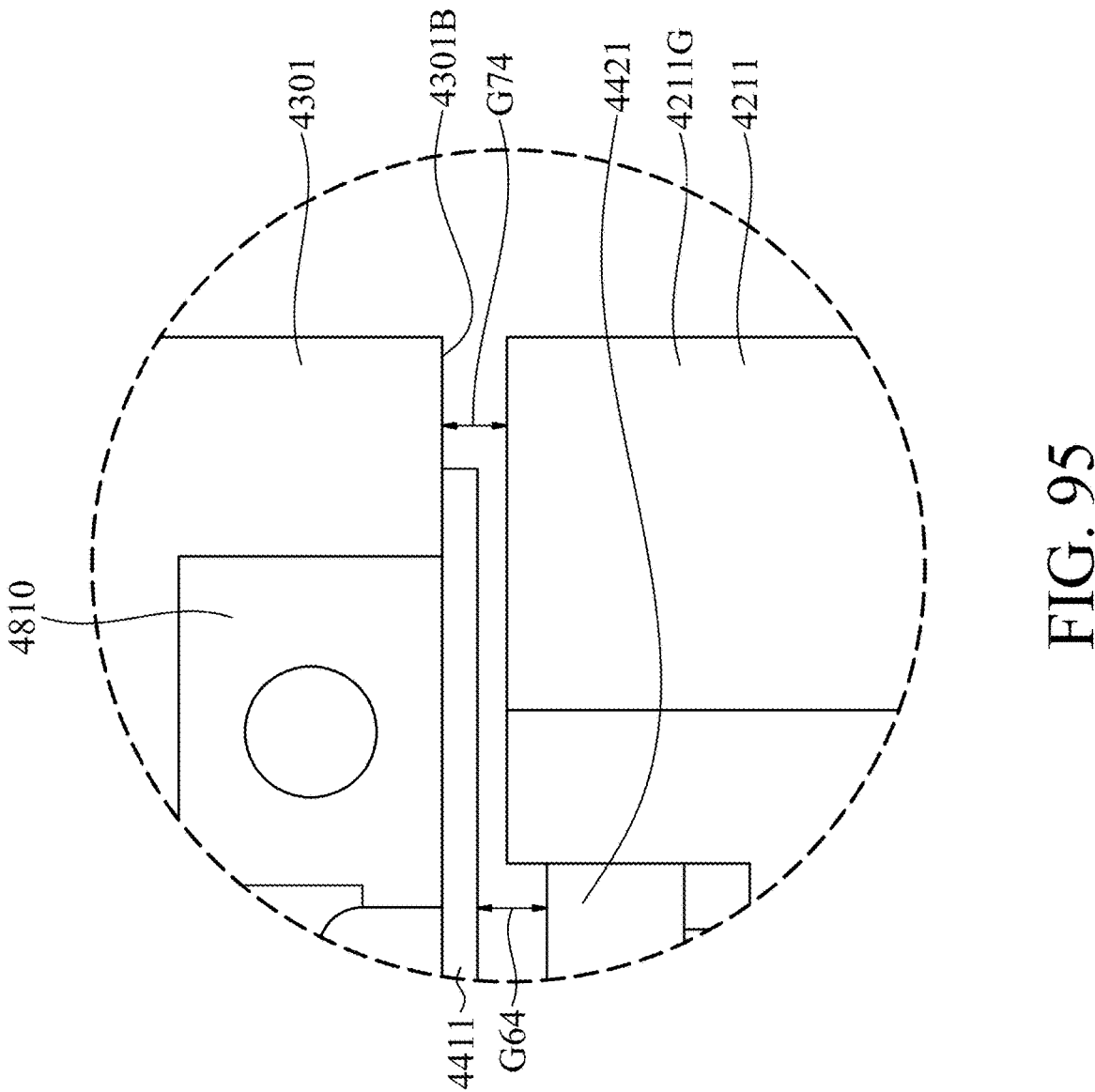
FIG. 95 is an enlarged view of the portion R4 in FIG. 93.

FIG. 95 is an enlarged view of the portion R4 in FIG. 93. As shown in FIG. 95, the distance G64 between the first magnetic element 4411 and the second magnetic element 4421 is greater than the distance G74 between the stopping portion 4211G and the movable portion 4301. As a result, the first magnetic element 4411 and the second magnetic element 4421 may be prevented from colliding with each other.

Figure 96:
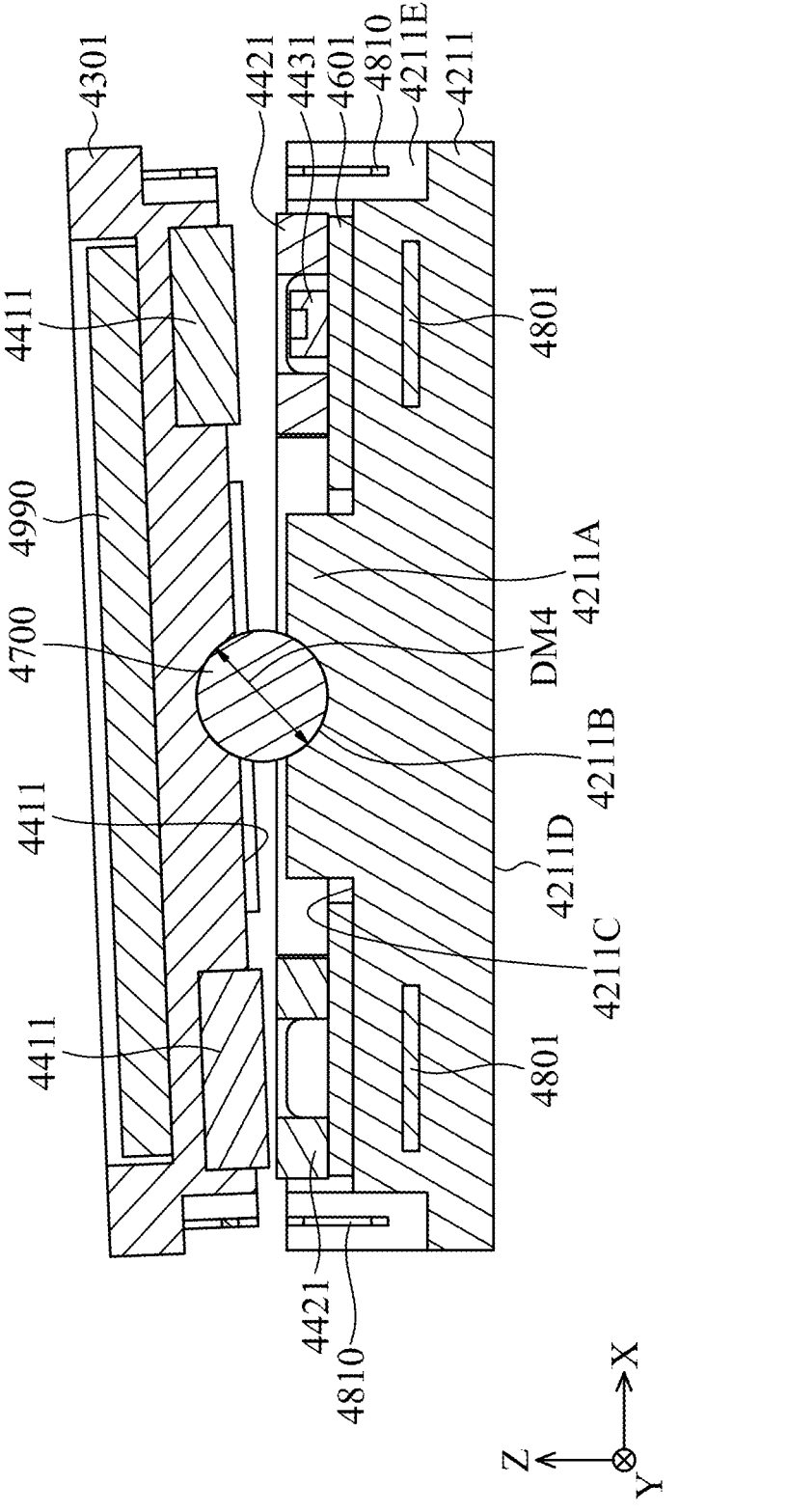
FIG. 96 is a schematic view when the optical element driving mechanism is operating.

FIG. 96 is a cross-sectional view of the movable portion 4301 of the optical element driving mechanism 4101 and other elements disposed on the movable portion 4301 when these elements rotate in Y axis relative to the fixed portion F14. As shown in FIG. 96, the movable portion 4301 and the optical module 4990 disposed on the movable portion 4301 may use the spherical support element 4700 as a fulcrum to rotate in different directions by the force generated from the driving assembly D14. Although the embodiment in FIG. 96 only shows the movable portion 4301 rotating in a single axis, but it should be noted that the movable portion 4301 may rotate in more than one axes, such as X, Y, and Z axes, to achieve optical image stabilization (OIS).

Although the second magnetic element 4421 in aforementioned embodiments surrounds the convex portions 4211F of the base 4211, the present disclosure is not limited thereto. For example, FIG. 97 to FIG. 100 are a schematic view, an exploded view of the optical element driving mechanism 4102 in another embodiments of the present disclosure, a cross-sectional view illustrated along the line B4-B4 in FIG. 97, and a side view of the optical element driving mechanism 4102, respectively. It should be noted that some elements are omitted in FIG. 97 for clarity.

Figure 98:
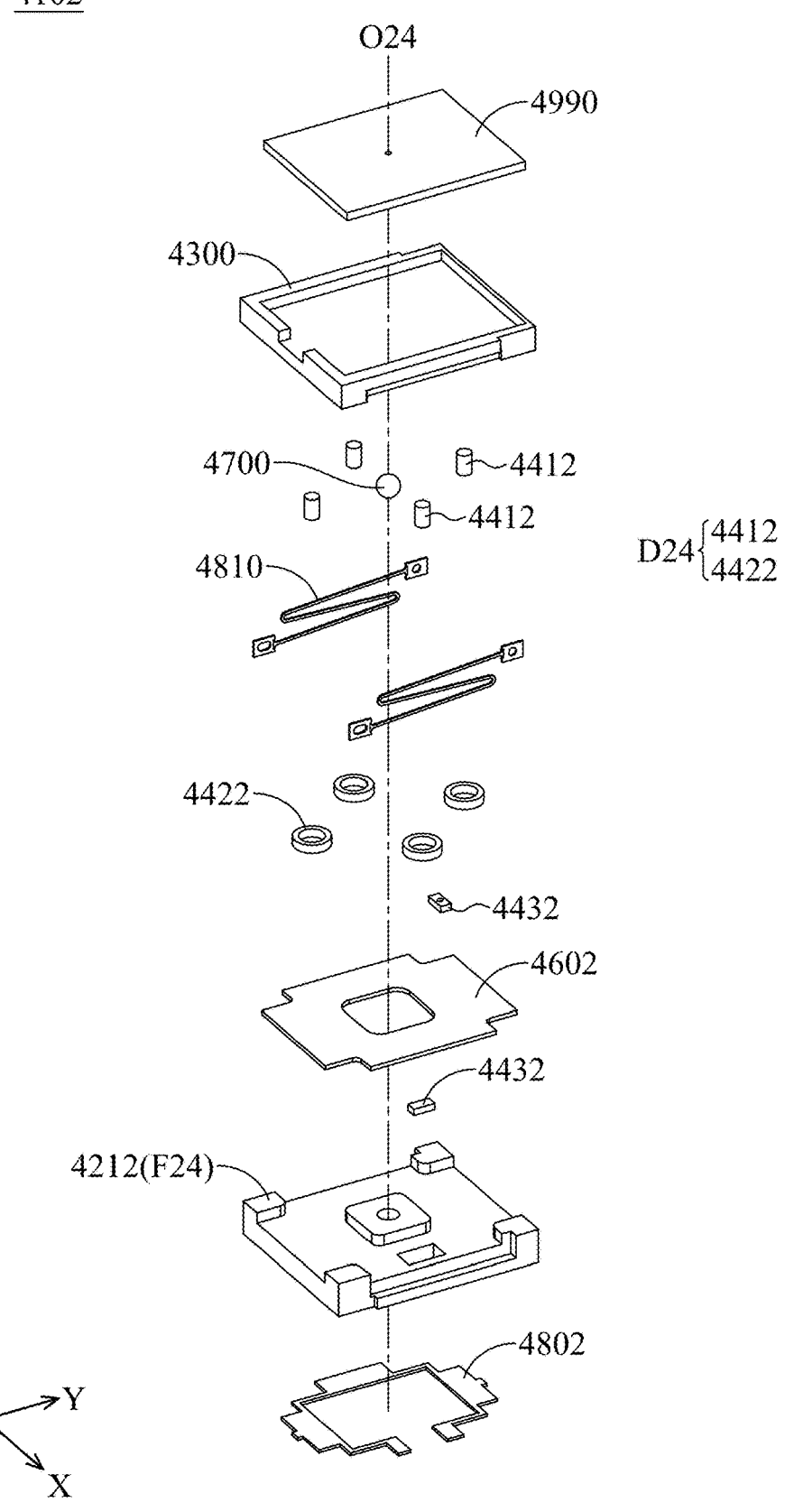
FIG. 98 is an exploded view of the optical element driving mechanism.

In FIG. 98, the optical element driving mechanism 4102 mainly includes a base 4212 (or called as a fixed portion F24), a movable portion 4302, a first magnetic element 4412 and a second magnetic element 4422 (may be called as a driving assembly D24), a position sensor 4432, a circuit board 4602, a support element 4700, a magnetic permeable element 4802, and a resilient element 4810. The optical element driving mechanism 4102 may be used to drive the optical module 4990 or other optical elements. Identical or similar elements are not described again.

Figure 97:
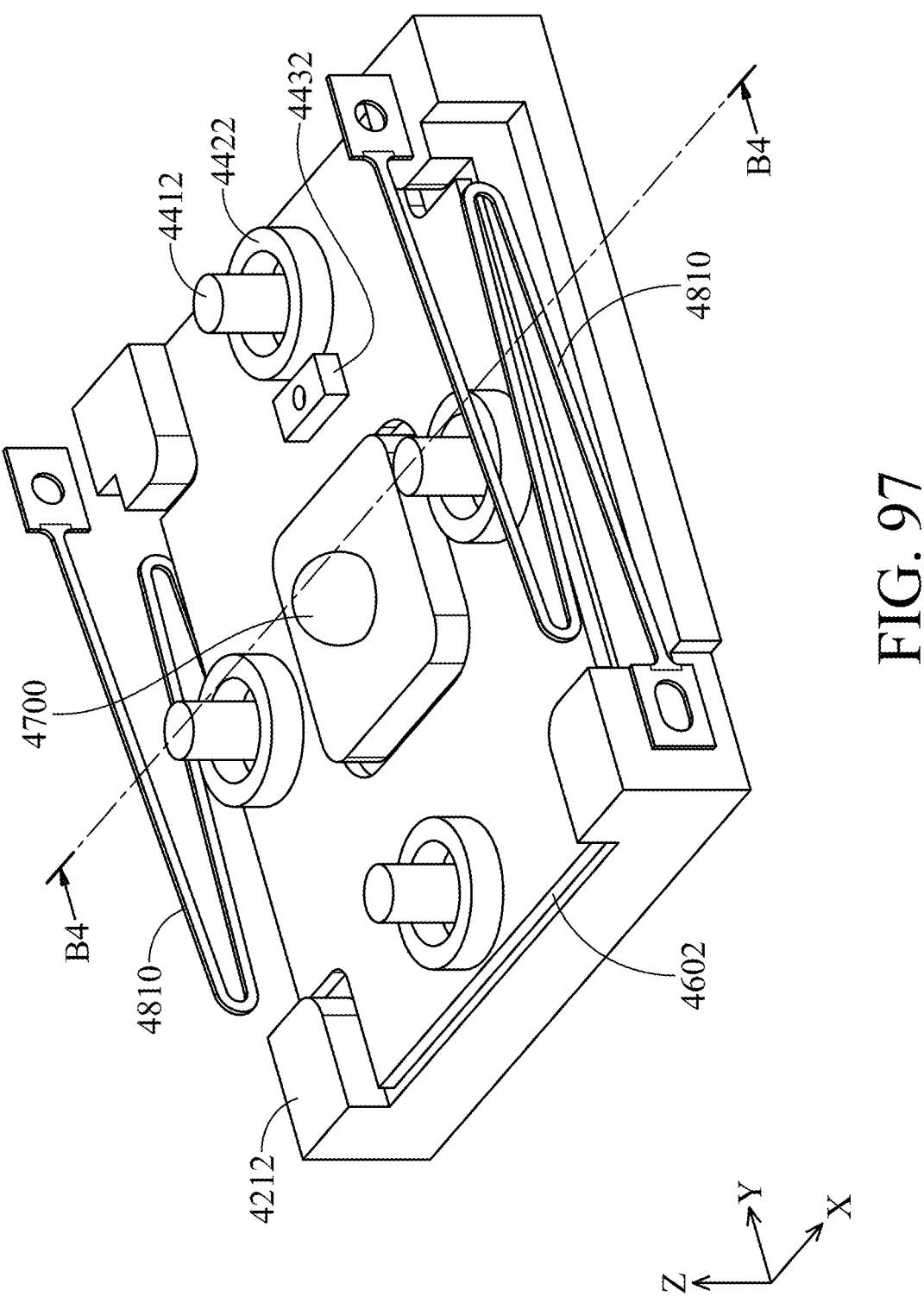
FIG. 97 is a schematic view of some elements of the optical element driving mechanism in some embodiments of the present disclosure.
Figure 99:
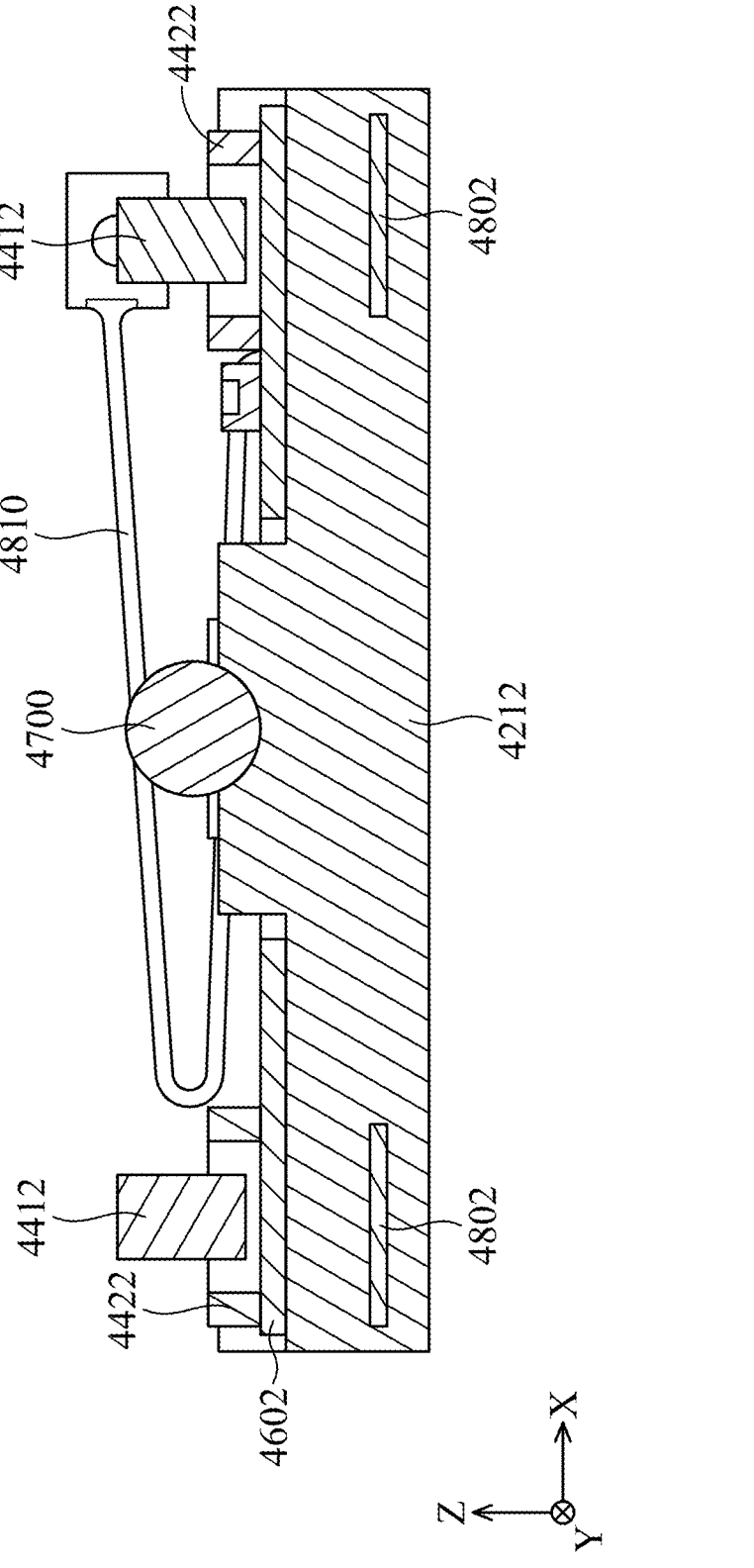
FIG. 99 is a cross-sectional view of the optical element driving mechanism.
Figure 100:
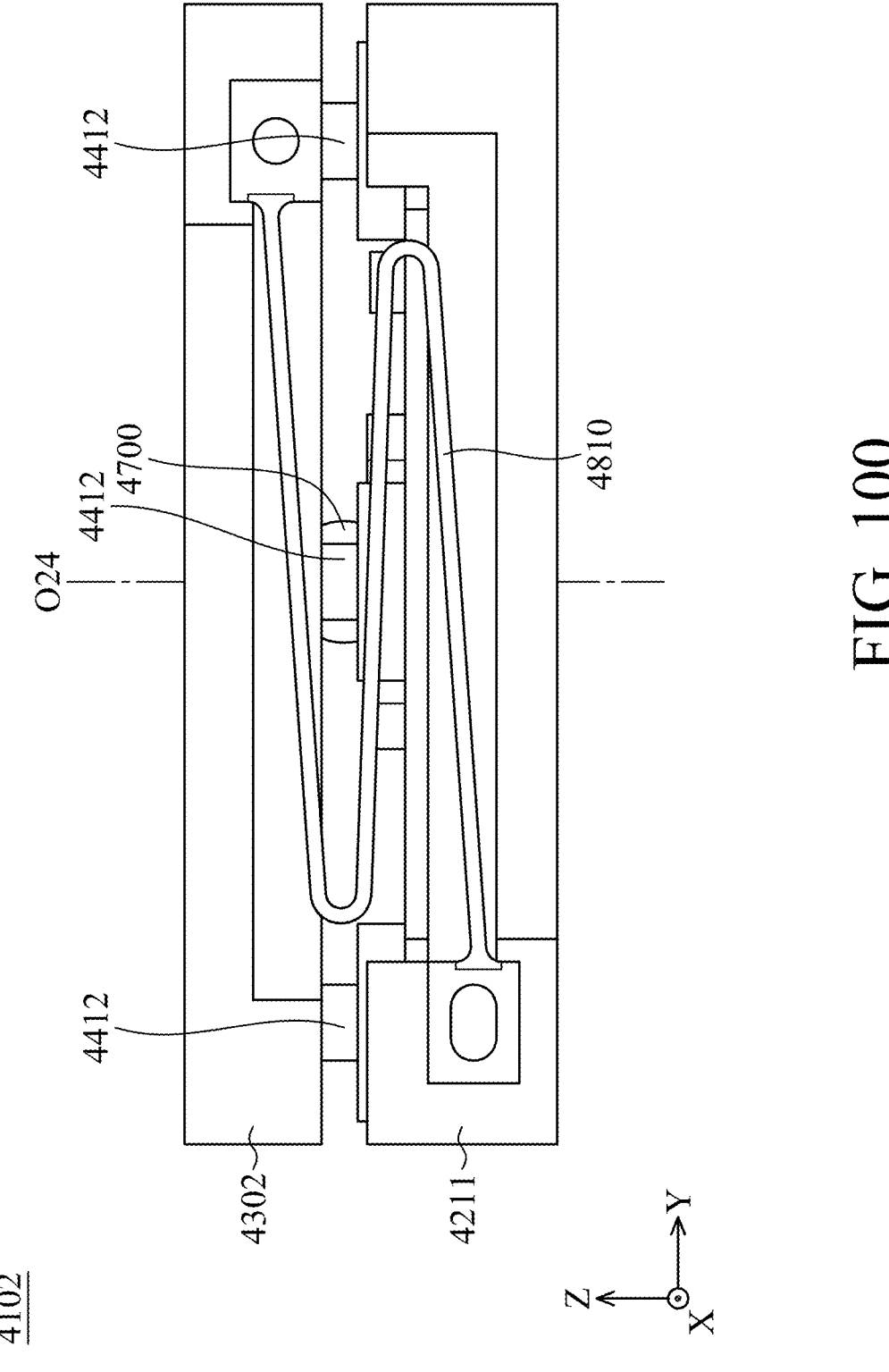
FIG. 100 is a side view of the optical element driving mechanism.

In this embodiment, as shown in FIG. 97 and FIG. 99, the first magnetic element 4412 may be disposed in the second magnetic element 4422. In other words, as shown in FIG. 100, the first magnetic element 4412 and the second magnetic element 4422 are at least partially overlap each other to reduce the required space in a direction that is perpendicular to the main axis O24. In some embodiments, the second magnetic element 4422 may be disposed on the circuit board 4602, and the first magnetic element 4412 may be disposed on the movable portion 4302 and may be separated from the circuit board 4602 by a distance. In some embodiments, the first magnetic element 4412 may be disposed in the movable portion 4302 to fix the first magnetic element 4412. In some embodiments, the positions of the first magnetic element 4412 and the second magnetic element 4422 may be interchanged. As a result, the electromagnetic force generated between the first magnetic element 4412 and the second magnetic element 4422 may drive the movable portion 4302 to move relative to the fixed portion F24.

Figure 101:
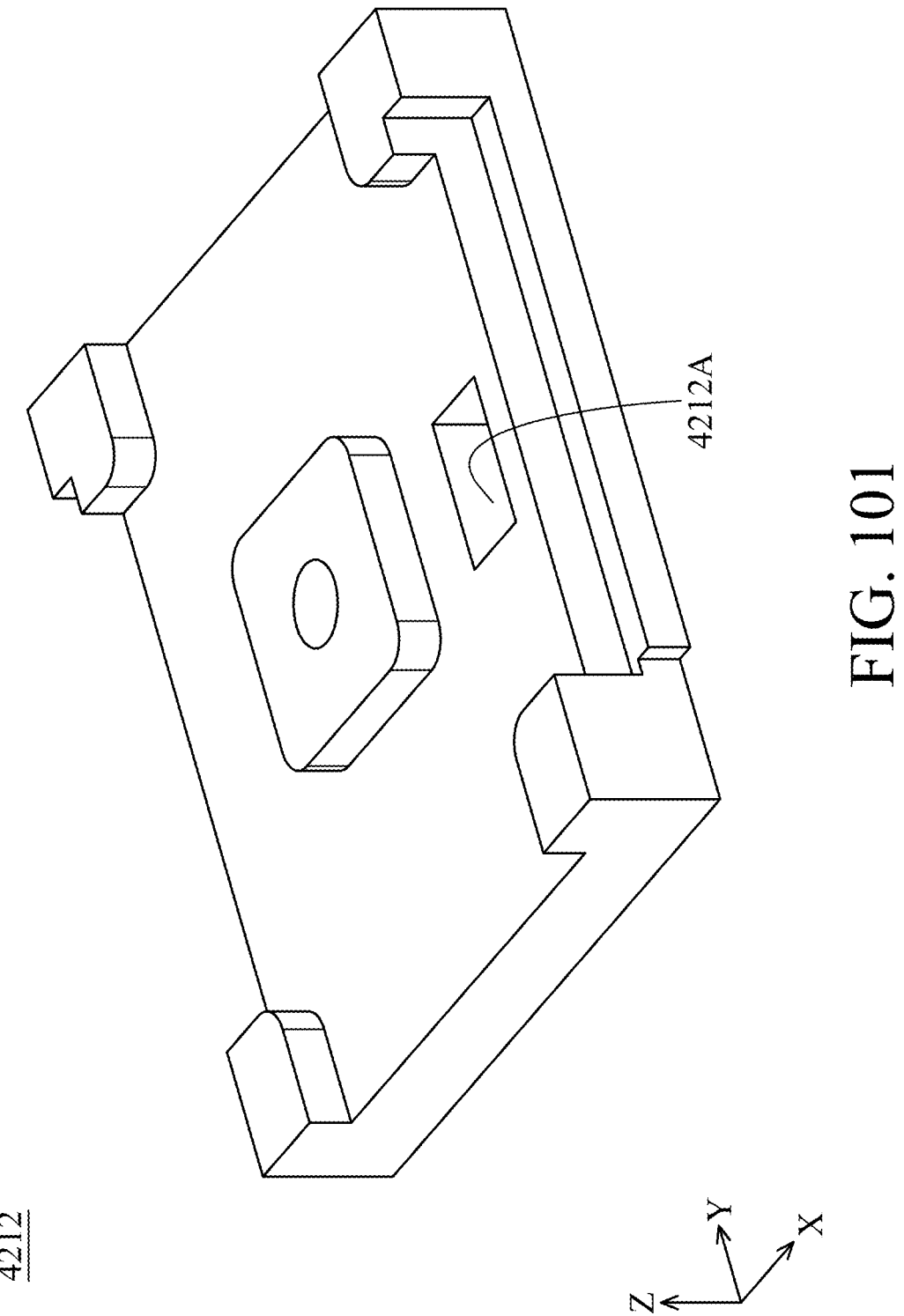
FIG. 101 is a schematic view of the base.
Figure 102:
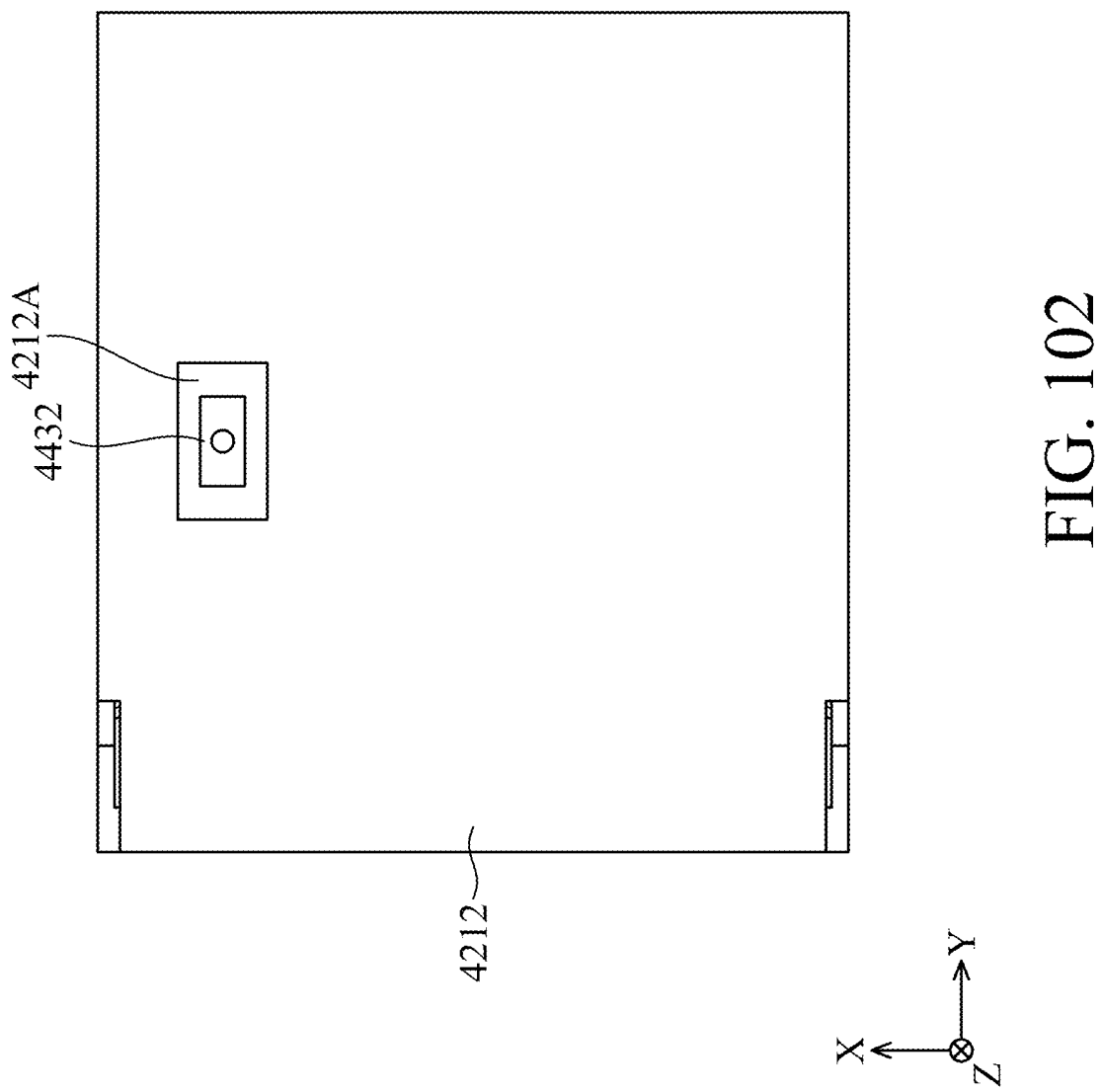
FIG. 102 is a bottom view of some elements of the optical element driving mechanism.

FIG. 101 is a schematic view of the base 4212, and FIG. 102 is a bottom view of the base 4212 and the position sensor 4432. An opening 4212A may be formed on the base 4212, and the position sensor 4432 may be positioned in the opening 4212A to protect the position sensor 4432 and achieving miniaturization. In other words, the position sensor 4432 and the driving assembly D24 may be disposed on the same side (FIG. 97) or they may be disposed on opposite sides (FIG. 102) of the circuit board 4602. Furthermore, the thickness of the position sensor 4432 may be less than the thickness of the base 4212 along the main axis O24, so the position sensor 4432 may be protected by the base 4212. In some embodiments, the opening 4212A may be replaced by a recess to increase the mechanical strength of the base 4212. In some embodiments, the first magnetic element 4412 or the second magnetic element 4422 may at least partially overlap the position sensor 4432 along the main axis O24 to detect the magnetic field variation of the first magnetic element 4412 or the second magnetic element 4422.

Figure 103:
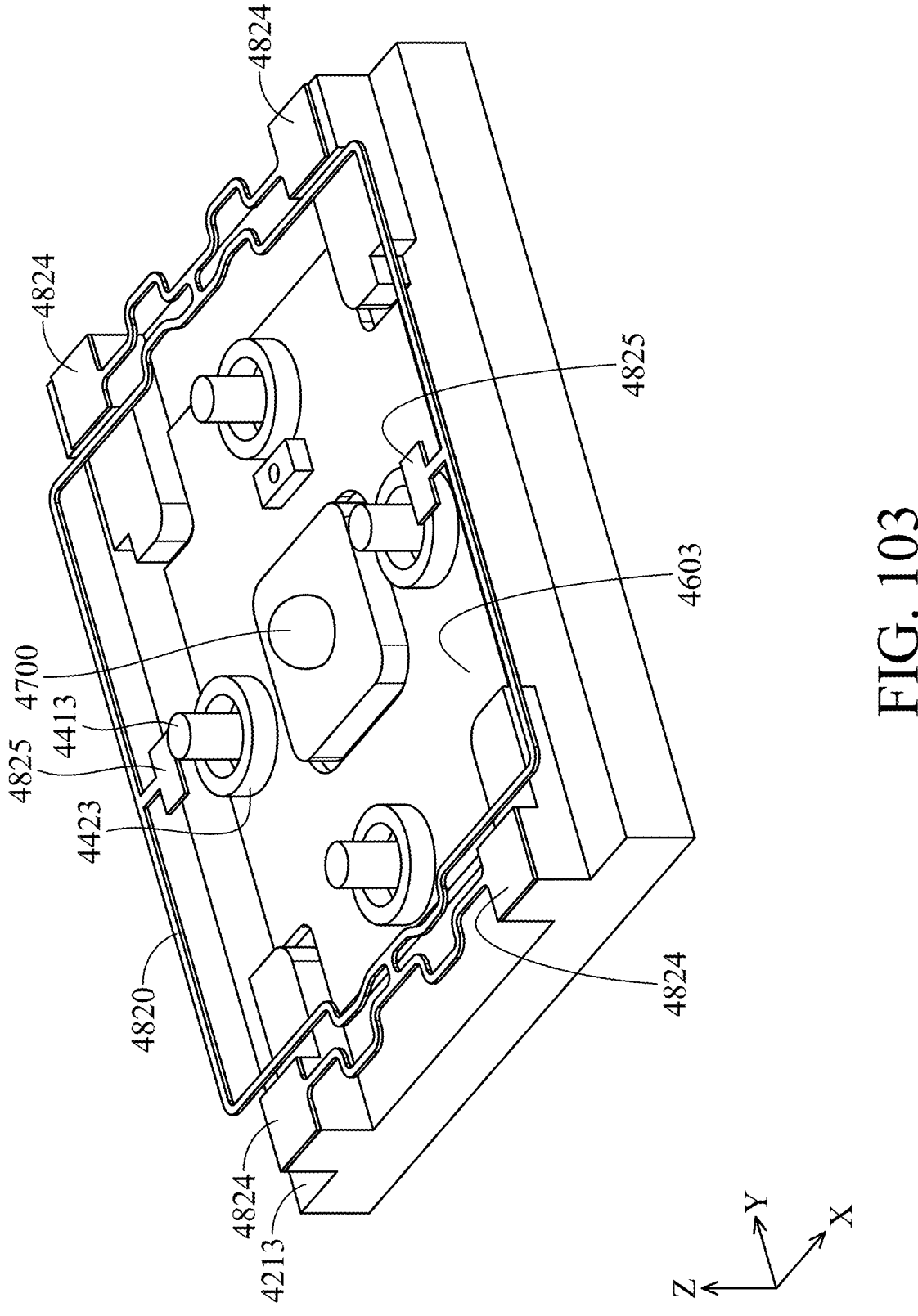
FIG. 103 is a schematic view of some elements of the optical element driving mechanism in some embodiments of the present disclosure.

In the aforementioned embodiments, the movable portion and the fixed portion are connected by the resilient elements 4810 disposed on the sides of the optical element driving mechanism, but the present disclosure is not limited thereto. For example, FIG. 103 to FIG. 103 are a schematic view, an exploded view, a cross-sectional view, and a side view of an optical element driving mechanism 4103, respectively. It should be noted that some elements are omitted in FIG. 103 for clarity.

Figure 104:
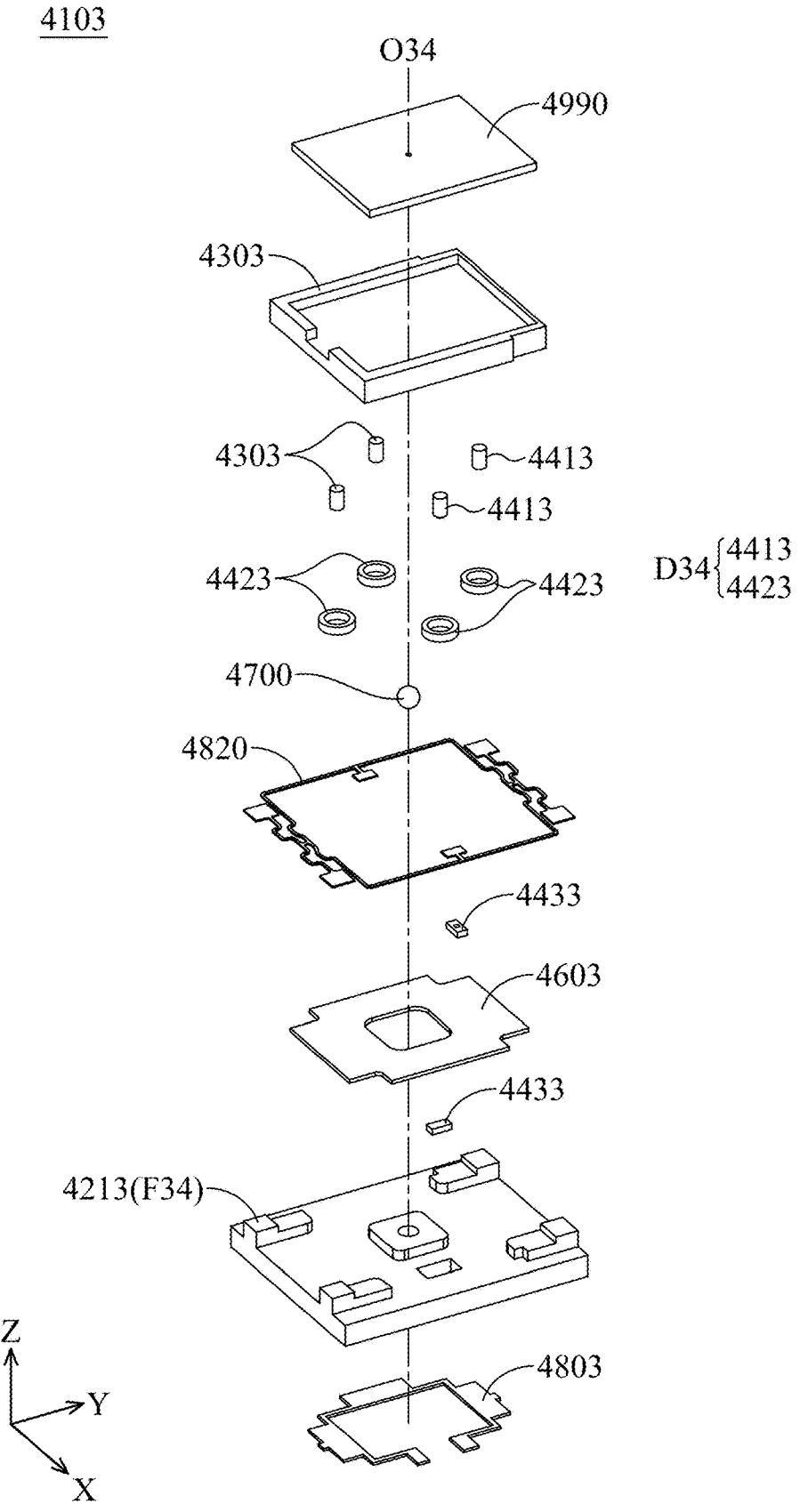
FIG. 104 is an exploded view of the optical element driving mechanism.
Figure 105:
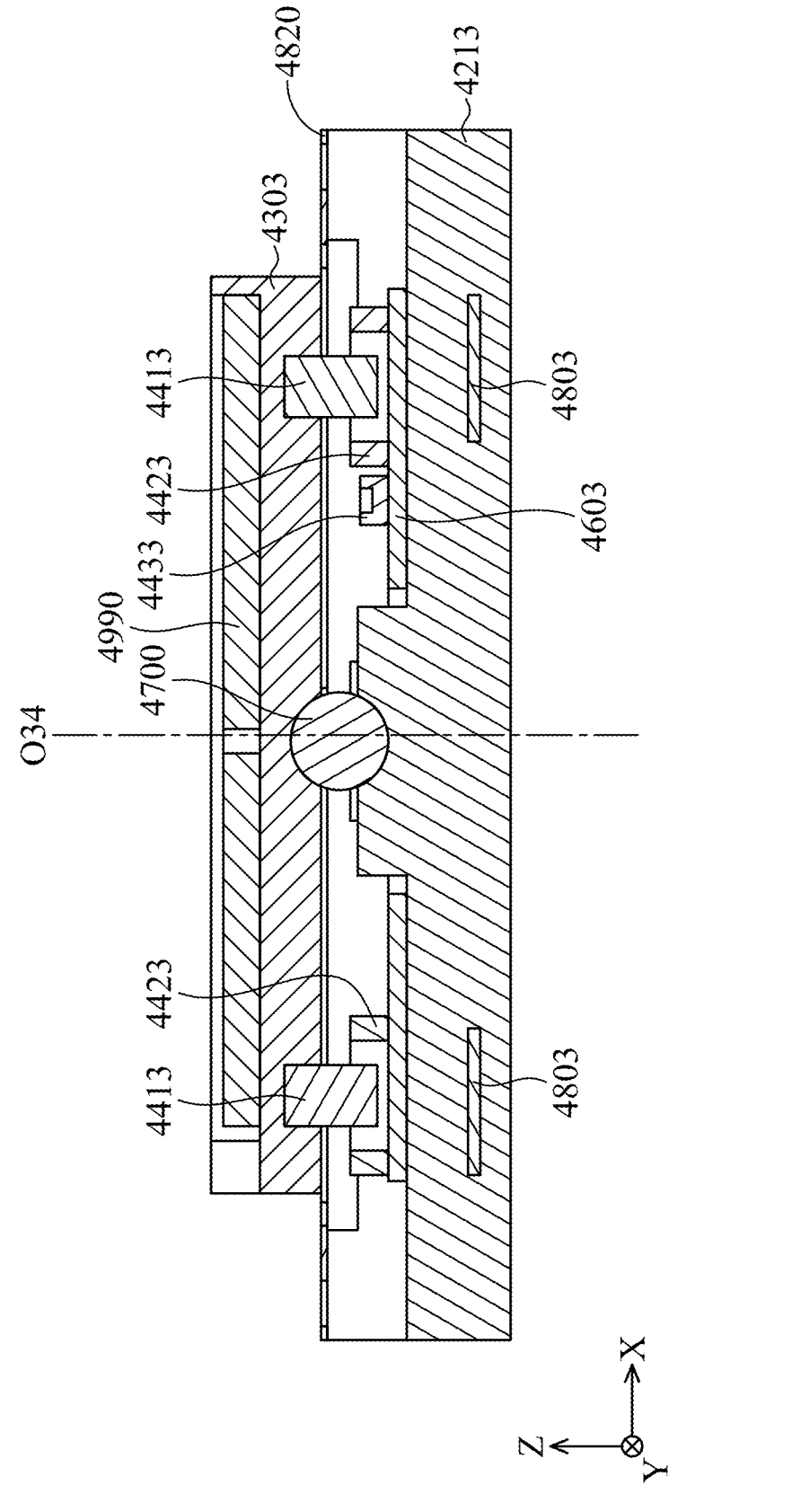
FIG. 105 is a cross-sectional view of the optical element driving mechanism.
Figure 106:
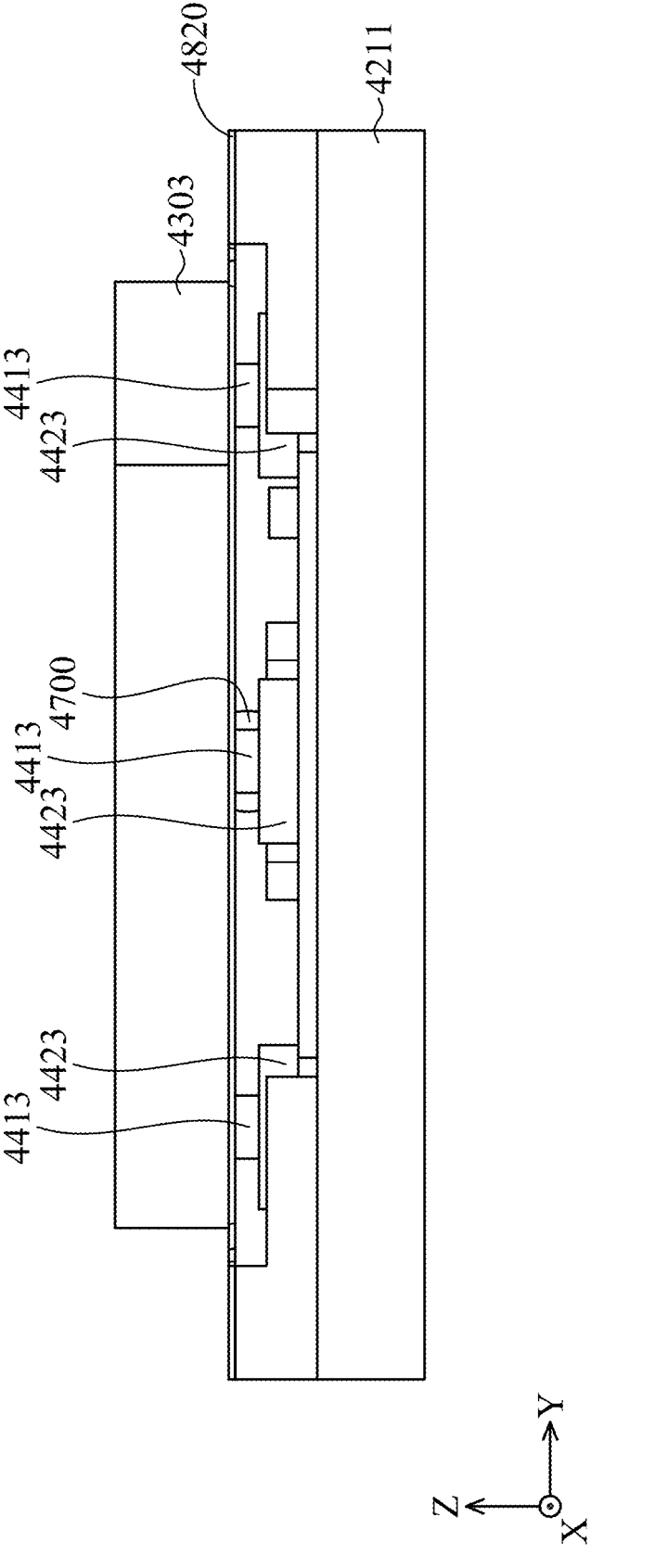
FIG. 106 is a side view of the optical element driving mechanism.

In FIG. 104, the optical element driving mechanism 4103 mainly includes a base 4213 (or called as a fixed portion F34), a movable portion 4303, a first magnetic element 4413 and a second magnetic element 4423 (may be called as a driving assembly D34), a position sensor 4433, a circuit board 4603, a support element 4700, a magnetic permeable element 4803, and a resilient element 4820. The optical element driving mechanism 4103 may be used to drive the optical module 4990 or other optical elements. Identical or similar elements are not described again.

Figure 107:
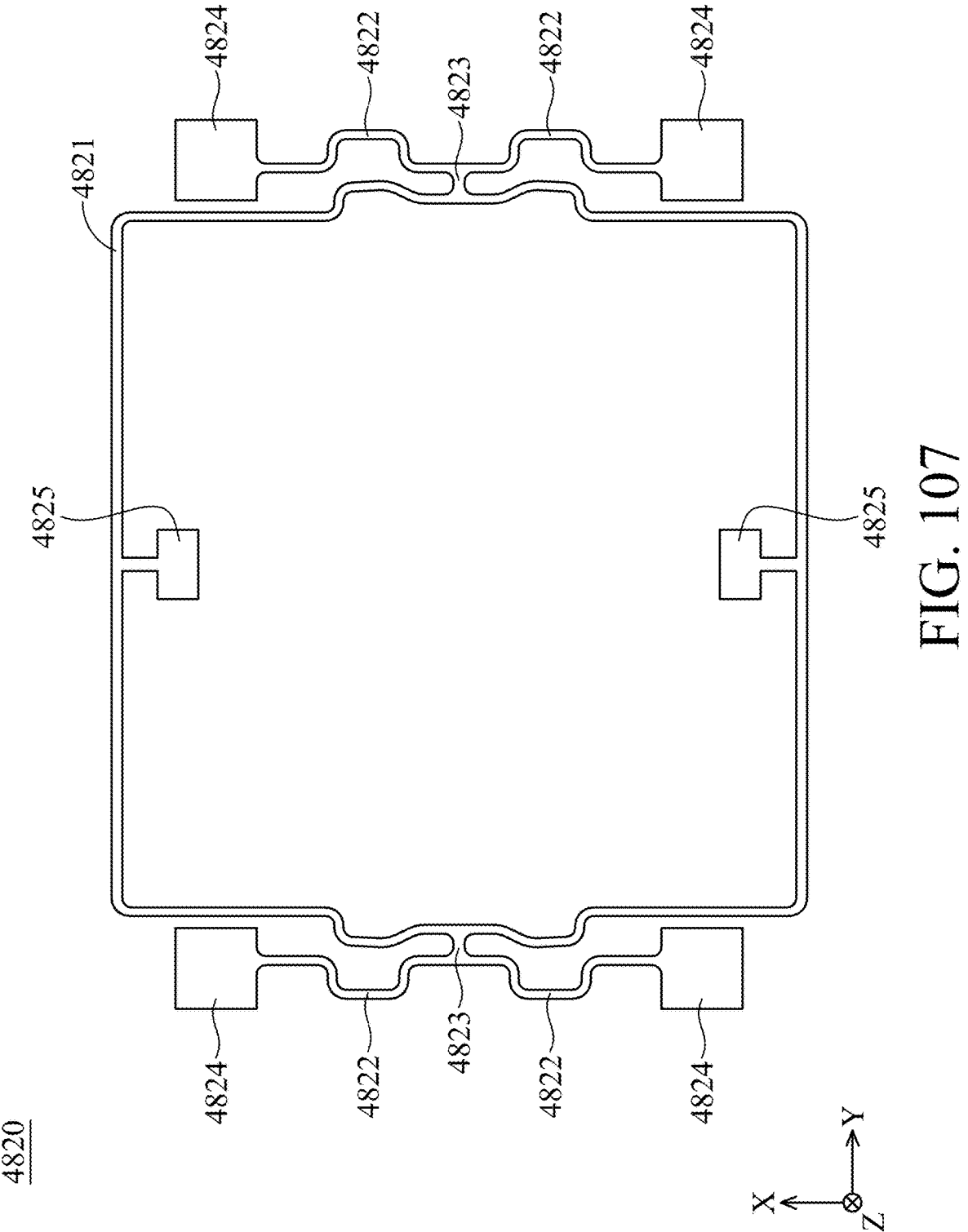
FIG. 107 is a schematic view of a resilient element.

In the optical element driving mechanism 4103, the movable portion 4303 and the fixed portion F34 are connected by the resilient element 4802 rather than the resilient element 4810 in previous embodiments. FIG. 107 is a schematic view of the resilient element 4820. The resilient element 4820 includes an inner portion 4821, an extension portion 4822, a connecting portion 4834 connecting the inner portion 4821 and the extension portion 4822, a contact portion 4824 positioned at an end of the extension portion 4822, and a contact portion 4825 positioned on the inner portion 4821. As shown in FIG. 103, the contact portion 4824 may be directly disposed on the base 4213 and connect to the base 4213, such as affixed on the base 4213 by gluing. The contact portion 4825 may be disposed on the movable portion 4303 (not shown in FIG. 103). As a result, the movable portion 4304 and the fixed portion F34 may be connected by a single resilient element 4820. In some embodiments, the circuit board 4303 and the resilient element 4820 may be disposed on different sides of the fixed portion F34 to reduce required space. In some embodiments, the resilient element 4820 is disposed on a plane having a normal vector that is parallel to the main axis O34.

It should be noted that the contact portion 4824 and/or the contact portion 4825 of the resilient element 4820 may be disposed on opposite sides of the optical element driving mechanism 4103 (opposite sides relative to the main axis O34) to balance the forces of the optical element driving mechanism 4103 in different directions. Furthermore, the contact portion 4824 and the contact portion 4825 may be positioned at different sides of the inner portion 4821. For example, as shown in FIG. 107, the contact portion 4824 is disposed on the outer side of the inner portion 4821, and the contact portion 4825 is disposed at the inner side of the inner portion 4821. However, the positions of the contact portion 4824 and the contact portion 4825 may be interchanged. As a result, required space may be reduced to achieve miniaturization. The resilient element 4820 may be disposed on a plate that is substantially perpendicular to the main axis O34. As a result, the rotation of the movable portion 4303 relative to the main axis O34 may be restricted.

Figure 108:
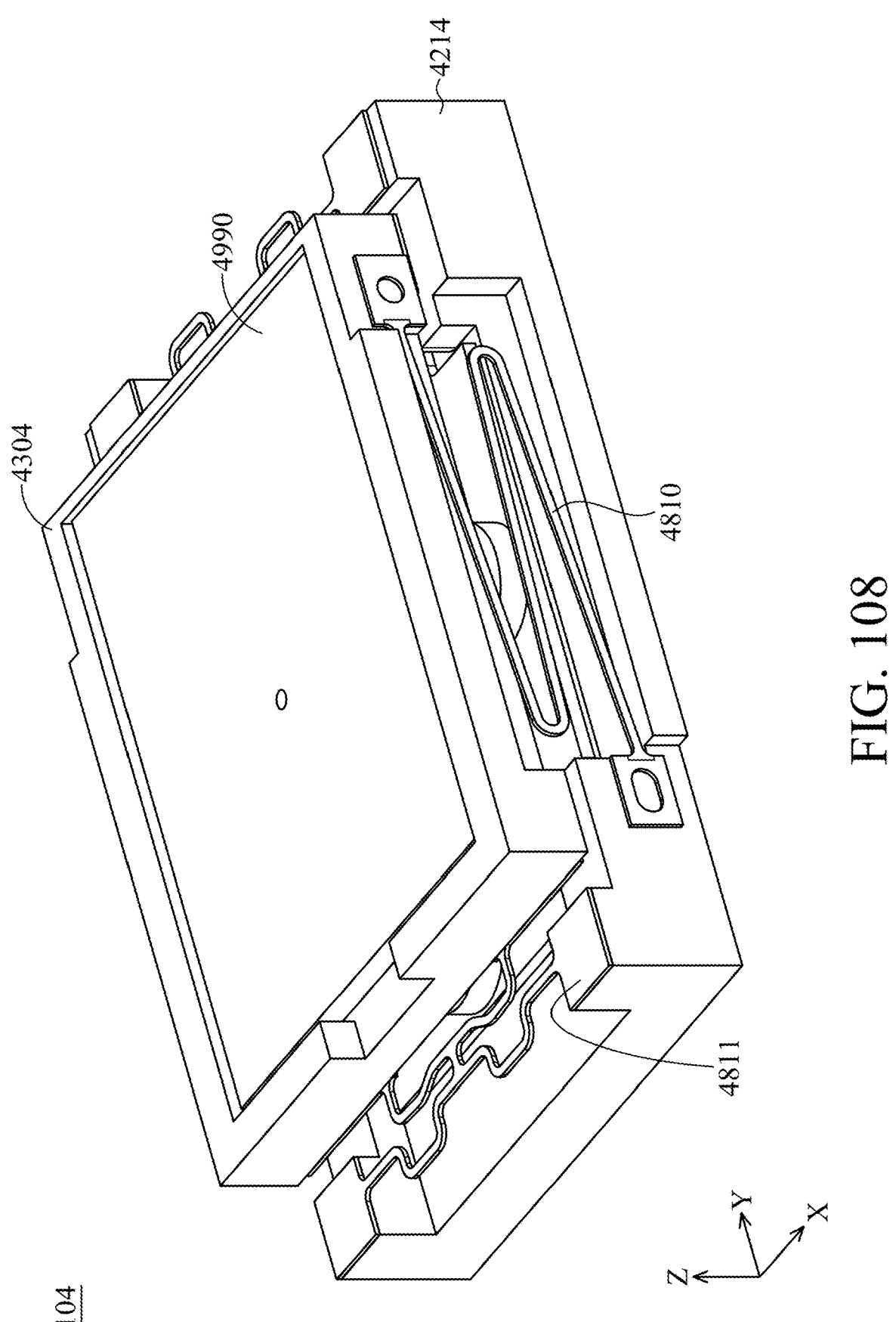
FIG. 108 is a schematic view of some elements of the optical element driving mechanism in some embodiments of the present disclosure.

In some embodiments, the resilient element 4810 and the resilient element that is disposed on the XY plane may be provided at the same time. For example, FIG. 108 to FIG. 110 are a schematic view, an exploded view, and a side view of an optical element driving mechanism 4104 in another embodiments of the present disclosure.

Figure 109:
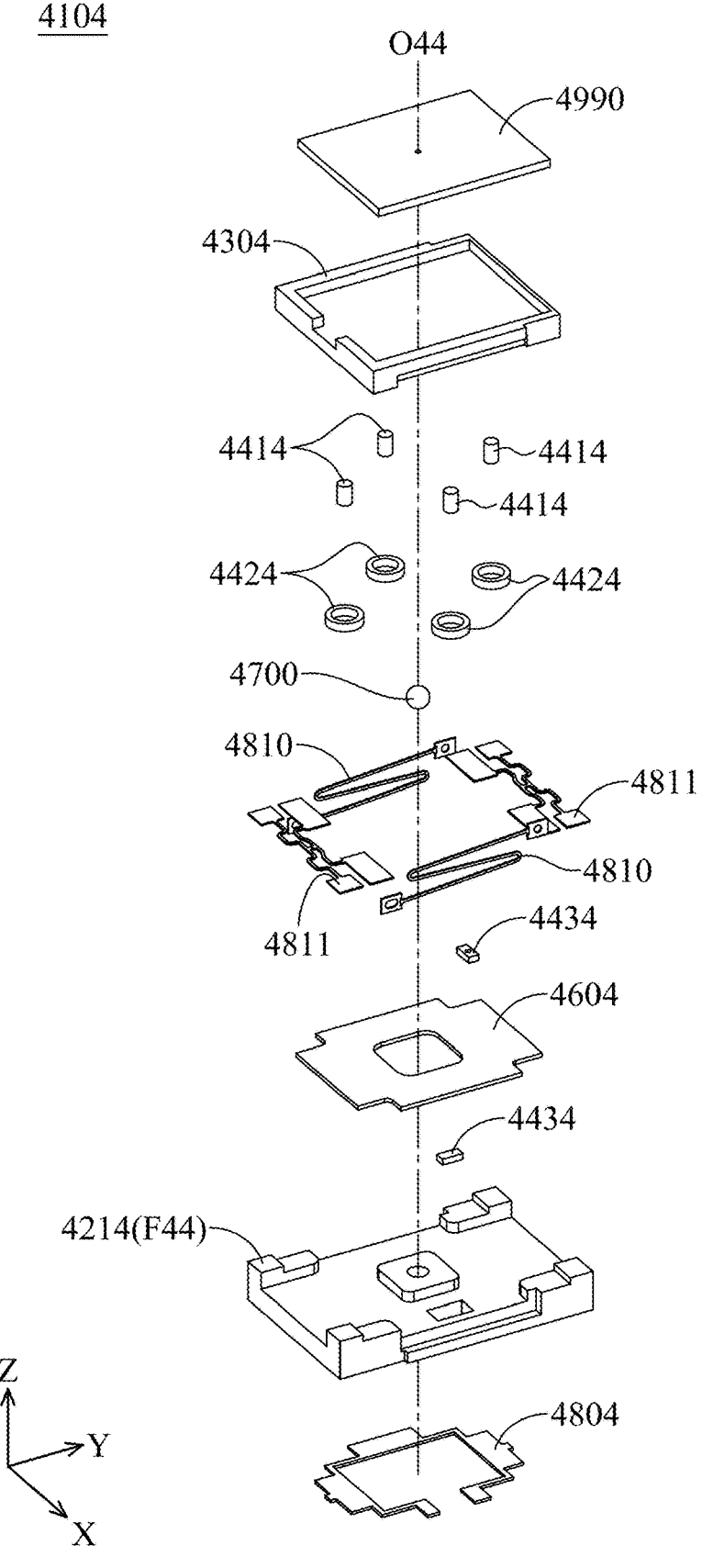
FIG. 109 is an exploded view of the optical element driving mechanism.

In FIG. 109, the optical element driving mechanism 4104 mainly includes a base 4214 (or called as a fixed portion F44), a movable portion 4304, a first magnetic element 4414 and a second magnetic element 4424 (may be called as a driving assembly D44), a position sensor 4434, a circuit board 4604, a support element 4700, a magnetic permeable element 4804, resilient elements 4810, and resilient elements 4811. The optical element driving mechanism 4104 may be used to drive the optical module 4990 or other optical elements. Identical or similar elements are not described again.

Figure 110:
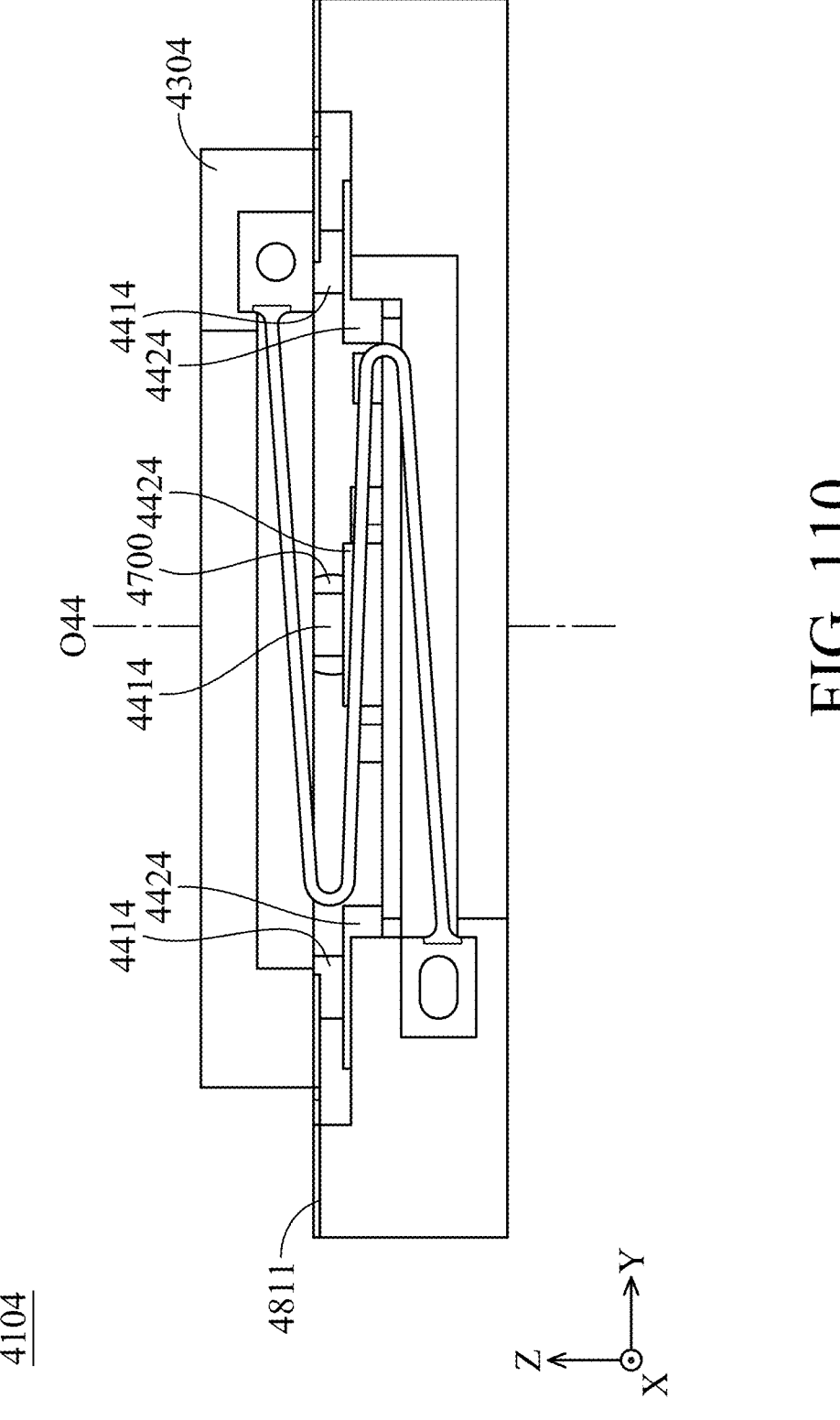
FIG. 110 is a side view of the optical element driving mechanism.

As shown in FIG. 110, the resilient elements 4810 and the resilient elements 4811 may connect to the movable portion 4304 and the fixed portion 4214, wherein the two resilient elements 4810 are disposed on two sides of the optical element driving mechanism 4104, and the resilient elements 4811 are disposed on another two sides of the optical element driving mechanism 4104. Furthermore, the resilient elements 4810 and the resilient elements 4811 are disposed on different sides of the optical element driving mechanism 4104. As a result, the maximum movable range of the movable portion 4304 indifferent directions relative to the fixed portion F44 may be restricted. The required space in a single side of the optical element driving mechanism 4104 may be reduced by letting the resilient elements 4810 and the resilient elements 4811 disposed on different sides of the optical element driving mechanism 4104, and miniaturization may be achieved.

Figure 111:
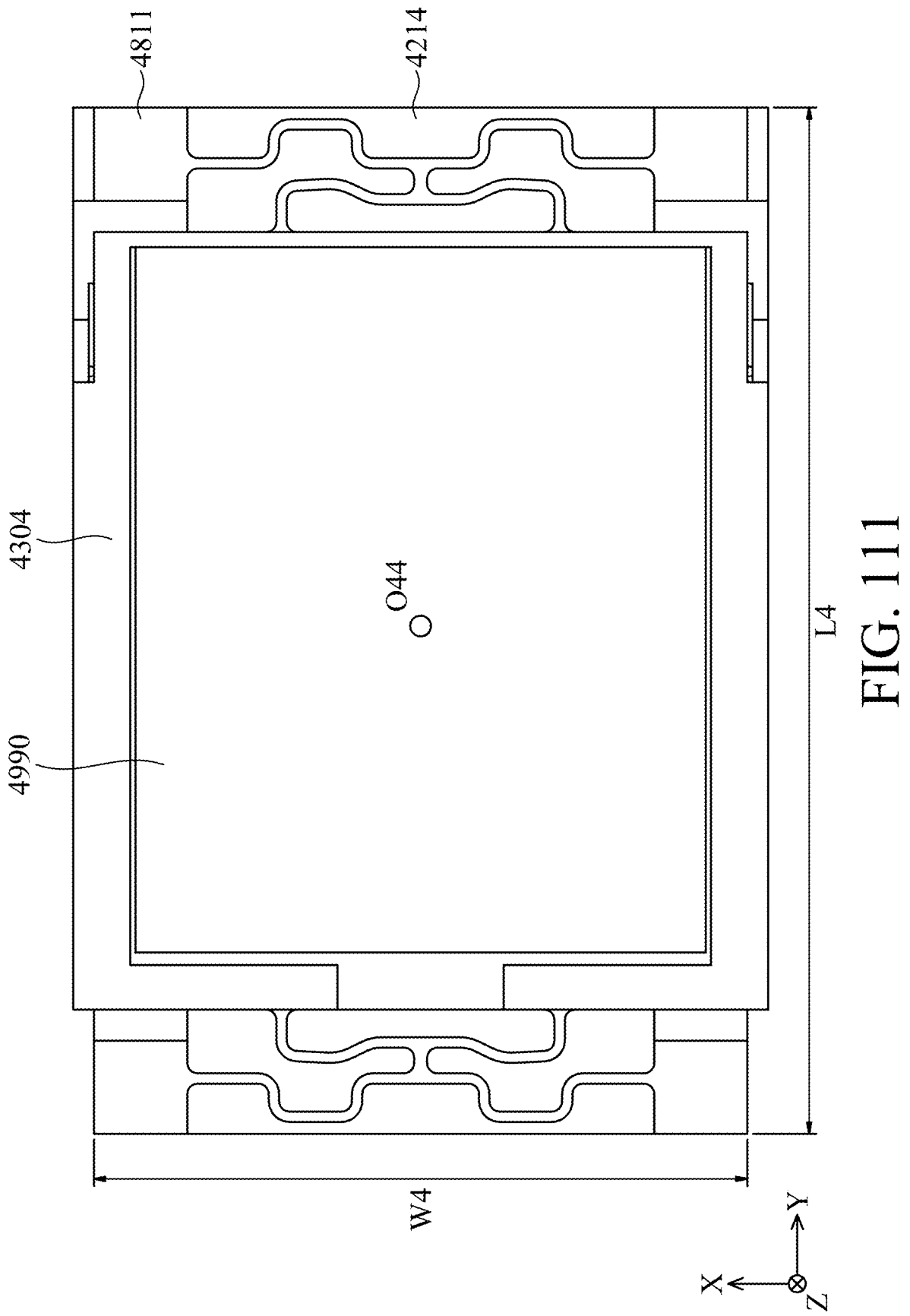
FIG. 111 is a top view of the optical element driving mechanism.

FIG. 111 is a top view of the optical element driving mechanism 4104. As shown in FIG. 111, the optical element driving mechanism 4104 has a rectangular shape, wherein the length is L4, the width is W4, and the length L4 is greater than the width W4. As a result, the size of the optical element driving mechanism 4104 in X axis may be reduced to achieve miniaturization.

Figure 112:
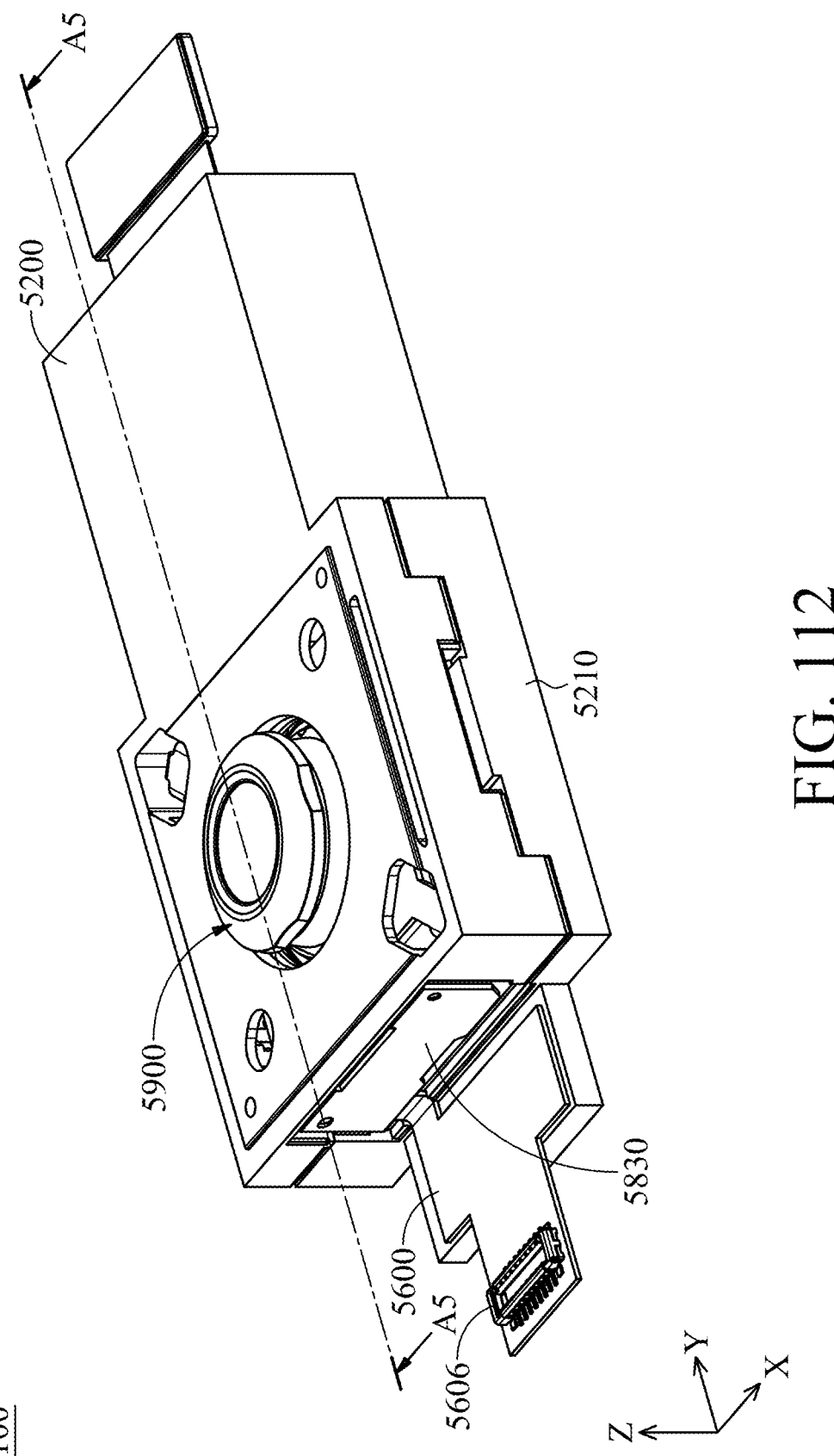
FIG. 112 is a perspective view of an optical element driving mechanism according to some embodiments of the present disclosure.
Figure 113:
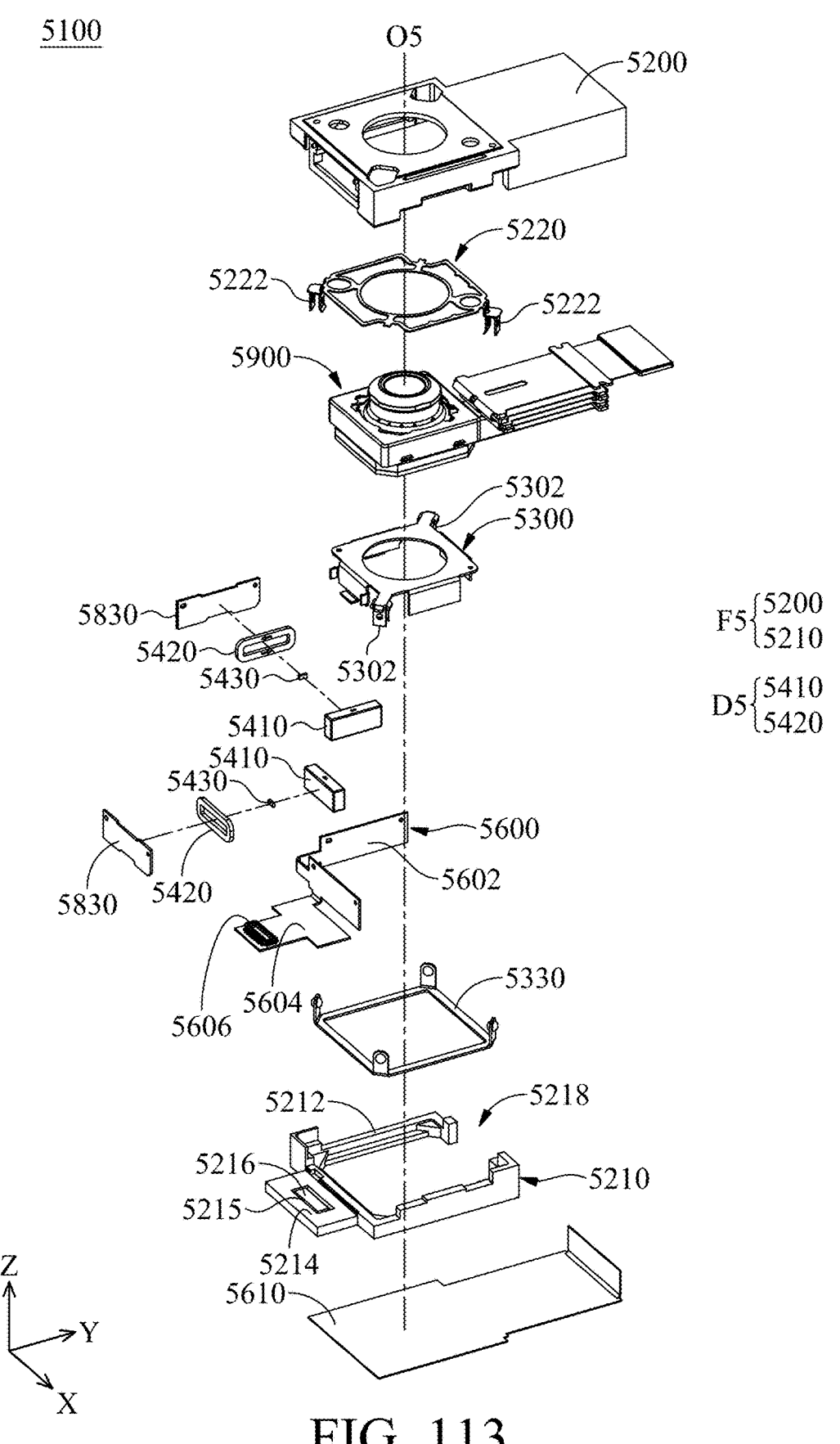
FIG. 113 is an exploded view of the optical element driving mechanism.

In some embodiments of the present disclosure, FIG. 112 to FIG. 115 are a perspective view and an exploded view of an optical element driving mechanism 5100, and a cross-sectional view illustrated along a line A5-A5 in FIG. 112, and a side view of the optical element driving mechanism 5100, respectively. In FIG. 113, the optical element driving mechanism 5100 mainly includes a case 5200, a base 5210, a movable portion 5300, a connecting element 5330, a first magnetic element 5410, a second magnetic element 5420, a position sensor 5430, a first circuit board 5600, a second circuit board 5610, and a magnetic permeable element 5830 arranged in a main axis O5. The optical element driving mechanism 5100 may be used for driving an optical module 5900, or may be used for driving various optical elements, such as a lens, a mirror, a prism, a beam splitter, or an aperture.

Figure 115:
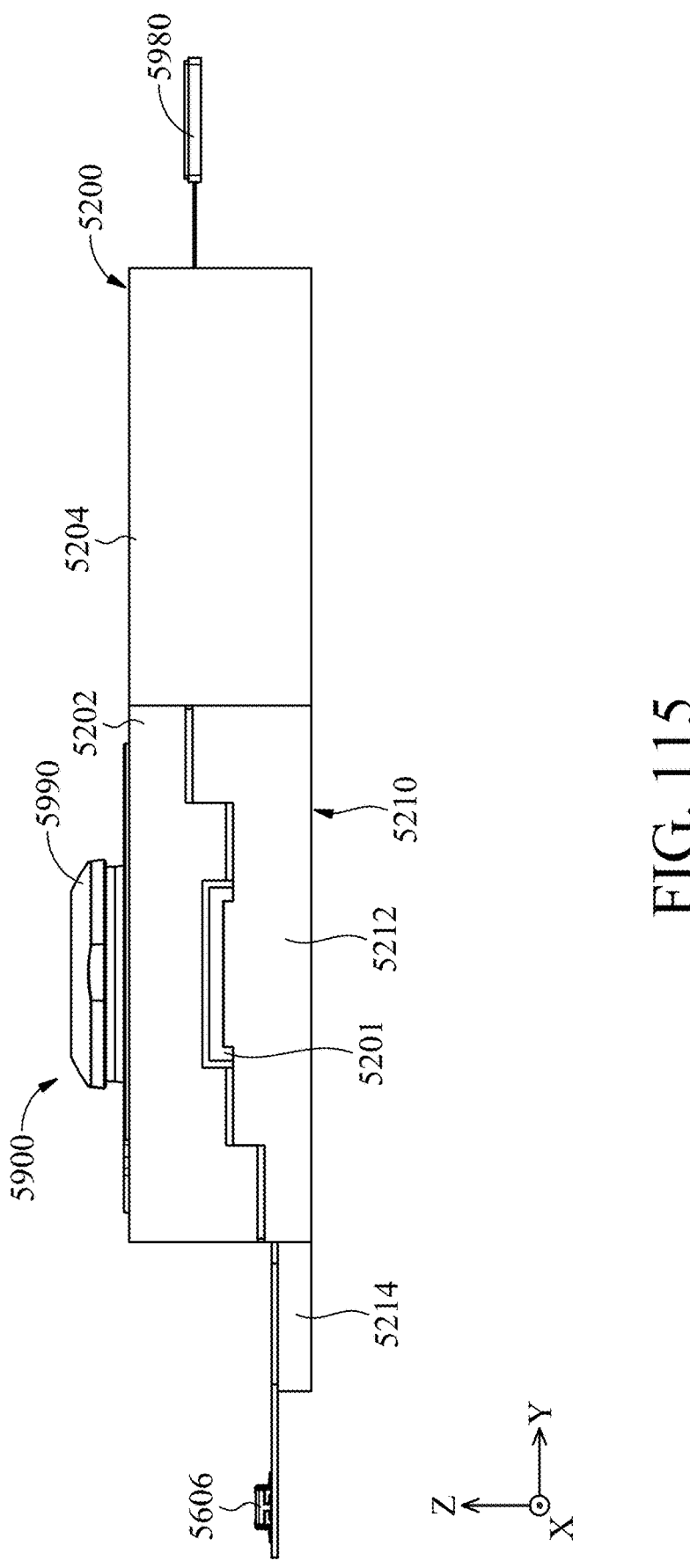
FIG. 115 is a side view of the optical element driving mechanism.

In some embodiments, the case 5200 and the base 5210 may be combined to form the outer case of the optical element driving mechanism 5100. Furthermore, the case 5200 and the base 5210 may be called as a fixed portion F5. In some embodiments, as shown in FIG. 115, a gap 5201 may be formed between the case 5200 and the base 5210. If glue is used for affixing the case 5200 and the base 5210 with each other, the gap 5201 may store excess glue to prevent the glue from contacting with other elements. Furthermore, the case 5200 and the base 5210 may also be affixed with each other by, for example, laser welding.

In some embodiments, the movable portion 5300 is movable relative to the fixed portion F5 (such as including the case 5200 and the base 5210). As a result, the optical module 5900 disposed on the movable portion 5300 may be moved by the movable portion 5300 to achieve auto focus (AF) or optical image stabilization (OIS).

In some embodiments, the first magnetic element 5410 and the second magnetic element 5420 may be referred to as a driving assembly D5 to drive the movable portion 5300 moving relative to the fixed portion F5. For example, the first magnetic element 5410 and the second magnetic element 5420 may include a combination of a driving coil and a driving magnet. For example, the first magnetic element 5410 may be a driving magnet, and the second magnetic element 5420 may be a driving coil. In another example, the first magnetic element 5410 may be a driving coil, and the second magnetic element 5420 may be a driving magnet, and is not limited thereto. It should be noted that the interaction between the first magnetic element 5410 and the second magnetic element 5420 may create a magnetic force to move the optical module 5900 relative to the fixed portion F5, so auto focus (AF) or optical image stabilization (OIS) may be achieved. In some embodiments, the driving assembly D5 may include other driving elements, such as piezoelectric elements, shape memory alloys, etc.

Furthermore, the first circuit board 5600 may be, for example, a flexible printed circuit (FPC) board, which may be affixed on the fixed portion F5 by adhesion. In some embodiments, the first circuit board 5600 is electrically connected to other electronic elements disposed inside or outside the optical element driving mechanism 5100. For example, the first circuit board 5600 may send electric signal to the driving assembly D5 to control the movement of the movable portion 5300.

Figure 114:
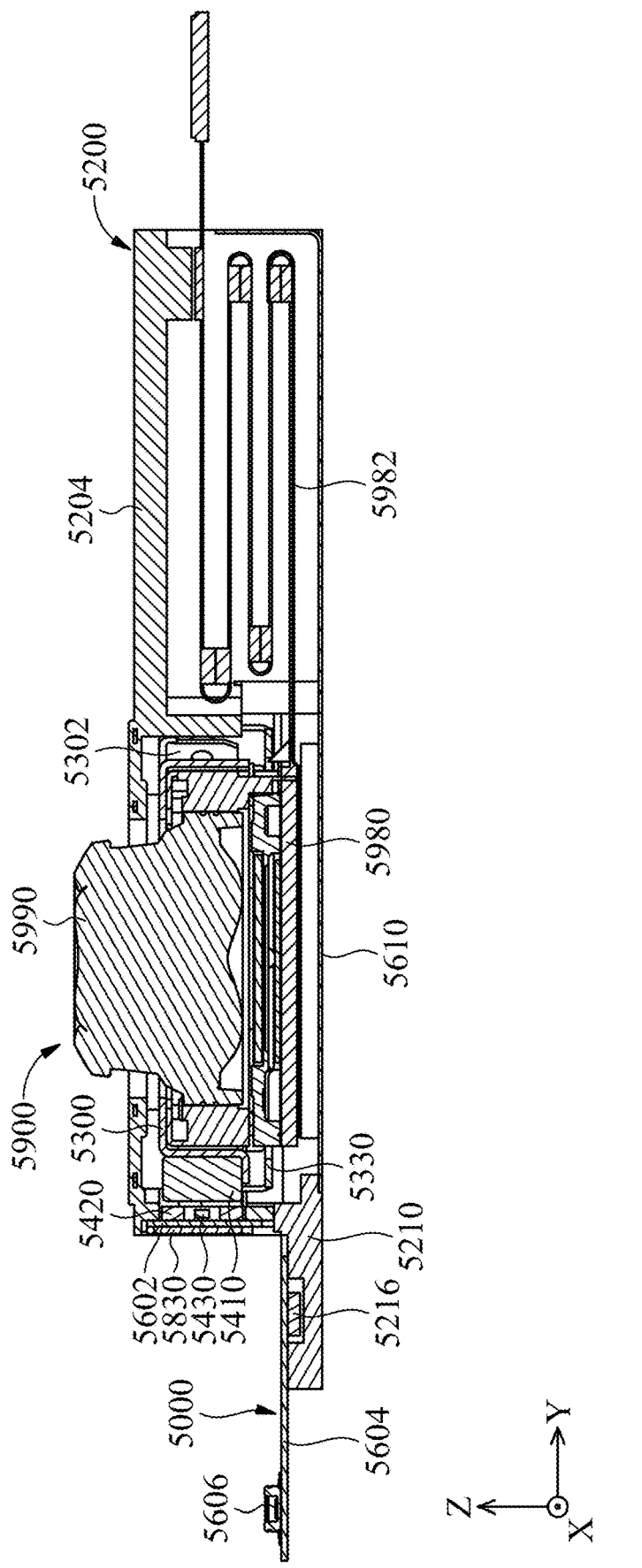
FIG. 114 is a cross-sectional view of the optical element driving mechanism.

As shown in FIG. 113 and FIG. 114, the first circuit board 5600 may include a main body 5602 corresponding to the driving assembly D5, an extending portion 5604 extended outwardly from the main body 5602, and a reading element 5606 disposed on the extending portion 5604. The main body 5602 and the optical module 5900 do not overlap each other along the main axis O5, which reduces the size of the optical element driving mechanism 5100 in the Z axis. Furthermore, in a direction that is perpendicular to the main axis O5, the main body 5602 of the first circuit board 5600 may overlap the movable portion 5300. The reading element 5606 may include control elements such as a chip, and may be electrically connected to, for example, the inertia sensor 5700 (FIG. 129) to process the signal from the inertia sensor 5700.

In some embodiments, position sensor 5430 may be disposed in the optical element driving mechanism 5100 to detect the position of the movable portion 5300 relative to the fixed portion F5. The position sensor 5430 may include Hall effect sensor, magnetoresistance effect sensor (MR Sensor), giant magnetoresistance effect sensor (GMR sensor), tunneling magnetoresistance effect sensor (TMR sensor), or fluxgate sensor. In some embodiments, the position sensor 5430 may be surrounded by the second magnetic element 5420.

Figure 116:
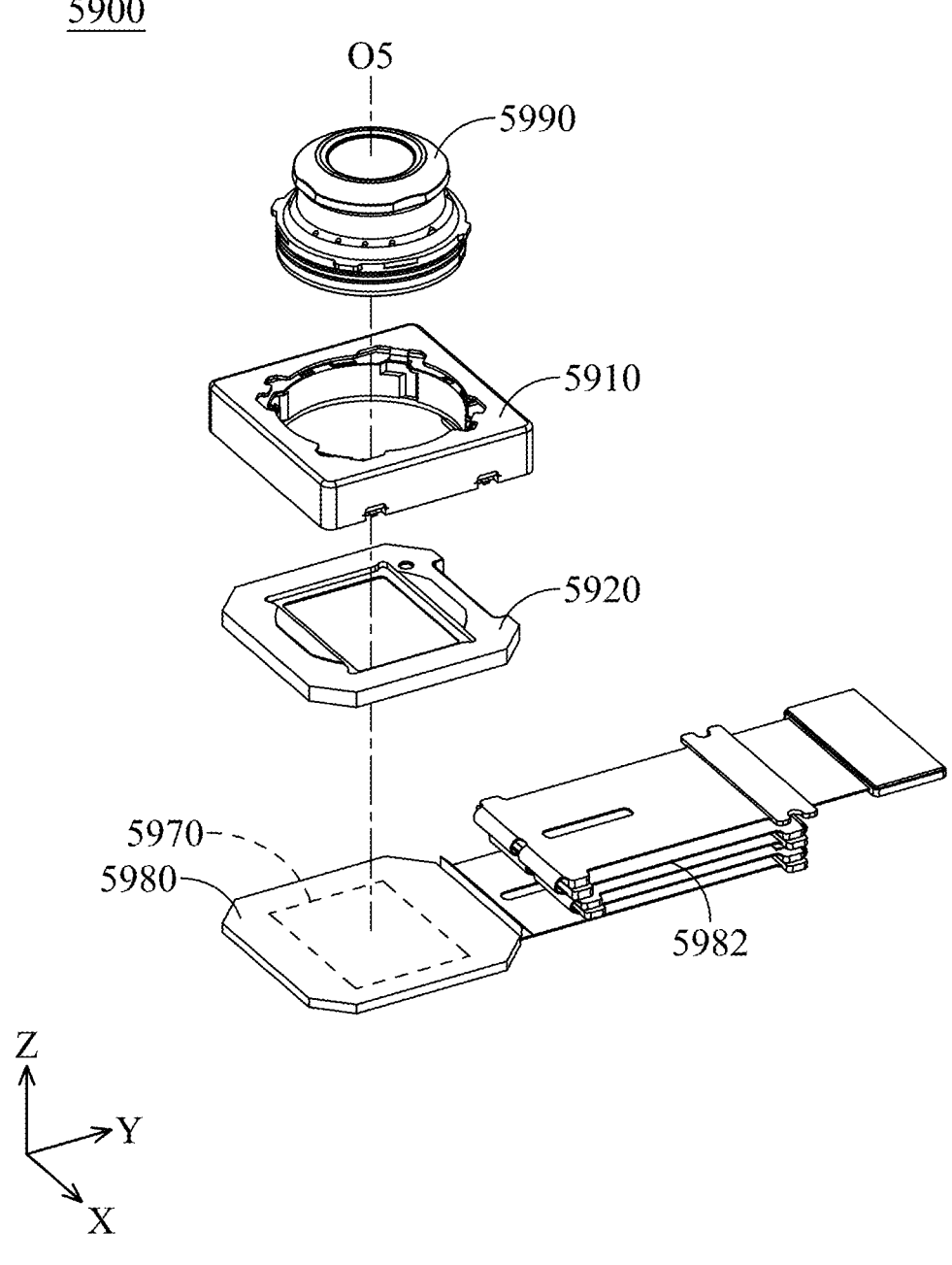
FIG. 116 is an exploded view of the optical module.

FIG. 116 is an exploded view of the optical module 5900. As shown in FIG. 116, the optical module 5900 may include a case 5910, a base 5920, and an optical element 5990 disposed between the case 5910 and the base 5920. These elements are disposed on a substrate 5980 with a photo sensor 5970. It should be noted that a case opening and a bottom opening are formed on the case 5910 and the base 5920, respectively. The center of the case opening corresponds to the main axis O5 of the optical element 5990, and the base opening corresponds to the photo sensor 5970, and the photo sensor 5970 may be disposed on the substrate 5980. As a result, the optical element 5990 disposed in the optical module 5900 may focus with the photo sensor 5970 along the main axis O5 (i.e. Z direction).

Furthermore, a moving assembly (not shown) which is movable relative to the case 5910 and the base 5920 may be disposed in the optical module 5900, and the optical element 5990 may be fixed on the movable assembly, such as by locking, gluing, or engaging. Furthermore, additional driving component may be provided in the optical module 5900, such as an assembly of a magnet and a coil (not shown), to move the optical element 5990 with the movable assembly in a direction that is different than the moving direction of the movable portion 5300. As a result, the optical element 5990 may be moved in more directions. In some embodiments, the driving component of the optical module 5900 and the driving assembly D5 may be disposed on opposite sides of the main axis O5 to reduce magnetic interference.

The substrate 5980 may be, for example, a flexible printed circuit (FPC) board, which may be affixed on the base 5920 by adhesion. In some embodiments, the substrate 5980 is electrically connected to other electronic elements disposed inside or outside the optical module 5900. For example, the substrate 5980 may send electric signal to the driving component to control the movement of the movable assembly in X, Y or Z direction, and thus achieving auto focus (AF) or optical image stabilization (OIS). In some embodiments, please also refer to FIG. 114, the substrate 5980 may include a circuit 5982, and the case 5200 may include a first portion 5202 and a second portion 5204, wherein the circuit 5982 may be disposed in the second portion 5204, and other portions of the optical module 5900 may be disposed at the first portion 5202 to further protect the circuit 5982. In some embodiments, as shown in FIG. 114, the circuit 5982 may be bent as multiple layers along the main axis O5 to save the space occupied by the circuit 5982, and miniaturization may be achieved. In some embodiments, the circuit 5982 may not overlap other portions of the optical module 5900 along the main axis O5, for example, it does not overlap the movable portion 5300. Furthermore, the circuit 5982 at least partially overlaps the movable portion 5300 in a direction that is perpendicular to the main axis O5 to reduce the size of the optical element driving mechanism 5100 in Z axis to achieve miniaturization.

Furthermore, the optical element driving mechanism 5100 further includes a strengthening element 5220. Although the strengthening element 5220 and the case 5200 are illustrated separately in FIG. 113, the strengthening element 5220 may be disposed in the case 5200, such as embedded in the case 5200, to increase the mechanical strength of the case 5200. In some embodiments, the material of the strengthening element 5220 may include metal to further increase the mechanical strength of the strengthening element 5220. Furthermore, a metal contact element 5222 may be disposed on the strengthening element 5220 for connecting to the connecting element 5330 (described later), such as by soldering, welding, resistance welding, or conductive adhesive. In some embodiments, the strengthening element 5220 and the contact element 5222 may be formed as one piece.

In some embodiments, as shown in FIG. 114, the first circuit board 5600 and the circuit 5982 may be disposed on different sides of the optical element driving mechanism 5100 to decrease the amount of space required in a specific side. For example, they may be disposed on adjacent sides or on opposite sides, so miniaturization may be achieved. Additional optical element may be disposed at a side of the optical element driving mechanism 5100 that no first circuit board 5600 and circuit 5982 is positioned to get an optical system that has multiple optical elements.

Figure 117:
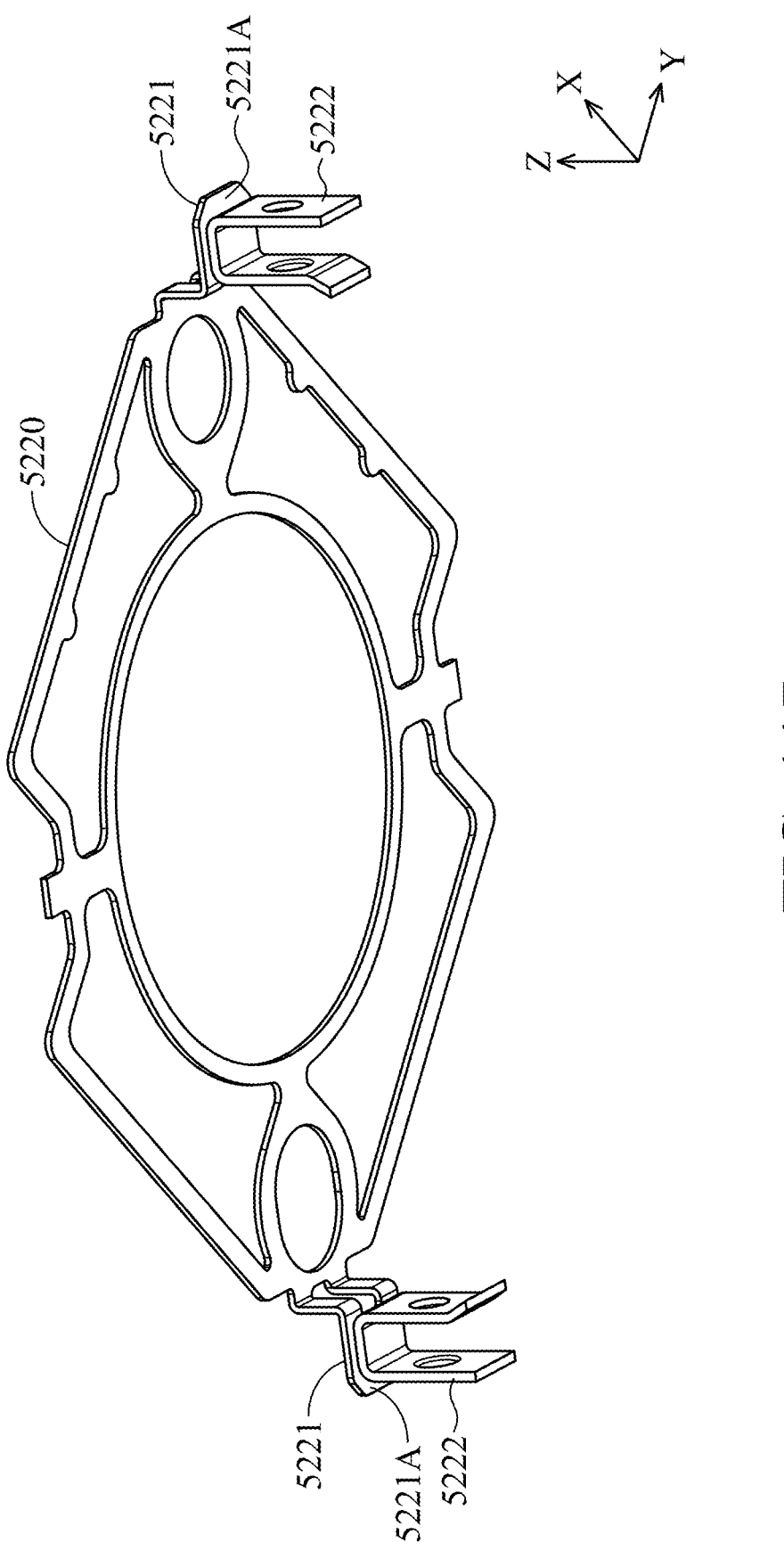
FIG. 117 is a schematic view of the strengthening element.
Figure 118:
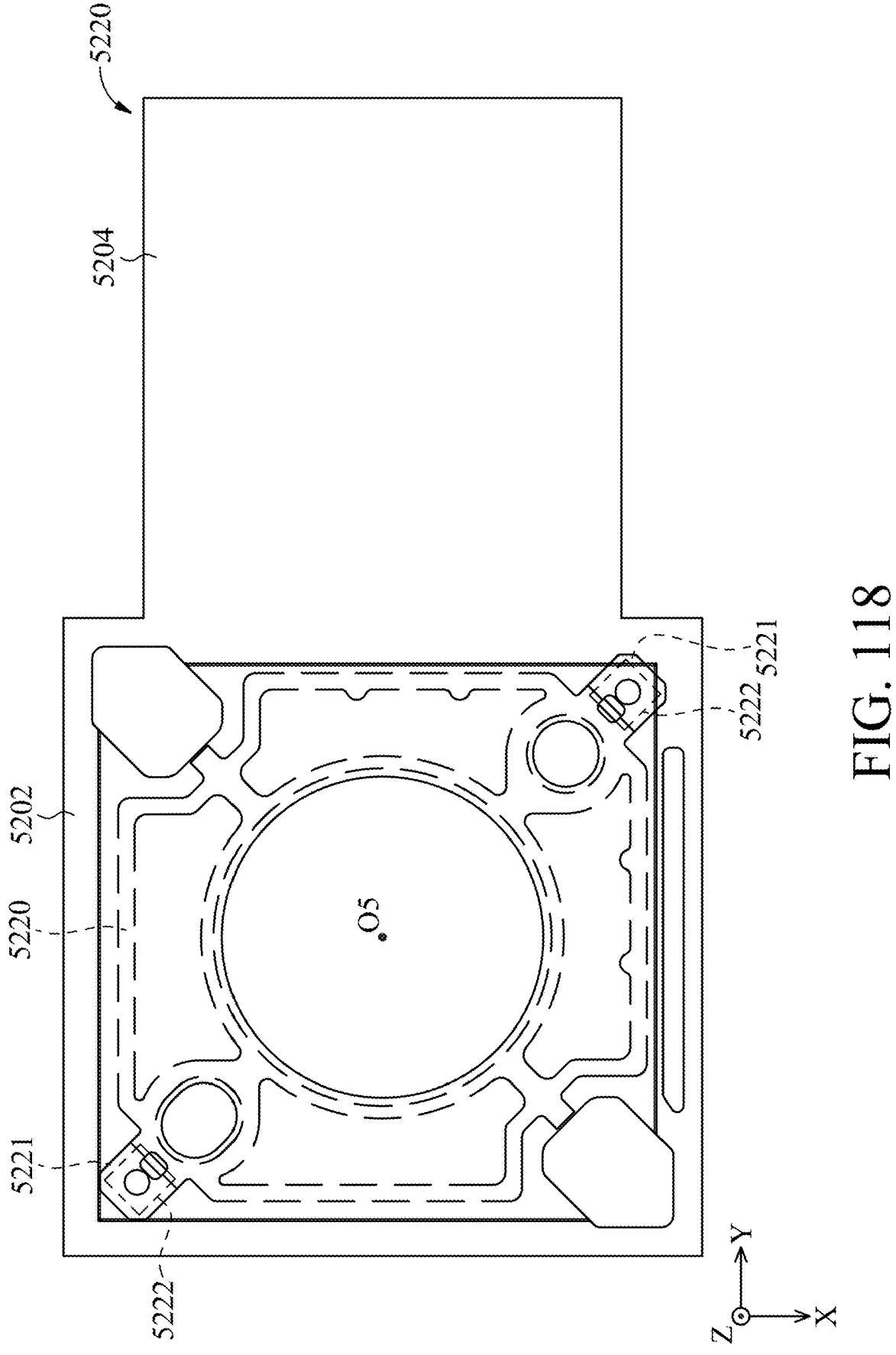
FIG. 118 is a top view of the case and the strengthening element.
Figure 119:
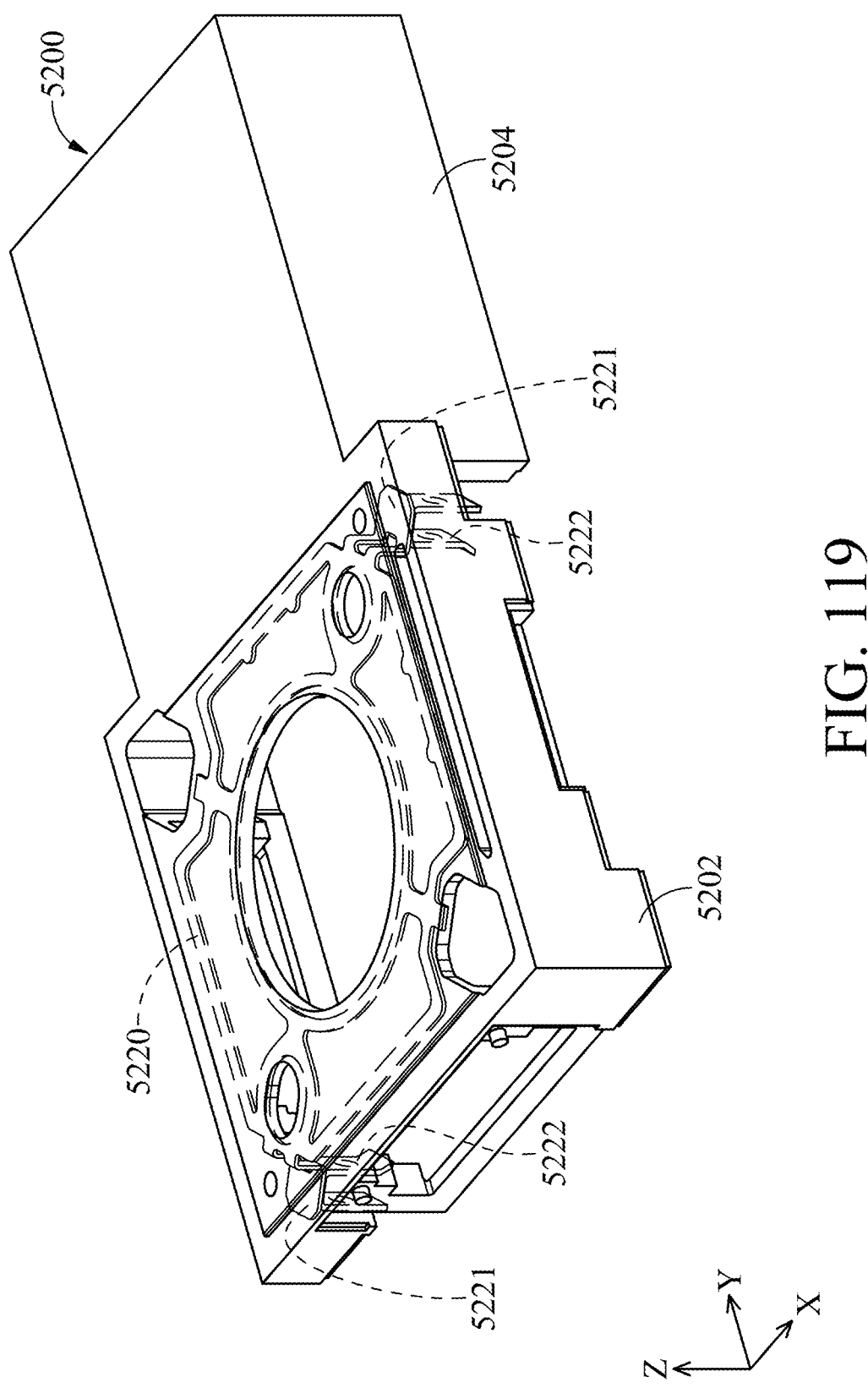
FIG. 119 is a schematic view of the case and the strengthening element.

For example. FIG. 117 is a schematic view of the strengthening element 5220 and the contact element 5222, FIG. 118 is a top view of the case 5200, the strengthening element 5220, and the contact elements 5222, and FIG. 119 is a schematic view of the case 5200, the strengthening element 5220, and the contact elements 5222. The strengthening element 5220 may include two arm portions 5221, the arm portions 5221 may include a surface 5221A facing the –Z direction, and the contact elements 5222 may be disposed on the arm portions 5221 and in contact with the surface 5221A. Furthermore, the two arm portions 5221 and the two contact elements 5222 may be disposed on opposite sides of the main axis O5, such as on a diagonal of the strengthening element 5220, and they may extend to the connecting element 5330 in FIG. 113 (i.e. –Z direction). In some embodiments, the arm portions 5221 are exposed from the case 5220 to allow the contact elements 5222 to be disposed on the arm portions 5221. In some embodiments, the contact elements 5222 may be replaced based on different requirements to achieve modularization.

Figure 120:
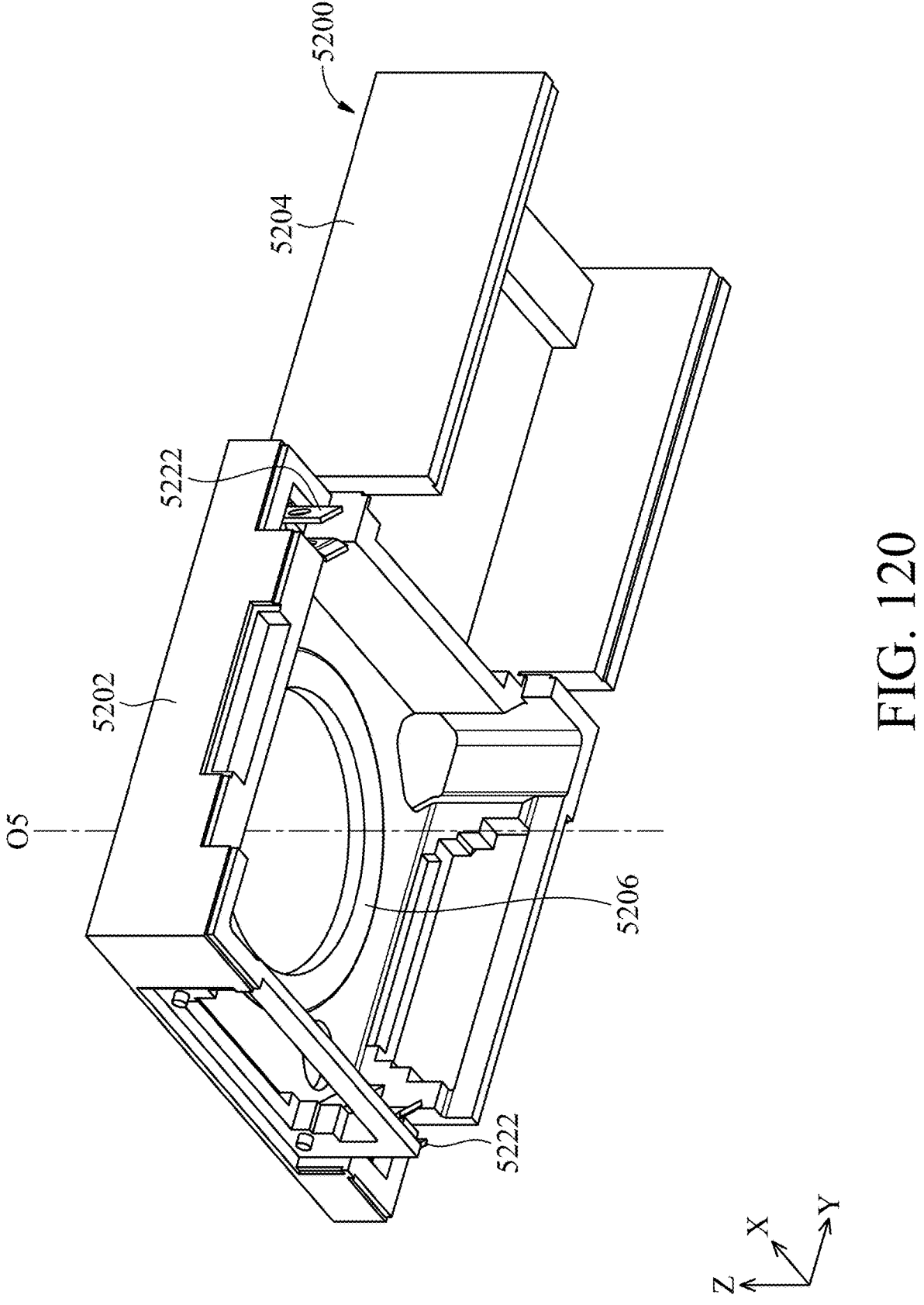
FIG. 120 is a schematic view of the case.

FIG. 120 is a schematic view of the case 5200. The case 5200 includes a stopping portion 5206 at a side that is facing the optical module 5900 (i.e. –Z direction). The stopping portion 5206 has a shape that is symmetrical to the main axis O5, such as having a circular shape, and is used for limiting the range of motion of the movable portion 5300 in different directions and preventing the movable portion 5300 from colliding with other portions of the case 5200. The material of the stopping portion 5206 may include soft buffer materials (such as resin or foam) or metal, to prevent other elements from being damaged by the movable portion 5300 when the movable portion 5300 is operating, to reduce noise, or to increase the durability of the stopping portion 5206. The stopping 5206 and the case 5200 may be formed as one piece or may be formed separately, depending on design requirements.

Figure 121:
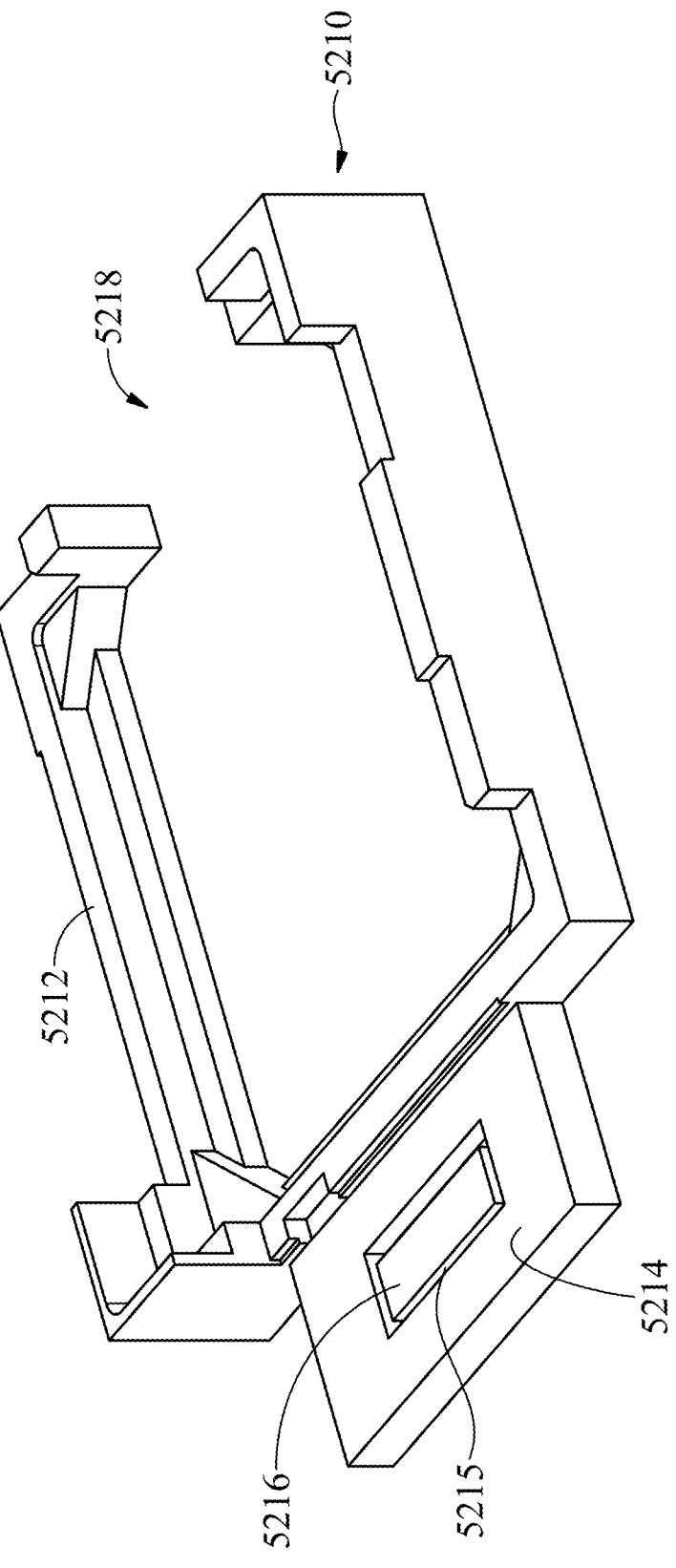
FIG. 121 is a schematic view of the base.

FIG. 121 is a schematic view of the base 5210. The base 5210 includes a main body 5212 and an extending portion 5214 extending from the main body 5212. A recess 5215 is formed on the extending portion 5214, and a control element 5216 may be accommodated and protected in the recess 5215. The control element 5216 may include control elements, such as a chip, to be electrically connected to the driving assembly D5 for driving the driving assembly D5, or may be electrically connected to other elements as well. Furthermore, the base 5210 may include an opening 5218, and the opening 5218 and the extending portion 5214 may be positioned on different sides of the base 5210, so the second circuit board 5610 may pass the opening 5218 for connecting to other elements outside the optical element driving mechanism 5100.

Figure 122:
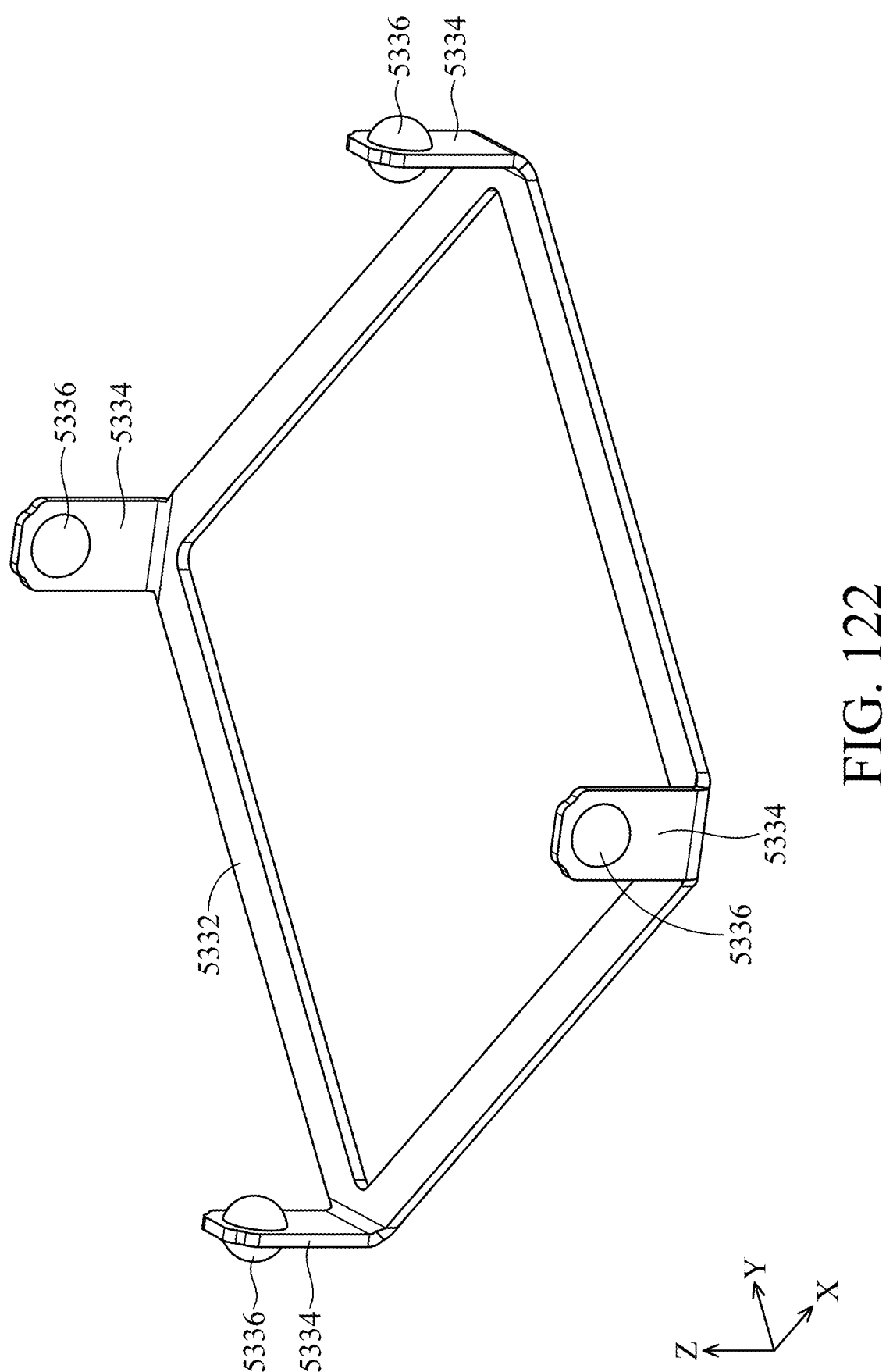
FIG. 122 is a schematic view of the connecting element.

FIG. 122 is a schematic view of the connecting element 5330. The connecting element includes a main body 5332, extending portions 5334, and connecting portions 5336. The extending portions 5334 may extend from the corners of the main body 5332, and the connecting portions 5336 are positioned on the extending portions 5334 and may include spherical shapes. In some embodiments, the material of the connecting element 5330 may be non-magnetic permeable metal to prevent magnetic interference between the connecting element 5330 and other elements in the optical element driving mechanism 5100 (such as the first magnetic element 5410 or the second magnetic element 5420) from occurring.

Figure 123:
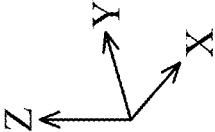
FIG. 123 is a schematic view of the movable portion.
Figure 124:
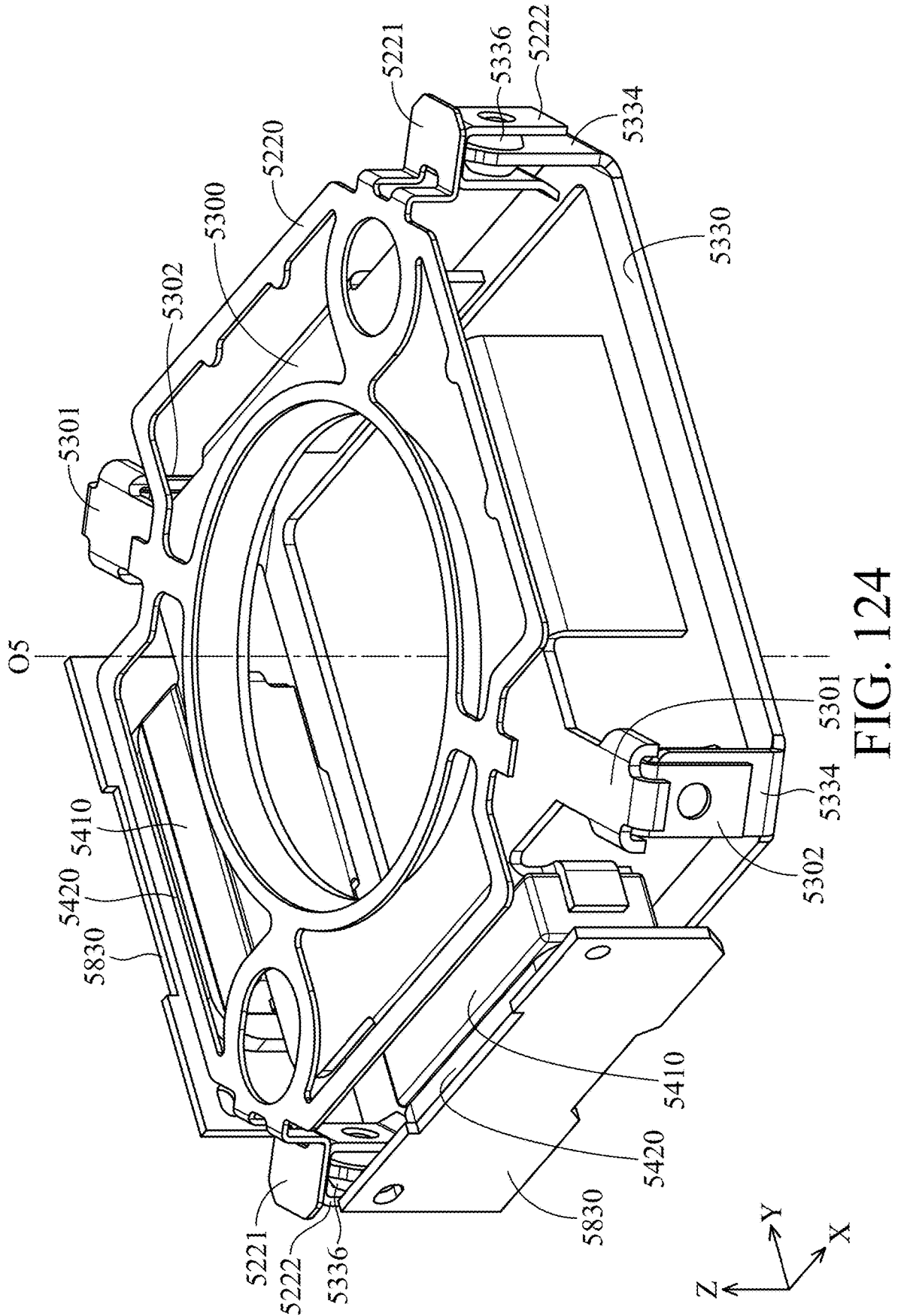
FIG. 124 is a schematic view of some elements of the optical element driving mechanism.

FIG. 123 is a schematic view of the movable portion 5300, and FIG. 124 is a schematic view of some elements of the optical element driving mechanism 5100. The movable portion 5300 may include an accommodating portion 5303, and the driving assembly D5 is at least partially disposed in the accommodating portion 5303. For example, the first magnetic element 5410 may be disposed at the accommodating portion 5303 to fix the position of the first magnetic element 5410. In some embodiments, the movable portion 5300 may have two accommodating portions 5303 for accommodating the first magnetic elements 5410 for moving the movable portion 5300 in different directions. In some embodiments, the second magnetic element 5420 may be disposed in the accommodating portion 5303, depending on design requirements.

As shown in FIG. 124, the movable portion 5300 may include two arm portions 5301 extending away from the main axis O5, and the contact elements 5302 may be disposed on the arm portions 5301. Furthermore, the two arm portions 5301 and the two contact portions 5302 may be disposed on opposite sides of the main axis O5, such as on a diagonal of the movable portion 5300, and they may extend to the connecting element 5330 in FIG. 113 (–Z direction). In some embodiments, the connecting element 5330 includes four extending portions 5334 and four connecting portions 5336 disposed on the extending portions 5334, two of the connecting portions 5336 may be connected to the movable portion 5300, and the other two connecting portions 5336 may be connected to the strengthening element 5220 (a portion of the fixed portion F5). Furthermore, the connecting portions 5336 that are connected to the movable portion 5300 may be positioned on opposite sides of the main axis to allow the movable portion 5300 to move relative to the fixed portion F5 in different directions.

Furthermore, in some embodiments, the movable portion 5300 may include metal, so the movable portion 5300 may be a magnetic permeable element for guiding the magnetic lines of force of the first magnetic element 5410 or the second magnetic element 5420, so the magnetic field of the first magnetic element 5410 or the second magnetic element 5420 may be concentrated, and the magnetic force generated from the first magnetic element 5410 or the second magnetic element 5420 may be increased. Moreover, the mechanical strength of the movable portion 5300 which includes metal material may be further increased. In some embodiments, the metal contact elements 5302 may be disposed on the movable portion 5300 for connecting to the connecting element 5330 (described later), such as by soldering, welding, resistance welding, or conductive adhesive. In some embodiments, the movable portion 5300 and the contact element 5302 may be formed as one piece.

It should be noted that the first magnetic element 5410 may be positioned at a side of the second magnetic element 5420, and a magnetic permeable element 5830 may be positioned at another side of the second magnetic element 5420, as shown in FIG. 124. The material of the magnetic permeable element 5830 may include metal, and the magnetic permeable element 5830 may be used for guiding the magnetic lines of force of the first magnetic element 5410 or the second magnetic element 5420, so the magnetic field of the first magnetic element 5410 or the second magnetic element 5420 may be concentrated, and the magnetic force generated from the first magnetic element 5410 or the second magnetic element 5420 may be increased. The distance between the first magnetic element 5410 and the optical element 5990 may be less than the distance between the magnetic permeable element 5830 and the optical element 5990, and the magnetic permeable element 5830 and the second magnetic element 5420 may at least partially overlap each other in a direction that is perpendicular to the main axis O5. As a result, the size of the optical element driving mechanism O5 may be reduced to achieve miniaturization.

Figure 125:
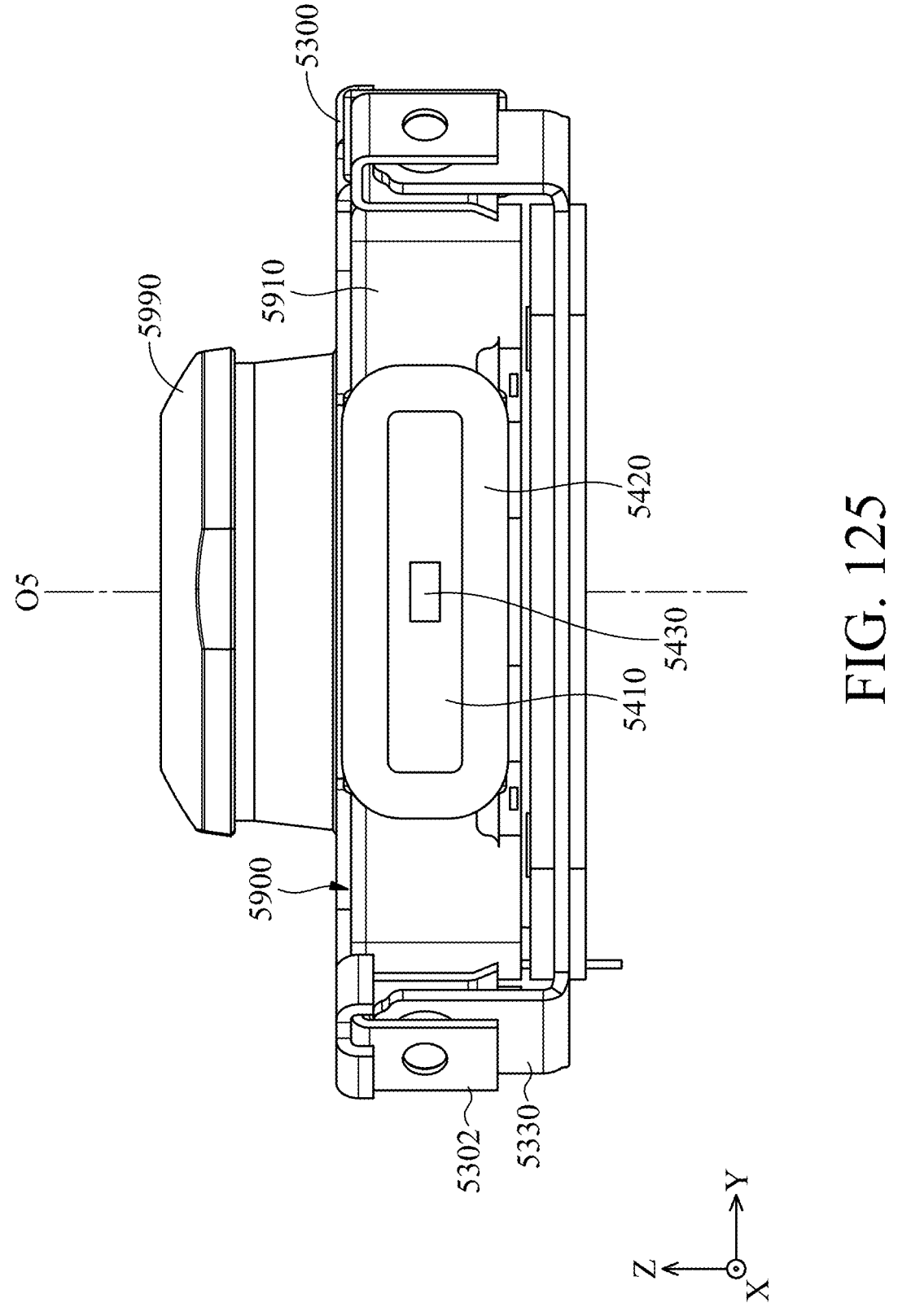

FIG. 125 is a side view of some elements of the optical element driving mechanism 5100. As shown in FIG. 125, the driving assembly D5 (includes the magnetic element 5410 and the second magnetic element 5420) and the optical module 5900 may be connected by the movable portion 5300. Furthermore, the movable portion 5300 and the optical module 5900 may at least partially overlap each other in a direction that is perpendicular to the main axis O5, such as along X axis or Y axis. As a result, required space may be reduced to achieve miniaturization.

Figures 126, 127:
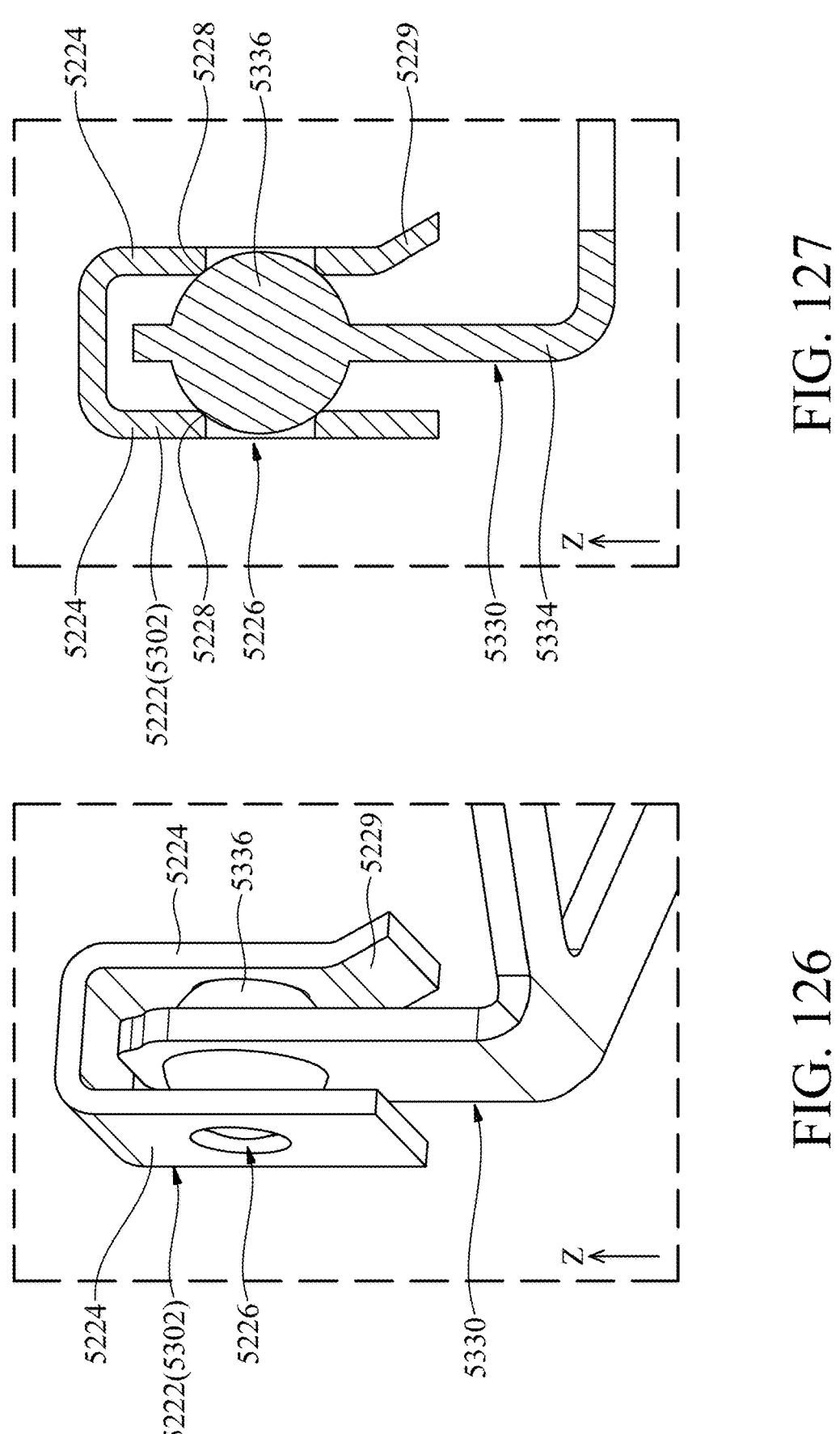

The connecting portions 5336 of the connecting element 5330 may be connected to the contact element 5302 and the contact element 5222. For example, FIG. 126 is an enlarged view of a portion where the connecting portion 5336 and the contact element 5302 (or the contact element 5222) are connected with each other, and FIG. 127 is a cross-sectional view of a portion where the connecting portion 5336 and the contact element 5302 (or the contact element 5222) are connected with each other. A pair of contact portions 5224 may be formed on the contact element 5222 or the contact element 5302 and may extend in Z axis. Each of the two contact portions 5224 may have an assemble portion 5226, such as a circular opening. The connecting portion 5336 may be held by the two contact portions 5224 from opposite sides of the connecting portion 5336. In other words, the connecting portion 5336 may be positioned between the two contact portions 5224. Furthermore, the spherical connecting portion 5336 may be partially disposed in the assembly portion 5226. That is, the connecting portion 5336 may overlap the contact portion 5224 when viewed along the main axis O5 (Z axis), so the connecting element 5330 may be movably connected to the case 5200 (a portion of the fixed portion F5) or the movable portion 5300. In other words, one of the pair of the connecting portions 5336 of the contact elements 5222 or 5302 are directly and movably connected to one of the movable portion 5300 or the fixed portion F5, and another pair of the connecting portions 5336 are directly and movably connected to another one of the movable portion 5300 or the fixed portion F5.

In some embodiments, the corner 5228 of the assemble portion 5226 that in contact with the connecting portion 5336 may be a non-normal angle, such as a radius angle or a chamfer angle, to prevent the connecting portion 5336 from directly contacting to a normal angle, which may damage the connecting portion 5336. Furthermore, a bending portion 5229 may be positioned at the end of the contact portion 5224, and the bending portion 5229 is bent to a direction that is away from another one of the contact portions 5224, so the connecting portion 5336 may be easily disposed between the two contact portions 5224.

As a result, the connecting element 5330 may be disposed in the optical element driving mechanism 5100 by friction contact to achieve rotation relative to a single axis or multiple axes, rather than being suspended in the optical element driving mechanism 5100 by springs. As a result, the optical element driving mechanism 5100 may be operated after overcoming the maximum static friction between the connecting elements 5330, the case 5200, and the movable portion 5330, and required electricity for operation may be reduced. Furthermore, this design allows the optical module 5900 may rotate relative to the optical element driving mechanism 5100 within a greater angle, such as ±2 to ±10 degrees. Moreover, this design has the connecting element 5330 having a higher mechanical strength, the reliability of the optical element driving mechanism 5100 may be increased, and the optical module 5900 may be prevented from sinking because of its own weight.

Figure 128:
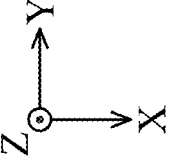

FIG. 128 is a top view of the base 5210, the first circuit board 5600, the second circuit board 5610, and the optical module 5900, wherein the first circuit board 5600 and the second circuit board 5610 may be electrically to different elements. As shown in FIG. 128, the first circuit board 5600 and the second circuit board 5610 may not overlap each other in the Z direction, or the first circuit board 5600 and the optical module 5900 may not overlap each other in the Z direction, so the size of the optical element driving mechanism 5100 in the Z direction may be reduced to achieve miniaturization. For example, in some embodiments, the first circuit board 5600 and the second circuit board 5610 may be overlap each other to reduce the side of the optical element driving mechanism 5100 in the X or Y axis. In some embodiments, as shown in FIG. 128, the first circuit board 5600 and the second circuit board 5610 may extend in directions that are parallel with each other, or the first circuit board 5600 and the second circuit board 5610 may extend in directions that are not parallel with each other, depending on design requirements.

In some embodiments, another optical element (not shown) may be provided outside the optical element driving mechanism 5100 to form a duel lenses optical system. In a direction that is parallel to the main axis O5, the other optical element does not overlap the first circuit board 5600 or the second circuit board 5610 to reduce the size of the optical system along the main axis O5.

Figure 130:
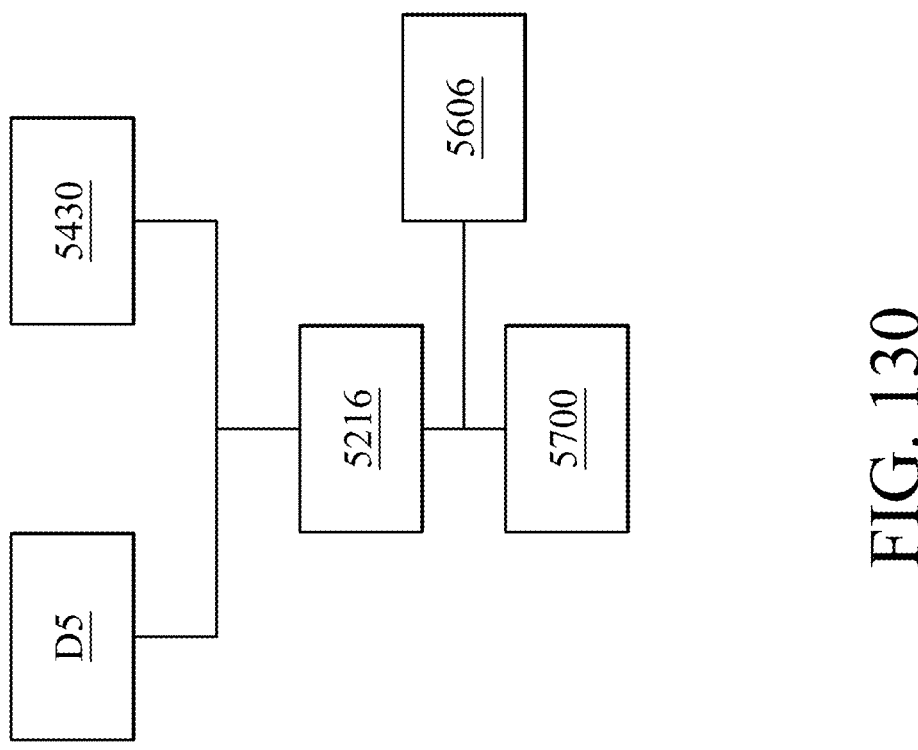
Figure 129:
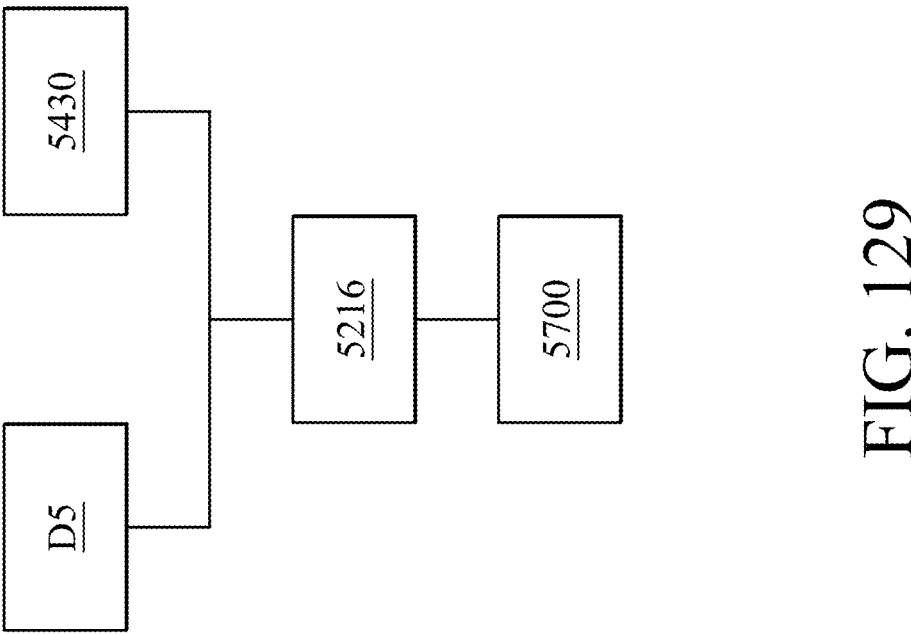

FIG. 129 and FIG. 130 are block diagrams showing the electrical connection relationship between some elements of the optical element driving mechanism 5100. The optical element driving mechanism 5100 may further includes an inertia sensor 5700 (or may be disposed outside the optical element driving mechanism 5100) electrically connected to the control element 5216. The inertia sensor 5700 may include a gyroscope or an acceleration sensor and may be electrically connected to the driving assembly D5 to measure the inertial of the optical element driving mechanism 5100. After the state of gravity or acceleration of the optical element driving mechanism 5100 is measured by the inertia sensor 5700, the result may be sent to the control element 5216, and appropriate signal may be provided by the control element 5216 to the driving assembly D5 to drive the optical module 5900 for rotating. Furthermore, the control element 5216 may be electrically connected to the position sensor 5430 to control the driving assembly D5 by the signal provided by the inertia sensor 5700 and the position sensor 5430.

In some embodiments, as shown in FIG. 130, a reading element 5606 electrically connected to the inertia sensor 5700 and the control element 5216 may be provided to receive the signal provided by the inertia sensor 5700, and the control element 5216 may receive the signal provided by the position sensor 5430 to prevent interference between different signals. In some embodiments, the reading element 5606, the control element 5216 and/or the position sensor 5430 may be packaged as one piece to reduce required number of elements. In some embodiments, the position of the reading element 5606 and the control element 5216 may be interchanged.

Figure 131:
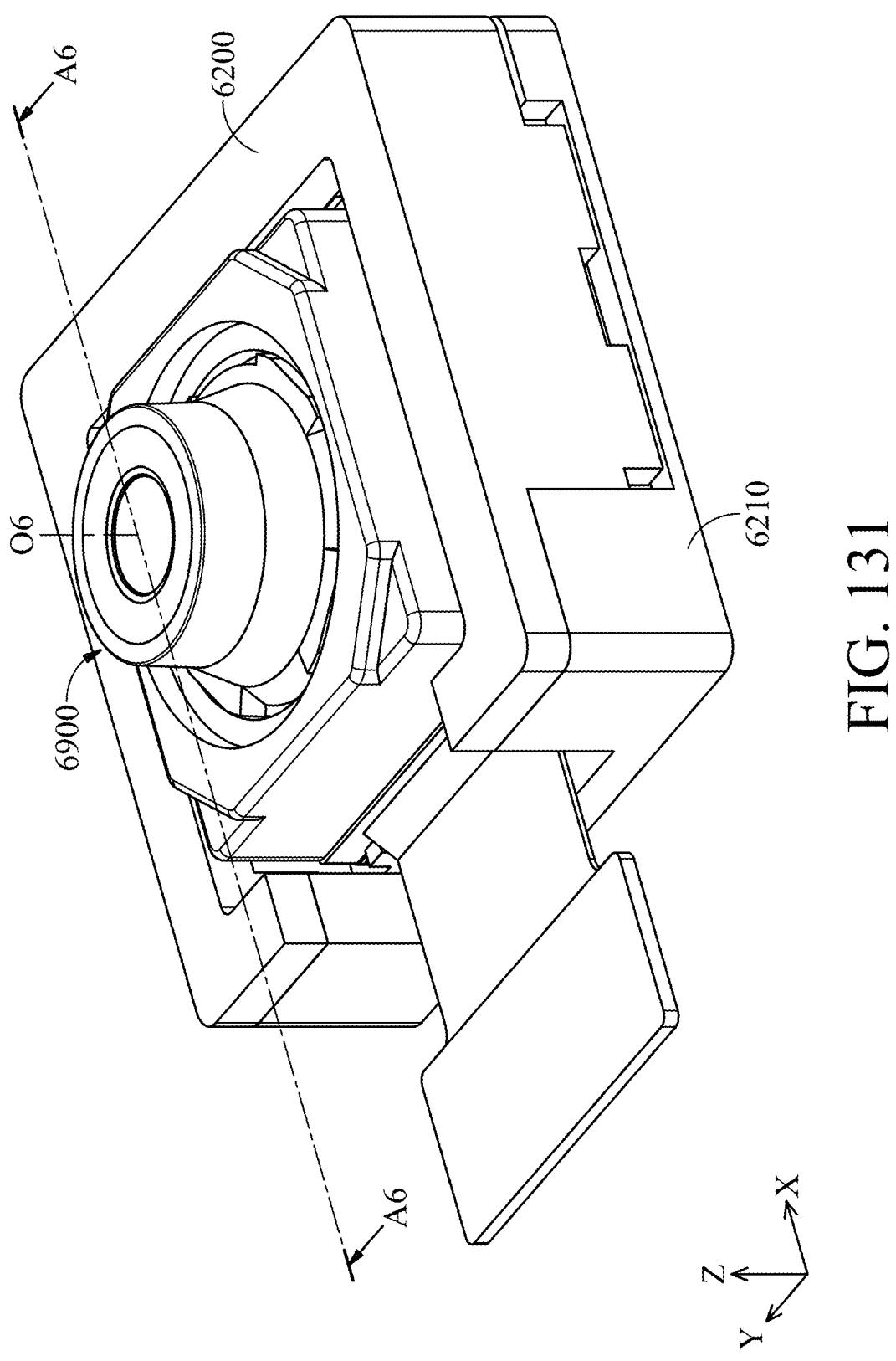
Figure 132:
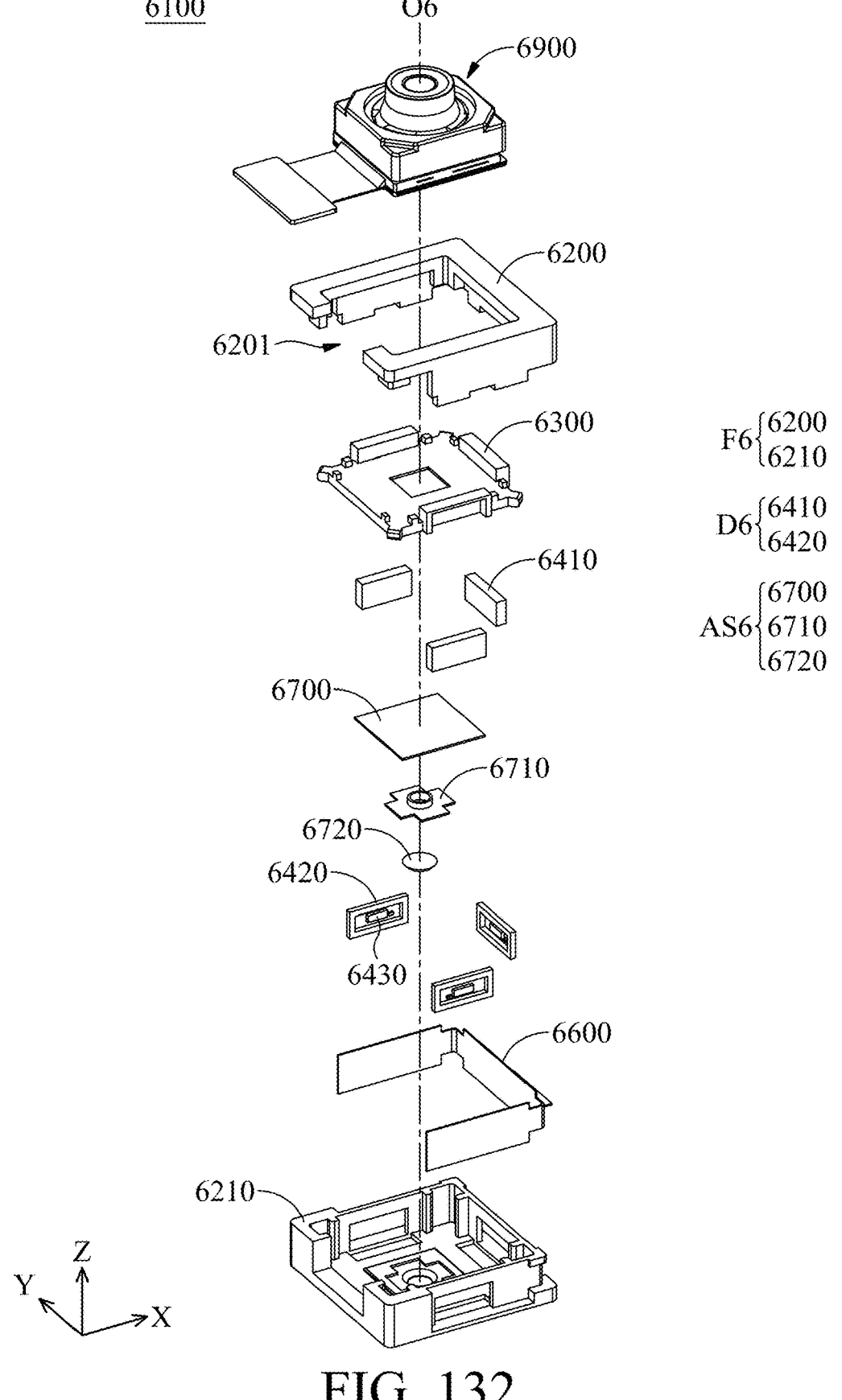
Figure 133:
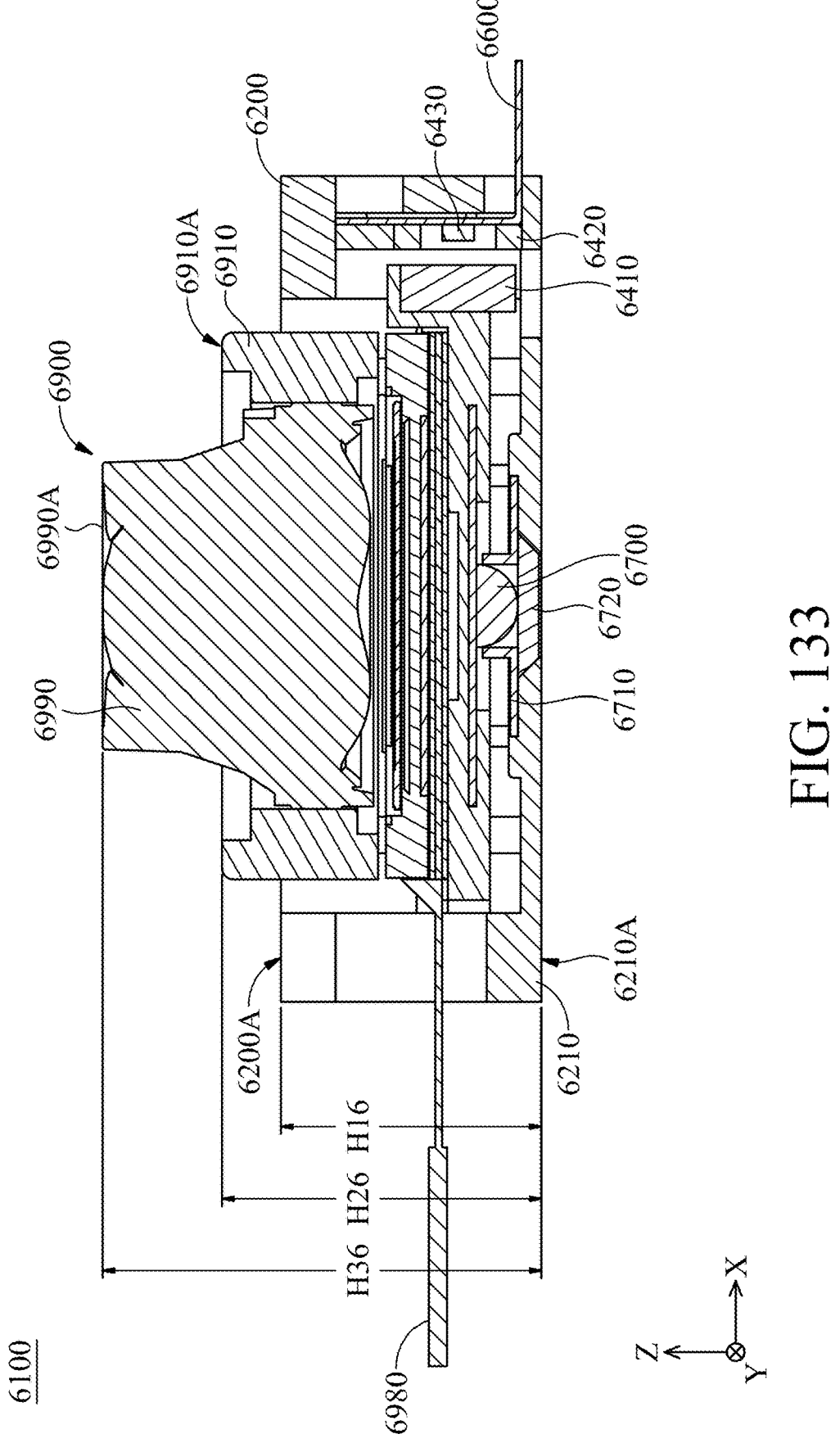

In some embodiments of the present disclosure, FIG. 131 to FIG. 133 are a perspective view and an exploded view of an optical element driving mechanism 6100, and a cross-sectional view illustrated along a line A6-A6 in FIG. 131, respectively. In FIG. 132, the optical element driving mechanism 6100 mainly includes a case 6200, a base 6210, a movable portion 6300, a first magnetic element 6410, a second magnetic element 6420, a position sensor 6430, a circuit board 6600, a support element 6700, a limiting element 6710, and a magnetic permeable element 6720. The optical element driving mechanism 6100 may be used for driving an optical module 6900, or may be used for driving various optical elements, such as a lens, a mirror, a prism, a beam splitter, or an aperture.

In some embodiments of the present disclosure, the case 6200 and the base 6210 may be combined to form the outer case of the optical element driving mechanism 6100. Furthermore, the case 6200 and the base 6210 may be called as a fixed portion F6. In some embodiments, an opening 6201 may be formed on the case 6200 to allow some elements disposed in the optical element driving mechanism 6100 being exposed from the fixed portion F6, such as the substrate 6980 in FIG. 133. In some embodiments, the movable portion 6300 is movable relative to the fixed portion F6 (such as including the case 6200 and the base 6210). As a result, the optical module 6900 disposed on the movable portion 6300 may be moved by the movable portion 6300 to achieve auto focus (AF) or optical image stabilization (OIS).

In some embodiments, the fixed portion F6 and the movable portion 6300 may include an identical material, such as metal or resin. As a result, the hardness of the fixed portion F6 may be substantially identical to the hardness of the movable portion 6300, and the fixed portion F6 and the movable portion 6300 may be prevented from being damaged when colliding with each other.

In some embodiments of the present disclosure, the first magnetic element 6410 and the second magnetic element 6420 may be called as a driving assembly D6 to drive the movable portion 6300 moving relative to the fixed portion F6. For example, the first magnetic element 6410 and the second magnetic element 6420 may include a combination of a driving coil and a driving magnet. For example, the first magnetic element 6410 may be a driving magnet, and the second magnetic element 6420 may be a driving coil. In another example, the first magnetic element 6410 may be a coil, and the second magnetic element 6420 may be a driving magnet, and is not limited thereto. The first magnetic element 6410 and the second magnetic element 6420 may be positioned on the fixed portion F6 and the movable portion 6300, respectively. It should be noted that the interaction between the first magnetic element 6410 and the second magnetic element 6420 may create a magnetic force to move the optical module 6900 relative to the fixed portion, so auto focus (AF) or optical image stabilization (OIS) may be achieved. In some embodiments, the driving assembly D6 may include other driving elements, such as piezoelectric elements, shape memory alloys, etc.

In some embodiments of the present disclosure, the first magnetic element 6410 may be disposed on the movable portion 6300, and the second magnetic element 6420 may be disposed on the fixed portion F6, such as affixed on the fixed portion by gluing. As a result, the movable portion 6300 may be moved relative to the fixed portion F6 by the magnetic force generated between the first magnetic element 6410 and the second magnetic element 6420. However, the present disclosure is not limited thereto. For example, the first magnetic element 6410 may be disposed on the fixed portion F6, and the second magnetic element 6420 may be disposed on the movable portion 6300, depending on design requirements.

In some embodiments, the size of the first magnetic element 6410 along the main axis O6 (Z axis) is less than the size of the first magnetic element 6410 in a direction that is perpendicular to the main axis O6 (X or Y axis). As a result, the size of the first magnetic element 6410 may be reduced to achieve miniaturization.

Furthermore, the circuit board 6600 may be, for example, a flexible printed circuit, which may be affixed on the fixed portion F6 by adhesion. In some embodiments, the circuit board 6600 is electrically connected to other electronic elements disposed inside or outside the optical element driving mechanism 6100. For example, the circuit board 6600 may send electric signal to the driving assembly D6 to control the movement of the movable portion 6300.

In some embodiments of the present disclosure, position sensor 6430 may be disposed in the optical element driving mechanism 6100 to detect the position of the movable portion 6300 relative to the fixed portion F6. The position sensor 6430 may include Hall sensor, magnetoresistance effect sensor (MR Sensor), giant magnetoresistance effect sensor (GMR sensor), tunneling magnetoresistance effect sensor (TMR sensor), or fluxgate sensor.

In some embodiments, the support element 6700, the limiting element 6710, and the magnetic permeable element 6720 may be called as an assisting assembly AS6 for limit the movement of the movable portion 6300 relative to the fixed portion F6. Furthermore, the limiting element 6710 may be disposed between the support element 6700 and the magnetic permeable element 6720, and a magnetic force may be generated between the support element 6700 and the magnetic permeable element 6720 to fix the position of the limiting element 6710.

Figure 134:
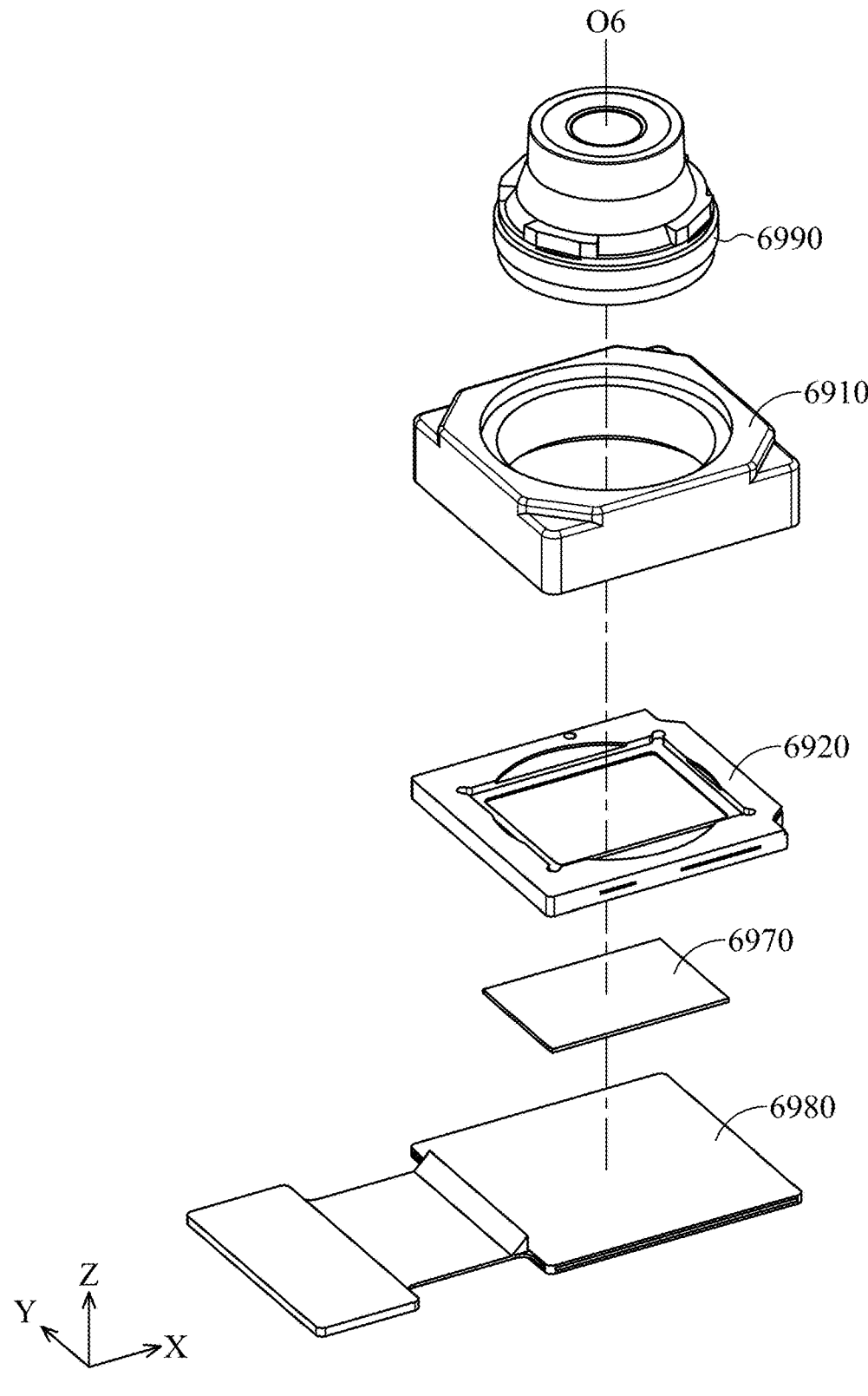

As shown in FIG. 134, the optical module 6900 may include a frame 6910, a base 6920, and an optical element 6990 disposed between the frame 6910 and the base 6920. It should be noted that a case opening and a bottom opening are formed on the frame 6910 and the base 6920, respectively. The center of the case opening corresponds to the main axis O6 of the optical element 6990, and the base opening corresponds to a photo sensor 6970, and the photo sensor 6970 may be disposed on a substrate 6980. As a result, the optical element 6990 disposed in the optical module 6900 may focus with the photo sensor 6970 along the main axis O6 (i.e. Z direction).

Furthermore, a moving assembly (not shown) which is movable relative to the frame 6910 and the base 6920 may be disposed in the optical module 6900, and the optical element 6990 may be fixed on the movable assembly, such as by locking, gluing, or engaging. Furthermore, additional driving component may be provided in the optical module 6900, such as an assembly of a magnet and a coil (not shown), to move the optical element 6990 with the movable assembly in a direction that is different than the moving direction of the movable portion 6300. As a result, the optical element 6990 may be moved in more directions. For example, the optical element 6990 may be moved on X, Y, or Z direction.

The substrate 6980 may be, for example, a flexible printed circuit, which may be affixed on the base 6920 by adhesion. In some embodiments, the substrate 6980 is electrically connected to other electronic elements disposed inside or outside the optical module 6900. For example, the substrate 6980 may send electric signal to the driving component to control the movement of the movable assembly in X, Y or Z direction.

It should be noted that, as shown in FIG. 133, the distance between the top surface 6200A of the case 6200 and the bottom surface 6210A of the base 6210 is H16 (i.e. the total height of the optical element driving mechanism 6100). The distance between the top surface 6910A of the frame 6910 and the bottom surface 6210A of the base 6210 us H26. The distance between the top surface 6990A of the optical element to the bottom surface 6210A of the base 6210 is H36. The distance H16 may be designed to be less than the distance H26 or the distance H36 to reduce the total height of the optical element driving mechanism 6100, so that miniaturization may be achieved.

Figure 135:
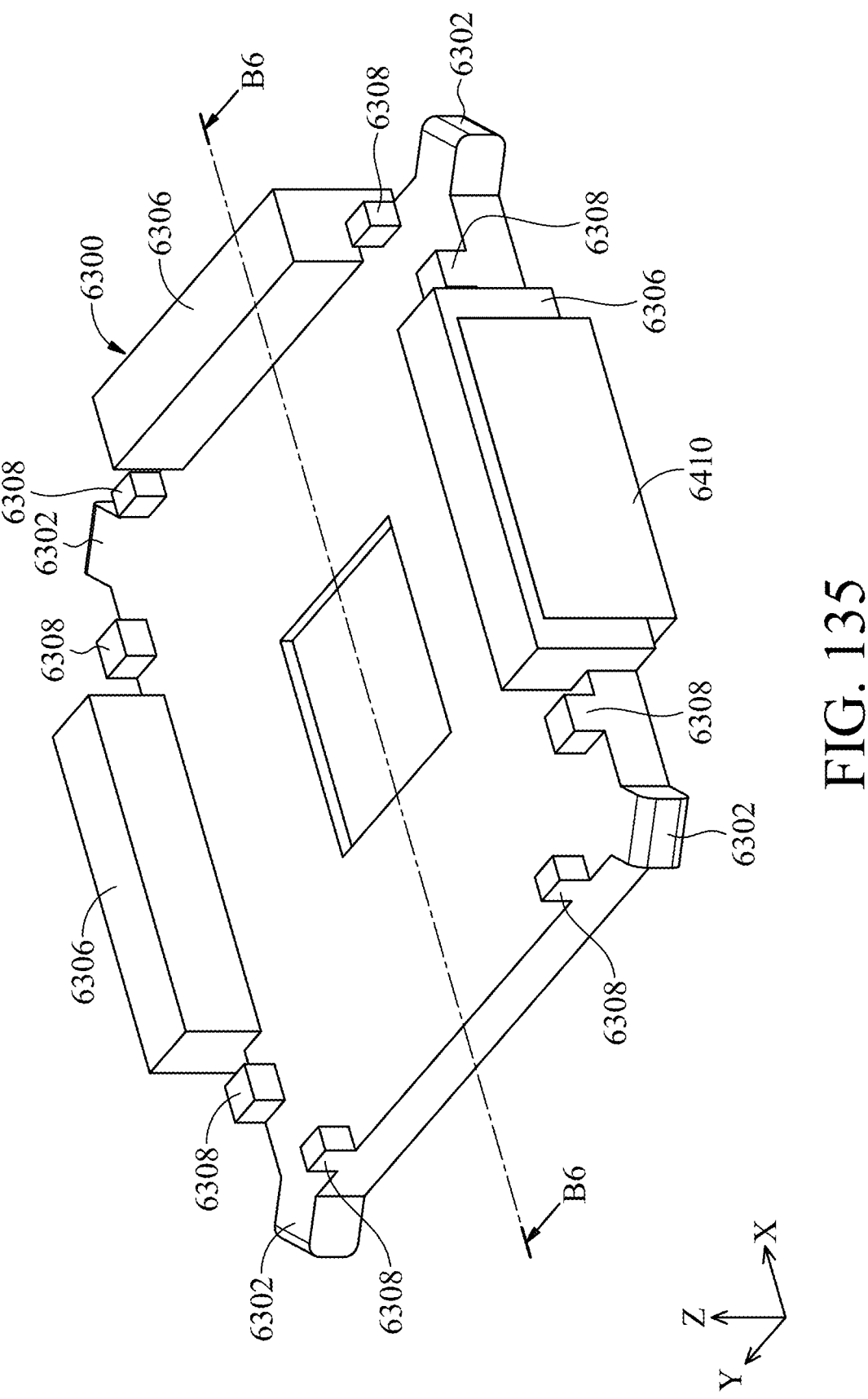
Figure 136:
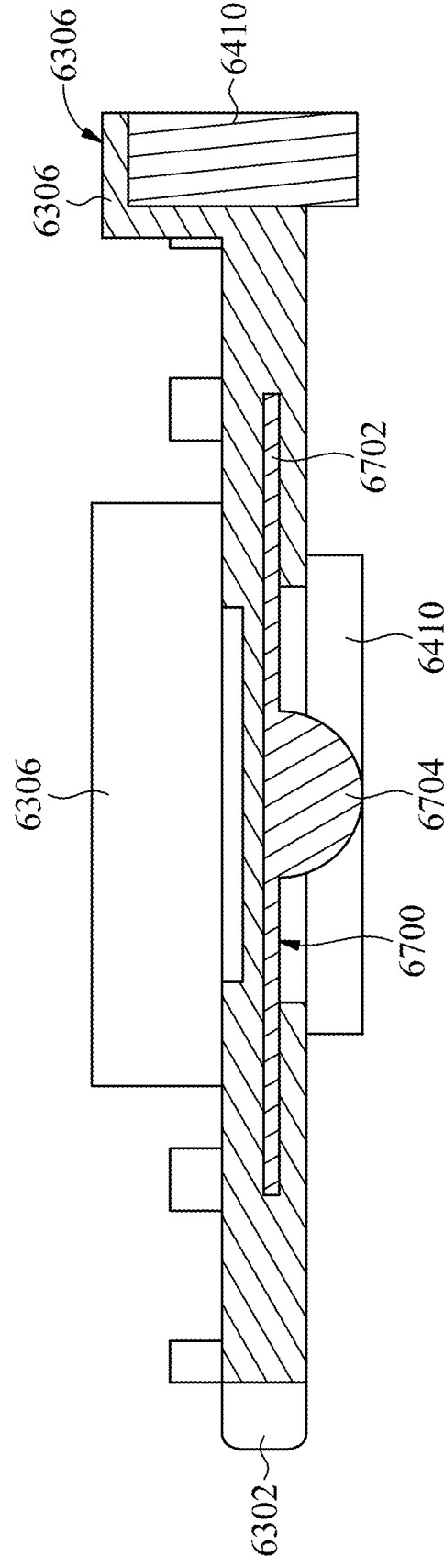

FIG. 135 is a schematic view of some elements of the optical element driving mechanism 6100, and FIG. 136 is a cross-sectional view illustrated along line B6-B6 in FIG. 135. The movable portion 6300 has a substantially rectangular shape, limiting portions 6302 may be formed on the corners of the movable portion 6300, and the limiting portions 6302 may extend in the XY plane. Furthermore, a plurality of protruding portions 6306 may be formed on sides of the movable portion 6300, and a recess is formed in the protruding portion 6306 to accommodate the first magnetic element 6410. Protruding portions 6308 may be formed on opposite sides of the protruding portion 6306 to define the position of the optical module 6900.

It should be noted that, in FIG. 136, the support element 6700 is partially embedded in the movable portion 6300 and includes an embedded portion 6702 embedded in the movable portion 6300 and an exposed portion 6704 that is at least partially exposed from the movable portion 6300. The embedded portion 6702 may have a plate shape, and the exposed portion may have a half-spherical shape. The movable portion 6300 may be rotated in different directions (such as rotate relative to X, Y or Z axis) by making the exposed portion 6704 having a half-spherical shape exposed from the movable portion 6300.

Figure 137:
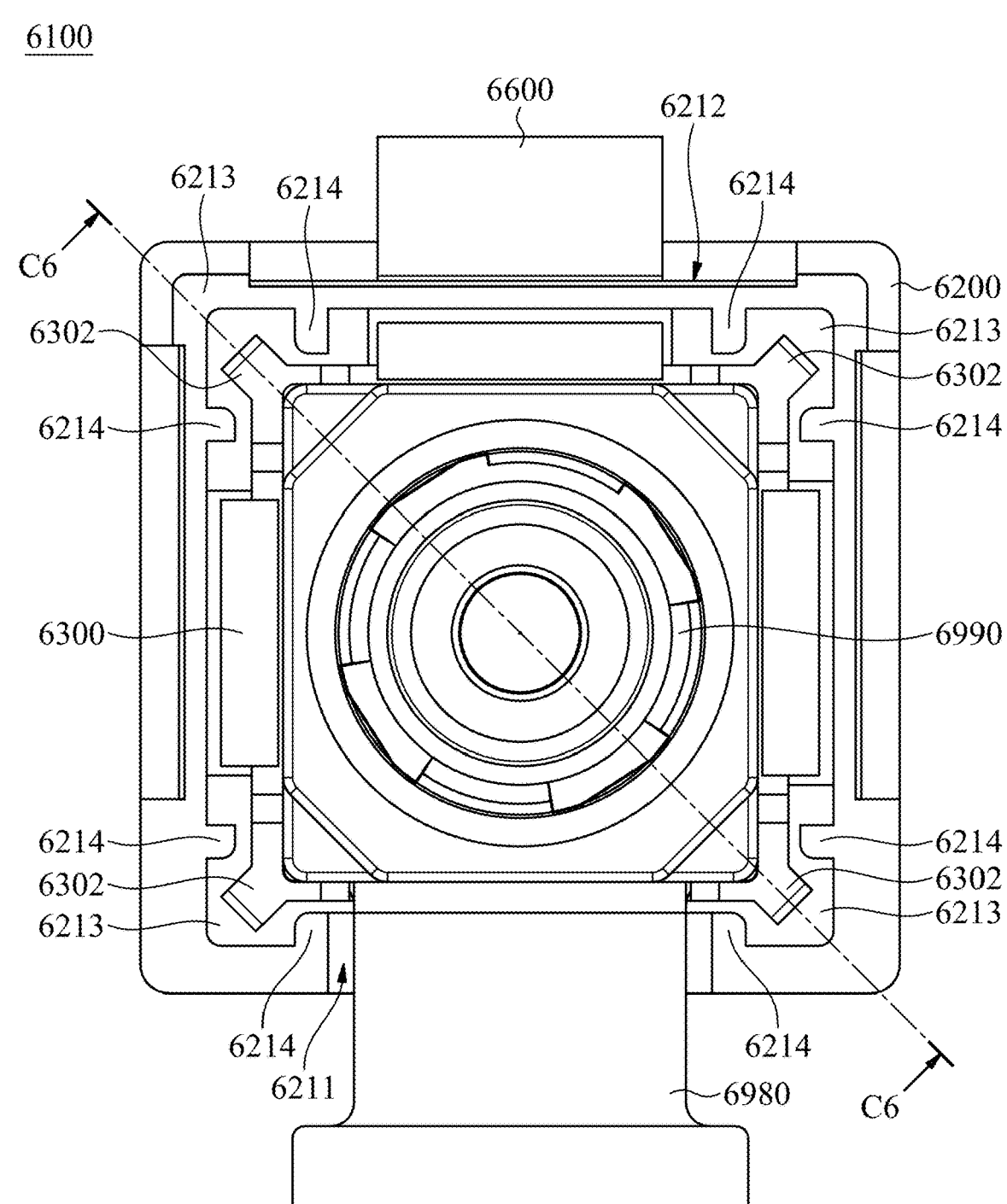

FIG. 137 is a top view of the optical element driving mechanism 6100, and FIG. 138 is a schematic view of some elements of the optical element driving mechanism 6100. In FIG. 137, the substrate 6980 and the circuit board 6600 are exposed from the opening 6211 and the opening 6212 of the base 6210, respectively, wherein the opening 6211 and the opening 6212 are positioned on different sides of the optical element driving mechanism 6100 (such as positioned on opposite sides). In other words, the outlet of the circuit of the optical element driving mechanism 6100 and the outlet of the circuit of the optical module 6900 are positioned on different sides of the optical element driving mechanism 6100 to reduced required space.

In some embodiments, the limiting portions 6302 of the movable portion 6300 are positioned at the corner spaces 6213 of the base 6210. When the movable portion 6300 is moving relative to the fixed portion F6, the limiting portion 6302 may be accommodated in the corner space 6213 and is movable, and the movable range of the movable portion 6300 relative to the fixed portion F6 may be limited by making the limiting portions 6302 and the protruding portions 6214 adjacent to the corner spaces 6213 colliding with each other.

In FIG. 138, the base 6210 may include a main body 6210B and a sidewall 6210C, a recess 6215, a first opening 6216 positioned in the recess 6215, and a protruding portion 6217 surrounding the recess 6215 may be formed on the main body 6210B. Furthermore, a limiting element 6710 and a magnetic permeable element 6720 may be positioned between the movable portion 6300 and the base 6210. The magnetic permeable element 6720 may be disposed in the first opening 6216, and the limiting element 6710 may be disposed in the recess 6215. Furthermore, the limiting element 6710 may have a connecting portion 6712 and a column 6714. The connecting portion 6712 may be disposed in the recess 6215, and the position of the limiting element 6710 may be defined by the protruding portion 6217. In some embodiments, the connecting portion 6712 may have a criss-cross shape to further design the position of the limiting element 6710. An opening may be formed in the column 6714, and the exposed portion 6704 of the support element 6700 may be disposed in the opening.

FIG. 139 is an enlarged cross-sectional view of some elements in FIG. 138. In the cross-sectional view, the magnetic permeable element 6720 and the first opening 6216 may have trapezoid shapes to prevent the magnetic permeable element 6720 falling out from the first opening. Furthermore, a gap G6 may be formed between the embedded portion and the limiting element 6710 to allow the movable portion 6300 moving relative to the support element 6700. In some embodiments, the first opening 6216 may be replaced by a concave portion, and the magnetic permeable element 6720 may be disposed in the concave portion to increase the structural strength of the base 6210. In other words, the magnetic permeable element 6720 is not exposed from the base 6210 when viewed in the −Z direction.

In some embodiments of the present disclosure, as shown in FIG. 138, a second opening 6218 may be formed on the sidewall 6210C of the base 6210, so the driving assembly D6 (such as the second magnetic element 6420) may be disposed in the second opening 6218, and the weight of the base 6210 may be reduced. Furthermore, in some embodiments, a third opening 6219 may be formed on the main body 6210B of the base 6210 to prevent the movable portion 6300 and the first magnetic element 6410 from directly colliding to the base 6210 when the movable portion 6300 and the first magnetic element 6410 are moving.

FIG. 140 is a bottom view of the optical element driving mechanism 6100, wherein the base 6210 is not shown. FIG. 141 is an enlarged view of the portion R6 in FIG. 140, and FIG. 142 is a cross-sectional view illustrated along line C6-C6 in FIG. 137. As shown in FIG. 142, the case 6200 has a stopping portion 6202 extending to the base 6210 (i.e. extending in –Z direction). When viewed along the main axis O6 (–Z direction), as shown in FIG. 140 and FIG. 141, the stopping portion 6202 at least partially overlaps the limiting portion 6302 of the movable portion 6300. In other words, the movable range of the movable portion 6300 may be defined by the colliding between the limiting portion 6302 and the stopping portion 6202 when the movable portion 6300 is moving, so the assisting assembly AS6 may be prevented from detached from the movable portion 6300 and the fixed portion F6.

FIG. 143 and FIG. 144 are a schematic view and a cross-sectional view of the case 6200, the base 6210 and the circuit board 6600. As shown in FIG. 143 and FIG. 144, the circuit board 6600 may be sandwiched between the case 6200 and the base 6210. For example, when viewed in a direction that is perpendicular to the main axis O6, the case 6200, the base 6210, and the circuit board 6600 at least partially overlap each other. As a result, the circuit board 6600 may be protected from being damaged by external impact.

In some embodiments, additional blocking element (not shown) may be provided on the optical element driving mechanism 6100 or the optical module 6900 to prevent external dust from entering the optical module 6900 when the optical element driving mechanism 6100 or the optical module 6900 is operating.

FIG. 145 is a cross-sectional view of the movable portion 6300 of the optical element driving mechanism 6100 and other elements disposed on the movable portion 6300 when these elements rotate in Y axis relative to the fixed portion F6. As shown in FIG. 145, the movable portion 6300 and the optical module 6900 disposed on the movable portion 6300 may use the spherical support element 6700 as a fulcrum to rotate in different directions by the force generated from the driving assembly D6. Although the embodiment in FIG. 145 only shows the movable portion 3301 rotating in a single axis, but it should be noted that the movable portion 3301 may rotate in more than one axes, such as X, Y, and Z axes, to achieve optical image stabilization (OIS).

In some embodiments of the present disclosure, FIG. 146 to FIG. 149 are a perspective view and an exploded view of an optical element driving mechanism 7100, a schematic of some elements of the optical element driving mechanism 7100, and a cross-sectional view illustrated along a line A7-A7 in FIG. 146, respectively. The optical element driving mechanism 7100 mainly includes a case 7200, a base 7210, a first movable portion 7310, a second movable portion 7320, a first magnetic assembly 7410 (includes first magnetic elements 7410A and 7410B), a second magnetic assembly 7420 (includes second magnetic elements 7420A and 7420B), a position sensor assembly 7430 (includes position sensors 7430A and 7430B), a circuit board 7600, and a resilient element 7810. In some embodiments, the first movable portion 7310 and the second movable portion 7320 may be called a movable portion M17.

The optical element driving mechanism 7100 may be used for driving an optical module 7900, or it may be used for driving various optical elements, such as a lens, a mirror, a prism, a beam splitter, or an aperture. For example, the optical module 7900 may be attached to the movable portion M17 with glue.

In some embodiments, the case 7200 and the base 7210 may be combined to form the outer case of the optical element driving mechanism 7100. Furthermore, the case

7200 and the base 7210 may be called a fixed portion F17. In some embodiments, the material of the case 7200 and the base 7210 may include metal, such as iron. In some embodiments, the material of the case 7200 and the base 7210 may also include non-magnetic permeable material or weak magnetic permeable material. In some embodiments, the case 7200 may include a case opening 7201 and a stopping portion (not shown) surrounding the case opening 7201 and extending to the movable portion M17 for limiting the movable range of the first movable portion 7310, and the main axis O17 passes through the case opening 7201. The stopping portion may have a shape that is symmetrical to the main axis O17 to balance the movable range of the first movable portion 7310, such as a circular shape. As shown in FIG. 146, a recess R17 may be formed between the case 7200 and the base 7210 when viewed in a direction that is perpendicular to the main axis O17, the recess R17 may be used for accommodating the adhesive for connecting the case 7200 and the base 7210 from flowing to other elements. Furthermore, the contact area between the case 7200 and the base 7210 may be increased.

In some embodiments, the movable portion M17 (includes the first movable portion 7310 and the second movable portion 7320) may be moved relative to the fixed portion F17 (such as including the case 7200 and the base 7210). In some embodiments, the second movable portion 7320 may be moved relative to the first movable portion 7310, and the moving directions of the first movable portion 7310 and the second movable portion 7320 are different (such as rotatable relative to different axes). As a result, the optical module 7900 may move with the movable portion M17 to achieve auto focus (AF) or optical image stabilization (OIS).

In some embodiments, the first magnetic assembly 7410 and the second magnetic assembly 7420 may be called a driving assembly D17 to drive the movable portion M17 moving relative to the fixed portion F17. For example, the first magnetic assembly 7410 and the second magnetic assembly 7420 may include a combination of a driving coil and a driving magnet. For example, the first magnetic assembly 7410 may be a driving magnet, and the second magnetic assembly 7420 may be a driving coil. In another example, the first magnetic assembly 7410 may be a coil, and the second magnetic assembly 7420 may be a driving magnet, and is not limited thereto. The first magnetic assembly 7410 and the second magnetic assembly 7420 may be positioned on the fixed portion F17 and the movable portion M17, respectively. In some embodiments, the positions of the fixed portion F17 and the movable portion M17) may be interchanged. It should be noted that the interaction between the first magnetic assembly 7410 and the second magnetic assembly 7420 may create a magnetic force to move the optical module 7900 relative to the fixed portion, so auto focus (AF) or optical image stabilization (OIS) may be achieved. In some embodiments, the driving assembly D17 may include other driving elements, such as piezoelectric elements, shape memory alloys, etc.

Furthermore, the circuit board 7600 may be, for example, a flexible printed circuit, which may be affixed on the fixed portion F17 by adhesion. In some embodiments, the circuit board 7600 is electrically connected to other electronic elements disposed inside or outside the optical element driving mechanism 7100. For example, the circuit board 7600 may send electric signals to the driving assembly D17 to control the movement of the movable portion M17.

In some embodiments, the position sensor assembly 7430 may be disposed in the optical element driving mechanism 7100 to detect the position of the movable portion M17 relative to the fixed portion F17. The position sensor assembly 7430 may include a Hall effect sensor, a magnetoresistance effect sensor (MR Sensor), a giant magnetoresistance effect sensor (GMR sensor), a tunneling magnetoresistance effect sensor (TMR sensor), or a fluxgate sensor. In some embodiments, the position sensor assembly 7430 may be affixed on the fixed portion F17 for detecting the position of the movable portion M17 relative to the fixed portion F17. For example, the position sensor assembly 7430 may be disposed on the case 7200 or the base 7210.

Although the main axis O17 in FIG. 147 does not pass through the circuit board 7600, the present disclosure is not limited thereto. For example, in some embodiments, the circuit board 7600 may have a portion (not shown) that extends to the light exit side of the optical module 7900, i.e. it overlaps the optical module 7900 in the Z axis. Furthermore, additional position sensors may be provided on the portion of the circuit board 7600 that extends to the light exit side of the optical module 7900. In other words, the optical element driving mechanism 7100 may include at least three position sensors to improve performance.

FIG. 150 is an exploded view of the optical module 7900. The optical module 7900 may include a frame 7910, a base 7920, and an optical element 7990 disposed between the frame 7910 and the base 7920. It should be noted that a case opening and a bottom opening are formed on the frame 7910 and the base 7920, respectively. The center of the case opening corresponds to the main axis O17 of the optical element 7990, and the base opening corresponds to a photo sensor (not shown). As a result, the optical element 7990 disposed in the optical module 7900 may focus with the photo sensor along the main axis O17 (i.e. the Z direction).

Furthermore, a movable assembly 7930 which is movable relative to the frame 7910 and the base 7920 may be disposed in the optical module 7900, and the optical element 7990 may be fixed on the movable assembly 7930, such as by locking, gluing, or engaging. Furthermore, additional driving component may be provided in the optical module 7900, such as a first driving magnetic element 7940 and a second driving magnetic element 7950, to move the optical element 7990 with the movable assembly 7930 in a direction that is different than the moving direction of the movable portion M17. As a result, the optical element 7990 may be moved in more directions. The first driving magnetic element 7940 and a second driving magnetic element 7950 may include a combination of a magnet and a coil, such as the first driving magnetic element 7940 may be a coil, and the second driving magnetic element 7950 may be a magnet. For example, the optical element 7990 may be moved in the X, Y, or Z direction.

The substrate 7980 may be, for example, a flexible printed circuit board, which may be affixed on the base 7920 by adhesion. In some embodiments, the substrate 7980 is electrically connected to other electronic elements disposed inside or outside the optical module 7900. For example, the substrate 7980 may send electric signals to the driving component to control the movement of the movable assembly in the X, Y or Z direction.

FIG. 151 and FIG. 152 are a schematic view and a top view of some elements of the optical element driving mechanism 7100, FIG. 153 and FIG. 154 are cross-sectional views of the optical element driving mechanism 7100 illustrated along the line B7-B7 and C7-C7 in FIG. 152, FIG. 155 is a schematic view of the base 7210, FIG. 156 is a schematic view of the first movable portion 7310, and FIG. 157 is a schematic view of the second movable portion 7320.

The base 7210 has a rectangular shape. Extending portions 7211 may be positioned on two of the corners of the base 7210. The strengthening portions 7212 may be positioned on the other two corners. A recess 7213 may be formed in the extending portion 7211.

The first movable portion 7310 includes a main body 7311, two extending portions 7312 extending from the main body 7911 in a direction that is substantially perpendicular to the main axis O17, contact portions 7313 extending from the extending portion 7312, accommodating portions 7314 extending from the main body 7311 in a direction that is substantially parallel to the main axis O17, and blocking walls 7315 extending from the main body 7311 in a direction that is substantially parallel to the main axis O17.

The second movable portion includes a main body 7321, two bending portions 7322 bent from the main body 7321, recesses 7323 formed on the bending portions 7322, contact portions 7324 formed on the main body 7321, and an accommodating portion 7325 bent from the main body 7321.

As shown in FIG. 151, FIG. 153, and FIG. 154, the contact portion 7313 of the first movable portion 7310 may be disposed in the recess 7323 of the second movable portion 7320, and the contact portion 7324 of the second movable portion 7320 may be disposed in the recess 7213 of the base 7210. FIG. 158 is a partial cross-sectional view of the contact portion 7313 and the recess 7323 (or the contact portion 7324 and the recess 7213). It should be noted that the shape of the portion of the contact portion 7313 that contacts the recess 7323 may be a round angle, and the recess 7323 may have a flat surface 7323A in direct contact with the contact portion 7313. A distance may form between the contact portion 7313 and the sidewall 7323B of the recess 7323, so the contact portion 7313 may move in the recess 7323, and the friction between the contact portion 7313 and the recess 7323 may be reduced. Furthermore, in FIG. 158, an angle between the two sides 7313A of the contact portion 7313 may be less than an angle between the two sidewalls 7323B of the recess 7323, so the first movable portion 7310 and the second movable portion 7320 may be easily assembled with each other.

In some embodiments, the contact portion 7313 and the recess 7323 (or the contact portion 7324 and the recess 7213) may be made of the same material, and therefore have similar hardness, and the durability during operation may be enhanced. For example, the contact portion 7313 and the recess 7323 (or the contact portion 7324 and the recess 7213) may be made of metal, to further enhance their durability.

In some embodiments, as shown in FIG. 151, the second movable portion 7320 has the bending portion 7322 bent to Z direction, and the contact portion 7313 of the first movable portion 7310 contacts the bending portion 7322, so the minimum distance between the first movable portion 7310 and the bottom surface 7214 of the base 7210 may be different than the minimum distance between the second movable portion 7320 and the bottom surface of the base 7210 in Z direction.

It should be noted that as shown in FIG. 152, the strengthening portion 7212 of the base 7210 may act as a stopping portion for stopping the rotational movement of the second movable portion 7320 relative to the line B7-B7 in some embodiments. In particular, as shown in FIG. 152, the strengthening portion 7212 and the second movable portion 7320 at least overlap each other along the main axis O17 (Z axis). As a result, the movable range of the second movable portion 7320 may be restricted to prevent the second movable portion 7320 from being damaged by colliding with other elements. In some embodiments, the strengthening portion 7212 includes metal, so the mechanical strength of the strengthening portion 7212 may be further increased.

As shown in FIG. 152, the line B7-B7 passes through the two contact points between the second portion 7320 and the base 7210, and the line C7-C7 passes through the two contact points between the first movable portion 7310 and the second movable portion 7320, so the first movable portion 7310 and the second movable portion 7320 may rotate relative to the line C7-C7 and the line B7-B7, so movement in different dimensions may be achieved. Although the contact points are substantially positioned at the corners of the optical element driving mechanism 7100, the present disclosure is not limited thereto. For example, the contact points may be positioned at the sides of the optical element driving mechanism 7100. In other words, the connecting of the two contact points may be substantially perpendicular to a side 7216 of the optical element driving mechanism 7100.

Referring to FIG. 148, FIG. 156, and FIG. 157, the first magnetic element 7410A and the first magnetic element 7410B may be disposed on the accommodating portion 7314 of the first movable portion 7310 and the accommodating portion 7325 of the second movable portion 7320, respectively. The second magnetic elements 7420A and 7420B may be disposed on the circuit board 7600, so the first movable portion 7310 and the second movable portion 7320 may be driven by the first magnetic element 7410A and the first magnetic element 7410B to allow the first movable portion 7310 and the second movable portion 7320 to move in different directions.

Although the main body 7311 of the first movable portion 7310 overlaps the optical module 7900 in Z direction, the present disclosure is not limited thereto. For example, in some embodiments, the main body 7311 may surround the sidewall of the optical module 7900 in X or Y direction and may be attached on the optical module 7900, so the height of the optical element driving mechanism 7100 in Z axis may be further reduced.

In some embodiments, as shown in FIG. 146 and FIG. 156, the case 7200 may have openings 7202 at the corners that corresponding to the extending portions 7312 of the first movable portion 7310 to prevent the extending portion 7312 and the case 7200 from colliding with each other, so the durability of the optical element driving mechanism 7100 may be enhanced. For example, the extending portion 7312 is at least partially exposed from the opening 7202 in the main axis O17.

In some embodiments, the elements of the optical element driving mechanism 7100 may be weak magnetic permeable material or non-magnetic permeable material to prevent magnetic interference from occurring when the optical element driving mechanism 7100 or the optical module 7900 is operating.

FIG. 159 and FIG. 160 are a perspective view and a side view when the second movable portion 7320 rotates relative to the base 7210, wherein the first movable portion 7310 does not move relative to the second movable portion 7320. FIG. 161 and FIG. 162 are a perspective view and a side view when the first movable portion 7310 further rotates relative to the second movable portion 7320 after the condition in FIG. 159. As shown in FIG. 159 to FIG. 162, the movable portion M17 may be rotated in different directions by the driving force generated from the driving assembly D17, so effects such as optical image stabilization (OIS) may be achieved.

FIG. 163 and FIG. 164 are a schematic view and an exploded view of an optical element driving mechanism 7101 in other embodiments of the present disclosure. As shown in FIG. 163 and FIG. 164, the optical element driving mechanism 7101 may include a fixed portion F27, a first movable portion 7330, and a second movable portion 7340 disposed between the first movable portion 7330 and the fixed portion F27. The fixed portion F27, the first movable portion 7330, and the second movable portion 7340 are arranged in a main axis O27. The first movable portion 7330 and the second movable portion 7340 may be called a movable portion M27. The optical element driving mechanism 7101 may be used for driving an optical module 7900, or it may be used for driving various optical elements, such as a lens, a mirror, a prism, a beam splitter, or an aperture. For example, the optical module 7900 may be attached to the movable portion M27 with glue so that it moves with the movable portion M27. It should be noted that some of the aforementioned elements, such as the driving assembly, the position sensor assembly, and the circuit board, are omitted for clarity in FIG. 163 and FIG. 164.

The second movable portion 7340 may has two contact portions 7341 extending to the fixed portion F27 and two contact portions 7342 extending to the first movable portion 7330. The contact portions 7341 and the two contact portions 7342 may be disposed in the recess R27 of the fixed portion F27 and the recess 7331 of the first movable portion 7330, respectively. In other words, the contact portions 7341 and the contact portions 7342 have opposite extending directions. In some embodiments, the line D7-D7 of the two contact portions 7341 may be substantially to the line E7-E7 of the two contact portions 7342 to allow the first movable portion 7330 and the second movable portion 7340 to move in different directions.

FIG. 165 is a perspective view when the first movable portion 7330 rotates relative to the second movable portion 7340, wherein the second movable portion 7340 does not move relative to the fixed portion F27. FIG. 166 is a perspective view when the second movable portion 7340 further rotates relative to the fixed portion F27 after the condition in FIG. 165. As shown in FIG. 165 and FIG. 166, the movable portion M27 may rotate in different directions by the driving force generated from the driving assembly to achieve optical image stabilization.

FIG. 167 and FIG. 168 are a schematic view and an exploded view of an optical element driving mechanism 7102 according to some embodiments of the present disclosure. The optical element driving mechanism 7102 may include a base 7230 (or a fixed portion F37), a first movable portion 7350, and a second movable portion 7360 disposed between the first movable portion 7350 and the fixed portion F37. The fixed portion F37, the first movable portion 7350, and the second movable portion 7360 are arranged in a main axis O37. The first movable portion 7350 and the second movable portion 7360 may be called a movable portion M37. The optical element driving mechanism 7102 may be used for driving an optical module 7900, or it may be used for driving various optical elements, such as a lens, a mirror, a prism, a beam splitter, or an aperture. For example, the optical module 7900 may be attached to the movable portion M37 with glue so that it moves with the movable portion M37. It should be noted that some of the aforementioned elements, such as the driving assembly, the position sensor assembly, and the circuit board, are omitted for clarity in FIG. 165 and FIG. 166.

FIG. 169 is a top view of the optical element driving mechanism 7102. The base 7230 may include two contact portions 7231 extending to the movable portion M37, the second movable portion 7360 may include two contact portions 7362 extending to the first movable portion 7350, and the first movable portion 7350 may has recesses 7351 corresponding to the contact portions 7362. It should be noted that the line F7-F7 of the two contact portions 7231 and the line G7-G7 of the two contact portions 7362 may be substantially perpendicular to each other to allow the first movable portion 7350 and the second movable portion 7360 to move in different directions.

FIG. 170 is a perspective view when the second movable portion 7360 rotates relative to the base 7230, wherein the first movable portion 7350 does not move relative to the second movable portion 7360. FIG. 171 is a perspective view when the first movable portion 7350 further rotates relative to the second movable portion 7360 after the condition in FIG. 170. As shown in FIG. 170 and FIG. 171, the movable portion M37 may rotate in different directions by the driving force generated from the driving assembly to achieve optical image stabilization.

In some embodiments of the present disclosure, FIG. 172 to FIG. 174 are a perspective view and an exploded view of an optical element driving mechanism 8100, and a cross-sectional view illustrated along a line A8-A8 in FIG. 172, respectively. In FIG. 172, the optical element driving mechanism 8100 mainly includes a case 8200, a base 8210, a first movable portion 8310, a second movable portion 8320, first magnetic elements 8411, 8412, second magnetic elements 8421, 8422, position sensors 8431, 8432, and a circuit board 8600. The optical element driving mechanism 8100 may be used for driving an optical module 8900, or may be used for driving various optical elements, such as a lens, a mirror, a prism, a beam splitter, or an aperture.

In some embodiments, the case 8200 and the base 8210 may be combined to form the outer case of the optical element driving mechanism 8100. Furthermore, the case 8200 and the base 8210 serve as a fixed portion F8.

In some embodiments, the first movable portion 8310 and the second movable portion 8320 may serve as a movable portion M8, and the first movable portion 8310 and the second movable portion 8320 may move relative to the fixed portion F8 (including the case 8200 and the base 8210). In some embodiments, the second movable portion 8320 may be moved relative to the first movable portion 8310, and the direction of motions of the first movable portion 8310 and the second movable portion 8320 are different (such as rotatable relative to different axes). As a result, the optical module 8900 may move with the movable portion M8 to achieve optical image stabilization (OIS).

In some embodiments, the first magnetic element 8411 and the second magnetic element 8421 may serve as a first driving assembly D81. The first magnetic element 8412 and the second magnetic element 8422 may serve as a second driving assembly D82. The first driving assembly D81 and the second driving assembly D82 may serve as a driving assembly D8 to move the movable portion M8 relative to the fixed portion F8. For example, the first magnetic elements 8411, 8412 and the second magnetic elements 8421, 8422 may include a combination of driving coil and driving magnet. For example, the first magnetic elements 8411, 8412 may be driving magnets, and the second magnetic elements 8421, 8422 may be driving coils. In another example, the first magnetic elements 8411, 8412 may be driving coils, and the second magnetic elements 8421, 8422 may be driving magnets, but it is not limited thereto. In some embodiments, the shape of the second magnetic elements 8421, 8422 may be oval.

The first magnetic elements 8411, 8412 and the second magnetic elements 8421, 8422 may be positioned on the fixed portion F8 and the movable portion M8, respectively. In some embodiments, the first magnetic elements 8411, 8412 (or the second magnetic elements 8421, 8422) are respectively disposed on the first movable portion 8310 and the second movable portion 8320 for moving the first movable portion 8310 and the second movable portion 8320. In some embodiments, the first magnetic element 8411 may be disposed on the first movable portion 8310, the second magnetic element 8422 may be disposed on the second movable portion 8320, and the first magnetic element 8412 and the second magnetic element 8421 may be disposed on the fixed portion F8. In some embodiments, the first magnetic elements 8411, 8412 may be disposed on the first movable portion 8310.

It should be noted that the interaction between the first magnetic elements 8411, 8412 and the second magnetic elements 8421, 8422 may generate a magnetic force for moving the optical module 8900 relative to the fixed portion, so auto focus (AF) or optical image stabilization (OIS) may be achieved. In some embodiments, the driving assembly D8 may include other driving elements, such as piezoelectric elements, shape memory alloys, etc.

Furthermore, the circuit board 8600 may be, for example, a flexible printed circuit (FPC), which may be affixed to the fixed portion F8 by adhesion. In some embodiments, the circuit board 8600 is electrically connected to other electronic elements disposed inside or outside the optical element driving mechanism 8100. For example, the circuit board 8600 may send electric signal to the driving assembly D8 to control the movement of the movable portion 8300.

In some embodiments, position sensors 8431, 8432 may be disposed in the optical element driving mechanism 8100 and corresponding to the first driving assembly D81 and the second driving assembly D82, to detect the position of the movable portion M8 relative to the fixed portion F8. The position sensors 8431, 8432 may include Hall sensor, magnetoresistance effect sensor (MR Sensor), giant magnetoresistance effect sensor (GMR sensor), tunneling magnetoresistance effect sensor (TMR sensor), or fluxgate sensor.

In some embodiments, the position sensor 8431 may be at least partially disposed on the first movable portion 8310 and the fixed portion F8, and the position sensor 8432 may be at least partially disposed on the second movable portion 8320 and the fixed portion F8 to detect the movement of the first movable portion 8310 and the second movable portion in different directions. Furthermore, in some embodiments, the position sensors 8431, 8432 may be at least partially disposed on the first movable portion 8310 or the second movable portion 8320 to enhance detection.

FIG. 175 is a schematic view of some elements of the optical element driving mechanism 8100, and FIG. 176 is a side view of the elements in FIG. 175. As shown in FIG. 175, first connecting portions 8311 may be positioned on a diagonal of the first movable portion 8310, and line B8-B8, which connects the two first connecting portions 8311, may act as the rotational axis of the first movable portion 8310 relative to the base 8210. Furthermore, second connecting portions 8321 may be positioned on a diagonal of the second movable portion 8320, and line C8-C8, which connects the two second connecting portions 8321, may act as the rotational axis of the second movable portion 8320 relative to the first movable portion 8310. The main axis O8 of the optical element driving mechanism 8100 may be an axis that passes through the intersection of line B8-B8 and line C8-C8 and extends in Z direction.

As shown in FIG. 175, the first driving assembly D81 and the second driving assembly D82 are positioned on different sides of the movable portion M8, and the driving assembly D8 may be not positioned on the identical sides of the movable portion M8. In other words, the main axis O8 of the optical element driving mechanism 8100 may have a distance (which is greater than zero) from the center of the optical element driving mechanism 8100, rather than passing through the center of the optical element driving mechanism 8100 when viewed in Z direction. For example, if the optical element driving mechanism 8100 has a rectangular shape when viewed in the Z direction, the center of the optical element driving mechanism 8100 may be defined as a point that passes through two diagonals. As a result, the number of elements of the driving assembly D8 may be reduced to achieve miniaturization. Furthermore, as shown in FIG. 176, the height of the first movable portion 8310 is greater than the height of the second movable portion 8320 in the Z direction, which means the distance between the top surface of the first movable portion 8310 and the bottom surface of the second movable portion 8320 is greater than the distance between the top surface of the second movable portion 8320 and the bottom surface of the base 8210.

FIG. 6 is a schematic of the base 8210. Referring to FIG. 175 and FIG. 177, a pair of recesses 8213 may be formed at the diagonal of the base 8210, and the recesses 8213 corresponds to the second connecting portions 8321 positioned at the diagonal of the second movable portion 8320. Furthermore, the base 8210 may have a column 8211 disposed at a corner of the base 8210 where no recess 8213 is formed, and the column may extend in Z axis. Accommodating portions 8212 may be formed at the sides of the base 8210, the circuit board 8600 may be accommodated in the accommodating portions 8212, and the position of the circuit board 8600 may be defined by the column 8211. For example, the accommodating portions 8212 may position at two adjacent sides of the base 8210, and the circuit board 8600 may be L-shaped so that it may accommodated in the two accommodating portions 8212.

FIG. 178 is a schematic view of the second movable portion 8320. Refer to FIG. 175 and FIG. 178, second connecting portions 8321 may be formed at the diagonal of the second movable portion 8320 and may protrude outwardly from the movable portion 8320. An accommodating space 8322 may be formed at a side of the second movable portion 8320, and the first magnetic element 8412 may be disposed in the accommodating space 8322, for example it may be affixed in the accommodating space 8322 using glue. Furthermore, an opening 8323 may be formed at a side of the second movable portion 8320, so the first driving assembly D81 may be disposed at the opening 8323 and on the first movable portion 8310. Another diagonal on which no second connecting portion 8321 is disposed has concave portions 8324, and the first connecting portions 8311 of the first movable portion 8310 may be disposed in the concave portions 8324. Stopping portions 8325 may be formed on the diagonal of the second movable portion 8320 that is corresponding to the second connecting portions 8321, and the movable range of the first movable portion 8310 relative to the second movable portion 8320 may be restricted by the stopping portions 8325.

FIG. 179 is a schematic view of the first movable portion 8310. Refer to FIG. 175 and FIG. 179, first connecting portions 8311 that protruding outwardly from the first movable portion 8310 may be formed at the diagonal of the first movable portion 8310. An accommodating space 8312 may be formed at a side of the first movable portion 8310, and the first magnetic element 8411 may be disposed in the accommodating space 8312. For example, the first magnetic element 8411 may be affixed in the accommodating space 8312 by glue. Furthermore, concave portions 8313 and concave portions 8314 may be formed at the corners of the movable portion 8310, wherein the bottom surface 8313A of the concave portion 8313 faces the stopping portion 8325 of the second movable portion 8320. The movable range of the first movable portion 8310 relative to the second movable portion 8320 may be limited by the bottom surface 8313A and the stopping portion 8325. In some embodiments, the two bottom surfaces 8313A may position on an identical plane in Z direction, and the two stopping portions 8325 may position on an identical plane in Z direction, so the movable range of the movable portion M8 in different directions may be balanced. Furthermore, a stopping portion 8315 may be formed on the first movable portion 8310, the optical module 8900 may be attached on the stopping portion 8315, such as be affixed to the stopping portion 8315, to allow the optical module 8900 and the first movable portion 8310 moving together.

FIG. 180 is a partial cross-sectional view illustrated along line D8-D8 in FIG. 175, and the case 8200 is also shown in FIG. 180. In some embodiments, the second connecting portion 8321 may be shaped like a column and be positioned in the recess 8213 of the base 8210, and the second connecting portion 8321 may in direct contact with side surfaces 8213A, 8213B and the bottom surface 8200A of the case 8200. As a result, the contact area between the second connecting portion 8321 and other elements may be increased, so friction between the second connecting portion 8321 and a single surface may be reduced. As a result, the second connecting portion 8321 may rotate in the recess 8213. In some embodiments, a material used for lubrication (such as a lubricant) may be provided on the second connecting portion 8321 of the second movable portion 8320 to reduce the friction of the connecting portions even further when it rotates.

Although the second connecting portion 8321 may in direct contact with the side surfaces 8213A, 8213B and the bottom surface 8200A, the present disclosure is not limited thereto. In some embodiments, the second connecting portion 8321 may fit tightly with the side surfaces 8213A and is a distance away from the bottom surface 8200A. In some embodiments of the present disclosure, the first connecting portion 8311 or the second connecting portion 8321 may include metal to enhance the durability of the first connecting portion 8311 or the second connecting portion 8321. For example, metal may be provided in the first connecting portion 8311 or the second connecting portion 8321 by insert molding.

Although the recess 8213 has a rectangular shape in FIG. 180, the present disclosure is not limited thereto. For example, the shape of the cross-section of the recess 8213 or the concave portion 8324 (e.g., illustrated along line D8-D8) may have a V shape, a rectangle, a trapezoid, an oval, or an arc, depending on design requirements. In other words, the portion of the recess 8213 or the concave portion 8324 that is in direct contact with the first connecting portion 8311 or the second connecting portion 8321 may include a rounded angle so that the friction between the movable portion M8 and other elements may be reduced when the movable portion M8 is moving. In some embodiments, an additional position adjusting element (not shown) may be provided in the recess 8213 or the concave portion 8324, or it may be provided between the case 8200 and the base 8210 to adjust the position of the first movable portion 8310 or the second movable portion 8320, so the usage of the optical element driving mechanism 8100 may be more flexible. Furthermore, as shown in FIG. 175, the first movable portion 8310 may move along line B8-B8, and the second movable portion 8320 may move along line C8-C8.

In some embodiments, additional resilient elements (such as a spring or gel, not shown) may be provided on the movable portion M8 to allow the movable portion M8 returning to an initial position when no current is provided to the optical element driving mechanism 8100. As a result, the movable portion M8 may be prevented from colliding with the fixed portion F8 when the optical element driving mechanism 8100 is not operating.

FIG. 181 is an exploded view of the optical module 8900. The optical module 8900 may include a frame 8910, a base 8920, and an optical element 8990 disposed between the frame 8910 and the base 8920. It should be noted that the case opening and the bottom opening are formed on the frame 8910 and the base 8920, respectively. The center of the case opening corresponds to the main axis O8 of the optical element 8990, and the base opening corresponds to a photo sensor 8970, and the photo sensor 8970 may be disposed on a substrate 8980. As a result, the optical element 8990 disposed in the optical module 8900 may focus with the photo sensor 8970 along the main axis O8 (i.e. Z direction).

Furthermore, a moving assembly (not shown) which is movable relative to the frame 8910 and the base 8920 may be disposed in the optical module 8900, and the optical element 8990 may be fixed on the movable assembly, such as by locking, gluing, or engaging. Furthermore, additional driving component may be provided in the optical module 8900, such as an assembly of a magnet and a coil (not shown), to move the optical element 8990 with the movable assembly in a direction that is different than the direction of motion of the movable portion M8. As a result, the optical element 8990 may be moved in more directions. For example, the optical element 8990 may be moved on X, Y, or Z direction.

The substrate 8980 may be, for example, a flexible printed circuit (FPC) board, which may be affixed to the base 8920 by adhesion. In some embodiments, the substrate 8980 is electrically connected to other electronic elements disposed inside or outside the optical module 8900. For example, the substrate 8980 may send electric signal to the driving component to control the movement of the movable assembly in the X, Y or Z direction.

FIG. 182 and FIG. 183 are a schematic view and a side view of some elements of the optical element driving mechanism 8100, wherein the second movable portion 8320 is rotating relative to the base 8210, and the first movable portion 8310 does not move relative to the second movable portion 8320. FIG. 184 and FIG. 185 are a schematic view and a side view of some elements of the optical element driving mechanism 8100, wherein the first movable portion 8310 is further rotating relative to the second movable portion 8320 after the condition in FIG. 182. As shown in FIG. 182 to FIG. 185, the movable portion M8 may be rotated in different directions by the driving force generated by the driving assembly D8 to achieve optical image stabilization.

Although embodiments of the present disclosure and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope of such processes, machines, manufacture, and compositions of matter, means, methods, or steps. In addition, each claim constitutes a separate embodiment, and the combination of various claims and embodiments are within the scope of the disclosure.

What is claimed is:

1. A driving mechanism, comprising:
   a movable portion used for holding an optical module, wherein the optical module comprises a substrate and an optical sensor, the optical module connects to an external circuit through the substrate, and the optical sensor is used for receiving light;
   a fixed portion, wherein the movable portion is movable relative to the fixed portion;
   a driving assembly used for driving the movable portion to move relative to the fixed portion; and
   an aperture module used for controlling size of an aperture, and the light enters to the optical sensor through the aperture
   further comprising a sensor, the driving assembly comprises a magnetic element, wherein the sensor does not overlap the magnetic element in a top view,
   wherein the sensor overlaps the aperture module in the top view.

2. The driving mechanism as claimed in claim 1, wherein the driving assembly and the aperture module are disposed on opposite sides of the fixed portion.

3. The driving mechanism as claimed in claim 1, wherein the aperture module does not overlap the magnetic element in the top view.

4. The driving mechanism as claimed in claim 1, wherein the fixed portion comprises a frame, and the aperture module does not overlap the frame in a top view.

5. The driving mechanism as claimed in claim 4, wherein the fixed portion further comprises a base, and the base and the aperture module are disposed on opposite sides of the frame.

6. The driving mechanism as claimed in claim 1, wherein the optical module is surrounded by the fixed portion.

7. The driving mechanism as claimed in claim 1, wherein the aperture module is disposed on the optical module.

8. The driving mechanism as claimed in claim 1, further comprising a circuit board, wherein the aperture module do not overlap the circuit board in a top view.

9. The driving mechanism as claimed in claim 8, wherein the circuit board and the substrate extend from different sides of the fixed portion in the top view.

10. The driving mechanism as claimed in claim 1, further comprising a connecting element, wherein the aperture module and the connecting element are disposed on opposite sides of the fixed portion.

11. The driving mechanism as claimed in claim 1, wherein the movable portion comprises a holder, and the optical module is disposed on the holder.

12. The driving mechanism as claimed in claim 11, wherein the holder and the aperture module are disposed on opposite sides of the optical module.

13. The driving mechanism as claimed in claim 11, wherein the holder and the optical sensor are disposed on opposite sides of the substrate.

14. The driving mechanism as claimed in claim 11, wherein the optical module further comprises a filter, and the filter and the holder are disposed on opposite sides of the substrate.

15. The driving mechanism as claimed in claim 14, wherein the substrate and the filter are disposed on opposite sides of the optical sensor.

16. The driving mechanism as claimed in claim 1, wherein the optical module further comprises a second driving assembly surrounded by the fixed portion.

17. The driving mechanism as claimed in claim 1, wherein no magnet is positioned between the optical module and the fixed portion.

18. The driving mechanism as claimed in claim 1, wherein the optical module further comprises a sensor, the optical module is substantially rectangular, and the driving assembly and the sensor are positioned at different sides of the optical module.

* * * * *